United States Patent [19]
Schmitz

[11] Patent Number: 5,128,871
[45] Date of Patent: Jul. 7, 1992

[54] APPARATUS AND METHOD FOR ALLOCATION OF RESOURES IN PROGRAMMABLE LOGIC DEVICES

[75] Inventor: Nicholas A. Schmitz, Cupertino, Calif.

[73] Assignee: Advanced Micro Devices, Inc., Sunnyvale, Calif.

[21] Appl. No.: 490,817

[22] Filed: Mar. 7, 1990

[51] Int. Cl.⁵ .............................................. G06F 15/60
[52] U.S. Cl. .................................. 364/490; 364/489; 364/491
[58] Field of Search .............................. 307/440, 465; 364/488-490, 491

[56] References Cited

U.S. PATENT DOCUMENTS

| | | | |
|---|---|---|---|
| 4,612,618 | 9/1986 | Pryor et al. | 364/488 |
| 4,786,904 | 11/1988 | Graham, III et al. | 364/488 |
| 4,792,909 | 12/1988 | Serlet | 364/490 |
| 4,849,928 | 7/1989 | Hauck | 364/489 |
| 4,916,627 | 4/1990 | Hathaway | 364/488 |
| 4,918,614 | 4/1990 | Modarres et al. | 364/489 |

OTHER PUBLICATIONS

Pal Device Data Book, Advanced Micro Devices, Sunnyvale, CA, pp. 4-1 to 4-198, (1988).
Pal Device Handbook, Advanced Micro Devices, Sunnyvale, CA, pp. 2-66 to 2-70, (1988).

*Primary Examiner*—Salvatore Cangialosi
*Attorney, Agent, or Firm*—Skjerven, Morrill, MacPherson, Franklin & Friel

[57] ABSTRACT

Programmable logic device design software is provided for allocating specific resources in a programmable logic device having a multiplicity of programmable logic blocks interconnected by a programmable switch matrix to logic equations in a user logic design. In particular, a resource allocation means for fitting a logic design to a multiplicity of programmable logic blocks with limited interconnectivity between the modules is provided. The resource allocation means requires minimal programmable logic device resources to achieve the allocation of resources within the programmable logic device to the user logic design. The resource allocation means employs block partitioning means and resource assignment means to map user logic to a programmable logic device (PLD) having multiple programmable AND fixed OR arrays interconnected by a programmable switch matrix, i.e., allocate the PLD resources to the user logic.

75 Claims, 86 Drawing Sheets

Title 4 Bit_Counter
Pattern    4cnt.pds
Revision   B
Author     Mehrnaz Hada, Bill Hollon, Ali Sebt
Company    Monolithic Memories Inc. Santa Clara, CA
Date       1/14/85

CHIP 4BitCoun PAL16RP4

CLK UP AI BI CI DI CLR LOAD NC GND
/OC NC NC D C B A NC NC VCC

;The 4-bit counter counts up or down and has the clear and
;load capability. The clear operation overrides count and
;load. The counter counts up when CLR=low, LOAD=low, and
;UP=high. It counts down whenever CLR=low, LOAD=low, and
;UP=low EQUATIONS
A   :=    /A*/B*/C*/D*/UP*/LOAD*/CLR
      +   /A* B* C* D* UP*/LOAD*/CLR
      +    A* B*    /UP*/LOAD*/CLR
      +    A*/B*  D*    /LOAD*/CLR
      +    A*   /C*  UP*/LOAD*/CLR
      +    A*    C*/D*   /LOAD*/CLR
      +              LOAD*/CLR* AI B   :=      /B*/C*/D*/UP*/LOAD*/CLR
      +     /B* C* D* UP*/LOAD*/CLR
      +      B* C*/D*    /LOAD*/CLR
      +      B*/C*   UP*/LOAD*/CLR
      +      B*    D*/UP*/LOAD*/CLR
      +              LOAD*/CLR* BI C   :=      /C*/D*/UP*/LOAD*/CLR
      +     /C* D* UP*/LOAD*/CLR
      +      C*/D* UP*/LOAD*/CLR
      +      C* D*/UP*/LOAD*/CLR
      +              LOAD*/CLR* CI

D   :=     /D*  /LOAD*/CLR
      +         LOAD*/CLR* DI

FIG. 3A-1
(PRIOR ART)

SIMULATION

TRACE_ON AI BI CI DI LOAD CLR UP A B C D

SETF LOAD/CLR AI BI CI DI OC
CLOCKF CLK ;to HIGH and count up

SETF CLR ;Clear all registers
CLOCKF CLK

SETF/CLR UP /LOAD

FOR 1: = 1 TO 16 DO
    BEGIN ;cycles
      CLOCKF CLK
    END

SETF LOAD /CLR /UP AI BI CI DI
CLOCKF
SETF /LOAD ;down
    FOR 1: = 1 TO 16 DO
    BEGIN ;cycles
      CLOCKF CLK
    END SETF LOAD CLR AI /BI CI /DI
CLOCK CLK ;and CLR on at the

SETF /OC

TRACE_OFF

FIG. 3A-2
(PRIOR ART)

| | |
|---|---|
| TITLE | UP/DOWN COUNTER |
| PATTERN | X0000 |
| REVISION | 0 |
| AUTHOR | BRYON MOYER |
| COMPANY | MONOLITHIC MEMORIES |
| DATE | 9/23/87 |

CHIP  2_BIT_CTR                    PAL16R4

```
;PINS 1   2   3    4   5   6   7   8   9   10
     CLK UP INIT NC  NC  NC  NC  NC  NC  GND

;PINS 11  12  13  14  15  16  17  18  19  20
     /OE NC  NC  R0  R1  NC  NC  NC  NC  VCC
```

;THIS IS A SIMPLE TWO-BIT UP/DOWN COUNTER EXAMPLE. NOTE THAT
;INITIALIZATION HAS BEEN DESIGNED IN WITH DEFAULT_BRANCH.
;THE STATE MACHINE RETURNS TO STATE S0 IF CLOCKED WHEN PIN
;INIT IS HI. COUNTING IS ONLY POSSIBLE IF INIT IS LO. IF
;PIN UP IS HI, COUNTER COUNTS UP. IF PIN IS LO, COUNTER
;COUNTS DOWN.

STATE                              ;START THE STATE MACHINE SECTION

MOORE_MACHINE
DEFAULT_BRANCH S0                  ;FOR INITIALIZATION

;IN THIS EXAMPLE, THE OUTPUTS ARE TAKEN DIRECTLY FROM THE
;STATE BITS. THEREFORE, AN OUTPUT DEFAULT IS NOT USED.

FIG. 3B
(PRIOR ART)

```
;STATE ASSIGNMENTS
;STATES ARE THE SAME AS THE OUTPUTS

S0 = /R1 * /R0  ;COUNT 0
S1 = /R1 * /R0  ;COUNT 1
S2 =  R1 * /R0  ;COUNT 2
S3 =  R1 * /R0  ;COUNT 3

;STATE AND TRANSITION DEFINITIONS
;BECAUSE THE OUTPUTS ARE TAKEN DIRECTLY FROM THE STATE BITS,
;NO OUTPUT EQUATIONS ARE USED.

S0 := COUNT_UP        -> S1        ;COUNT 0 TO 1
    + COUNT_DOWN      -> S3        ;COUNT 0 TO 3

S1 := COUNT_UP        -> S2        ;COUNT 1 TO 2
    + COUNT_DOWN      -> S0        ;COUNT 1 TO 0

S2 := COUNT_UP        -> S3        ;COUNT 2 TO 3
    + COUNT_DOWN      -> S1        ;COUNT 2 TO 1

S3 := COUNT_UP        -> S0        ;COUNT 3 TO 0
    + COUNT_DOWN      -> S2        ;COUNT 3 TO 2

;DEFINE THE BRANCH CONDITIONS.  THE BRANCH CONDITIONS ARE
;ESSENTIALLY THE CONDITIONS FOR COUNTING UP OR DOWN. THE
;COUNTER CAN ONLY COUNT IF PIN INIT IS LO.  IF PIN INIT IS
;HI, THEN NEITHER OF THE CONDITIONS IS TRUE, AND THE DEFAULT ;BRANCH
IS USED TO INITIALIZE THE COUNTER TO COUNT 0.

CONDITIONS

COUNT_UP   =          UP*/INIT
COUNT_DOWN =         /UP*/INIT
```

FIG. 3C
(PRIOR ART)

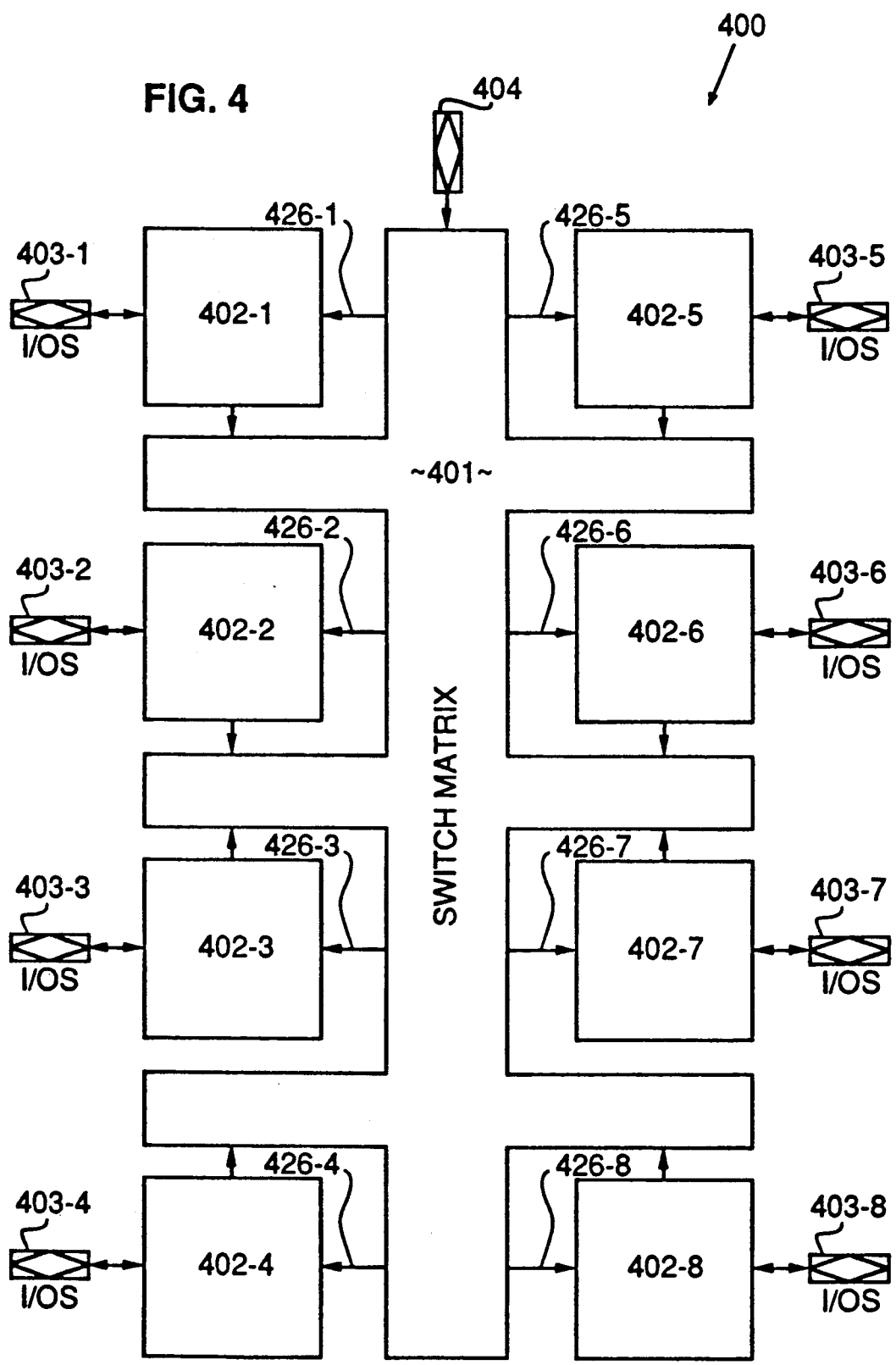

```
module C8
title 'Loadable 8-bit counter
Copyright 1990 Advanced Micro Devices, All rights reserved COUNT8      device 'MACH110';

Clk,CO,I1,I0,CI         pin  1,22,8,9,10;
    A0,A1,A2,A3       pin  2,3,4,5;
    Q7,Q6,Q5,Q4       pin  18,19,20,21;
    Q3,Q2,Q1,Q0       pin  14,15,16,17;

H,L,X,Z,C        = 1,0, .X.,.Z.,.C.;
    InputA           = [A3,A2,A1,A0];
    Output           = [CO,Q7,Q6,Q5,Q4,Q3,Q2,Q1,Q0];
    Mode             = [I1,I0];
    Hold,LoadA,LoadB,Incr   = 0,1,2,3;       " define Modes equations " input multiplexer !Q0  := (Mode==Hold ) &  !Q0      # (Mode==LoadA) &  !A0;
    !Q1  := (Mode==Hold ) &  !Q1      # (Mode==LoadA) &  !A1;
    !Q2  := (Mode==Hold ) &  !Q2      # (Mode==LoadA) &  !A2;
    !Q3  := (Mode==Hold ) &  !Q3      # (Mode==LoadA) &  !A3;
    !Q4  := (Mode==Hold ) &  !Q4      # (Mode==LoadB) &  !A0;
    !Q5  := (Mode==Hold ) &  !Q5      # (Mode==LoadB) &  !A1;
    !Q6  := (Mode==Hold ) &  !Q6      # (Mode==LoadB) &  !A2;
    !Q7  := (Mode==Hold ) &  !Q7      # (Mode==LoadB) &  !A3;

Q0.C=Clk; Q1.C=Clk; Q2.C=Clk; Q3.C=Clk;
    Q4.C=Clk; Q5.C=Clk; Q6.C=Clk; Q7.C=Clk;

" 8 bit counter

!Q0  := (Mode==Incr ) &  !CI &  !Q0         "Hold if no carry
         #  (Mode==Incr ) &   CI &   Q0 ;

!Q1  := (Mode==Incr ) &  !CI &  !Q1         "Hold if no carry
         #  (Mode==Incr ) &  !Q0 &  !Q1         "Hold if Q0=L
         #  (Mode==Incr ) &   CI &   Q0 &  Q1 ;

!Q2  := (Mode==Incr ) &  !CI &  !Q2         "Hold if no carry
         #  (Mode==Incr ) &  !Q0 &  !Q2         "Hold if Q0=L
         #  (Mode==Incr ) &  !Q1 &  !Q2         "Hold if Q1=L
         #  (Mode==Incr ) &   CI &   Q0 &  Q1 &  Q2 ;

!Q3  := (Mode==Incr ) &  !CI &  !Q3         "Hold if no carry
         #  (Mode==Incr ) &  !Q0 &  !Q3         "Hold if Q0=L
         #  (Mode==Incr ) &  !Q1 &  !Q3         "Hold if Q1=L
         #  (Mode==Incr ) &  !Q2 &  !Q3         "Hold if Q2=L
         #  (Mode==Incr ) &   CI &   Q0 &  Q1 &  Q2 &  Q3 ;
```

Fig. 8B

Copyright 1990 Advanced Micro Devices, All rights reserved

```
!Q4  := (Mode==Incr ) & !CI & !Q4        "Hold if no carry
   # (Mode==Incr) & !Q0 & !Q4            "Hold if Q0=L
   # (Mode==Incr) & !Q1 & !Q4            "Hold if Q1=L
   # (Mode==Incr) & !Q2 & !Q4            "Hold if Q2=L
   # (Mode==Incr) & !Q3 & !Q4            "Hold if Q3=L
   # (Mode==Incr) &  CI &  Q0 & Q1 &  Q2 & Q3 & Q4;

!Q5  := (Mode==Incr ) & !CI & !Q5        "Hold if no carry
   # (Mode==Incr) & !Q0 & !Q5            "Hold if Q0=L
   # (Mode==Incr) & !Q1 & !Q5            "Hold if Q1=L
   # (Mode==Incr) & !Q2 & !Q5            "Hold if Q2=L
   # (Mode==Incr) & !Q3 & !Q5            "Hold if Q3=L
   # (Mode==Incr) & !Q4 & !Q5            "Hold if Q4=L
   # (Mode==Incr) &  CI &  Q0 & Q1 &  Q2 & Q3 & Q4 & Q5;

!Q6  := (Mode==Incr ) & !CI & !Q6        "Hold if no carry
   # (Mode==Incr) & !Q0 & !Q6            "Hold if Q0=L
   # (Mode==Incr) & !Q1 & !Q6            "Hold if Q1=L
   # (Mode==Incr) & !Q2 & !Q6            "Hold if Q2=L
   # (Mode==Incr) & !Q3 & !Q6            "Hold if Q3=L
   # (Mode==Incr) & !Q4 & !Q6            "Hold if Q4=L
   # (Mode==Incr) & !Q5 & !Q6            "Hold if Q5=L
   # (Mode==Incr) &  CI &  Q0 & Q1 &  Q2 & Q3 & Q4 & Q5 & Q6;

!Q7  := (Mode==Incr ) & !CI & !Q7        "Hold if no carry
   # (Mode==Incr) & !Q0 & !Q7            "Hold if Q0=L
   # (Mode==Incr) & !Q1 & !Q7            "Hold if Q1=L
   # (Mode==Incr) & !Q2 & !Q7            "Hold if Q2=L
   # (Mode==Incr) & !Q3 & !Q7            "Hold if Q3=L
   # (Mode==Incr) & !Q4 & !Q7            "Hold if Q4=L
   # (Mode==Incr) & !Q5 & !Q7            "Hold if Q5=L
   # (Mode==Incr) & !Q6 & !Q7            "Hold if Q6=L
   # (Mode==Incr) &  CI &  Q0 & Q1 &  Q2 & Q3 & Q4 & Q5 & Q6 & Q7;

!CO  = !CI # !Q0 # !Q1 # !Q2 # !Q3 # !Q4 # !Q5 # !Q6 # !Q7;

end C8;
```

Fig. 8C

```
' ABEL generated count8 file
'$ JEDECFILE count8
'$ DEVICE MACH110
'$ PINS 17 Clk:1 CO:22 I1:8 I0:9 CI:10 A0:2 A1:3 A2:4 A3:5
C7:18 Q6:19 Q5:20 Q4:21 Q3:14 Q2:15 Q1:16 Q0:17
'$ NODES 0
.i 16
.o 17
.ilb Clk:1 I1:8 I0:9 CI:10 A0:2 A1:3 A2:4 A3:5 Q7:18 Q6:19
Q5:20 Q4:21 Q3:14 Q2:15 Q1:16 Q0:17
.ob Q0.D-:17 Q1.D-:16 Q2.D-:15 Q3.D-:14 Q4.D-:21 Q5.D-:20
Q6.D-:19 Q7.D-:18 Q0.C:1 Q1.C:1 Q2.C:1 Q3.C:1 Q4.C:1 Q5.C:1
Q6.C:1 Q7.C:1 CO.D-:22
'.phase 1111111111111111
.p 77
-111-----------1 10000000000000000
-110-----------0 10000000000000000
-00------------0 10000000000000000
-01-0----------- 10000000000000000
-111----------11 01000000000000000
-11-----------00 01000000000000000
-110----------0- 01000000000000000
-00-----------0- 01000000000000000
-01--0---------- 01000000000000000
-111---------111 00100000000000000
-00----------0-- 00100000000000000
-11----------0-0 00100000000000000
-11----------00- 00100000000000000
-110---------0-- 00100000000000000
-01---0--------- 00100000000000000
-111--------1111 00010000000000000
-00---------0--- 00010000000000000
-01----0-------- 00010000000000000
-11---------0--0 00010000000000000
-11---------0-0- 00010000000000000
-11---------00-- 00010000000000000
-110--------0--- 00010000000000000
-111-------11111 00001000000000000
-00--------0---- 00001000000000000
-01-0----------- 00001000000000000
-11--------0---0 00001000000000000
-11--------0--0- 00001000000000000
-11--------0-0-- 00001000000000000
-11--------00--- 00001000000000000
-110-------0---- 00001000000000000
-111------111111 00000100000000000
-00-------0----- 00000100000000000
-01--0---------- 00000100000000000
-11-------0----0 00000100000000000
-11-------0---0- 00000100000000000
```

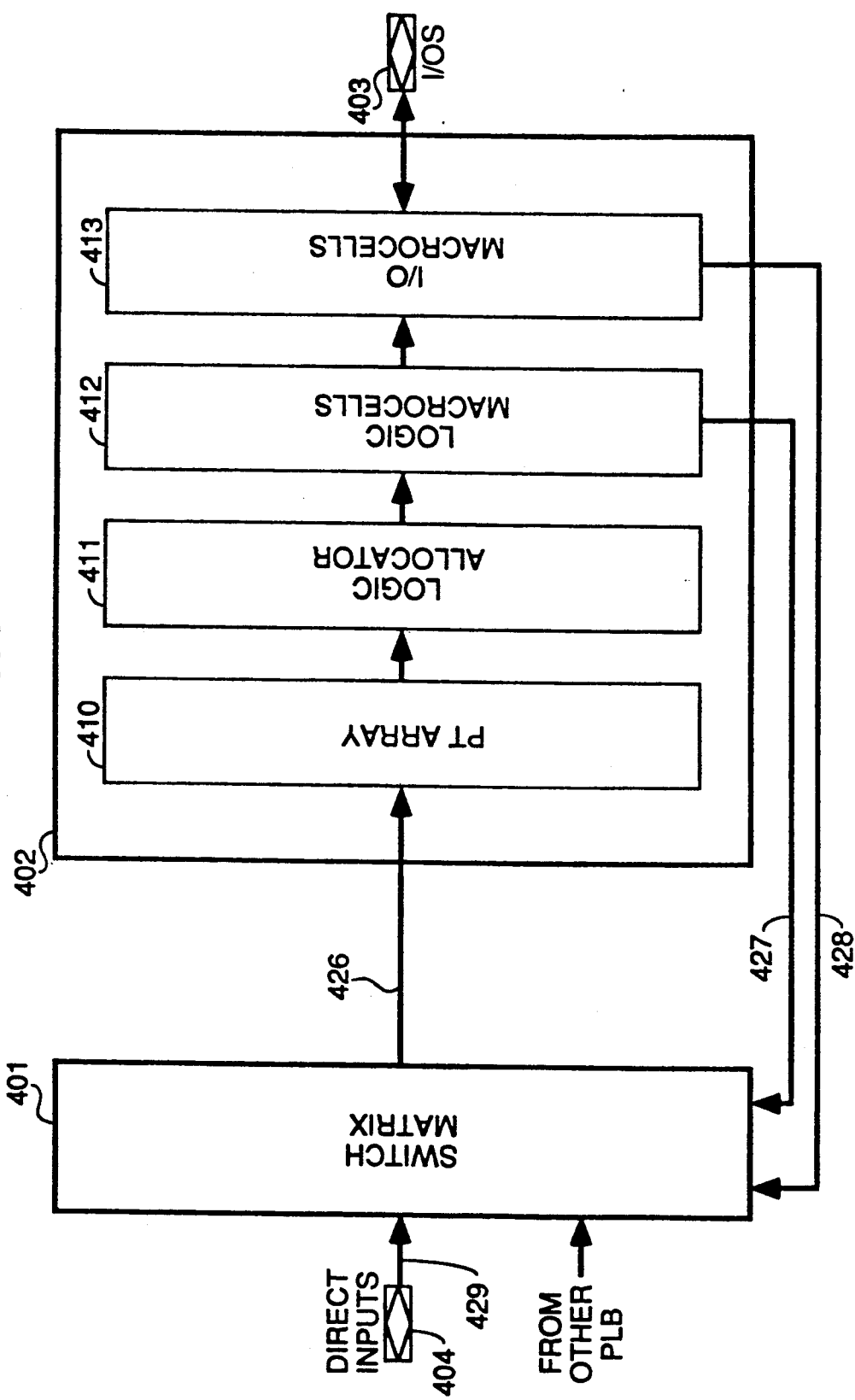

| Programmable Logic Block Input Line | Switch Matrix Multiplexer Input Lines | | | | |
|---|---|---|---|---|---|
| AIN1  | A1^  | A9   | B1^  | B9   |    |
| AIN2  | A2^  | A10  | B2^  | B10  |    |
| AIN3  | A3^  | A11  | B3^  | B11  |    |
| AIN4  | A4^  | A12  | B4   | B12  |    |
| AIN5  | A5^  | A13  | B5^  | B13  |    |
| AIN6  | A6^  | A14  | B6^  | B14  |    |
| AIN7  | A7^  | A15  | B7^  | B15  |    |
| AIN8  | A8^  | A16  | B8^  | B16  |    |
| AIN9  | A9^  | A1   | B9^  | B1   |    |
| AIN10 | A10^ | A2   | B10^ | B2   |    |
| AIN11 | A11^ | A3   | B11^ | B3   |    |
| AIN12 | A12^ | A4   | B12^ | B4   |    |
| AIN13 | A13^ | A5   | B13^ | B5   |    |
| AIN14 | A14^ | A6   | B14^ | B6   |    |
| AIN15 | A15^ | A7   | B15^ | B7   |    |
| AIN16 | A16^ | A8   | B16^ | B8   |    |
| AIN17 | I1   |      |      |      |    |
| AIN18 | I2   |      |      |      |    |
| AIN19 | A1^  | A9^  | A2   | A10  | I3 |
| AIN20 | A3^  | A11^ | A4   | A12  | I4 |
| AIN21 | A5^  | A13^ | A6   | A14  | I5 |
| AIN22 | A7^  | A15^ | A8   | A16  | I6 |

FIG. 19A

| Programmable Logic Block Input Line | Switch Matrix Multiplexer Input Lines | | | | |
|---|---|---|---|---|---|
| BIN1  | A1^  | A9  | B1^  | B9  | |
| BIN2  | A2^  | A10 | B2^  | B10 | |
| BIN3  | A3^  | A11 | B3^  | B11 | |
| BIN4  | A4^  | A12 | B4^  | B12 | |
| BIN5  | A5^  | A13 | B5^  | B13 | |
| BIN6  | A6^  | A14 | B6^  | B14 | |
| BIN7  | A7^  | A15 | B7^  | B15 | |
| BIN8  | A8^  | A16 | B8^  | B16 | |
| BIN9  | A9^  | A1  | B9^  | B1  | |
| BIN10 | A10^ | A2  | B10^ | B2  | |
| BIN11 | A11^ | A3  | B11^ | B3  | |
| BIN12 | A12^ | A4  | B12^ | B4  | |
| BIN13 | A13^ | A5  | B13^ | B5  | |
| BIN14 | A14^ | A6  | BI4^ | B6  | |
| BIN15 | A15^ | A7  | BI5^ | B7  | |
| BIN16 | A16^ | A8  | B16^ | B8  | |
| BIN17 | I1 | | | | |
| BIN18 | I2 | | | | |
| BIN19 | B1^ | B9^  | B2 | B10 | I3 |
| BIN20 | B3^ | B11^ | B4 | B12 | I4 |
| BIN21 | B5^ | B13^ | B6 | B14 | I5 |
| BIN22 | B7^ | B15^ | B8 | B16 | I6 |

FIG. 19B

| Programmable Logic Block Input Line | Switch Matrix Multiplexer Input Line | | | | | | | | | | |
|---|---|---|---|---|---|---|---|---|---|---|---|
| A1IN  | A1^ | A5 | A9  | B1^ | B5 | B9  | C1^ | C5 | C9  | D1^ | D5 | D9  |
| A2IN  | A2^ | A6 | A10 | B2^ | B6 | B10 | C2^ | C6 | C10 | D2^ | D6 | D10 |
| A3IN  | A3^ | A7 | A11 | B3^ | B7 | B11 | C3^ | C7 | C11 | D3^ | D7 | D11 |
| A4IN  | A4^ | A8 | A12 | B4^ | B8 | B12 | C4^ | C8 | C12 | D4^ | D8 | D12 |
| A5IN  | A5^ | A1 | A13 | B5^ | B1 | B13 | C5^ | C1 | C13 | D5^ | D1 | D13 |
| A6IN  | A6^ | A2 | A14 | B6^ | B2 | B14 | C6^ | C2 | C14 | D6^ | D2 | D14 |
| A7IN  | A7^ | A3 | A15 | B7^ | B3 | B15 | C7^ | C3 | C15 | D7^ | D3 | D15 |
| A8IN  | A8^ | A4 | A16 | B8^ | B4 | B16 | C8^ | C4 | C16 | D8^ | D4 | D16 |
| A9IN  | A1^ | A5 | A9  | B1^ | B5 | B9  | C1^ | C5 | C9  | D1^ | D5 | D9  |
| A10IN | A2^ | A6 | A10 | B2^ | B6 | B10 | C2^ | C6 | C10 | D2^ | D6 | D10 |
| A11IN | A3^ | A7 | A11 | B3^ | B7 | B11 | C3^ | C7 | C11 | D3^ | D7 | D11 |
| A12IN | A4^ | A8 | A12 | B4^ | B8 | B12 | C4^ | C8 | C12 | D4^ | D8 | D12 |
| A13IN | A5^ | A1 | A13 | B5^ | B1 | B13 | C5^ | C1 | C13 | D5^ | D1 | D13 |
| A14IN | A6^ | A2 | A14 | B6^ | B2 | B14 | C6^ | C2 | C14 | D6^ | D2 | D14 |
| A15IN | A7^ | A3 | A15 | B7^ | B3 | B15 | C7^ | C3 | C15 | D7^ | D3 | D15 |
| A16IN | A8^ | A4 | A16 | B8^ | B4 | B16 | C8^ | C4 | C16 | D8^ | D4 | D16 |
| A17IN | I1 | | | | | | | | | | | |
| A18IN | I2 | | | | | | | | | | | |
| A19IN | A1^ | A2 | A10 | I3 | | | | | | | | |
| A20IN | A2^ | A4 | A12 | I4 | | | | | | | | |
| A21IN | A3^ | A6 | A14 | I5 | | | | | | | | |
| A22IN | A4^ | A8 | A16 | I6 | | | | | | | | |

FIG. 20A

| Programmable Logic Block Input Line | Switch Matrix Multiplexer Input Line | | | | | | | | | | |
|---|---|---|---|---|---|---|---|---|---|---|---|
| B1IN | A1^ | A5 | A9 | B1^ | B5 | B9 | C1^ | C5 | C9 | D1^ | D5 | D9 |
| B2IN | A2^ | A6 | A10 | B2^ | B6 | B10 | C2^ | C6 | C10 | D2^ | D6 | D10 |
| B3IN | A3^ | A7 | A11 | B3^ | B7 | B11 | C3^ | C7 | C11 | D3^ | D7 | D11 |
| B4IN | A4^ | A8 | A12 | B4^ | B8 | B12 | C4^ | C8 | C12 | D4^ | D8 | D12 |
| B5IN | A5^ | A1 | A13 | B5^ | B1 | B13 | C5^ | C1 | C13 | D5^ | D1 | D13 |
| B6IN | A6^ | A2 | A14 | B6^ | B2 | B14 | C6^ | C2 | C14 | D6^ | D2 | D14 |
| B7IN | A7^ | A3 | A15 | B7^ | B3 | B15 | C7^ | C3 | C15 | D7^ | D3 | D15 |
| B8IN | A8^ | A4 | A16 | B8^ | B4 | B16 | C8^ | C4 | C16 | D8^ | D4 | D16 |
| B9IN | A1^ | A5 | A9 | B1^ | B5 | B9 | C1^ | C5 | C9 | D1^ | D5 | D9 |
| B10IN | A2^ | A6 | A10 | B2^ | B6 | B10 | C2^ | C6 | C10 | D2^ | D6 | D10 |
| B11IN | A3^ | A7 | A11 | B3^ | B7 | B11 | C3^ | C7 | C11 | D3^ | D7 | D11 |
| B12IN | A4^ | A8 | A12 | B4^ | B8 | B12 | C4^ | C8 | C12 | D4^ | D8 | D12 |
| B13IN | A5^ | A1 | A13 | B5^ | B1 | B13 | C5^ | C1 | C13 | D5^ | D1 | D13 |
| B14IN | A6^ | A2 | A14 | B6^ | B2 | B14 | C6^ | C2 | C14 | D6^ | D2 | D14 |
| B15IN | A7^ | A3 | A15 | B7^ | B3 | B15 | C7^ | C3 | C15 | D7^ | D3 | D15 |
| B16IN | A8^ | A4 | A16 | B8^ | B4 | B16 | C8^ | C4 | C16 | D8^ | D4 | D16 |
| B17IN | I1 | | | | | | | | | | |
| B18IN | I2 | | | | | | | | | | |
| B19IN | B1^ | B2 | B10 | I3 | | | | | | | |
| B20IN | B2^ | B4 | B12 | I4 | | | | | | | |
| B21IN | B3^ | B6 | B14 | I5 | | | | | | | |
| B22IN | B4^ | B8 | B16 | I6 | | | | | | | |

FIG. 20B

| Programmable Logic Block Input Line | Switch Matrix Multiplexer Input Line | | | | | | | | | | |
|---|---|---|---|---|---|---|---|---|---|---|---|
| C1IN  | A1^ | A5 | A9  | B1^ | B5 | B9  | C1^ | C5 | C9  | D1^ | D5 | D9  |
| C2IN  | A2^ | A6 | A10 | B2^ | B6 | B10 | C2^ | C6 | C10 | D2^ | D6 | D10 |
| C3IN  | A3^ | A7 | A11 | B3^ | B7 | B11 | C3^ | C7 | C11 | D3^ | D7 | D11 |
| C4IN  | A4^ | A8 | A12 | B4^ | B8 | B12 | C4^ | C8 | C12 | D4^ | D8 | D12 |
| C5IN  | A5^ | A1 | A13 | B5^ | B1 | B13 | C5^ | C1 | C13 | D5^ | D1 | D13 |
| C6IN  | A6^ | A2 | A14 | B6^ | B2 | B14 | C6^ | C2 | C14 | D6^ | D2 | D14 |
| C7IN  | A7^ | A3 | A15 | B7^ | B3 | B15 | C7^ | C3 | C15 | D7^ | D3 | D15 |
| C8IN  | A8^ | A4 | A16 | B8^ | B4 | B16 | C8^ | C4 | C16 | D8^ | D4 | D16 |
| C9IN  | A1^ | A5 | A9  | B1^ | B5 | B9  | C1^ | C5 | C9  | D1^ | D5 | D9  |
| C10IN | A2^ | A6 | A10 | B2^ | B6 | B10 | C2^ | C6 | C10 | D2^ | D6 | D10 |
| C11IN | A3^ | A7 | A11 | B3^ | B7 | B11 | C3^ | C7 | C11 | D3^ | D7 | D11 |
| C12IN | A4^ | A8 | A12 | B4^ | B8 | B12 | C4^ | C8 | C12 | D4^ | D8 | D12 |
| C13IN | A5^ | A1 | A13 | B5^ | B1 | B13 | C5^ | C1 | C13 | D5^ | D1 | D13 |
| C14IN | A6^ | A2 | A14 | B6^ | B2 | B14 | C6^ | C2 | C14 | D6^ | D2 | D14 |
| C15IN | A7^ | A3 | A15 | B7^ | B3 | B15 | C7^ | C3 | C15 | D7^ | D3 | D15 |
| C16IN | A8^ | A4 | A16 | B8^ | B4 | B16 | C8^ | C4 | C16 | D8^ | D4 | D16 |
| C17IN | I1  |    |     |     |    |     |     |    |     |     |    |     |
| C18IN | I2  |    |     |     |    |     |     |    |     |     |    |     |
| C19IN | C1^ | C2 | C10 | I3  |    |     |     |    |     |     |    |     |
| C20IN | C2^ | C4 | C12 | I4  |    |     |     |    |     |     |    |     |
| C21IN | C3^ | C6 | C14 | I5  |    |     |     |    |     |     |    |     |
| A22IN | C4^ | C8 | C16 | I6  |    |     |     |    |     |     |    |     |

FIG. 20C

| Programmable Logic Block Input Line | Switch Matrix Multiplexer Input Line | | | | | | | | | | |
|---|---|---|---|---|---|---|---|---|---|---|---|
| D1IN  | A1^ | A5 | A9  | B1^ | B5 | B9  | C1^ | C5 | C9  | D1^ | D5 | D9  |
| D2IN  | A2^ | A6 | A10 | B2^ | B6 | B10 | C2^ | C6 | C10 | D2^ | D6 | D10 |
| D3IN  | A3^ | A7 | A11 | B3^ | B7 | B11 | C3^ | C7 | C11 | D3^ | D7 | D11 |
| D4IN  | A4^ | A8 | A12 | B4^ | B8 | B12 | C4^ | C8 | C12 | D4^ | D8 | D12 |
| D5IN  | A5^ | A1 | A13 | B5^ | B1 | B13 | C5^ | C1 | C13 | D5^ | D1 | D13 |
| D6IN  | A6^ | A2 | A14 | B6^ | B2 | B14 | C6^ | C2 | C14 | D6^ | D2 | D14 |
| D7IN  | A7^ | A3 | A15 | B7^ | B3 | B15 | C7^ | C3 | C15 | D7^ | D3 | D15 |
| D8IN  | A8^ | A4 | A16 | B8^ | B4 | B16 | C8^ | C4 | C16 | D8^ | D4 | D16 |
| D9IN  | A1^ | A5 | A9  | B1^ | B5 | B9  | C1^ | C5 | C9  | D1^ | D5 | D9  |
| D10IN | A2^ | A6 | A10 | B2^ | B6 | B10 | C2^ | C6 | C10 | D2^ | D6 | D10 |
| D11IN | A3^ | A7 | A11 | B3^ | B7 | B11 | C3^ | C7 | C11 | D3^ | D7 | D11 |
| D12IN | A4^ | A8 | A12 | B4^ | B8 | B12 | C4^ | C8 | C12 | D4^ | D8 | D12 |
| D13IN | A5^ | A1 | A13 | B5^ | B1 | B13 | C5^ | C1 | C13 | D5^ | D1 | D13 |
| D14IN | A6^ | A2 | A14 | B6^ | B2 | B14 | C6^ | C2 | C14 | D6^ | D2 | D14 |
| D15IN | A7^ | A3 | A15 | B7^ | B3 | B15 | C7^ | C3 | C15 | D7^ | D3 | D15 |
| D16IN | A8^ | A4 | A16 | B8^ | B4 | B16 | C8^ | C4 | C16 | D8^ | D4 | D16 |
| D17IN | I1 | | | | | | | | | | | |
| D18IN | I2 | | | | | | | | | | | |
| D19IN | D1^ | D2 | D10 | I3 | | | | | | | | |
| D20IN | D2^ | D4 | D12 | I4 | | | | | | | | |
| D21IN | D3^ | D6 | D14 | I5 | | | | | | | | |
| D22IN | D4^ | D8 | D16 | I6 | | | | | | | | |

FIG. 20D

Copyright 1990 Advanced Micro Devices, All rights reserved

```
? BLNK.LN  0 %1 %2
? PRT.NF  -3 Part type not found: / %1 Last= %2

? RD.TRE   0 Reading User Design...
? RD.PDB   0 Reading Device Database...
? RSRC.OK  0 MR-PLD Resource Checks OK!
? DO.FIT   0 On to Fitting...
? DO.PART  0 Partitioning Design into Blocks...
? DO.MAP   0 Assigning Resources...

? IOM.CNT-1 Too many IO macros in user design! [u: %1, a: %2]
? LF.CNT  -1 Too many logic functions in user design! [u: %1, a:
                                                                 %2]
? PIN.CNT-1 Too many pins in user design! [u: %1, a: %2]
? PT.CNT  -1 Too many PT's in user design! [u: %1, a: %2]
? CLK.CNT-1 Too many Clks in user design! [u: %1, a: %2]

? UN.PLC  -1 Partitioning could not place all signals into blks!
? NO.CNCT-1 Connection problem - SwMtrx filled here!
? PT.SHR  -1 PT distribution - No feasible solution!
? NO.MAP  -1 Mapping difficulty - No feasible solution! %1

? ABORT    0 MR-PLD Fitting Program Aborted - e: %1, w: %2
? INT.ERR-1 Internal error: Call 1-800-PALS-R-US - %1 %2
? SUCCES   0 Fitting   Successful - %1 %% Time *: %2 seconds.
? FAILED   0 Fitting Unsuccessful - %1 %% Time *: %2 seconds.

? CLK.MSG  1 No clock signal found for registered signal - %1
? REG.MSG  1 Clock signal found, but no logic function - %1
? TRS.MSG  1 Three state enable found, but no logic function - %1

? SRN.MSG  1 No SR initialization function found!
```

Fig. 21A

Copyright 1990 Advanced Micro Devices, All rights reserved

; New Mid-Range - Device Type Data 11/16/89

; TwinPAL 22T32 6504
; <Partname> <Tk#> <#Pin> <#Blk> <#SgPn> <#IOM> <#TM> <#PT>
@ MAP6032 221 44 2 22 38 32 32 128
@ MAP6032 221 44 2 22 38 32 32 128 ←── H1
; <Debug> <NU> * <Eq> <Pm> <PT> <In> {Cfgn Vars}
* 2 00 * 0 0 6 0 * ←── DBG1

```
; G 01 01 37 10 1 0 C * G 02 23 35 28 0 0 C *
# A 01 02 33 10 1 0 C B 01 24 39 28 0 0 C *
# A 02 03 29 10 1 0 C B 02 25 43 28 0 0 C *
# A 03 04 25 10 1 0 C B 03 26 47 28 0 0 C *  ←── Pin 1
# A 04 05 21 10 1 0 C B 04 27 51 28 0 0 C *
# A 05 06 17 10 1 0 C B 05 28 55 28 0 0 C *
# A 06 07 09 14 1 1 C B 06 29 62 24 0 1 C *
# A 07 08 09 15 1 1 C B 07 30 62 23 0 1 C *
# A 08 09 09 16 1 1 C B 08 31 62 22 0 1 C *
# I 01 10 09 17 1 1 A I 03 32 62 21 0 1 A *
# I 02 11 09 18 1 1 A I 04 33 62 20 0 1 A *
; G 01 12 09 19 1 1 C * G 03 34 62 19 0 1 C *
# I 05 13 09 20 1 1 B I 06 35 62 18 0 1 B *
# A 09 14 09 21 1 1 C B 09 36 62 17 0 1 C *
# A 10 15 09 22 1 1 C B 10 37 62 16 0 1 C *
# A 11 16 09 23 1 1 C B 11 38 62 15 0 1 C *
# A 12 17 09 24 1 1 C B 12 39 62 14 0 1 C *
# A 13 18 15 28 0 0 C B 13 40 57 10 1 0 C *
# A 14 19 19 28 0 0 C B 14 41 53 10 1 0 C *
# A 15 20 23 28 0 0 C B 15 42 49 10 1 0 C *
# A 16 21 27 28 0 0 C B 16 43 45 10 1 0 C *
; P 02 22 31 28 0 0 C * P 04 44 41 10 1 0 C *
```

Fig. 21B

Copyright 1990 Advanced Micro Devices, All rights reserved

```
; Switch Matrix for Cell A
;   % <Sink> {<Srcs>...} * <.h> <.v> <F1> <F2> {IL #F FB} *
% A 01 A^ 01 A 09 B^ 01 B 09 * 24 02 1 1 00 2 00 *
% A 02 A^ 02 A 10 B^ 02 B 10 * 24 03 1 1 02 2 02 *         SWM1
% A 03 A^ 03 A 11 B^ 03 B 11 * 24 04 1 1 04 2 04 *
% A 04 A^ 04 A 12 B^ 04 B 12 * 24 05 1 1 06 2 06 *
% A 05 A^ 05 A 13 B^ 05 B 13 * 24 06 1 1 08 2 08 *
% A 06 A^ 06 A 14 B^ 06 B 14 * 24 07 1 1 10 2 10 *
% A 07 A^ 07 A 15 B^ 07 B 15 * 24 08 1 1 12 2 12 *
% A 08 A^ 08 A 16 B^ 08 B 16 * 24 09 1 1 14 2 14 *
% A 09 A^ 09 A 01 B^ 09 B 01 * 24 10 1 1 16 2 16 *
% A 10 A^ 10 A 02 B^ 10 B 02 * 24 11 1 1 18 2 18 *
% A 11 A^ 11 A 03 B^ 11 B 03 * 24 12 1 1 20 2 20 *
% A 12 A^ 12 A 04 B^ 12 B 04 * 36 12 0 1 22 2 22 *
% A 13 A^ 13 A 05 B^ 13 B 05 * 36 11 0 1 24 2 24 *
% A 14 A^ 14 A 06 B^ 14 B 06 * 36 10 0 1 26 2 26 *
% A 15 A^ 15 A 07 B^ 15 B 07 * 36 09 0 1 28 2 28 *
% A 16 A^ 16 A 08 B^ 16 B 08 * 36 08 0 1 30 2 30 *
% A 17 I 03 A 01 A 04 A^ 08 A^ 11 * 36 07 0 1 32 3 32 *
% A 18 I 04 A 03 A 06 A^ 10 A^ 13 * 36 06 0 1 34 3 35 *
% A 19 I 05 A 05 A 08 A^ 12 A^ 15 * 36 05 0 1 36 3 38 *
% A 20 I 06 A 07 A 10 A^ 14 A^ 01 * 36 04 0 1 38 3 41 *
% A 21 I 01 * 36 03 0 1 40 0 00 *
% A 22 I 02 * 36 02 0 1 42 0 00 *

; Fanout List for Block A
; > <Src> {<Sinks>...} * <.h> <.v> {<PToe> <PTlm> <PT#> <d1..d4>
F# FB} *
; A0 is dummy Set & Reset macro for block
> A 00 * 00 00 02 67 0 99 99 99 99 0 070 *
> A 01 * 29 02 00 03 4 99 99 01 02 8 000 *
> A 02 * 29 03 00 07 4 99 01 02 03 8 008 *
> A 03 * 29 04 00 11 4 99 02 03 04 8 016 *
> A 04 * 29 05 00 15 4 99 03 04 05 8 024 *
> A 05 * 29 06 00 19 4 99 04 05 06 8 032 *
> A 06 * 29 07 00 23 4 99 05 06 07 8 040 *
> A 07 * 29 08 00 27 4 99 06 07 08 8 048 *
> A 08 * 29 09 00 31 4 99 07 08 99 8 056 *
> A 09 * 29 10 68 35 4 99 99 09 10 8 064 *
> A 10 * 29 11 68 39 4 99 09 10 11 8 072 *
> A 11 * 29 12 68 43 4 99 10 11 12 8 080 *
> A 12 * 32 12 68 47 4 99 11 12 13 8 088 *
> A 13 * 32 11 68 51 4 99 12 13 14 8 096 *
> A 14 * 32 10 68 55 4 99 13 14 15 8 104 *
> A 15 * 32 09 68 59 4 99 14 15 16 8 112 *
> A 16 * 32 08 68 63 4 99 15 16 99 8 120 *
```

Figure 21C

Copyright 1990 Advanced Micro Devices, All rights reserved

```
; Switch Matrix for Cell B
% B 01 * 58 02 1 1 * B 12 * 70 12 0 1 *
% B 02 * 58 03 1 1 * B 13 * 70 11 0 1 *
% B 03 * 58 04 1 1 * B 14 * 70 10 0 1 *
% B 04 * 58 05 1 1 * B 15 * 70 09 0 1 *
% B 05 * 58 06 1 1 * B 16 * 70 08 0 1 *
% B 06 * 58 07 1 1 * B 17 * 70 07 0 1 *
% B 07 * 58 08 1 1 * B 18 * 70 06 0 1 *
% B 08 * 58 09 1 1 * B 19 * 70 05 0 1 *
% B 09 * 58 10 1 1 * B 20 * 70 04 0 1 *
% B 10 * 58 11 1 1 * B 21 * 70 03 0 1 *
% B 11 * 58 12 1 1 * B 22 * 70 02 0 1 *

; Fanout list block B
> B 00 * 00 00 0 0 *
> B 01 * 63 02 0 0 * B 09 * 63 10 0 0 *
> B 02 * 63 03 0 0 * B 10 * 63 11 0 0 *
> B 03 * 63 04 0 0 * B 11 * 63 12 0 0 *
> B 04 * 63 05 0 0 * B 12 * 66 12 0 0 *
> B 05 * 63 06 0 0 * B 13 * 66 11 0 0 *
> B 06 * 63 07 0 0 * B 14 * 66 10 0 0 *
> B 07 * 63 08 0 0 * B 15 * 66 09 0 0 *
> B 08 * 63 09 0 0 * B 16 * 66 08 0 0 *

; Fanout List for INPUT Block
< I 1 * 9 2 1 1 * I 4 * 9 5 1 1 *
< I 2 * 9 3 1 1 * I 5 * 9 7 1 1 *
< I 3 * 9 4 1 1 * I 6 * 9 8 1 1 *
```

Fig. 21D

Copyright 1990 Advanced Micro Devices, All rights reserved

```
;   Str's
;   [<typ> <UR.h> <UR.v> <f1> <f2> <dstr>...] *
;   <f1> Justification: 0=front, 1=end
;   <f2> Orientation:   0=vert,  1=horiz
;   <dstr> String

[ 3  1 10   0 1 K: *
[ 3  4 10   0 1 @`?``O/PP *
[ 3  4 11   0 1 .`*``BReg *
[ 3  4 12   0 1 -`+``IOM *
[ 3  4 13   0 1 ~`:``Inp *
[ 3  4 14   0 1 !`/``BR+I *

[ 3  8   1 1 1 Gbl`Inp   3  7   6 1 1 Clk/Inp *
[ 3 21   1 1 1 I/O       3 39   1 0 1 I/O * Blk A
[ 3 55   1 1 1 I/O       3 73   1 0 1 I/O * Blk B
[ 3 30 1 0 0 A    3 64  1 0 0 B * Blk Labels
[ 3 29 13 0 0 u   3 32 13 0 0 u   3 63 13 0 0 u   3 66 13 0 0 u *
[ 3 27  1 0 0 +   3 33  1 0 0 +   3 61  1 0 0 +   3 67  1 0 0 + *
[ 3 27 13 0 0 +   3 33 13 0 0 +   3 61 13 0 0 +   3 67 13 0 0 + *

;   Sqr's
;   [<typ> <UR.h> <UR.v> <LL.h> <LL.v>...] *
[ 1 10  1   13  9    1 10   6 13  9 * Inputs
[ 1 24  1   36 13    1 27   1 33 13 * Blk A
[ 1 58  1   70 13    1 61   1 67 13 * Blk B ;   Num's
;   [<typ> <UR.h> <UR.v> <f1> <f2> <d1> <d2>...] *
;   <f1> Justification: 0=front, 1=end
;   <f2> Orientation:   0=vert,  1=horiz
;   <d1> start, <d2> end Number

[ 2 11  2 0 0  1   4    2 11  7 0 0  5  6 * Inputs
[ 2 25  2 0 0  1  11    2 34 12 1 0 12 22 * Blk A
[ 2 59  2 0 0  1  11    2 68 12 1 0 12 22 * Blk B ] 1 10   11 61 27 * Package Outline ] 2 11 14 0 0   7 17    2 59 24 1 0 29 39 * Pin Numbers
] 2 15 25 0 4 18 28  *
] 2 37 12 1 4  1  6    2 57  12 1 4 40 44 *

] 3 37 11 0 0 o * Pin 1 Index
] 3 33 14 0 0 `Gnd`     3 37 14 0 0 `Vcc` * { 1,44}
] 3 09 19 1 1 `Gnd`     3 62 19 0 1 `Gnd` * {12,34}
] 3 31 24 1 0 `Vcc`     3 35 24 1 0 `Gnd` * {22,23}

$ "end of File"
```

Fig. 21E

Copyright 1990 Advanced Micro Devices, All rights reserved

```
   sym_ary = packed record
       prv_ptr : sym_arp;    {for symbol table linking}
       nxt_ptr : sym_arp;
       loc     : integer;    {next open space}
       sym     : array [0..tot_sym] of sym_rec;
     end;

chr_ary = packed record
       nxt_ptr : chr_ptr;    {for storage blk linking}
       prv_ptr : chr_ptr;
       loc     : integer;    {next open space}
       chr     : str255;
     end;

{ ************************* }
   {symbol table types}
{ ************************* } sym_rec = packed record
       nxt_ptr : sym_ptr;       {for symbol table Hash linking}
       equ_ptr : equ_ptr;       {for mult equ linking}
       loc_ptr : stringptr;     {actual text of sym}
       use_lnk : use_ptr;       {equ(s) where used} sym_num : integer;       {gbl seq #}
       idf_val : integer;       {Pin/Node, seq #}
       sig_val : integer;       {Equ index into Sig_ary}
       len_val : integer;       {of string, in bytes+1}
       loc_val : Longint;       {chr blk where stored}
       Use_vec : integer;          {Boolean Vector - Blks where used}

Use_Loc : array [1..max_blk] of SignedByte;
       typ_val : SignedByte;    {Inp, IOM, internal, clk, etc}
       inp_fnc : SignedByte;    {Direct, Lat, Reg}
       out_fnc : SignedByte;    {Comb, Dff, Tff, Lat}
       Blk     : SignedByte;
       Loc     : SignedByte;
       log_flg : boolean;       {Active L/H}
     end;
```

Fig. 24

Copyright 1990 Advanced Micro Devices, All rights reserved

```
   sig_ary = array [1..max_sig] of equ_rec;
   equ_ary = packed record
         prv_ptr : equ_arp;   {for storage linking}
         nxt_ptr : equ_arp;
         loc     : integer;   {next open space}
         equ     : array [0..tot_eqa] of byte;
       end;

equ_rec =   packed record
       nxt_ptr : equ_ptr;   {for mult equ linking - R,S,Trst,Clk}

Adj_sig : equ_ptr;   {in phys module}
       sym_ptr : sym_ptr;   {Link to Symbol} len_val : integer;   {of equ, in bytes+1}
       loc_val : Longint;   {chr blk where stored}
       loc_equ : equ_arp;

typ_val : integer;
       trs_val : integer;
       simary: array [0..max_sim] of cmn_rec;
       scan:   SignedByte; {Temp var for Crystal}
       simcnt: SignedByte;

Sig_val:Byte;
       IOS_val:SignedByte;  {Resources used}
       PTS_val:SignedByte;

logic:  binvec;
     end;

cmn_rec =   packed record
       sig:    SignedByte;
       cmn:    SignedByte;
     end;
```

Fig. 26

Copyright 1990 Advanced Micro Devices, All rights reserved

```
All_PDB = packed record     {Header of resource}
     smx:    SMX_ary;
     Fan:    Fan_ary;
     Pin:    Pin_ary;
     P2B:    P2B_ary;
   end;
fys_rec = packed record
     sigs:   equ_ptr;
     psbl, locl, used:  binvec;
     PTa:    array [1..mxa_eqb] of SignedByte;

SizVl,FanCnt:   Integer;
     PT_lim, IN_Lim, EQ_lim, PM_lim,
     FulCnt, IOMCnt, BurCnt,
     SigCnt, OrdVal:         SignedByte;
     nxt_pin,        Blk:    SignedByte;
   end;

SMX_ary = array [0..max_blk,0..mxa_eqb] of RHdr_rec;
Fan_ary = array [0..max_blk,0..mxa_eqb] of RHdr_rec;

rsrc_rec = packed record    {resource element}
    Blk : SignedByte;
    Loc : SignedByte;
  end;

Rsrc = packed record
    a:array [1..max_rsrc] of rsrc_rec;
  end;

RHdr_rec = packed record    {Header of resource}
    PTs:       SignedByte;
    PTc:       array [0..3] of SignedByte;
    Sw_Pos:    SignedByte;
    Sig_Val:   SignedByte;
    Typ_Val:   SignedByte;
    IRCnt:     SignedByte;
    IRsrc:     rsrc_ptr;
    ILine:     SignedByte;
    NFuse:     SignedByte;
    FsBas:     Integer;
    case integer of
       0: (sqr:   sqr_rec);
       1: (num:   num_rec);
       2: (str:   str_rec);
    end;
```

Fig. 28

Copyright 1990 Advanced Micro Devices, All rights reserved

```
Pin_ary  =   array [0..max_blk,0..mxa_eqb] of Pind_rec;
P2B_ary  =   array [0..max_p2b] of Pin_rec;

Pin_rec = packed record      {Header of resource}
    Blk:     SignedByte;
    Loc:     SignedByte;
  end;

Pind_rec = packed record     {Header of resource}
    Pin_No:   SignedByte;
    Pin_typ:  SignedByte;
    Sig_Val:  SignedByte;
    Typ_Val:  SignedByte;

case integer of
        0:  (sqr:   sqr_rec);
        1:  (num:   num_rec);
        2:  (str:   str_rec);
      end;

pt_rec = packed record
    sig, srt: integer;
    fuse: array [1..3] of integer;
  end;
fuse_rec = packed record
    pta: array [0..280] of pt_rec;
    ASF: array [0..59] of integer;
  end;
```

Fig. 31

Copyright 1990 Advanced Micro Devices, All rights reserved

```
{*************************}
 {Crystal & Hungarian Asgn}
{*************************}

HAA = array [1..max_HAL] of HA_Lnk;
    MPA = array [1..max_HAL, 1..max_HAL] of integer;

HA_Lnk =    packed record
        covr,   whoc: integer;
        left,   rght: integer;
        frml:         integer;
        head,   Lcnt: integer;
        tail:   array [1..max_HAL] of integer;
      end;

PTA =  array [1..max_HAL] of PTA_rec;
    PTA_rec = packed record
        SPM, SLM, PTU:   integer;
        Sig, PTA:        integer;
        LBk, Mac, Fan:   integer;
        Sym:             sym_ptr;
      end;
```

Fig. 32

Copyright 1990 Advanced Micro Devices, All rights reserved

```
{**************************}
{Absolute Maximum size limits - Dimensioning of Data Storage} max_blk =    8;   { number of physical blocks/Mx16}
   mxa_eqb =   25;   { number of logic equ/block      }
   max_sig =   96;   { number of signals in design    }
   mxa_sig =    3;   { max_sig div 32                 }
   max_sim =    6;   { number kept for simularity     }
   max_HAL =   50;   { number of Hungarian Assign ele}
   max_p2b =   44;   { physical package pins}
{**************************}
   num_bkt =   32;   {in symbol table - power of 2 <= 256}
   tot_sym =   64;   {blk size power of 2}
   tot_eqa =1024;   {equ array dimension}
   stk_max =  300;   {Length of OP Stack for Rd Tre}
   max_use =    6;   {length of use list buffer}
   max_rsrc=   25;   {length of resource buffer}
  gph_v =  50;   gph_h = 119;    {chr buffer for log & pin maps}

{Enumerated types -> (Spelled out for debug printing ->
Type
   Sym_Typ = (input, output, IOMac, Lintv, Gintv, clkpin, SR_nod);
   Inp_Typ = (ifn_Dir, ifn_Lat, ifn_Reg);
   Out_typ = (ofn_Cmb, ofn_Dff, ofn_Tff, ofn_Lat);
   Pin_Typ = (input, clk, output);{}

Const
   input   =   1;   output  = 2;       IOMac   = 3;
   Lintv   =   4;   Gintv   = 5;       clkpin  = 6;      SR_nod=7;

ifn_Dir =   1;  ifn_Lat =   2;  ifn_Reg =    3;
   ofn_Cmb =   1;  ofn_Dff =   2;  ofn_Tff =    3; ofn_Lat =    4;
```

Fig. 33A

Copyright 1990 Advanced Micro Devices, All rights reserved

```
{*************************}

{Symbolic magic Numbers}
  nvald =  -99;    {token}
  nused =  -98;    {Pin}
  nset  =  -97;    {graph link}
  Ques  =  -96;    {Relocatable Pin or Node}
  nfeas =  121;    {infeasible pair match - hungarian assign - Do
Not Change}

{ ****************************************** }

{Palasm tre file constants}
  {Internal replacements}
  tk_and =255;    tk_or  =254;    tk_xor= 253;
  tk_not =252;    tk_nop =251;
  tk_vcc =250;    tk_gnd =249;

tk_comb=248;    tk_reg =247;
  tk_tff =246;    tk_lat =245;
  tk_trst=244;    tk_clkf=243;
  tk_setf=242;    tk_rstf=241;    tk_end = 240;

{ ****************************************** }
type stk_cell =  integer;
  binvec = array [1..mxa_sig] of longint;

{ ****************************************** }

{All Pointer Types Here!}
  sym_ptr =    ^sym_rec;    sym_arp =    ^sym_ary;
  equ_ptr =    ^equ_rec;    equ_arp =    ^equ_ary;
  chr_ptr =    ^chr_ary;    sig_arp =    ^sig_ary;

gph_ptr =    ^gph_lst;
  bv_ptr  =    ^binvec;     use_ptr =    ^use_rec;
  MPA_Ptr =    ^MPA;        HA_Ptr  =    ^HAA;

SMX_ptr = ^SMX_ary;    Fan_ptr =    ^Fan_ary;
  Pin_ptr = ^Pin_ary;    PTA_ptr =    ^PTA;
  rsrc_ptr = ^rsrc;      RHdr_Ptr =   ^RHdr_rec;
  P2b_Ptr = ^P2b_ary;
  Fuse_ptr = ^Fuse_rec;  PT_ptr  =    ^PT_rec;
```

Fig. 33B

Copyright 1990 Advanced Micro Devices, All rights reserved

```
{ ****************************** }
        { Doc Gen - Pin/Log Map}
{ ****************************** }
    GphPnt = record
         h,v:           Integer;    {must be in this order!}
       end;

sqr_rec = packed record
         UR, LL:        GphPnt;
       end;

num_rec = packed record
         ur:            GphPnt;
         f1, f2:        Integer;
         d1, d2:        Integer;
       end;

str_rec = packed record
         ur:            GphPnt;
         f1, f2:        Integer;
         dstr:          string[9]; {Max Length for labels!}
       end;

{***********************}
    gph_lst = packed record
         nxt_ptr:       gph_ptr;
         typ_val:       SignedByte;
         case integer of
             0:  (sqr:   sqr_rec);
             1:  (num:   num_rec);
             2:  (str:   str_rec);
           end;
```

Fig. 33C

Copyright 1990 Advanced Micro Devices, All rights reserved

```
    use_rec = packed record
        cnt:        byte;
        equ_ary:    array [1..max_use] of byte;
        nxt_ptr:    use_ptr;
      end;

var

{ ****************************** }
    {General}
    done:       boolean;
    suces:      boolean;
    debug:      integer;
    ErrCnt, WrnCnt: integer;

{Files}
    inp_nam, out_nam:   str255;
    Inp_Fil, PDB_Fil, PLC_Fil, Out_Fil:    text;

{Tokenize}
    a_ptr, b_ptr   : stringptr;
    a_str, b_str   : str255;
    post, lent, valt: integer;
    before: integer;              {Program timing}
    Pos_v,Pos_h:    integer;      {Extreme plot position}

{**********************}
    {User Design info}
    Part,Dsgn:      str255;
    Prt_Tkn:        INTEGER;
    HdrStr:         Array [0..5] of Str255;
    N_Blk, N_Macro,
    N_Pin,max_pin:  integer;
    sigary:         Sig_arp;

{Physical Data}
    fysary:     array      [0..max_blk] of fys_rec; {}
    Swmtrx:     SMX_ptr;   Fanout:     Fan_ptr;
    Pinfo:      Pin_ptr;   P2b:        P2b_Ptr;
    a_hptr:     RHdr_Ptr;  jedec:      fuse_ptr;

{Device specific sizes - actual terms avail}
    max_sgp:    integer;    { # signal pins/block   }
    max_eqb:    integer;    { # logic equ/block     }
    max_pmb:    integer;    { # pin macros/block    }
    max_ptb:    integer;    { # Product Terms/block }
    max_ptd:    integer;    { # Product Terms/block }
    CfgnVar:    RHdr_rec;   { Limit Deltas on above }
```

Fig. 33D

Copyright 1990 Advanced Micro Devices, All rights reserved

{ ************************************ }

```
    {Symbol Table}
    Frst_chr    : chr_ptr;      Last_chr    : chr_ptr;
    Frst_sym    : sym_arp;      Last_sym    : sym_arp;
    Frst_equ    : equ_arp;      Last_equ    : equ_arp;

Mru_chr     : chr_ptr;      scrt_chr    : chr_ptr;
    Mru_sym     : sym_ptr;      Mru_str     : stringptr;

ht_ary      : array [0..num_bkt] of sym_ptr;

{Usage Counters}
    nxt_str     : Longint;      nxt_sig     : integer;
    sym_idx     : integer;      equ_idx     : integer;

{************************}
    stk_ary:    array [0..stk_max] of stk_cell;
    stk_ptr:    integer;

myBuf:              array [1..gph_v] of String[gph_h];
    mapGph, PinGph,
    SigGph:             gph_ptr;

{************************}
{Crystal Partitioning }
    rslt:           extended;
    nxt_mod, max_cmn, 1st_cmn:      integer;
    All_used:       binvec;

{************************}
{Hungarian Assignment }
    mp_ary,     tmp_ary:    MPA_Ptr;
    n_row,      n_col,
    NRsav,      NCsav:      integer;
    TTmap,      SCmap:      integer;
    mtc_gfl:    HA_Ptr;
    PT_ary:     PTA_Ptr;
    dne:        boolean;

|   | V | W | X | Y | Z |
|---|---|---|---|---|---|
| A | 4 | 6 | 9 | 3 | 8 |
| B | 4 | 1 | 8 | 1 | 5 |
| C | 7 | 6 | 4 | 1 | 7 |
| D | 6 | 9 | 2 | 7 | 4 |
| E | 3 | 1 | 9 | 5 | 4 |

|   | V | W | X | Y | Z |
|---|---|---|---|---|---|
| A | 1 | 3 | 6 | 0 | 5 |
| B | 3 | 0 | 7 | 0 | 4 |
| C | 6 | 5 | 3 | 0 | 6 |
| D | 4 | 7 | 0 | 5 | 2 |
| E | 2 | 0 | 8 | 4 | 3 |

|   | V | W | X | Y | Z |
|---|---|---|---|---|---|
| A | 0 | 3 | 6 | 0 | 3 |
| B | 2 | 0 | 7 | 0 | 2 |
| C | 5 | 5 | 3 | 0 | 4 |
| D | 3 | 7 | 0 | 5 | 0 |
| E | 1 | 0 | 8 | 4 | 1 |

|   | V | W | X | Y | Z |
|---|---|---|---|---|---|
| A | (0) | 3 | 6 | 0 | 3 |
| B | 2 | (0) | 7 | 0 | 2 |
| C | 5 | 5 | 3 | (0) | 4 |
| D | 3 | 7 | 0 | 5 | (0) |
| E | 1 | 0 | 8 | 4 | 1 |

|   | V | W | X | Y | Z |
|---|---|---|---|---|---|
| A | ⓪ | 3 | 6 | ⓪ | 3 |
| B | 2 | 0 | 7 | ⓪ | 2 |
| C | 5 | 5 | 3 | 0 | 4 |
| D | 9 | 7 | ⓪ | 5 | ⓪ |
| E | ① | 0 | 8 | 4 | 1 |

FIG. 42F

|   | V | W | X | Y | Z |
|---|---|---|---|---|---|
| A | ⓪ | 4 | 6 | 1 | 3 |
| B | 1 | ⓪ | 6 | 0 | 1 |
| C | 4 | 5 | 2 | ⓪ | 3 |
| D | 3 | 8 | ⓪ | 6 | 0 |
| E | 0 | 0 | 7 | 4 | ⓪ |

FIG. 42G

|   | V | W | X | Y | Z |
|---|---|---|---|---|---|
| A | ④ | 6 | 9 | 3 | 8 |
| B | 4 | ① | 8 | 1 | 5 |
| C | 7 | 6 | 4 | ① | 7 |
| D | 6 | 9 | ② | 7 | 4 |
| E | 3 | 1 | 9 | 5 | ④ |

FIG. 42H

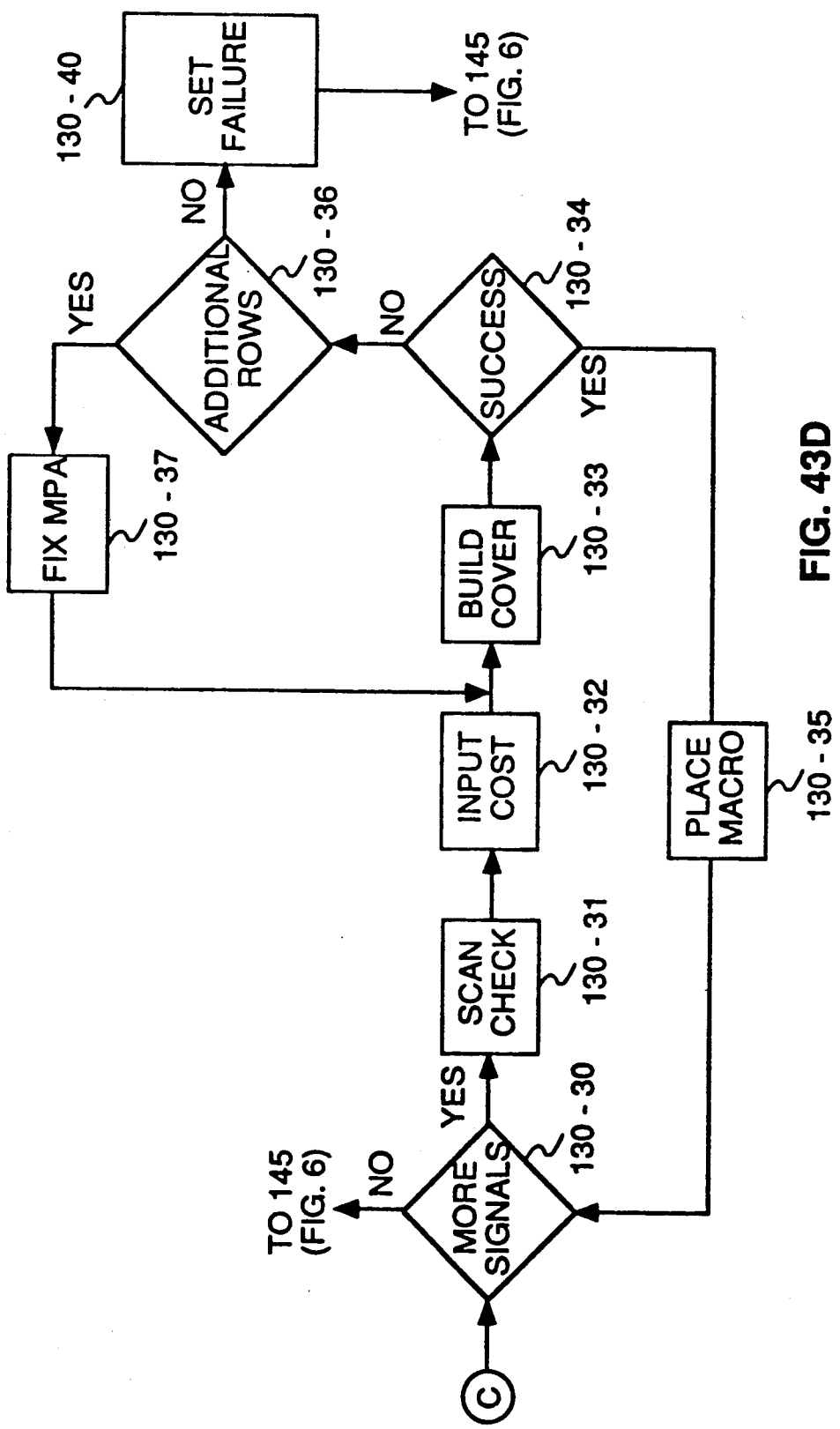

```
Reading User Design (PLA File)...
Reading Device Database ...
*** User Logic Pre-Placements

***   Device Resource Checks

Clocks - U:    1    A:    2    R:    1
  Pins - U:   17    A:   38    R:   21
IO_Mac - U:    9    A:   32    R:   23
Tot_Mc - U:    9    A:   32    R:   23
   PTs - U:   84    A:  128    R:   44
 Gates - U:  388    A:  874    ->   44%

MR-PLD Resource Checks OK!
On to Fitting...

Partitioning Design into Blocks...
Assigning Resources...

** Physical DB **

#I   Mr  #IO  #BR  PT#  FO#
blk-> A   12   12    4    0   28    8     Q0     Q1     Q2     Q3
blk-> B   16   11    5    0   56    4     Q4     CO     Q5     Q6     Q7

*** Mapping of Macros ***

Q1 (A   6) -> (A  14) (B  14)
        Q2 (A   4) -> (A  12) (B  12)
        Q3 (A   1) -> (A   9) (B   9)
        Q0 (A   7) -> (A  15) (B  15)

I1(I   5) -> (A  19) (B  19)
        I0(I   4) -> (A  18) (B  18)
        CI(I   3) -> (A  17) (B  17)
        A0(I   2) -> (A  22) (B  22)
        A1(I   1) -> (A  21) (B  21)

CO (B  13)
        Q5 (B  10) -> (B   2)
        Q6 (B   5) -> (B  13)
        Q7 (B   2) -> (B  10)
        Q4 (B   7) -> (B  20)

* Retry Mapping R=   2

```
*** Logic Map -

Gbl Inp .--.   I/O  .--+--A--+--.  I/O    I/O   .--+--B--+--.  I/O
        A1| 1|    /Q3 +| 1|  7  |22| A0            | 1|     |22| A0
        A0| 2|        | 2|     |21| A1    /Q7 -| 2|  11 |21| A1
        CI| 3|    A2 :| 3|     |20|       A2  :| 3|     |20| /Q4
        I0| 4|    /Q2 +| 4|  6  |19| I1            | 4|     |19| I1
   Clk/Inp |--|        | 5|     |18| I0    /Q6 -| 5|  10 |18| I0
        I1| 5|    /Q1 +| 6|  5  |17| CI            | 6|     |17| CI
       CLK| 6|    /Q0 +| 7|  4  |16: A3    /Q4 -| 7|   8 |16: A3
           '--'        | 8|     |15: /Q0           | 8|     |15: /Q0
   K: @ ?  O/PP   /Q3 :| 9|     |14: /Q1    /Q3 :| 9|     |14: /Q1
      . *  BReg        |10|     |13|       /Q5 -|10|  9  9|13@ /CO
      - +  IOM         |11|     |12: /Q2           |11|     |12: /Q2
      - :  Inp         '--+-u--u+--'               '--+-u--u+--'
```

Fig. 46

*** Pin Map

Connection Status 100 %    -   Run time *: 11 seconds.
The design map is stored in ===> count8.map.MAP %%CLK.MSG {w}->No clock signal found for registered signal-CLK
%%SRN.MSG {w}->No SR initialization function found!

The jedec is stored in    ===> count8.map.JED

%% FITR %% Program Completed - e: 0, w: 2
%% FITR %% File Processed Successfully.   - File: count8

```
*** Fdbk Map -

Gbl Inp  .--.   I/O    .--+--A--+--.   I/O   I/O   .--+--B--+--.   I/O
           | 1|                | 1|  |22| A0                | 1|  |22| A0
           | 2|                | 2|  |21| A1          /Q5 : | 2|  |21| A1
           | 3|    A2    :     | 3|  |20|             A2  : | 3|  |20| /Q4
           | 4|                | 4|  |19| I1                | 4|  |19| I1
  Clk/Inp  |--|                | 5|  |18| I0                | 5|  |18| I0
           | 5|                | 6|  |17| CI                | 6|  |17| CI
           | 6|                | 7|  |16: A3                | 7|  |16: A3
           |--|                | 8|  |15| /Q0               | 8|  |15| /Q0
  K: @ ?.  O/PP  /Q3   :       | 9|  |14| /Q1         /Q3 : | 9|  |14| /Q1
     . *   BReg                |10|  |13|             /Q7 :|10|  |13| /Q6
     - +   IOM                 |11|  |12| /Q2               |11|  |12| /Q2
     ~ :   Inp                '--+-u--u+--'                '--+-u--u+--'
```

Fig. 48

```
*** Signals - Where Generated & Used

Signal  S#   P#  Typ  PT  1s  B  M#  -Blk-              Fanout List
   CLK   1   35  ci.       I   6  AB  ->   Q7  Q6  Q5  Q4  Q3  Q2
                                   +  ->   Q1  Q0
    CO   2   40  p.d  9   9  B  13
    I1   3   13  ii.       I   5      AB  ->   Q7  Q6  Q5  Q4  Q3  Q2
                                   +  ->   Q1  Q0
    I0   4   33  ii.       I   4      AB  ->   Q7  Q6  Q5  Q4  Q3  Q2
                                   +  ->   Q1  Q0
    CI   5   32  ii.       I   3      AB  ->   CO  Q7  Q6  Q5  Q4  Q3
                                   +  ->   Q2  Q1  Q0
    A0   6   11  ii.       I   2      AB  ->   Q4  Q0
    A1   7   10  ii.       I   1      AB  ->   Q5  Q1
    A2   8    4  ii.       A   3      AB  ->   Q6  Q2
    A3   9   21  ii.       A  16      AB  ->   Q7  Q3
    Q7  10   25  pid 11  13  B   2       B  ->   CO  Q7
    Q6  11   28  pid 10  12  B   5       B  ->   CO  Q7  Q6
    Q5  12   37  pid  9  11  B  10       B  ->   CO  Q7  Q6  Q5
    Q4  13   30  pid  8  10  B   7       B  ->   CO  Q7  Q6  Q5  Q4
    Q3  14    2  pid  7   9  A   1      AB  ->   CO  Q7  Q6  Q5  Q4  Q3
    Q2  15    5  pid  6   8  A   4      AB  ->   CO  Q7  Q6  Q5  Q4  Q3
                                   +  ->   Q2
    Q1  16    7  pid  5   7  A   6      AB  ->   CO  Q7  Q6  Q5  Q4  Q3
                                   +  ->   Q2  Q1
    Q0  17    8  pid  4   6  A   7      AB  ->   CO  Q7  Q6  Q5  Q4  Q3
                                   +  ->   Q2  Q1  Q0
```

Fig. 49

```
count8
MACH110
count8
count8

^BMACH_110
count8*
QP44*
QF6504*
G0*F0*
L0084 11111111 11111111 11111111 11111111 11010111 1111*
L00B0 11111111 11111111 01111111 11011111 11111111 1111*
L00DC 11111111 11111111 11111111 11111111 11010111 1111*
L0108 11111111 11111111 01111111 11110111 11111111 1111*
L0134 11111111 11111111 11111111 11111110 11011011 1111*
L0160 11111111 11111111 01111111 11111111 11101011 1111*
L018C 11111111 11111111 11111111 11111111 11010111 1111*
L01B8 11111111 11111111 10111111 11111111 01111111 1111*
L01E4 11111011 11111111 11111111 11111111 11011011 1111*
L0210 11111111 11111111 11111111 11111111 11010111 1111*
L023C 11111111 11111111 11111101 11111111 10111111 1111*
L0268 11111111 11111111 11111111 11111111 11010111 1111*
L0294 11111111 11111111 11111101 11011111 11111111 1111*
L02C0 11111111 11111111 11111111 11111111 11010111 1111*
L02EC 11111111 11111111 11111101 11110111 11111111 1111*
L0318 11111111 11111111 11111101 11111111 11101011 1111*
L0344 11111111 11111111 11111111 11111111 11011011 1011*
L0370 11111111 11111111 11111111 11011111 11101011 1111*
L039C 11111111 11111111 11111111 11111111 11010111 1111*
L03C8 11111111 11111111 11111111 11011111 10111111 1111*
L03F4 11111111 11111111 11111111 11111111 11010111 1111*
L0420 11111111 11111111 11111111 11010111 11111111 1111*
L044C 11111111 11111111 11111111 11111111 11010111 1111*
L0478 11111111 11111111 11111111 11101011 01111111 1111*
L04A4 11111111 11111111 11111111 11111111 11010111 1111*
L04D0 11111111 11111111 11111111 11111011 01111111 1111*
L04FC 11111111 11111111 11111111 11111111 11010111 1111*
L0528 11111111 11111111 11111111 11110111 10111111 1111*
L0C8C 11111111 11111111 11111111 11111111 11010111 1111*
L0CB8 11111111 11111111 11011111 11111111 10111111 1111*
L0CE4 11111111 11111111 11111111 11111111 11010111 1111*
L0D10 11111111 11111111 11011111 01111111 11111111 1111*
L0D3C 11111111 11111111 11111111 11111111 11010111 1111*
L0D68 11011111 11111111 11011111 11111111 11111111 1111*
L0D94 11111111 11111111 11111111 11111111 11010111 1111*
L0DC0 11111111 11111111 11011111 11111111 11111101 1111*
```

Fig. 50A

```
L0DEC  11111111 11111111 11111111 11111111 11010111 1111*
L0E18  11111111 11111111 01011111 11111111 11111111 1111*
L0E44  11111111 11111111 11111111 11111111 11010111 1111*
L0E70  11111111 11111111 11011101 11111111 11111111 1111*
L0E9C  11111111 11111111 11111111 11111111 11010111 1111*
L0EC8  11111111 11111111 11111111 01111111 10111111 1111*
L0EF4  11111111 11111111 11111111 11111111 11010111 1111*
L0F20  11011111 11111111 11111111 01111111 11111111 1111*
L0F4C  11111111 11111111 11111111 11111111 11010111 1111*
L0F78  11111111 11111111 11111111 01111111 11111101 1111*
L0FA4  11111111 11111111 11111111 11111111 11010111 1111*
L0FD0  11111111 11111111 01111111 01111111 11111111 1111*
L0FFC  11111111 11111111 11111111 11111111 11010111 1111*
L1028  11111111 11111111 11111101 01111111 11111111 1111*
L1054  11111111 11111111 11111111 11111111 11010111 1111*
L1080  11111111 11111111 11111111 01011111 11111111 1111*
L10AC  11111111 11111111 11111111 11111111 11010111 1111*
L10D8  11111111 11111111 11111101 11111111 11111101 1111*
L1104  11111111 11111111 11111111 11111111 11010111 1111*
L1130  11111111 11111111 11111111 11011111 11111101 1111*
L115C  11111111 11111111 11111111 11111111 11010111 1111*
L1188  11111111 11111111 11111111 11110111 11111101 1111*
L11B4  11111111 11111111 11111111 11111111 11011011 1110*
L11E0  11111111 11111111 11111111 11111111 11101001 1111*
L120C  11111111 11111111 11111111 11111111 11010111 1111*
L1238  11011111 11111111 11111111 11111111 10111111 1111*
L1264  11111111 11111111 11111111 11111111 11010111 1111*
L1290  11011111 11111111 11111111 11111111 11111101 1111*
L12BC  11111111 11111111 11111111 11111111 11010111 1111*
L12E8  11011111 11111111 01111111 11111111 11111111 1111*
L1314  11111111 11111111 11111111 11111111 11010111 1111*
L1340  11011111 11111111 11111101 11111111 11111111 1111*
L136C  11111111 11111111 11111111 11111111 11010111 1111*
L1398  11011111 11111111 11111111 11011111 11111111 1111*
L13C4  11111111 11111111 11111111 11111111 11010111 1111*
L13F0  11011111 11111111 11111111 11110111 11111111 1111*
L141C  11111111 11111111 11011111 11111111 10111111 1111*
L1448  11111111 11111111 11111111 01111111 11111111 1111*
L1474  11011111 11111111 11111111 11111111 11111111 1111*
L14A0  11111111 11111111 11111111 11111111 11111101 1111*
L14CC  11111111 11111111 01111111 11111111 11111111 1111*
L14F8  11111111 11111111 11111101 11111111 11111111 1111*
L1524  11111111 11111111 11111111 11011111 11111111 1111*
L1550  11111111 11111111 11111111 11110111 11111111 1111*
```

APPARATUS AND METHOD FOR ALLOCATION OF RESOURES IN PROGRAMMABLE LOGIC DEVICES

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

This invention relates generally to design packages for allocating resources in a programmable logic device to user logic designs and more particularly to a resource allocation means for programmable logic devices having programmable logic blocks interconnected by a switch matrix.

DESCRIPTION OF THE PRIOR ART

Programmable logic devices are available for a variety of applications. Typically, a programmable logic device is a circuit on an integrated circuit chip which can be configured by a user to perform one or more logic functions. Most programmable logic devices include an AND array and an OR array either or both of which is programmable. In a programmable array logic (PAL) device, input signals are fed to a programmable AND array which performs programmed AND functions and generates product terms. The product terms are fed to a fixed, i.e., non-programmable, OR array. The OR array sums the product terms from the AND array to form the logic function desired by the user.

To use a programmable logic device, a user must specify the logic function for the device and then program the device to perform the logic function. Typically, a programmable logic device is programmed by setting the state of array logic cells, such as fuses or electrically erasable cells, so that a desired connection of two signal lines within the AND array of the device is achieved. Similarly, architectural cells are often used to configure multiplexers and/or flip-flops in a programmable logic device.

A variety of support tools have been developed to assist a user in implementing a logic function in a programmable logic device. Typically, the design support tools consist of design software and a logic programmer.

A typical block diagram of a design support system available to a user of a programmable logic device is illustrated in FIG. 1. Programmable logic design software 11 is loaded in a computer 10. The user supplies a circuit description 12 to logic design software executing in computer 10 which in turn typically generates a Joint Electronic Device Engineering Council (JEDEC) file 13. In general, a JEDEC file is a computer file containing information about the programming of a programmable device. The file format is a JEDEC-approved standard describing which fuses are to be programmed.

JEDEC file 13 is downloaded to logic programmer 14 which is coupled to programmable logic device 15. Logic programmer 14 uses the information in JEDEC file 13 to program logic device 15 to perform the logic function in circuit description 12.

Most design software packages perform essentially these same tasks. The design is first specified with relatively high-level constructs such as boolean equations or state machine diagrams. The software processes the design and converts the design to a form which the logic programmer uses to configure the programmable logic device. Most software packages include logic simulation which allows debugging of the design prior to programming the programmable logic device.

One design software package for programmable logic devices is the PALASM 2 software available from Advanced Micro Devices, 901 Thompson Place, Sunnyvale Calif. 94088. (PALASM 2 is the U.S. registered trademark of Advanced Micro Devices, Inc.) A software flow diagram of the PALASM 2 software for PAL devices is illustrated in FIG. 2.

As explained more completely below, a design input file 20 is provided to parse 21. Parse 21 checks the syntax of input file 20 and passes the information to expand 22. Expand 22 expands the input equations and converts state machine syntax to Boolean equations. Subsequently, minimize 23 minimizes the logic equations from expand 22. The results from minimize 23 are provided to xplot 24 and sim 25. Xplot 24 assembles PAL device designs and generates a PLD fuse map data file and a PLD fuse JEDEC data file. Sim 25 simulates PAL device designs and generates a simulation history data file, a simulation trace data file, and a file containing PLD fuse JEDEC data and JEDEC test vectors.

The PALASM 2 software executes on Digital Equipment Corp. VAX minicomputers under either Digital Equipment Corp. VMX operating system or Berkeley 4.2 UNIX operating system as well as on IBM or IBM compatible personal computers operating under the Microsoft Corp. MS-DOS operating system version 3.2 or above.

PALASM 2 software includes an interactive menu program that simplifies user interface to the software. Menu screens display all user options on one screen, enable the use of function keys to run all the programs, and allow the user to view the output. Help screens and message windows are used to facilitate user interaction with the software.

Design input file 20 contains information describing the circuit to be implemented on the programmable logic device. The information in the design input file varies with the design software used, but one skilled in the art know the required information for the design input file. For example, for PALASM 2 software, a first design input file is used for Boolean equation design and another design input file is used for state machine design.

For Boolean equation design, the design input file for the PALASM 2 software contains two segments, a declaration segment and an equations segment. The declaration segment contains design identification, device and pin data, and optionally string substitutions. Information in the declaration segment documents the input and output signals of the design. The equations segment contains Boolean logic functions that define output signals in terms of input signals and feedback signals as well as the configuration of the other programmable functions. A more detailed description of the Boolean equation design input file and the information in the file is given in *PAL Device Databook*, Advanced Micro Devices, Sunnyvale Calif., pp. 4-61 to 4-93 (1988) which is incorporated herein by reference. Also, a sample design for a four bit counter is given in FIG. 3A. A description of the design file in FIG. 3A is given in *PAL Device Handbook*, Advanced Micro Devices, Sunnyvale, Calif, pp. 2-66 to 2-70 (1988), which is incorporated herein by reference.

For state machine design, the design input file for the PALASM 2 software contains three segments, a declaration segment, a state segment, and a conditions segment. The declaration segment contains design identification, device and pin data, and string substitutions. The state segment contains information about the design and equations that describe functions of the state machine. The state segment information is derived from the state diagram for the state machine. The state segment includes (i) statements that specify the kind of machine, and the output signals; (ii) equations that assign register-values as a bit code for each state; and (iii) equations that specify the transitions between states and the polarity and behavior of the output signals. The conditions segment contains labels that give names to unique sets of input signals and associated equations that identify the branching conditions used in the state segment to determine transitions and output signals.

A state machine design input file is given in FIGS. 3B and 3C. A more detailed description of the state machine design input file and the information in the file is given in *PAL Device Databook*, Advanced Micro Devices, Sunnyvale Calif., pp. 4-95 to 4-135 (1988) which is incorporated herein by reference.

Parse 21 (FIG. 2A) checks the syntax of design input file 20. If parse 21 detects an error in file 20, the location of the error is indicated and an error message is displayed. The error messages are stored in a file that is accessed by parse 21 when an error is detected. To facilitate completion of a design, parse 21 attempts to recover after detection of each error and continue with the syntax checking. If the design input file 20 is error free, parse 21 creates an intermediate file for processing by expand 22.

Using the intermediate file from parse 20, expand 22 expands the input equations and converts state machine syntax to Boolean equations.

If the programmable device specified in design input file 20 does not contain an XOR gate, expand 22 expands any XOR expressions to AND and OR expressions. In general, expand 22 performs logic substitutions for logic expressions in the user design which are not included within the selected programmable logic device. Expand 22 creates another intermediate file that contains expanded Boolean equations.

Minimize 23 processes either the intermediate file from parse 21 or the intermediate file from expand 22. Minimize 23 looks for logic redundancy and minimizes the AND and OR expressions. Minimize 23 enables the user to program the logic device more efficiently. When minimize 23 detects an XOR gate and the logic device includes XOR gates, the equations on either side of the XOR gate are minimized independently leaving the XOR intact. Minimize 23 produces yet another intermediate file that is used by subsequent programs. Intermediate file 26 has a TRE format.

Xplot 24 validates the architectural design of an input PAL design to the logic device limits and produces fuse maps and JEDEC data. Xplot can process the intermediate file containing Boolean equations created by parse 21, expand 22, and minimize 23. Xplot 24 checks the Boolean equations for consistency and correctness for the specified device. When an error is encountered xplot 24 attempts immediate recovery.

Using architectural information about the device specified in a product design file, which is read and stored in the computer memory by the design software, xplot fits the Boolean equations to the programmable logic device. Xplot 24, as well as most other software design tools, works with an excess of resources and employs simple book-keeping methods to allocate the resources in a systematic fashion. After xplot 24 has fit the Boolean equations to the programmable logic device without error, the output fuse maps and JEDEC data are generated. A more detailed description of the PALASM 2 design software is given in *PAL Device Databook*, Advanced Micro Devices, Sunnyvale Calif., pp. 4-1 to 4-198 (1988) which is incorporated herein by reference.

The PALASM 2 software and programmable logic device design software in general is typically limited to processing a design for a single programmable logic device. The programmable logic device may contain, for example, dedicated input pins, dedicated output pins, I/O pins, clock input pins, a programmable logic array, programmable macrocells, programmable buried macrocells, programmable output signal polarity, and programmable feedback. Typically, the programmable logic array provides a fixed number of product term lines to each macrocell and a fixed number of product term control lines to each macrocell. Equivalent processing steps exist for other prior art PLDs.

Another design software package for programmable logic devices is the Advanced Boolean Expression Language available from Data I/O, 10525 Willows Road, Redmond, Wash. 98073 which is identified as ABEL version 3.2. As illustrated in FIG. 2B, this design package is equivalent to the PALASM 2 design software design package described above. Design file 30 and parse 31 perform functions which are equivalent to design file 20 and parse 21 in FIG. 2A. Transform 32 (FIG. 2B) transforms state machine equations into Boolean logic equations and expands nested logic functions.

Similarly, expresso 33 is a logic minimizer which forms a function equivalent to minimize 23 (FIG. 2A). Expresso 33 generates a PLA file which may be used in fuse map 34 to generate a JEDEC file and output documentation file or alternatively in sim 35 to simulate the functional operation of the user design. The PLA file format of file 36 is a relative standard having been adapted by several industrial companies after its design within the academic environment.

Typically, PLD design software does not have a capability for fitting the user's logic equations to a multiplicity of programmable logic modules within a programmable logic device. However, there are several known processes for partitioning of logic designs. See for example, B. Kernigham & S. Lin, "An efficient procedure for partitioning graphs", *Bell System Tech Journal*, 1970; C. Fiduccia & R. Matteyses, "A linear time heuristic for improving network partitions", *Proceedings 19th DAC*, June 1982; and C. Palesko & L. Akers, "Logic Partitioning for Minimizing Gate Arrays", *IEEE Transaction on CAD of ICs and Systems*, April 1983. Each of these processes accepts a logic design and breaks the design into partitions, constrained for minimum pinout or logic resources in each of the partitions.

All of these algorithms make the assumption that there are no restrictions in connectivity between partitions, i.e. any signal declared in the top-level interconnect can freely go between any or all of the top modules. The algorithms seek to minimize the number of these signals, hence the name Min-Cut associated with these algorithms. Min-Cut seeks to achieve the lowest overall number of connections between partitions. However, when applied to PLDs, this generally results in additional processing because reduction of the connections below the device resource limits is unnecessary. The user design will fit in the PLD even if the partition is not at an overall minimum. Moreover, Min-Cut fails to produce partitions, i.e., logic blocks, that have the same size. The Min-Cut partitions may be of different sizes and may be either too big or too small for PLD implementation.

Thus, if a programmable logic devices has restrictions on interconnections between programmable logic blocks (partitions) and/or restrictions on signal routing between programmable logic blocks, the above algorithms are not applicable. Further, if the programmable logic blocks have the same size, the above algorithms do not effectively utilize the blocks. Any process used to partition a logic design for multiple programmable logic modules must take into account both the restricted interconnections present between logic modules, and the resources available in the logic modules.

Each of the three processes noted above begins with an initial partition, and via interchanges seek to improve the metric characterizing the partitioning. In theory, one could modify the calculation of the metric to include constraints on the interconnections present between modules and module size within a programmable logic device, but this calculation is along the critical path, i.e., the calculation is performed many times during the course of partitioning improvement. Therefore, such a modification would result in a process that required extremely long processing time.

Further, these processes only swap one logic module at a time, neglecting any "affinities" present between logic functions in a larger group of modules. Local "hills" and "valleys" in the optimization function almost certainly preclude finding any multiple module swap that is the global "best" choice.

Placement and routing processes in gate array and standard cell logic design tools, such as those described above, have successfully solved several general and specific forms of the placement and routing problem. Nearly all of these processes rely on the assumption that the physical coordinates of logic modules are directly related to wire delay, congestion and probability of success in creating the final physical device layout. This assumption also runs counter to the basic arrangement of interconnects present in programmable logic devices with multiple modules. Any nonlocal interconnect between modules costs the same as any other. A small change in position is unrelated to metrics of success. Placement optimizations based on such metrics will directly fail.

Thus, at present, a means for fitting a logic design to a programmable logic device having a variable number of clumped product terms per macrocell is not available. In addition, a means for fitting a logic design to a multiplicity of programmable logic modules with limited interconnections between the modules is not available.

SUMMARY OF THE INVENTION

According to the principles of this invention, resources in a programmable logic device (PLD) having at least two programmable logic blocks, usually of the same size, interconnected by a switch matrix are assigned to user logic equations using a novel resource allocation method and system. The system is operable in a computer system having a main memory and secondary memory. In a first operation, the resource allocation system (system) partitions the user logic equations into a multiplicity of modules based upon affinities between the user logic equations. There is one module in the multiplicity of modules for each of the programmable logic blocks in the programmable logic device. In a second operation, the system assigns resources in the programmable logic device to each of the user logic equations in each of the multiplicity of modules.

Initially, the system reads a user design and then information from databases located on secondary memory characterizing the PLD specified in the user design, or alternatively the PLD selected by the system based upon the user design. The system stores the user design and the product information in several data structures in main memory. The data structures include links and pointers for dynamically generating table information and other data required by the system. In this initialization process, a Boolean vector is created for each user logic equation. The Boolean vector has n bits where n is the total number of input signals in all the user logic equations. The bits are ordered to correspond to each of the n input signals.

In one embodiment, the bits in Boolean vectors are all set to a first determined value and then in each Boolean vector, the bits corresponding to the input signals to the logic equation associated with that Boolean vector are set to a second predetermined value to represent the presence of the input signals in the logic equation. This initialization process also determines the resource limits for each of the modules in the block partitioning process.

The partitioning system uses a similarity means to determine a similarity measure S for each pair of said user logic equations using the Boolean vectors associated with the pair of user logic equations. In one embodiment, only similarity measures greater than a predetermined limit are retained by the system for further processing. For each similarity measure greater than the predetermined limit, the similarity measure and the associated Boolean vector for each user logic equation in said pair of equations are stored.

After the similarity measures are determined, the partitioning system places any user preplaced logic equations in the modules and decrements the resources for each module by the number of resources required to support the preplaced user logic equations. If the user does not preplace any equations, the partitioning system randomly assigns a user logic equation to each module and decrements the available resources.

The partitioning system uses a receptivity means to determine a receptivity of each module for each of said user logic equations. The receptivity is based upon the similarity between the logic equation input signals for an equation to be placed and the input signals of the logic equations already placed in the module. The use of input signals as a measure of similarity is only illustrative of the principles of the invention. Any parameter common to the logic equations may be used in the partitioning process, e.g., output signals.

Each user logic equations is assigned to the module having (i) the largest receptivity for the user logic equation and (ii) resources to support the user logic equation thereby partitioning the user logic equations into modules based upon the affinity of the logic equations input signals. When an equation is added to a module, the available resources in the module are decremented. If a module does not have sufficient available resources to support a user logic equation, the equation is assigned to a virtual module and a variable FulCnt for the module, which indicates the number of times the system attempted to add an equation to that full module, is incremented.

To ascertain the receptivity of a module for a user logic equation, the receptivity means determines, for each of the multiplicity of modules and one of said pairs of user logic equations, (i) a first similarity measure S1 for the Boolean vector for the first user logic equation in a pair and a Boolean vector for the input signals to the user logic equations already placed in the module and (ii) a second similarity measure S2 for the Boolean vector for the other user logic equation in a pair and the Boolean vector for the input signals to the user logic equations already placed in the module.

For each pair of module similarity measures S1, S2 in said multiplicity of modules, the maximum similarity measure SM is determined for that module. The maximum similarity measure SMMAX of the module maximum similarity measures SM is determined thereby determining the module that has the greatest receptivity for the user logic equation is the pair of user logic equations. In one embodiment, the maximum similarity measure SM for each module is adjusted by the value of the variable FulCnt for that module, i.e., the value of variable FulCnt is subtracted from SM. This process assures that the user logic equation is assigned to the most receptive module with available resources.

The user logic equation is placed in the module having the greatest receptivity only if that module has sufficient available resources to support the equation. Otherwise, the equation is assigned to a virtual module. If one equation in a pair of equations has been placed in a module, the partitioning means attempts to place the other equation in the same module. If sufficient resources are available in the module, the co-placement is made. Otherwise, the equation is assigned to the virtual module. If both equations in a pair have been placed in different modules, the partitioning means examines the available resources in both modules to determine if the modules can be merged. If sufficient resources are available in any of the modules, the modules are merged.

The similarity measure S is determined by a similarity means which includes a means for determining the input signals common to a pair of Boolean vectors and a means for determining the input signals in a first Boolean vector that are different from the input signals in a second Boolean vector. Both means generate an n bit Boolean vector. The bits in a Boolean vector C generated by the common input signal means represent the presence of common input signals in the pair of Boolean vectors while the bits in a Boolean vector D generated by the different input signal means represent the presence of different input signals in the vector pair.

In one embodiment a bit-wise AND of the pair of Boolean vectors associated with the pair of user logic equations is used to generate Boolean vector C. In this embodiment, a bit-wise Exclusive OR of the pair of Boolean vectors associated with the pair of user logic equations is used to generate Boolean vector D.

The similarity system counts the number bits in Boolean vector C having a first predetermined number, where the first predetermined number indicates the presence of common input signals. The similarity system also counts the number bits in Boolean vector D having the first predetermined number, where the first predetermined number indicates the presence of different input signals. The measure of similarity is generated by dividing the number D by a predetermined weight to form a number D1 and then subtracting the number D1 from the number C.

After all the logic equations are assigned to a module, the partitioning system attempts to place any equations in the virtual module in any module with sufficient resources to support the equation or equations. After all the equations are placed in a module associated with a programmable logic block, the number of interconnections and the fanout of signals are determined using the logic equations in each module. The modules are sorted by interconnection requirements so that the equations in the module requiring the greatest number of interconnection resources are assigned resources in the PLD when the maximum number of resources are available.

The resource assignment means assigns each of the modules to one of the programmable logic blocks in the programmable logic device. Note the block partitioning use the available resources in a programmable logic block to define the resource limits for a module, but the block partitioning does not associate a particular module with any particular programmable logic block. The resource assignment means uses the Hungarian assignment process to assign modules to programmable logic blocks.

The Hungarian assignment process uses a cost matrix where the rows of the matrix represent available resources in the programmable logic block and the columns represent elements in the module to be assigned to the rows. The number in the cost matrix at the intersection of a row and a column is the cost associated with using the resource represented by the row for the element, e.g. module, logic equation, or dedicated input signal, represented by the column. The Hungarian assignment process determines the optimal mapping of the columns in the cost matrix to the rows.

After assignment of blocks to modules, the resource assignment means assigns the resources in the blocks to the logic equations in the modules. In one embodiment, the logic equations, output logic equations and then buried logic equations, are assigned resources using the Hungarian assignment process. After the logic equations are assigned resources, the dedicated input signals are assigned resources. When a logic equation or input signal is assigned resources, the available resources in the block are decremented. A logic equation or input signal is allocated resources only if sufficient resources are available to support the equation or signal.

After all the equations in the modules have been allocated resources, the allocation system documents the user design and generates a JEDEC file that may be used to program the PLD. If the resource allocation fails, the user is provided diagnostic messages.

The block partitioning process has been described in terms of assigning user logic equations to modules associated within programmable logic blocks in a single programmable logic device. However, the partitioning process is suitable for a wide variety of applications. For example, an electronic device may have several interconnected PLDs where each PLD has resources to support several user designs. In this case, the PLDs correspond to programmable logic blocks and the designs correspond to user logic equation Thus, the block partitioning process assigns each of the user designs to modules based upon common input signals to the PLDs, for example. The modules may then be assigned to PLDs in the electronic device. Hence, the method and system of the invention provide a broad range of capability for rapidly and efficiently allocated resources in a device to user specified functions.

BRIEF DESCRIPTION OF THE DRAWINGS

FIG. 3A is a listing of a four bit counter design input file for the PALASM 2 software design package.

FIGS. 3B and 3C are a listing of a state machine design input file for the PALASM 2 software design package.

FIG. 4 is a general block diagram of one of the families of electrically programmable logic device 400 for which the resource allocation means of this invention assigns resources to a user's logic design.

FIGS. 8B and 8C are an example of an ABEL user input file 100A (FIG. 7) for an eight bit counter.

FIGS. 8D and 8E are an example of a user design 100 for the eight counter design (FIGS. 8B and 8C) in the PLA file format for processing by resource allocator means 110 according to the principles of this invention.

FIG. 9 is a more detailed block diagram of the symmetric programmable logic block of device 400.

FIGS. 19A and 19B are a representation of the input lines and the output lines to the programmable multiplexers in switch matrix 401A.

FIGS. 20A through 20D are a representation of the input lines and output lines of the programmable multiplexers in switch matrix 401B.

FIGS. 21A through 21E illustrate the information in the device database for the programmable logic device illustrated in FIG. 10 according to the principles of this invention.

FIG. 24 defines the symbol array, character array, and symbol record illustrated in FIG. 23.

FIG. 26 defines the signal array, the equation array, the equation record and the common record which are illustrated in FIG. 25.

FIG. 28 defines the physical record, switch matrix array, fanout array, resource record and resource header record according to the principles of this invention.

FIG. 31 defines the pin array, the pin record, as well as other structures required for the means of this invention.

FIG. 32 defines two of the data structures used in the Hungarian assignment process according to the principles of this invention.

FIGS. 33A and 33B define constants and pointer declarations used in the resource allocation means of this invention.

FIGS. 33C through 33E define other data structures used in the resource allocation means of this invention.

FIGS. 42A through 42H illustrate one application of the Hungarian assignment process used in the resource assignment means of this invention.

FIGS. 43A through 43D is a process flow diagram for the resource assignment means of this invention.

FIG. 45 is an example of the initial data in the output file according to the principles of this invention.

FIG. 46 is an example of a logic map produced by document generation 145 according to the principles of this invention.

FIG. 48 is an example of a feedback map produced by document generation 145 according to the principles of this invention.

FIG. 49 is an example of a signal list produced by document generation 145 according to the principles of this invention.

Figure 50C:
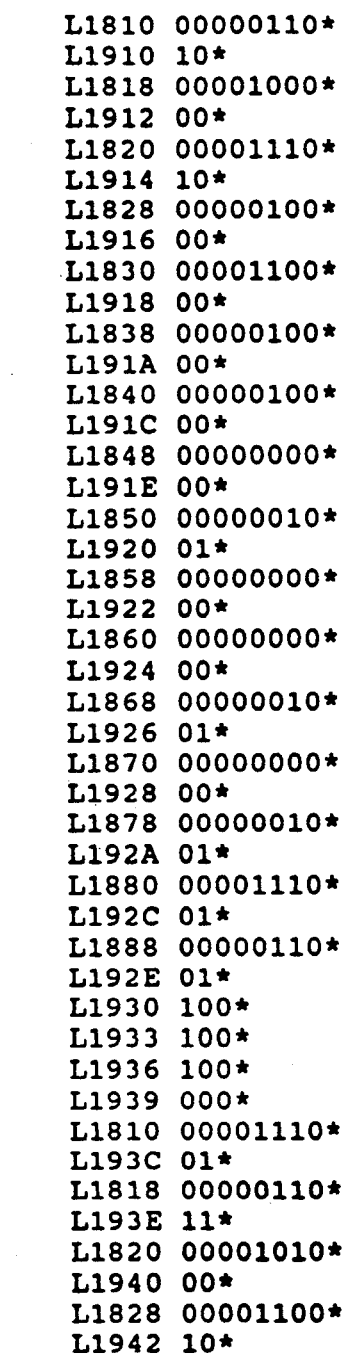
Figure 50D:
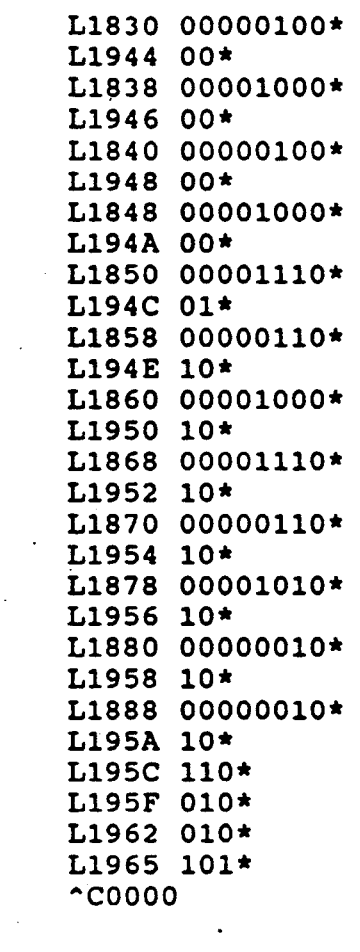

FIGS. 50A through 50D is an example of a JEDEC file produced by document generation 145 according to the principles of this invention.

DETAILED DESCRIPTION

Figure 1:
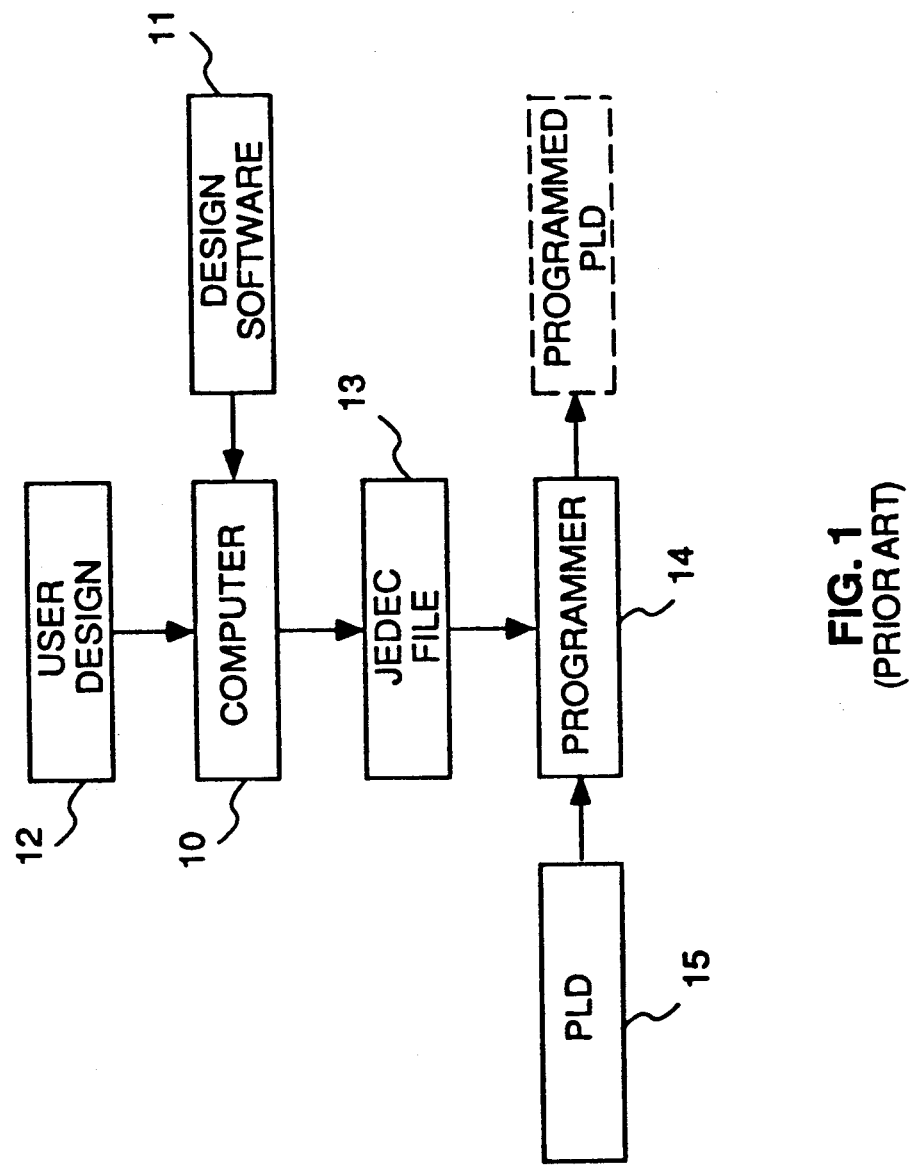
FIG. 1 is a block diagram of a typical prior art design support system for a programmable logic device.

According to the principles of this invention, programmable logic device design software is provided for allocating specific resources in a programmable logic device having a multiplicity of programmable logic blocks interconnected by a programmable switch matrix to logic equations in a user logic design. In particular, a resource allocation means for fitting a logic design to a multiplicity of programmable logic blocks with limited interconnectivity between the modules is provided. The resource allocation means, unlike the prior art fitters, requires minimal programmable logic device resources to achieve the allocation of resources within the programmable logic device to the user logic design.

In one embodiment, as explained more completely below, the resource allocation means employs block partitioning means and resource assignment means to map user logic to a programmable logic device (PLD) having multiple programmable AND fixed OR arrays interconnected by a programmable switch matrix, i.e., allocate the PLD resources to the user logic. A general block diagram of the families of electrically programmable logic devices 400 for which one embodiment of the fitting means of this invention is useful is given in FIG. 4.

Each programmable logic device 400 includes a plurality of identical programmable logic blocks 402 arranged in an array. Programmable logic blocks 402 are interconnected through programmable switch matrix 401. Programmable logic blocks 402 communicate with each other only through switch matrix 401. Moreover, in this embodiment, programmable logic blocks 402 receive all input signals on lines 426 from switch matrix 401. Thus, programmable logic blocks 402 may be viewed as independent programmable logic devices on the same integrated circuit chip.

Each programmable logic block 402 may receive a first plurality of input signals from input/output (I/O) pins 403 through switch matrix 407. Dedicated input pins 404 provide a plurality of input signals to switch matrix 401. The input signals from pins 404 are available to each programmable logic block 402. Each programmable logic block 402 may also provide a first plurality of output signals for I/O pins 403.

As explained more completely below, each programmable logic block includes (i) a programmable logic array having a multiplicity of products terms; (ii) a multiplicity of programmable logic macrocells, which may include programmable buried logic macrocells, with each logic macrocell having a feedback line to the programmable switch matrix; (iii) a logic allocator for steering product terms to a particular logic macrocell and for decoupling the programmable logic array from the programmable logic macrocells; (iv) programmable I/O macrocells for configuring the I/O pins and for decoupling the programmable logic macrocells from the I/O pins.

Figure 5:
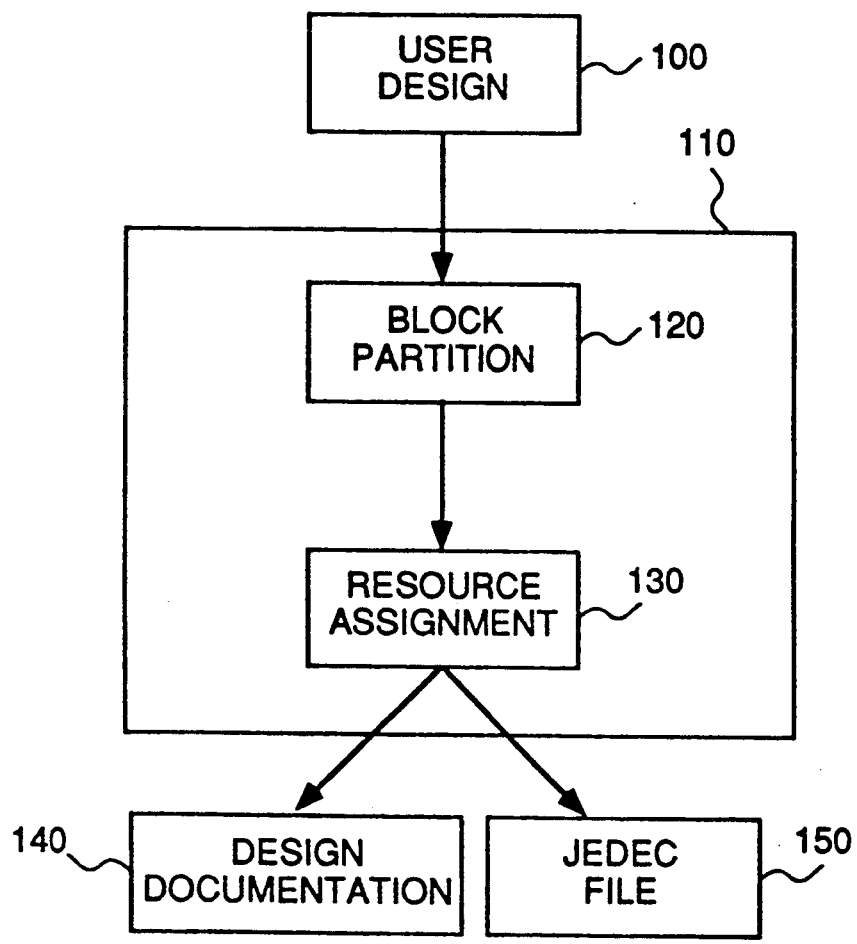
FIG. 5 is a block diagram of the resource allocation means of this invention.

Resource allocation means 110 (FIG. 5) of this invention includes a unification of two main processes—block partitioning 120 and resource assignment 130. Block partitioning means 120 attempts to partition a user design 100 into modules which have a logic affinity, e.g., in one embodiment, common input signals to the logic equations within the module.

After user design 100 is partitioned into modules, resource assignment 130 first assigns each module to one of programmable logic blocks 402 within programmable logic device 400 (FIG. 4). If logic device 400 is symmetric, the assignment of a particular module to a programmable logic block 402 is independent of the resources within the programmable logic block.

However, some programmable logic devices include programmable logic blocks having diagonal symmetry. See for example, the programmable logic devices described in U.S. patent application Ser. No. 07/243,574, entitled "Flexible, Programmable Cell Array Interconnected By A Programmable Switch Matrix" of Om P. Agrawal, et al., now U.S. Pat. No. 4,963,768 issued Oct. 16, 1990, which is incorporated herein by reference in its entirety. In such devices, modules are assigned to programmable logic blocks based upon the module's utilization of the resources within the programmable logic block. In general, the block assignment processes blocks without symmetry and in fact, may process arbitrarily sized blocks.

After resource assignment means 130 (FIG. 5) decides in which programmable logic block 402 (FIG. 4) to locate modules containing individual logic equations in user design 100, resource assignment means 130 sequentially determines for each programmable logic block 402 where to locate individual logic terms within programmable logic block 402 and how to configure both within the programmable logic block and within switch matrix 401 the programmable connections necessary to realize the desired user function.

Upon completion of resource assignment 130, resource allocation means 110, as explained more completely below, generates design documentation 140 for the user design and a JEDEC file 150 which may be downloaded to a programmer for actually programming programmable logic device 400.

Figure 6:
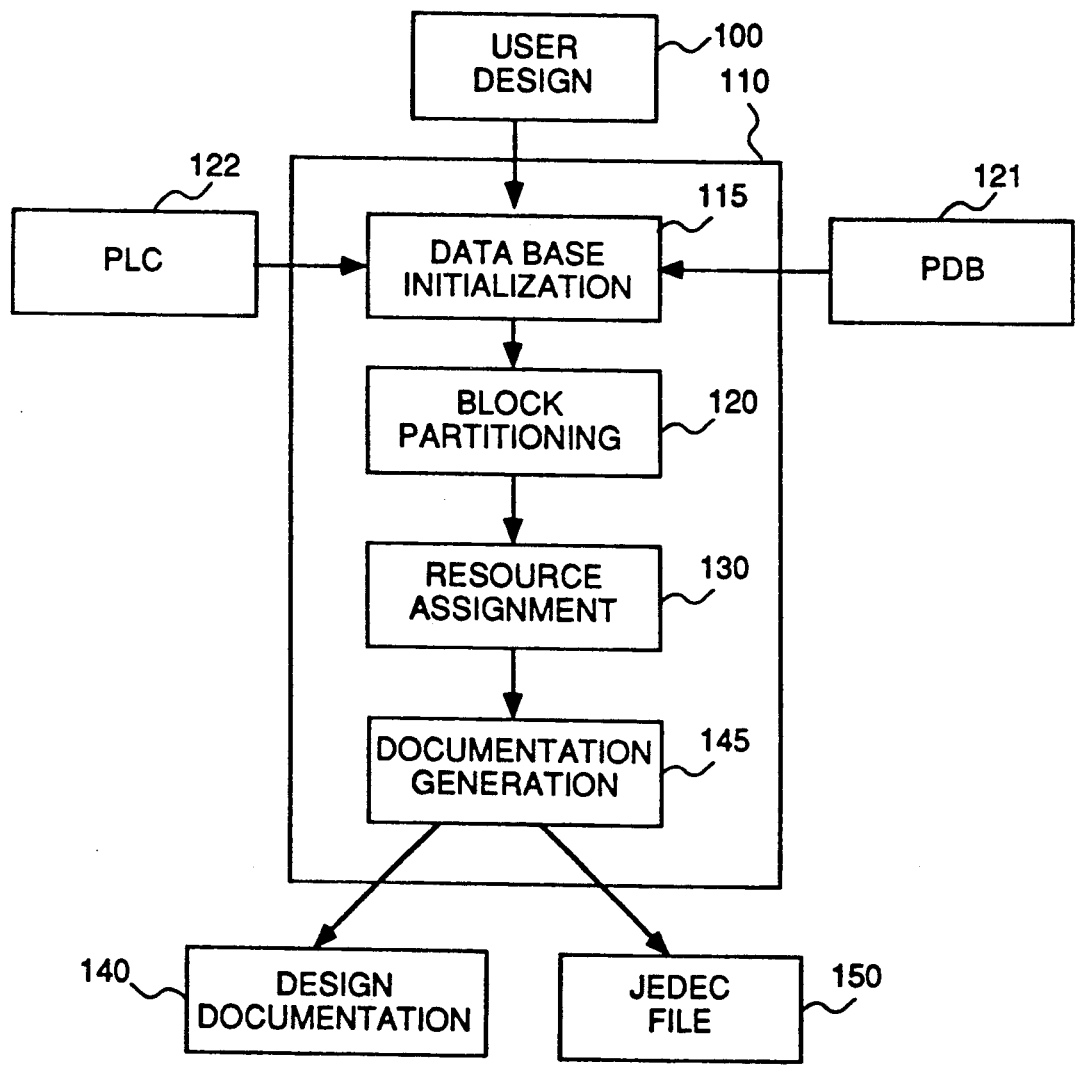
FIG. 6 is a more detailed block diagram of the resource allocation means of this invention.

Resource allocation means 110 is shown in more detail in FIG. 6. Resource allocation means 110 of this invention includes, (i) a database initialization means 115, (ii) block partitioning means 120 (iii) resource assignment means 130, and (iv) documentation generating means 145. Sometimes these means are referred to as processes within resource allocation means 110.

In database initialization means 115, user design 100 is processed. Typically, as described more completely below, user design 100 includes (i) a logic description encoded in a Boolean sum of products format, i.e., Boolean logic equations, (ii) a programmable logic part type, i.e. a PLD, chosen for this design and (iii) signal declarations provided by the user in a Pin/Node list.

Database initialization means 115 first initializes data structures used by resource allocation means 110 as described more completely below, and then reads the user's logic description and the programmable logic part type chosen for this design from user design 100. Database initialization means 115 also reads the signal declarations provided by the user in the Pin/Node list. Specifically, database initialization means 115 determines which signals are specified as input signals, output signals and buried nodes of the design.

The database initialization process also reads user supplied pin pre-placements for signals in the logic equations from PLC database 122. The initialization process locates the signals and related equations at the specified positions. If the specified positions result in contradictions, i.e., some of the input or output signals are unreachable with the connection resources provided within the programmable logic device, the user is notified.

Signals preplaced on specified pins are useful when design changes are anticipated after an initial prototype system is fabricated. Unless signal pre-placement is allowed, each time resource allocation means 110 maps a user design to the programmable logic device the pin-out would change. Such a change requires rewiring of the board or system in which the programmable logic device was used.

In addition to user design 100, database initialization means 115 reads the internal architecture description for the specified programmable logic device from a product database (PDB) 121 and checks the user logic design for compliance with the general size limits and resource usage of that device. If no errors are encountered, upon completion of the database initialization process, the user's design is ready for processing by block partition means 120.

In block partitioning means 120, the user's design is partitioned into modules that fit within the resource limits of individual programmable logic blocks 402 within programmable logic device 400. Initially, in the block partitioning process, logic equations that use common input signals are grouped together. The process then scans for "affinities," as described more completely below, between the groups of the logic equations and allocates the groups of logic equations within modules based upon these affinities In the partitioning process, the available logic resources are monitored so that the logic resources required by a module are not greater than the resources in a programmable logic block.

In one embodiment of block partition means 120, a different user logic equation is initially seeded, i.e., placed in each of the modules. The "affinity" used to subsequently place user logic equations in each of the modules is the similarity between the input signals to a user logic equation and the input signals for the user logic equation or equations already placed in the module. In this embodiment, each user logic equation is placed in the module having the maximum affinity, i.e., similarity, for the user logic equation, if sufficient resources are available in the module to support the equation.

While block partitioning means 120 automatically partitions the user's logic equations into modules that fit within the programmable logic blocks, an expert user may impart his choices for block partitioning by pre-placing logic equations in particular programmable logic blocks. In this case, the block resource totals are decreased by the number of resources preplaced by the user prior to beginning the block partitioning process.

After the user's logic equations are segmented into programmable logic modules, resource assignment means 130 assigns the modules to programmable logic blocks and individual logic equations in the modules to physical resources with the programmable logic blocks. This process is done sequentially for each programmable logic block within the device starting with the block which uses the largest number of connection resources, as determined by block partitioning means 120, and proceeds finally to the block with the smallest number of connections. Thus, resource assignment means 130 performs the most difficult signal routing, i.e. resource assignment, when the programmable logic block and switch matrix 401 are the emptiest, i.e., when the maximum number of resources are available for signal routing.

As explained more completely below, resource assignment means, in one embodiment, performs a series of mapping processes. For example in a first process, equations containing independent output enable product terms are mapped to resources in the PLD. In a second process, I/O pin mapping to resources in the PLD is performed based upon product term usage. A subsequent process maps buried logic equations to resources in the PLD. Note "mapping" and "resource assignment" are the same operation. "Mapping" views the operation from the perspective of the user logic equations while "resource assignment" views the operation from the perspective of the PLD.

Prior to any resource assignment, logic equations assigned to pins by the user are allocated resources first. Next, in another embodiment of resource assignment means 130, the product terms required for each logic equation are placed in groups based on size (product term count), referred to as groups of similar size. For example, equations requiring 9–12 product terms are a first group. Equations requiring 5–8 product terms are a second group and so forth. Typically, groups of a similar size are determined by the multiples of product terms clumps available from the logic allocator. The equations in the first group are each assigned to an I/O pin from the available I/O pins, and then equations in the second group are processed and so on. When a logic equation is assigned to an I/O pin, the product terms associated with realizing each of the assigned logic equations are routed to form an OR-tree of the proper size to realize the logic equation, as explained below in more detail.

In yet another process, typically performed after the I/O pin mapping process, buried logic functions are placed in the "holes" remaining, i.e., unutilized resources, after the I/O pin mapping. Finally, any remaining dedicated input signals are assigned to any available free pins, either unused I/O pins or those I/O pins associated with a buried logic cell.

At each stage within resource assignment means 130, connection resources needed are "marked" as used. The used resources affect the later resource assignment decisions. Iterative trial and error cycles for this assignment process are avoided by having a slight excess in the number connections available and by simultaneously evaluating alternative feasible assignments, as explained more completely below.

Upon successful completion of resource assignment 130, documentation means 145 generates in design documentation 140 three outputs that reflect results of mapping user design 100 to the programmable logic device resources. A logical map (FIG. 46) depicts, as described more completely below, (i) the mapping of the user logic onto programmable logic blocks and (ii) the interconnects provided by switch matrix 401. A pin map (FIG. 47), as described more completely below, depicts user signal names associated with package pins. The pin map is a "customized" package outline, which allows the user to quickly locate signals on a breadboard.

Finally, a signal list is provided in design documentation 140. The signal list (FIG. 49) is a comprehensive tabulation detailing (i) the signal location, (ii) the type of equation, e.g., combinatorial, D-type flip-flop or T-type flip-flop, (iii) whether the signal is used as a feedback signal and (iv) the logic equations driven by the signal. Also, the programmable logic block and the macrocell location for the signal is given. Additionally, as previously described, JEDEC file 150 for programming the device in a suitable programmer may be generated.

In one embodiment, resource allocation means 110 is operating within a computer system. The computer system includes main memory which holds at least the computer operating system, resource allocation means 110 data, secondary memory (typically, disks) which typically holds PLC database 122, PDB 121 and user design 100. The computer system also includes a means for user input, printing and a video display screen.

One system suitable for use with this invention is the Apple MacIntosh SE computer system with a 20 Megabyte hard disk drive. Alternatively, an IBM or IBM compatible AT class computer with a 80×86 microprocessor, a 40 Megabyte hard disk drive, a 1.2 Megabyte floppy disk drive and 640 Kbytes of main memory is suitable for use with this invention.

In either computer system, the Pascal computer programming language was used in one embodiment of this invention. In particular Turbo Pascal, Version 1.1 for the Apple MacIntosh computer system and Turbo Pascal for the IBM PC, Version 5.0 for the IBM and IBM compatible computer systems was used. Both of these computer languages and the associated compilers were obtained from Borland International of Scotts Valley, Calif. The two versions of this invention are portable between Apple MacIntosh computers and the IBM compatible computers with only minor changes.

Figure 2A:
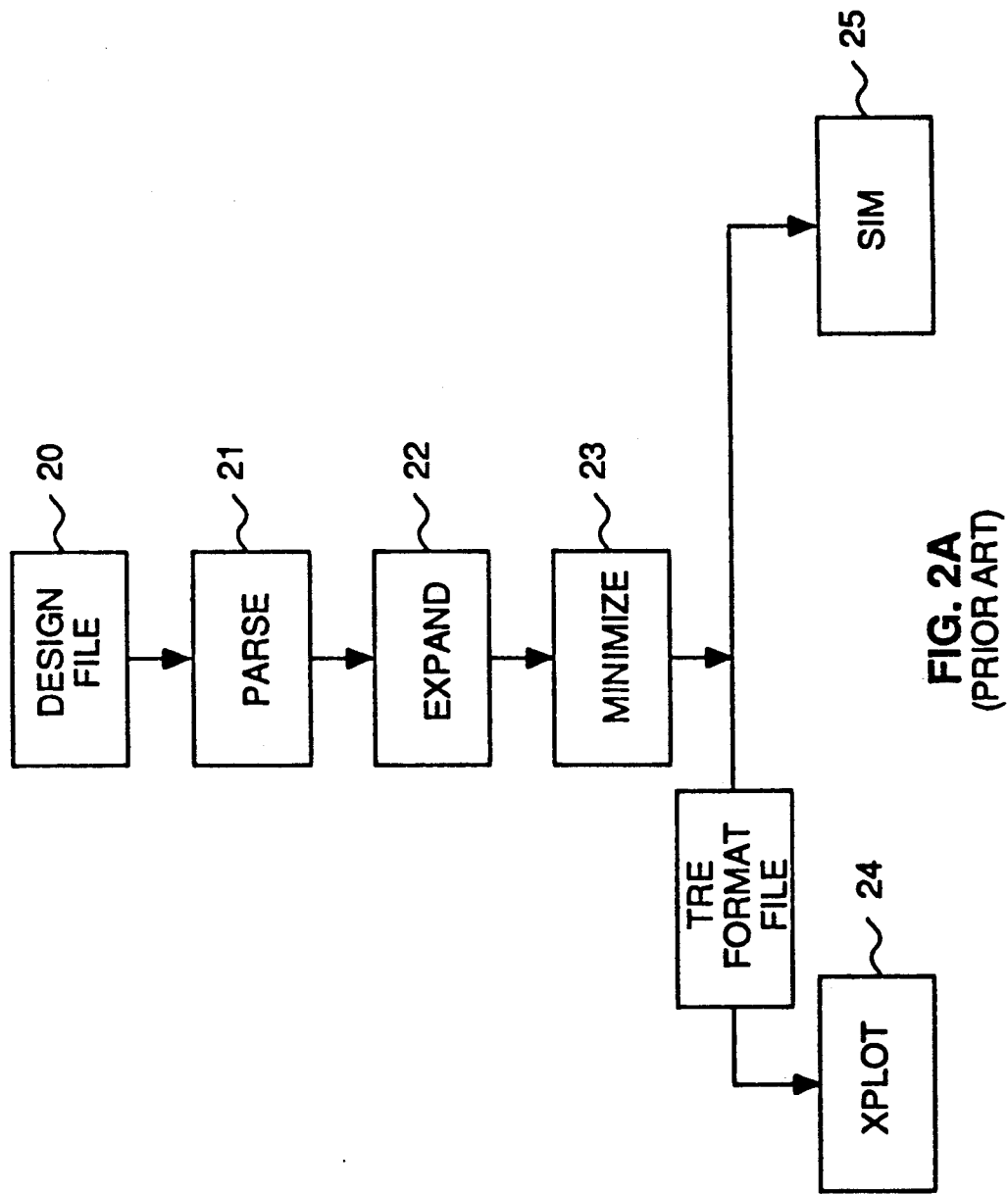
FIG. 2A is a block diagram of the prior art PALASM 2 software design package for PAL devices.
Figure 2B:
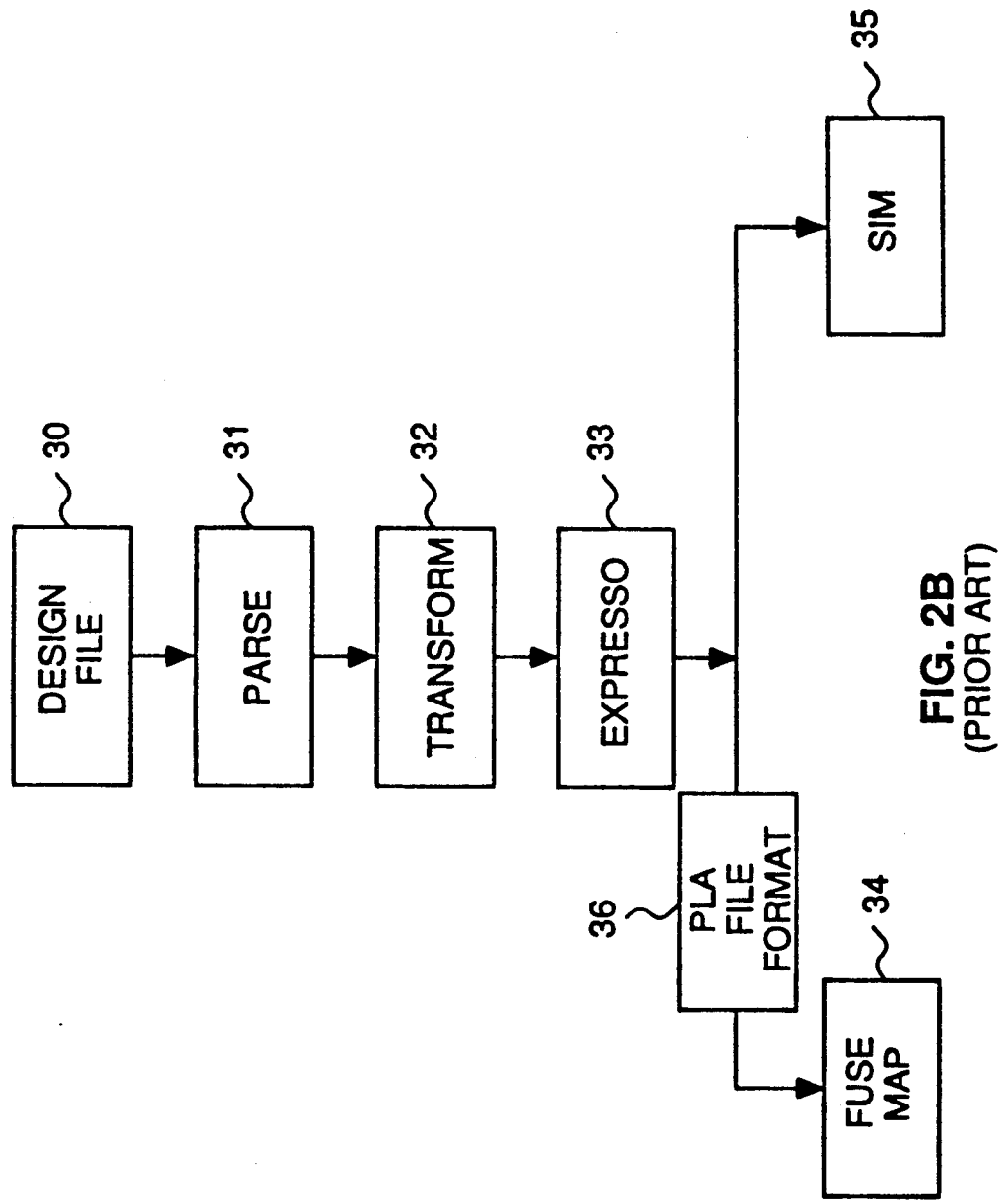
FIG. 2B is a block diagram of the prior art ABEL software design package for PAL devices.
Figure 7:
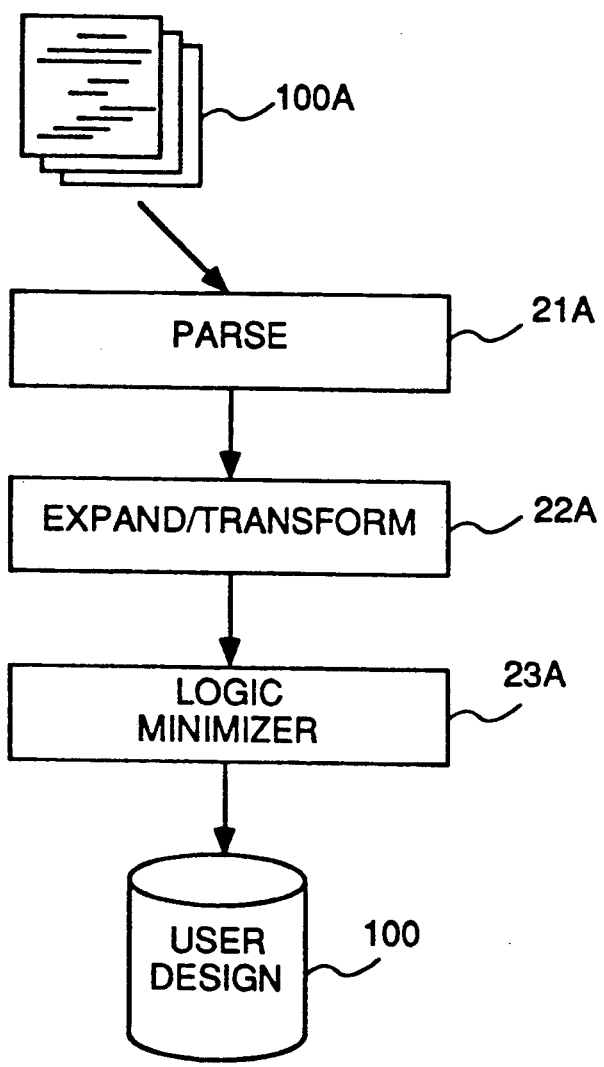
FIG. 7 is a block diagram illustrating one embodiment for generation of user design 100.

User design 100 (FIGS. 5 and 6) may be either a design for several interconnected PAL-like devices or a design for one monolithic device. In this embodiment, user design 100 is, in one embodiment, a file with a PLA format and in another embodiment a file with a TRE format. The resource allocation means 110 of this invention is suitable, for example, for replacing either xplot 24 (FIG. 2A) or fuse map 34 (FIG. 2B) in the prior art software design packages. Thus, user design 100 may be generated in multiple ways. For example, as illustrated in FIG. 7, user design 100 may be generated starting with a design input file 100A in a PALASM 2 format, which was described above and is incorporated herein by reference.

However, to use the prior art software design packages with the resource allocation means 110 of this invention, these software design packages must be modified so that they can process syntax associated with the description of programmable logic devices 400, which are described more completely below. Also, the packages must be modified to include the expanded logic capability of devices 400. Accordingly, while the operations of the prior art software packages necessary to generate the PLA file format are not essential to this invention, the general operations that must be modified in such packages to handle programmable logic devices 400 are briefly described below.

Parse 21A (FIG. 7) checks the syntax of design input file 100A. Parse 21A is substantially identical to parse 21 (FIG. 27), 31 (FIG. 2B) with additions for processing syntax associated with programmable logic devices 400. Such additions are apparent to those skilled in the art in view of the description of programmable logic devices 400. If parse 21A detects an error in file 100A, the location of the error is indicated and a message displayed on the video display screen. The error messages are stored in a file that is accessed by parse 21A. To facilitate completion of a design, parse 21A attempts to recover after detection of each error and continue with the syntax checking. If design input file 100A is error free, parse 21A creates an intermediate file with a TRE file format for processing by expand 22A.

Using the intermediate file from parse 20A, expand/transform 22A expands the input equations and converts state machine syntax to Boolean equations. Again, expand/transform 22A is substantially identical to expand 22 (FIG. 2A) and transform 32 (FIG. 2B) described above. Expand/transform 22A creates another intermediate file that contains expanded Boolean equations.

Logic minimizer 23A processes either the intermediate file from parse 21A or the intermediate file from expand 22A. Logic minimizer 23A looks for logic redundancy and minimizes the AND and OR expressions. Logic minimizer 23A is also substantially identical to minimizer 23 (FIG. 2A) and expresso (33) as described above. Minimizer 23A produces yet another intermediate file. Typically, the file produced by minimize 23A is user design 100.

Of course, parse 21A, expand/transform 22A and logic minimizer 23A have been modified to process the features of the programmable logic devices having multiple programmable logic blocks interconnected by a switch matrix and both D-type flip-flop and T-type flip-flop capability. Specifically, the processes are modified to handle the syntax associated with the new devices such as the floating pin/node syntax and signal pre-placement within logic blocks. Also, minimizer 23 must handle D/T flip-flop equation minimization and transfer equations linking input storage functions. The required modifications will be apparent to those skilled in the art in view of the following more detailed description of the logic devices and the form of the various data structures that are processed.

While one embodiment for generating user design 100 has been described, those skilled in the art may use equivalent processes to generate user design 100. The important aspect is that user design 100 includes the information, described more completely below, in either the TRE format or preferably the PLA format. Both of these file formats contain similar information and in fact are constructed very similarly. Therefore, resource allocation means 110 of this invention assumes that either another computer program has generated user design 100 or alternatively that user design 100 has been thoroughly checked out and contains correct information. The data in the user design 100 must be in the proper low-level format whether the file is generated by a computer program or some other means.

Further, resource allocation means 110 of this invention could be used without minimizing the logic equations, but such a use may result in an inefficient utilization of resources within the programmable logic device. Similarly, the state machine equation conversion to Boolean equations performed by expand 21A could be performed in numerous ways. Again the important aspect is that Boolean equations are generated for the state machine.

Typically, user design 100 includes a part number for the programmable logic device selected by the user and a global pin/node list of all signals interfaced to the "outside world", e.g., the signals that are supplied to or generated by programmable logic device 400. If the information is a pin list, each signal has a number associated with the signal that refers to a physical device pin. Otherwise, the number associated with a signal refers to sequential logical nodes, which are not directly associated with physical device resources.

If too many of the signals are constrained to specific pins, resource allocation means 110, described more completely below, may fail to map user design 100. Specifically, if too many pins are constrained, some contradictions may be detected when locating a logic function because some of the function's input signals or output signals may be unreachable.

Each of the signals in the global pin/node list is marked with an attribute of the signal (Input, I/O Pin, buried equation). However, if the signal attribute is not specified, the attribute is determined in database initialization means 115 by looking at the signal usage within the logic equations. Other signal attributes, such as registered (D-type and T-type flip-flops) latched, combinatorial, signal polarity, are also provided in user design 100.

Typically, in the TRE file format, user design 100 has, in addition to the part name and the pin/node section, an equation section. The equation section contains Boolean logic equations for each module of the design. Specially, the logic for each module in the user design is specified in the form of a Boolean AND/OR equation (Sum of Products—SOP format). There are no restrictions on the number of terms in the logic equations or the number of product terms. Further, there are no restrictions on the number of logic equations in user design 100. However, the number of logic equations must fit within the selected programmable logic device or the mapping will not be successful.

In general, the Boolean logic equations may be either registered or combinatorial and may be isolated from other equations or may directly feed other equations, e.g., a design module may have independent input and output signals or two design modules may share input signals. An output signal of one design module may be an input signal to a second design module. Auxiliary equations for register clock, output enable, set, reset, etc., are allowed in user design 100.

Figure 8A:
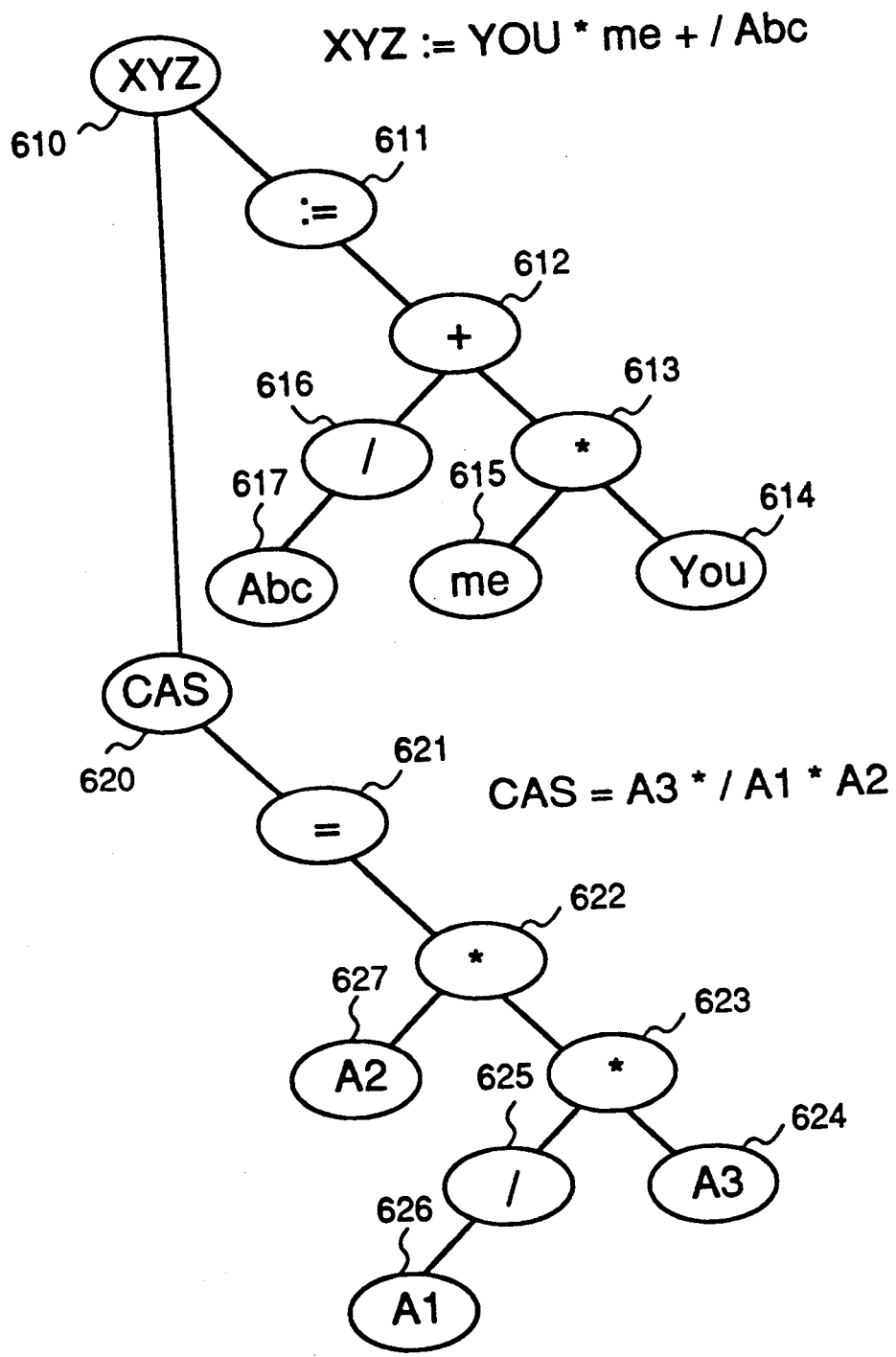
FIG. 8A illustrates the logic equation section of user design 100 in the TRE file format.

The equation section of the TRE file is depicted graphically in FIG. 8A using a simple example of two logic equations "XYZ" and "CAS" where:

$XYZ := You^*me + /Abc$ $CAS = A3^*/A1^*A2$

Each of the circled variables represent nodes or records in a structured database. Each node contains two pointers to its children. Overall, the information in FIG. 8B represents the Pre-fix parse tree generated by standard LL(1) language compilers created to process language grammars.

The highest nodes 610, 620 are the equation labels, containing the equation name, and linked to the next equation. Each equation has its own functional definition given in the lower level nodes 611–617 and 621–627, respectively. In traversing the operations, a right branch, left branch order is used, proceeding to its end.

The equation data can also be stored in a sequential manner (610, 611, 612, . . . 627), using numerical codes to identify each element, its datatype, and optionally provide a signal name ("Abc") if present. This equation section is a fragment of the disk-based TRE user design 100.

Various codes have been defined for the symbols used in the equation section of a TRE file, e.g., ":=" registered transfer, "=" combinatorial transfer, "*" logic AND, "+" logic OR, "/" logic not or complement, as well as others.

In the computer memory resident device 400 data structure (equation EQU_ARY (FIG. 26), described below), single byte values (0–255) represent both the logic operations and the logic variables to be manipulated—thus the entire structure can be stored quite compactly. If additional variables or operations have to be handled beyond the 255 codes defined, an extension code points to additional data. The exact codings used are quite arbitrary and so are not considered further.

As explained above, user design 100 may be generated by a prior art software design package that has been modified to include a capability for processing programmable logic devices 400, which are explained more completely below.

An example of a user design file 100 in the PLA format is illustrated in FIGS. 8D and 8E. The file in FIGS. 8D and 8E is a eight bit counter file for the eight bit counter specified in the ABEL user input file 100A (FIGS. 8B and 8C). The important aspect for user design 100 is that it is error free and has the proper PLA file format, which is presented below. As explained more completely below in data initialization 115 the only error checking performed on user design 100 is that of syntax and the error recovery is limited to skipping to the next record in the user design 100 after providing the user with a brief error message.

User design 100 in the PLA file format is described by a series of AND/OR expressions written as a sequence of the characters {"0", "1", "—", "_"} within lines of a programmable logic array (PLA). The PLA file format was developed at the University of California at Berkeley and is documented in the "Expresso - UNIX programmer's Manual" (March/1985), "Berkeley Logic Interchange Format (BLIF)" April/1987, and also R. Braytons, et al., *Logic Minimization Algorithms for VLSI Synthesis*, Klewer Academic Publishers, 1984.

In the PLA file format, the first element on a line introduces the data that is to follow. A pound sign "#" introduces a comment line. Eight data types, as illustrated in Table 1, are introduced by a period "." followed by a unique type name. In the case where a multiplicity of items may follow, a decimal number field [d], comes next to specify the number of objects to follow—zero and all positive numbers are legal parameters. The data in Table 1 is from the UCB Expresso Programmers Manual.

TABLE 1

A Description of the PLA File Format for User Design 100

| | |
|---|---|
| .i [d] | Specifies the number of input variables. |
| .o [d] | Specifies the number of output variables. |
| .ilb signal_list | Specifies the list of output signal variables. |
| signal_list | Consists of an Alphanumeric signal name, followed by (i) an optional signal extension, (ii) an optional active-low polarity indicator ("-"), and finally (iii) an optional node number field (":[d]") using a colon and decimal number. (The signal extension is a member of the list (D, T, G, C, AR, AP, RE, LE, where D = D-type FF, T = T-type FF, G = Latch, D = Clock Equation, AR = Async Reset, AP = Async Preset, RE = Reset, and LE = Latch Enable) describing the function for configuring the macrocell realizing the output variable. For a description of the members of this list see, "OPEN ABEL Specification" DRAFT, Feb. 27, 1990, which is available from DATA I/O. |
| .ob signal_list | Specifies the list of output signal variables. |
| .type [s] | Specifies the logical interpretation of the PLA lines -- i.e., whether on-set, off-set or both are provided. - Both ("fr") is most usual. |
| .phase boolean_vector | Specifies how the output variables are to be defined, in terms of on-set ("1") or off-set ("0") for the minimal realization. A full vector of ones is assumed if no phase is provided. |
| .p [d] | Specifies the number of product terms (one per line) to follow. Each product term consists of two fields -- an input string and an output string. The input string uses the characters {"1", "0", "-"} for the inclusion of a logic variable, its complement or a "don't care" at that position of the AND. The output string uses the characters {"0", "1", "~"} for definition of a logic function ("on-set"), its complement ("off-set") or no inclusion at that position of the OR sum term. At least one space separates the input and output strings. In this embodiment, additional spaces and line breaks can be inserted within the input and output strings. |
| .e | Marks the end of the PLA description. |

Various extensions to the PLA file format have been proposed in the form of user comments, i.e., lines beginning with the characters {"#$"}, followed by a keyword.

Typically, these user comments are used to target the design within a specific PLD architecture, or within a user design environment, and to provide additional labeling of physical device pins and circuit nodes.

Five extensions—{TITLE, JEDECFILE, DEVICE, PINS, NODES} have been implemented in resource allocation means 110, and others may be considered in future embodiments. Each of the names are descriptive of the type of information contained on the line in user design 100.

PINS and NODES data types contain a number and a signal list (including the optional polarity and optional number filed ("—" and ":[d]"). A number of zero ("abc/0") is interpreted to allow that pin or node to float to any circuit point at the discretion of resource allocation means 110.

TITLE, JEDECFILE, and DEVICE introduce an ASCII string of characters, terminated by the end-of-line. These user comments are more informational, indicating choices made by the designer of the logic function implemented.

The lines of the PINS statement for devices 400, described below, are typically rather long. The UCB standard and DATA I/O's implementation provide for no specific breaking point in long line. Accordingly, resource allocation means 110 allows line breaks to be inserted at any space, and comments also to be placed in-line.

Resource allocation means 110 supports programmable logic device architectures consisting of a network of interconnected programmable logic blocks with each programmable logic block having both programmable and fixed connections. Resource allocation means 110 is adaptable to a variety of device configurations and architectures because resource allocation means 110 reads information on chip physical resources from product database (PDB) 121. The use of PDB 121 allows resource allocation means 110 to be used with a range of architectures.

Herein, PDB 121 is described in terms of two families of programmable logic device 400. To understand the structure of PDB 121, the structure of the two families of programmable logic device 400 must be understood. Thus, prior to describing PDB 121 in more detail, the two families of programmable logic device 400 are described. A more complete description of the two logic device families is given in copending, commonly assigned, and commonly filed U.S. patent application Ser. No. 07/490,808, entitled "Multiple Array High Performance Logic Device Family" of Om P. Agrawal et. al, now U.S. Pat. No. 5,015,884, issued on May 14, 1991, which is incorporated herein by reference in its entirety.

As illustrated in more detail in FIG. 9, each programmable logic block 402 in programmable logic device 400 contains a programmable logic array, for example a product-term array 410, a logic allocator 411, logic macrocells 412, and I/O macrocells 413. Product-term array 410 generates the basic logic using signals provided by switch matrix 401 Logic allocator 411 is programmable so that product terms from array 410 are distributed to logic macrocells 412 as required by the user of device 400. Logic macrocells 412 configure the signals from logic allocator 411 as explained more completely below. Each logic macrocell includes a programmable flip-flop.

The output signals from logic macrocells 412 are provided to I/O macrocells 413 and feedback to switch matrix 401 over lines 427. Each logic macrocell that may be used to generate an output signal is coupled to an I/O macrocell I/O macrocells 413 deliver the output signals from macrocells 413 to I/O pins 403. Alternatively, I/O macrocells 413 provide input signals from I/O pins 403 to switch matrix 401 over lines 428. If an I/O cell is used to configure an I/O pin as an input pin, the logic macrocell associated with that I/O cell can function as a buried logic macrocell.

Each programmable logic block 402 additionally contains, in this embodiment, an asynchronous reset product term and an asynchronous preset product term. These product terms are used to initialize all flip-flops within programmable logic block 402. In addition, in one embodiment, each programmable logic block 402 contains two output enable product terms for every eight I/O macrocells in the block. In each programmable logic block 402, I/O macrocells 413 are divided into banks where each bank, in this embodiment, contains eight I/O macrocells. Each bank of I/O macrocells 413 receives two of the output enable product terms.

Thus, each programmable logic block 402, in this embodiment, has a multiplicity of product terms in product term array 410 which provide control functions to all macrocells in block 402. Symmetric programmable logic device 400 with programmable switch interconnect matrix 401 is further subdivided into two families. A first family 400A (FIG. 10) includes 44, 68, and 84 pin devices with 32 to 64 logic macrocells respectively. This family, with a high pin-to-logic ratio, is targeted to address I/O intensive applications.

Conversely, a second family 400B (FIG. 11), with a high logic-to-pin ratio, is targeted to address logic intensive applications. The second family offers twice the logic capability of the first family in the same package. The use of two families provides a convenient way for migrating designs up or down with little difficulty. The I/O and logic intensive nature of the families offers system designers broader options, allowing them to suit their designs to appropriate devices.

Figure 10:
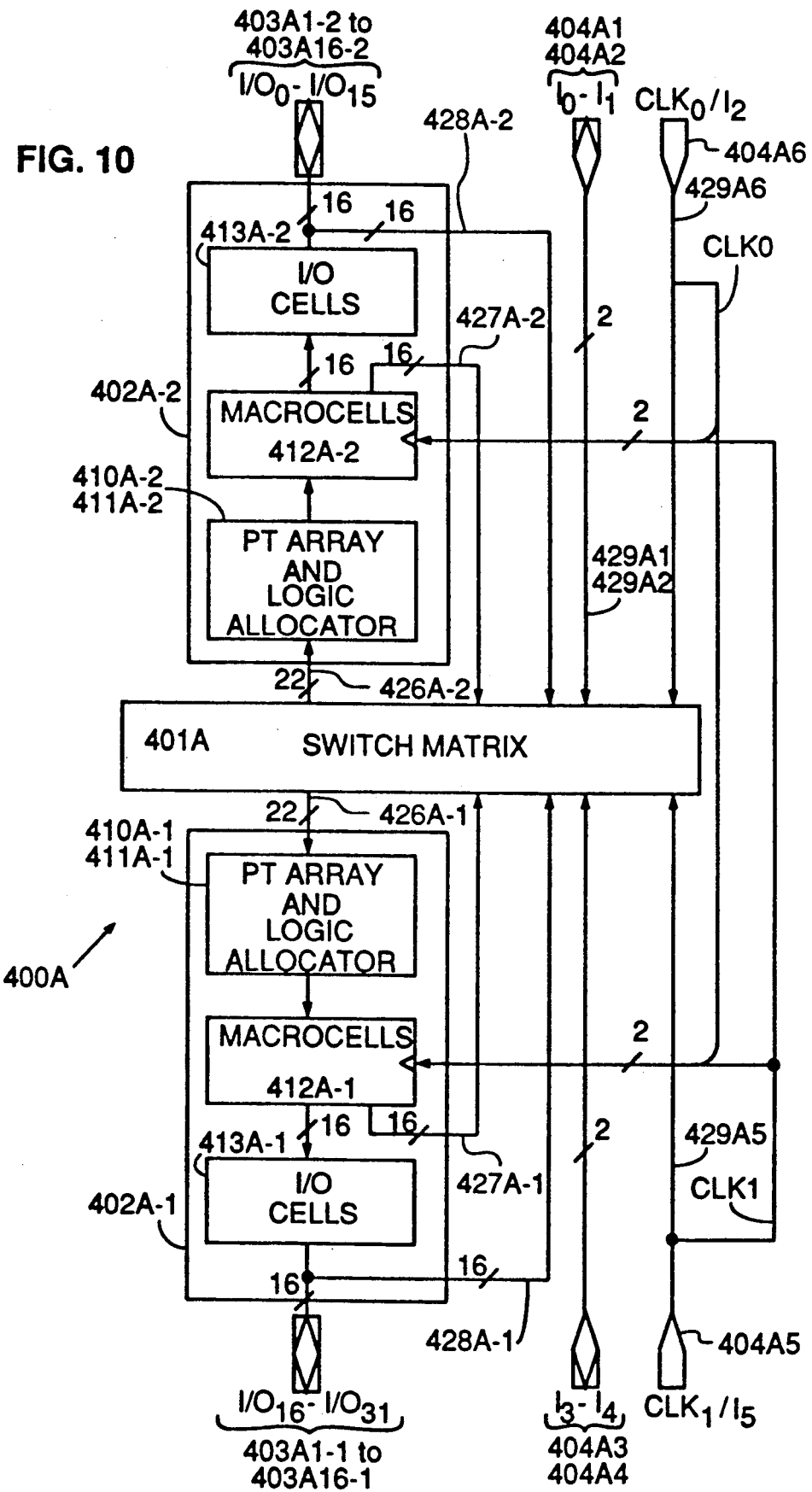
FIG. 10 is a detailed block diagram illustrating one embodiment of the first family of programmable logic devices 400.

FIG. 10 illustrates the first family of programmable logic devices 400A, according to the principles of this invention. Logic device 400A is a 44 pin device which has 32 I/O pins 403A-1, 403A-2 and six dedicated direct input pins 404A. Each of the programmable logic blocks 402A-1, 402A-2 are identical and include a product term array 410A-1, 410A-2, a logic allocator 411A-1, 411A-2, 16 logic macrocells 412A-1, 412A-2, and 16 I/O macrocells 413A-1, 413A-2.

In the figures, a line with a slash through the line and then a number N is used to indicate that the line represents N lines. Hence, switch matrix 401A provides twenty-two input signals to product term array 410A-1 over twenty-two input lines 426A-1. Similarly, logic macrocells 412A-1 provide feedback signals to switch matrix 401A over sixteen lines 427A-1 and I/O macrocells 413A-1 provide I/O pin feedback signals to switch matrix 401A over sixteen lines 428A-1.

Figure 11A:
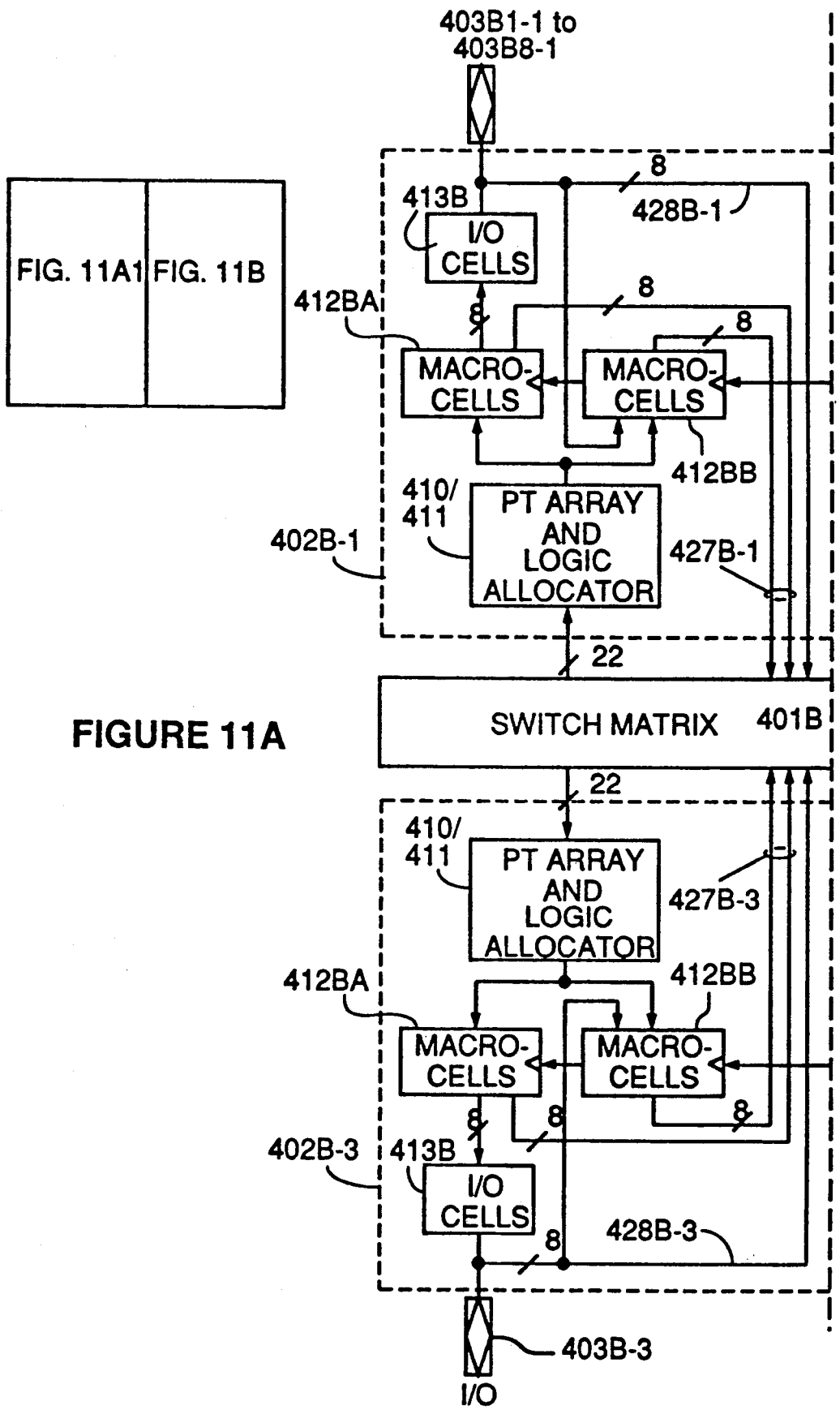
FIG. 11 is a detailed block diagram illustrating one embodiment of the second family of programmable logic devices 400.
Figure 11B:
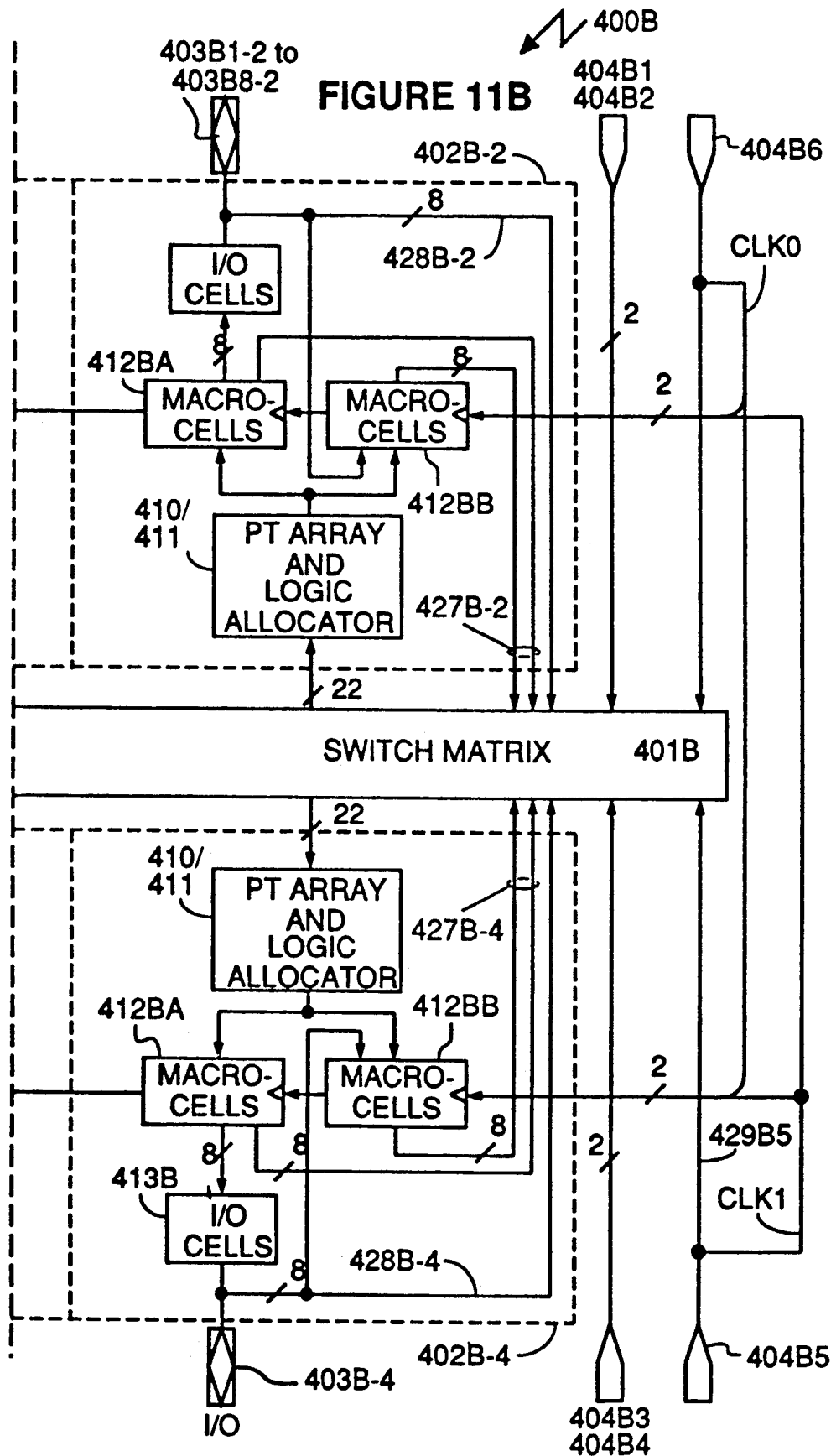
Figure 12A:
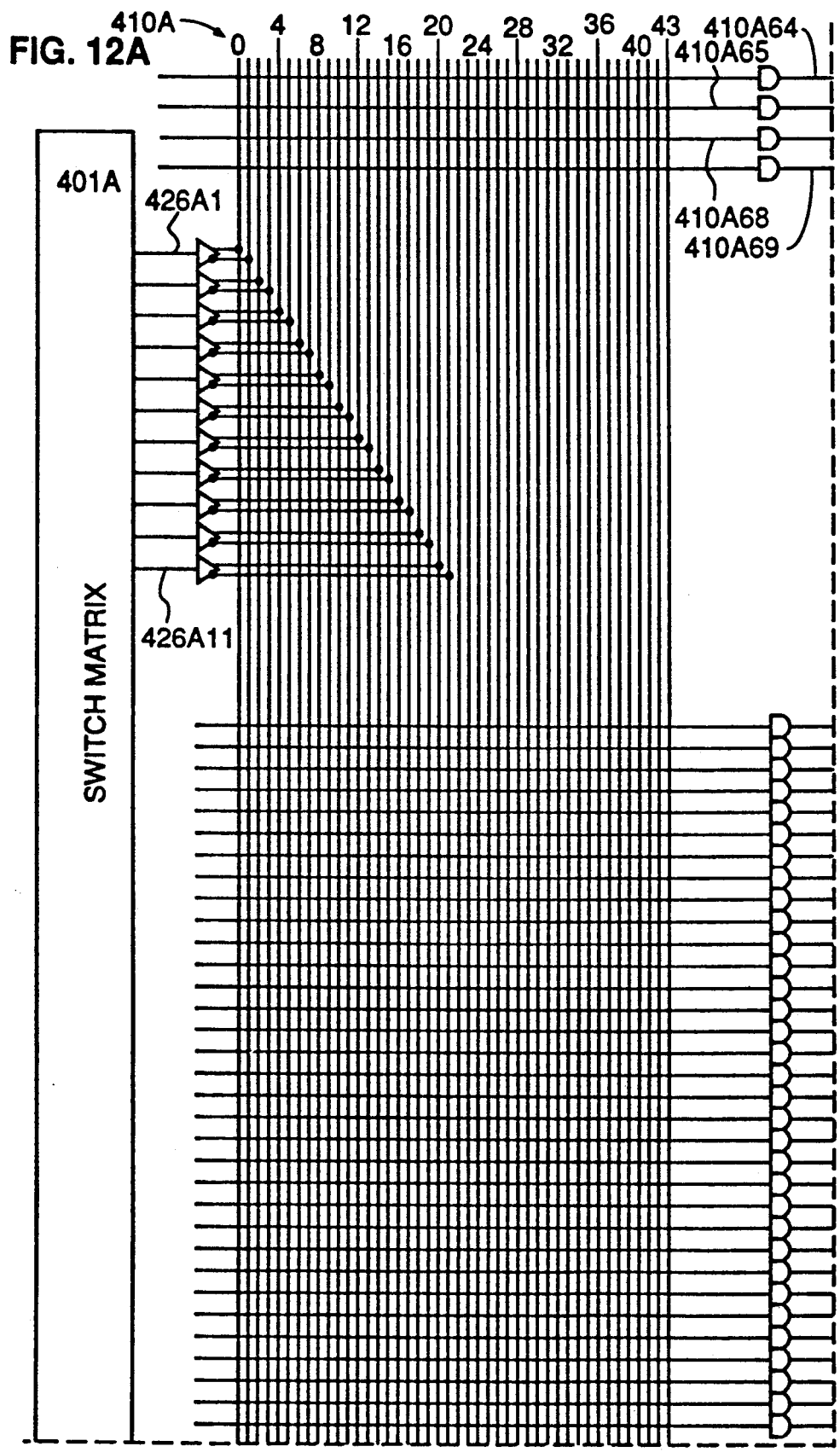
FIG. 12 is a schematic diagram of the programmable logic block in the first family of programmable logic devices 400.
Figure 12B:
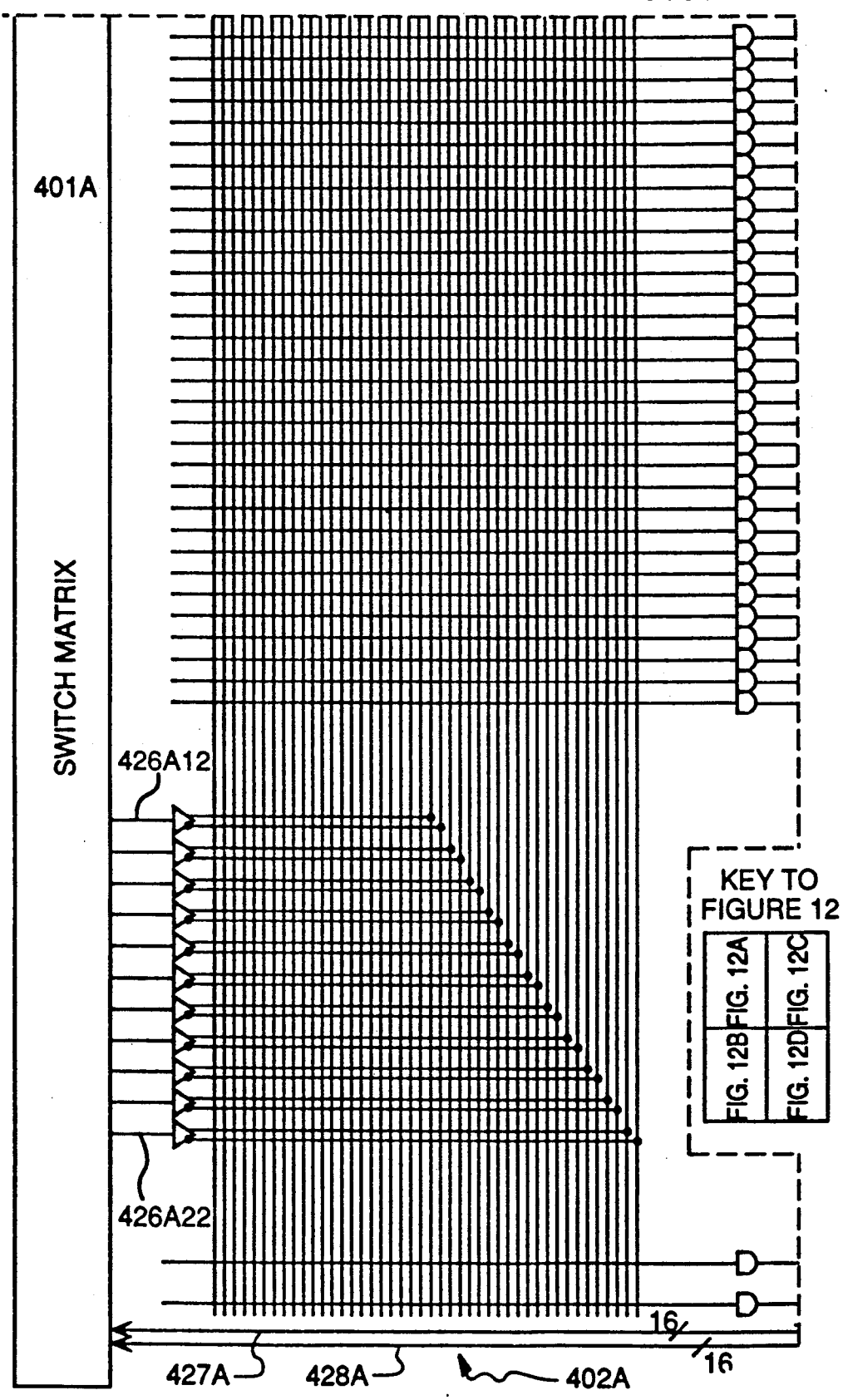
Figure 12C:
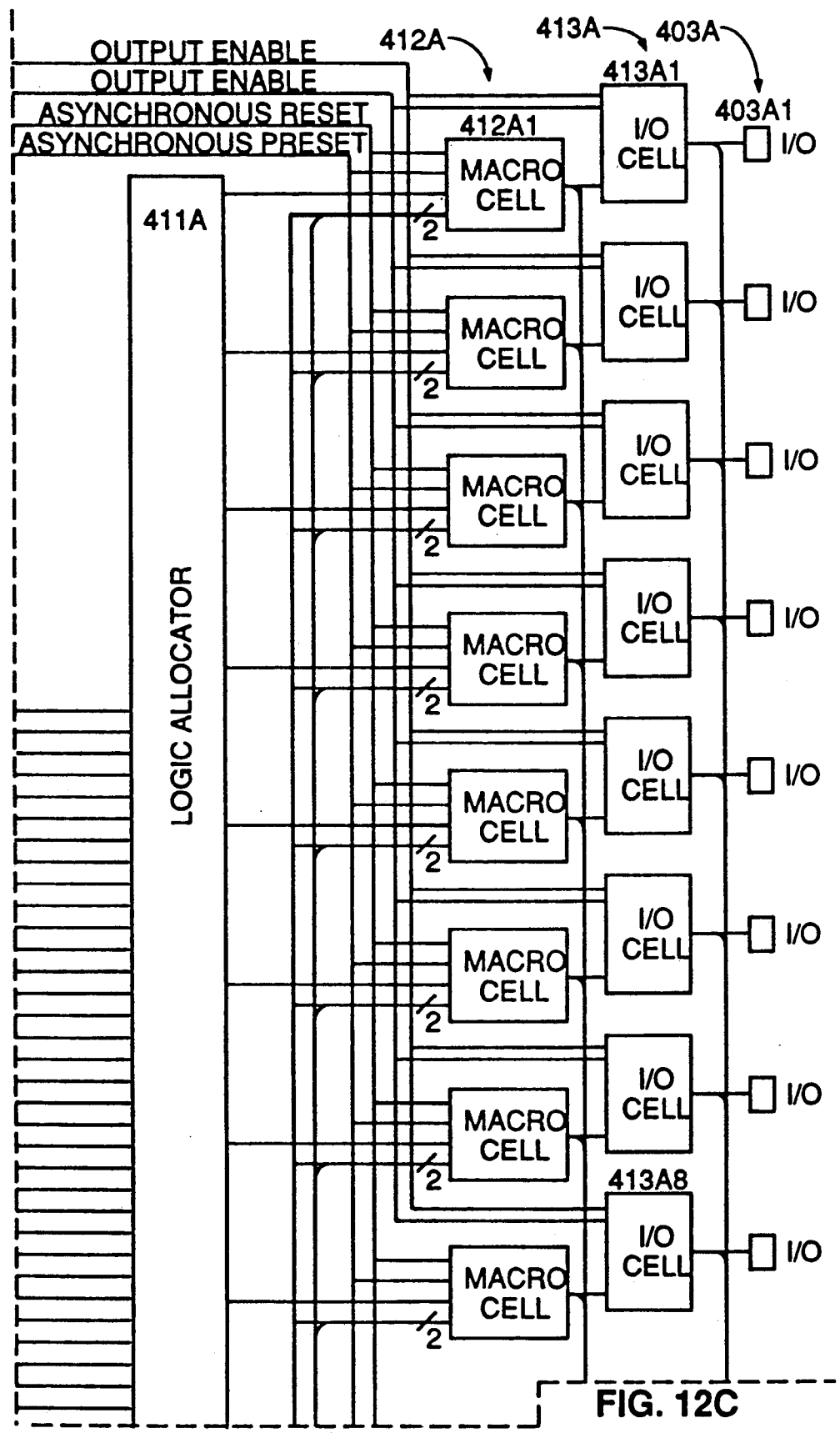
Figure 12D:
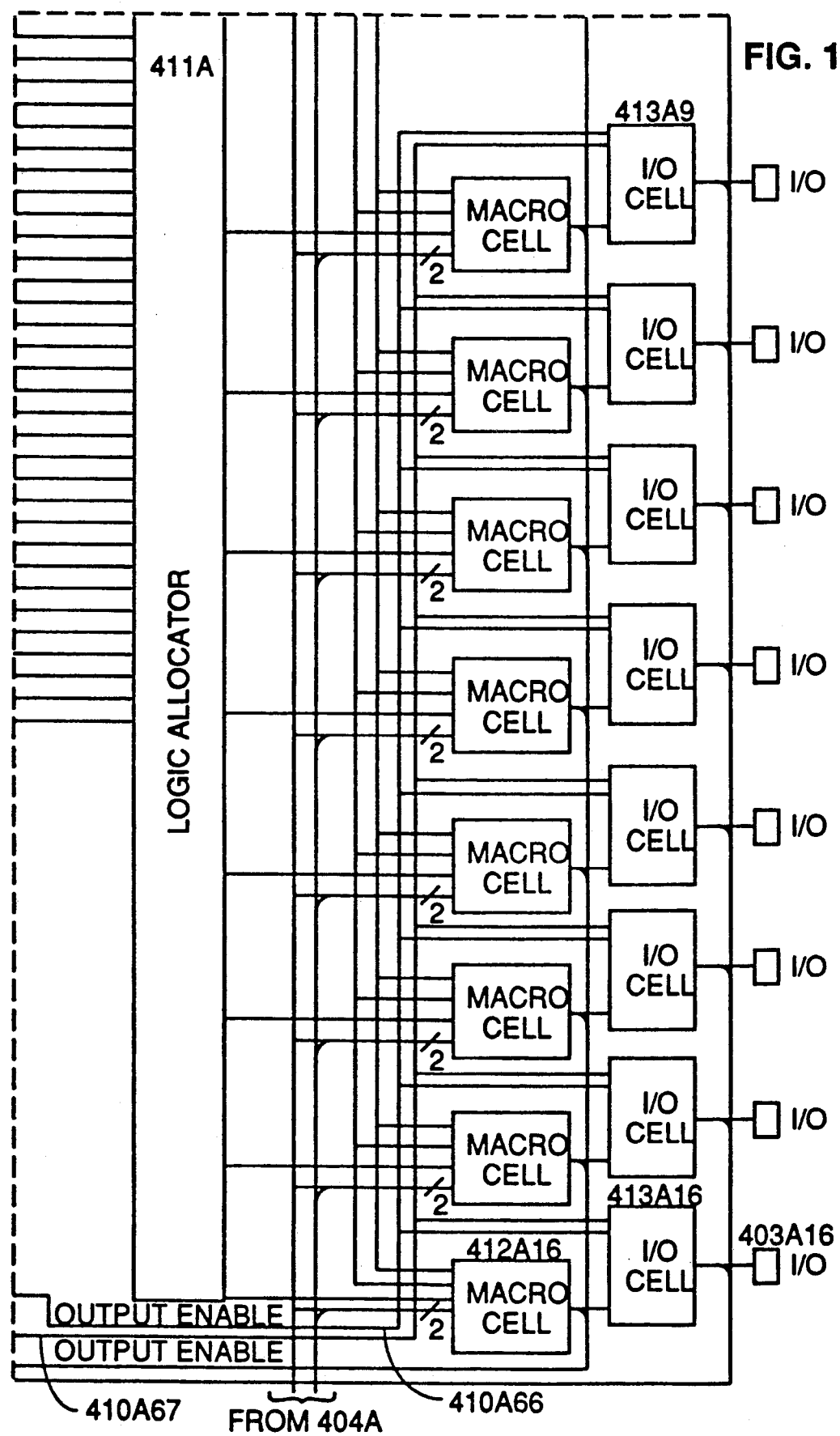
Figure 13A:
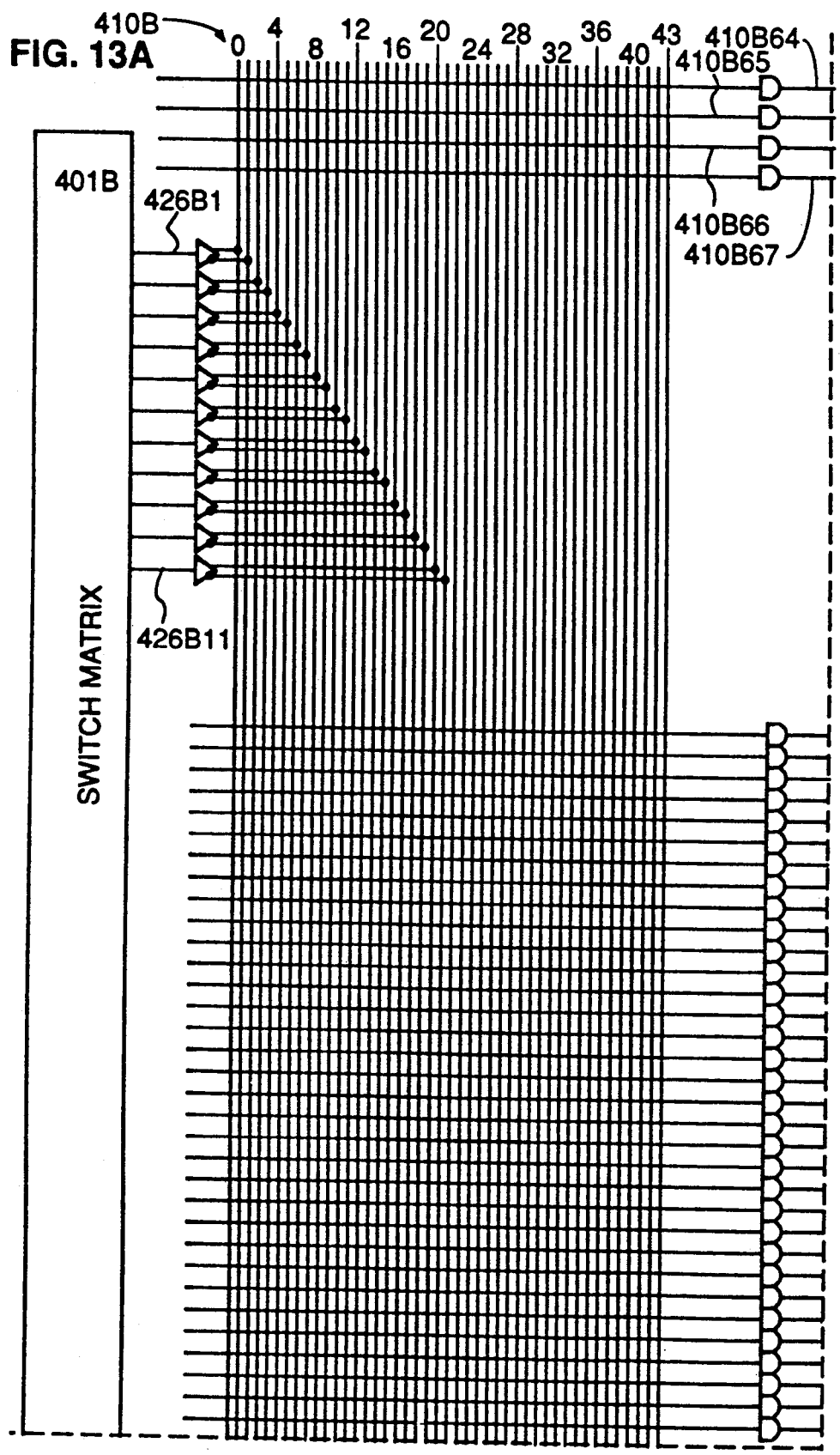
FIG. 13 is a schematic diagram of the programmable logic block in the second family of programmable logic devices 400.
Figure 13B:
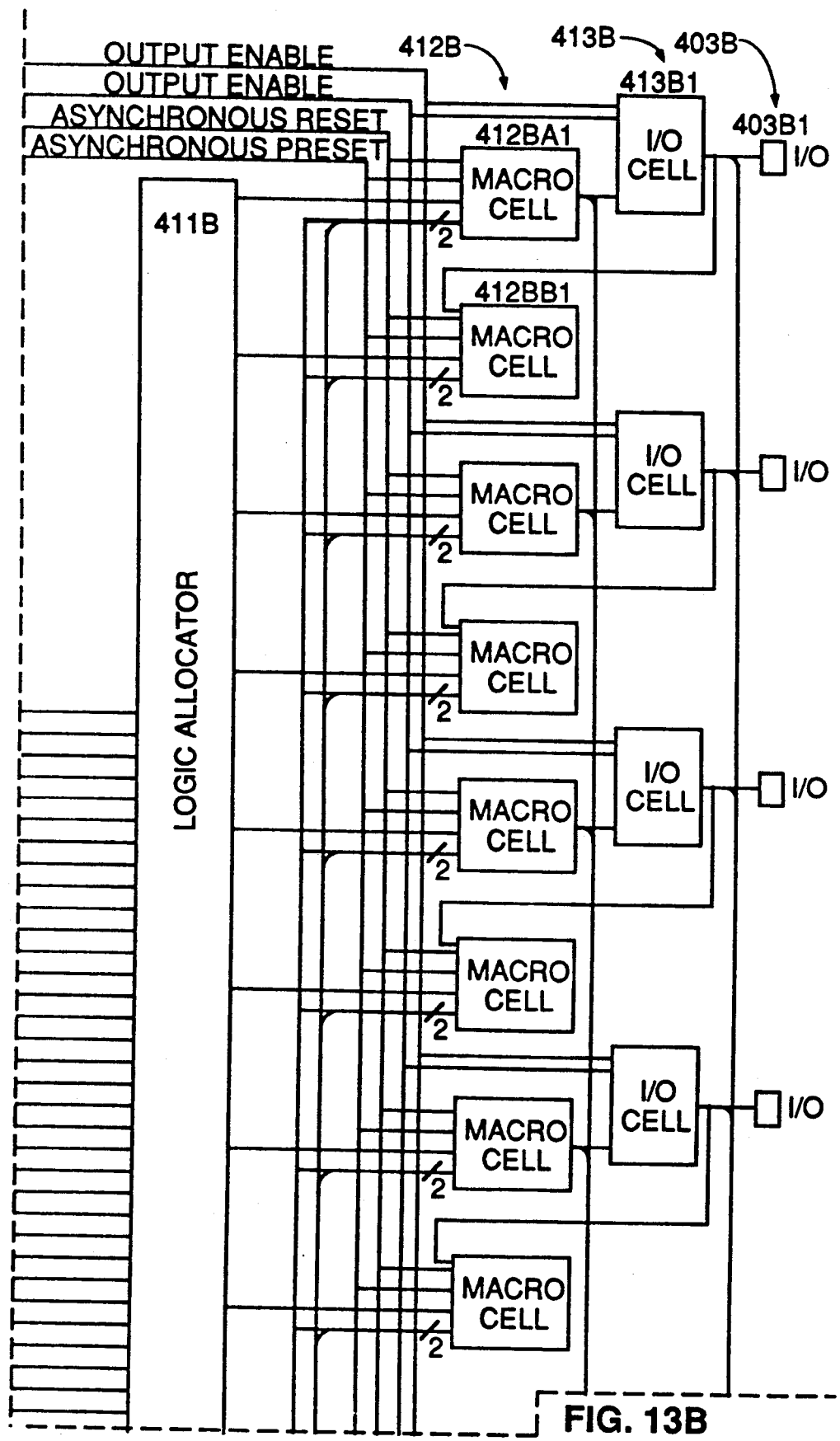
Figure 13C:
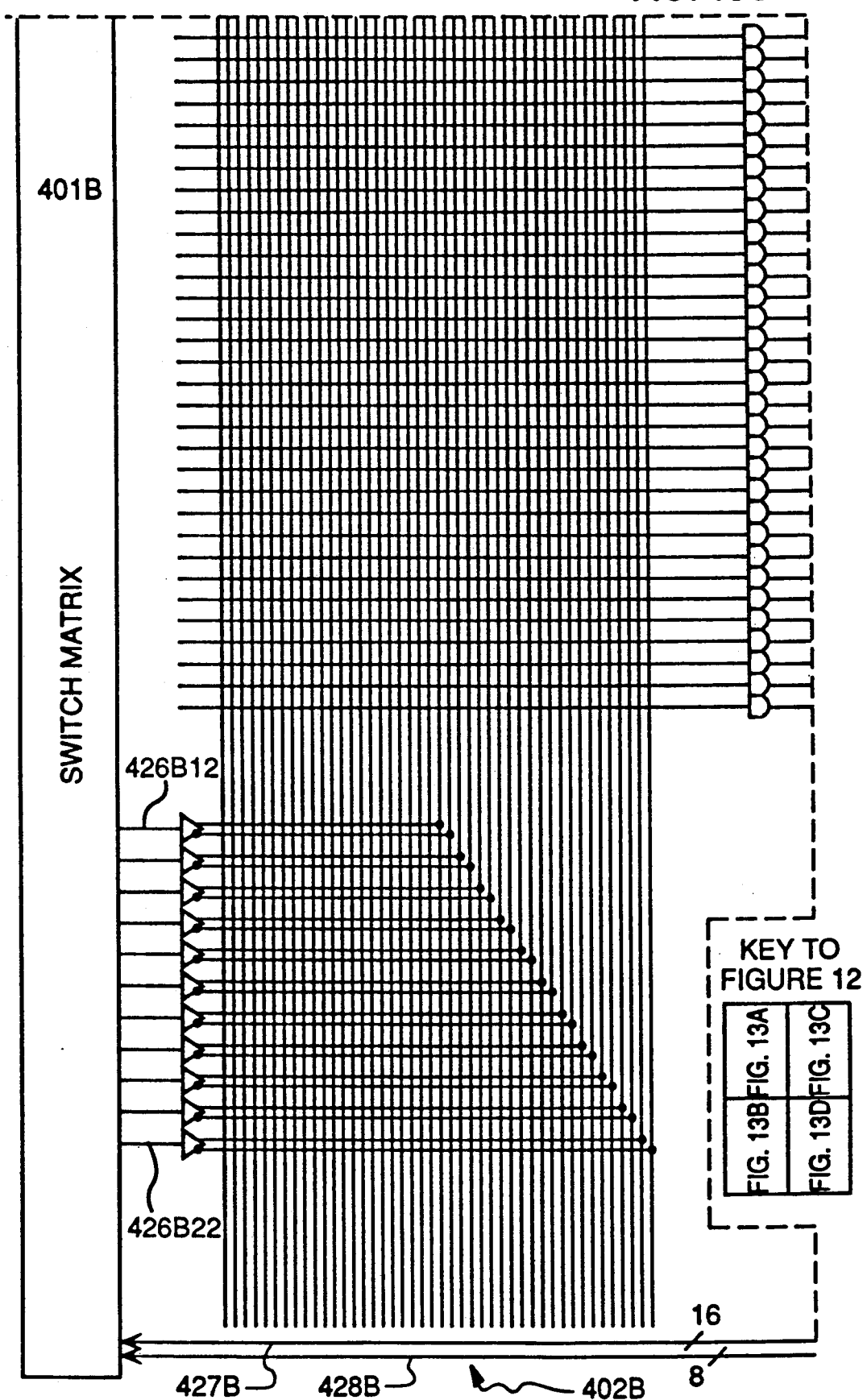
Figure 13D:
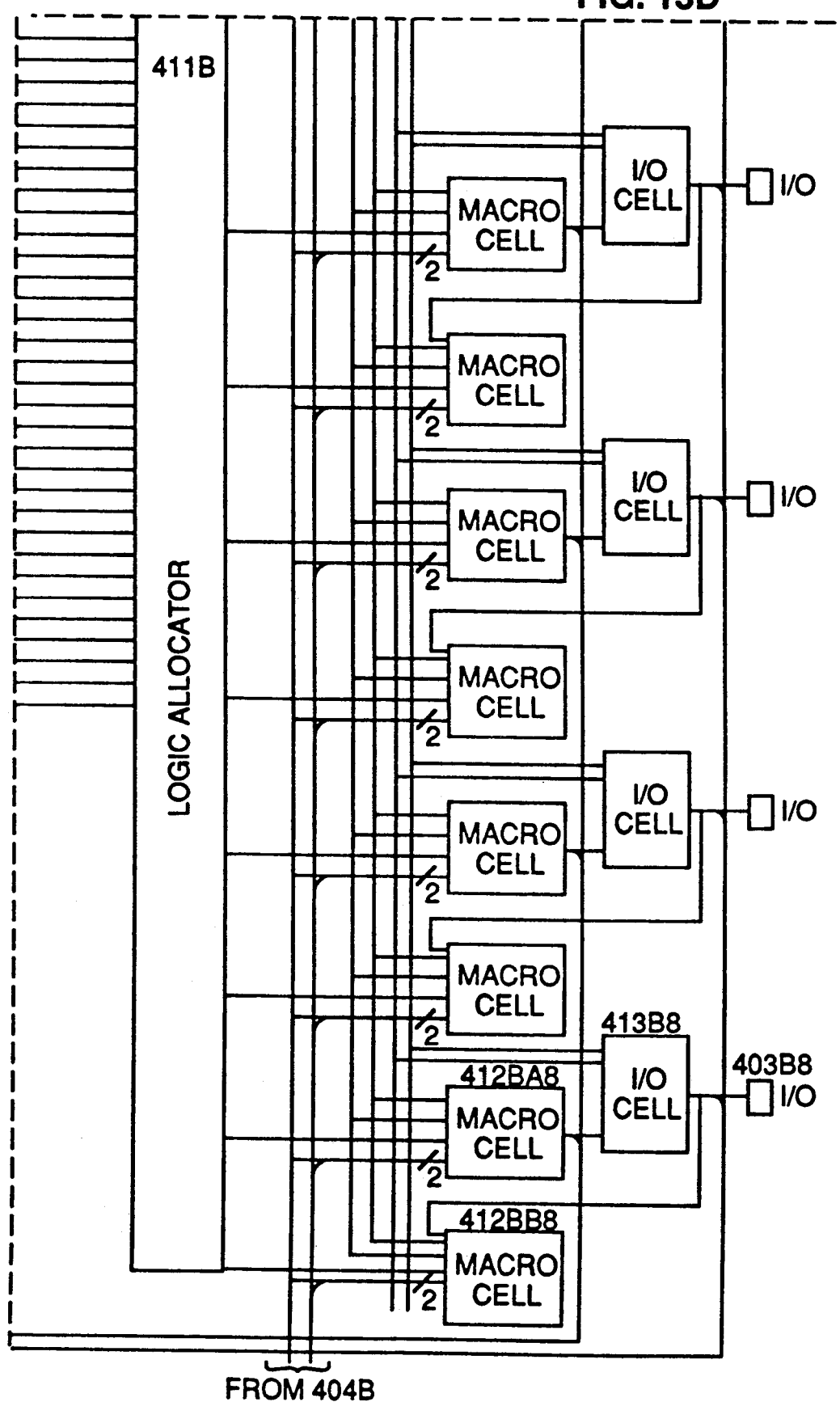

FIG. 11 is a block diagram of the second family of programmable logic devices 400B according to the principles of this invention. As previously described, this family of logic devices 400B has a higher logic to pin ratio than the first family 400A. Thus, in this embodiment, each programmable logic block 402B has only eight I/O pins 403B. Product term array 410B, logic allocator 411B and logic macrocells 412B in programmable logic block 402B are similar to the corresponding devices in programmable logic block 402A (FIG. 10). However, logic macrocells 412B include output logic macrocells 412BA (FIG. 11) and buried logic macrocells 412BB.

In one embodiment of second family 400B, each programmable logic block 402B (FIG. 11) is connected to only eight I/O pins 403B. Thus, only eight of logic macrocells 412B are coupled to eight I/O macrocells 413B which in turn are coupled to eight I/O pins 403B (FIG. 11). The other eight logic macrocells are buried logic cells 412BB that provide feedback signals on line 427B to switch matrix 401B.

The first group of logic macrocells 412BA provides feedbacks signals to switch matrix 401B and signals to I/O macrocells 413B. The second group of logic macrocells 412BB receive signal from I/O pins 403B and provide either feedback signals or input signals to switch matrix 401 and therefore function, as previously described, as buried logic macrocells. Also, as in first family 400A of devices, the second family of devices 400B has either six or ten dedicated input pins 404B of which two may be configured as either direct input pins or clock signal input pins.

Programmable logic block 402A for the first family of programmable logic devices 400 of this invention is shown in more detail in FIG. 12. In particular, the interconnection of switch matrix 401A, product term array 410A, logic allocator 411A, a column of sixteen logic macrocells 412A, a column of sixteen I/O macrocells 412A and a column of sixteen I/O pins 403A are illustrated. Product term array 410A includes a 44 by 70 programmable AND logic array. Sixty-four of the product term lines are provided to logic allocator 411A. In addition, product term array 410A in this embodiment has six additional product term lines 410A64 through 410A69.

In FIG. 12, a single line is shown connecting logic allocator 411A to each logic macrocell 412An (n=1 .. ., 16). However, as explained more completely below, the line between logic allocator 411A and each macrocell 412An represents a multiplicity of lines, e.g. 3 to 4 lines.

I/O macrocells 413A, in this embodiment, are divided into two banks. The first bank of I/O macrocells 413A is defined by I/O macrocells 413A1 to 413A8 that receive the signals on output enable product term lines 410A64 and 410A65. Similarly, the second bank of I/O macrocells 413A is defined by I/O macrocells 413A9 to 413A16 that receive signals on output enable product term lines 410A66 and 410A67. The signals on lines CLK0, CLK1 from dedicated input pins 404A5, 404A6 (FIG. 10) are provided to each logic macrocell 412A (FIG. 12). Similarly, the product term on asynchronous reset line 410A68 and the product term on asynchronous preset line 410A69 are provided to each of logic macrocells 412A.

Programmable logic block 402B for the second family of programmable logic devices 400 of this invention is shown in more detail in FIG. 13. In particular, the interconnection of switch matrix 401B, product term array 410B, logic allocator 411B, a column of sixteen logic macrocells 412B, which has eight output logic macrocells 412BA and eight buried logic macrocells 412BB, a column of eight I/O macrocells 413B and a column of eight I/O pins 403B are illustrated. Product term array 410B includes a 44 by 68 programmable AND logic array. Sixty-four of the product term lines are provided to logic allocator 411B. In addition, product term array 410B in this embodiment has four additional product term lines 410B64 through 410B67.

I/O macrocells 413B, in this embodiment, receive the signals on output enable product term lines 410A64 and 410A65. The signals on lines CLK0, CLK1 from dedicated input pins 404B5, 404B6 (FIG. 11) are provided to each output logic macrocell 412BA and buried logic macrocell 412BB (FIG. 13). Similarly, the product term on the asynchronous reset line 410B66 and the product term on the asynchronous preset line 410B67 are provided to each output logic macrocell 412BA and buried logic macrocell 412BB.

Each I/O pin is connected to a buried logic macrocell so that when the I/O pin is configured as an input pin, the input signal is supplied to both the buried logic macrocell and switch matrix 401B. Thus, the input signal may be either processed by the buried logic macrocell, i.e., may be a registered input signal, and then provided to switch matrix 401B or provided directly to switch matrix 401B as a simple combinatorial input signal.

Switch matrix 401B is coupled to programmable product term array 410B by twenty-two input lines. As described above for device 410A, each input line is connected to a driver that generates the signal on the input line and the complement of the signal on the input line.

Logic allocator 411, i.e., logic allocator 411A (FIG. 12) and logic allocator 411B (FIG. 13) includes a multiplicity of router elements wherein each router element steers the sum of a selected number of product terms from product term array 410 to a selected macrocell. In this embodiment, the selected number of product terms is four and there is one router element for each logic macrocell 412. Hence, as described above, if a programmable logic block has sixteen logic macrocells, the product term array provides sixty-four product terms to logic allocator 411.

Figure 14A:
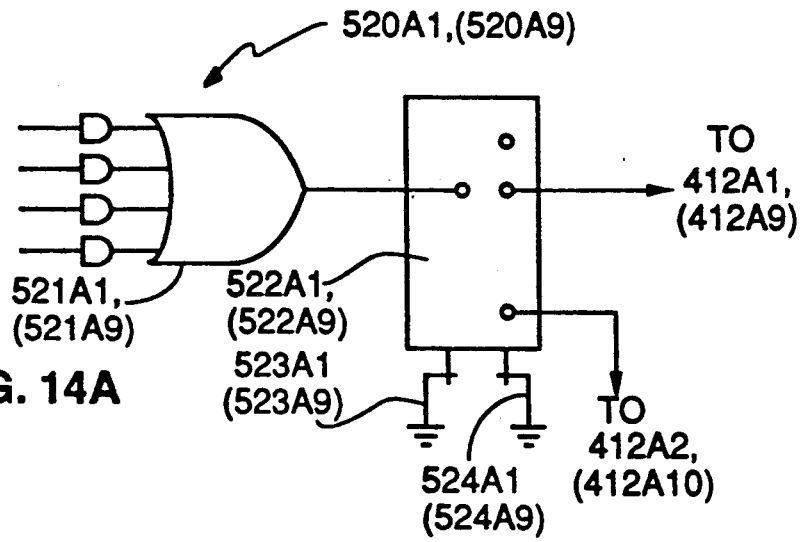
FIGS. 14A through 14C illustrate the router elements in the logic allocator of the first family of programmable logic devices.
Figure 14B:
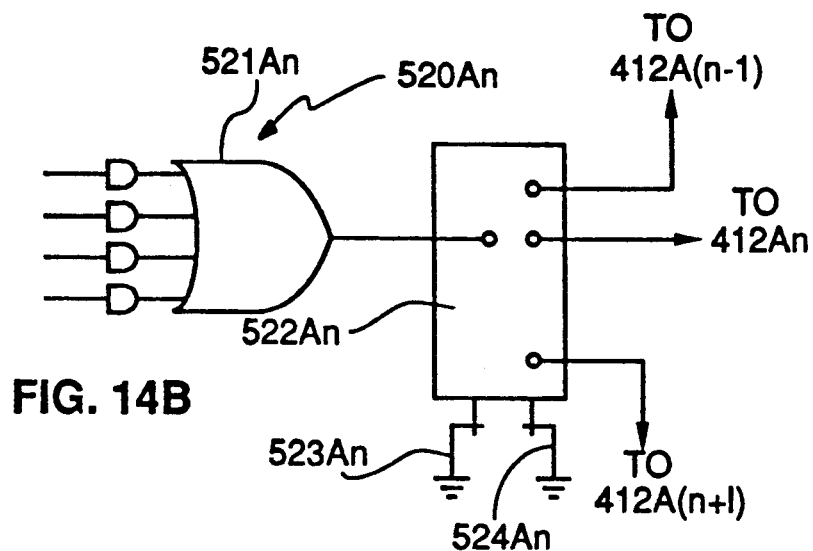
Figure 14C:
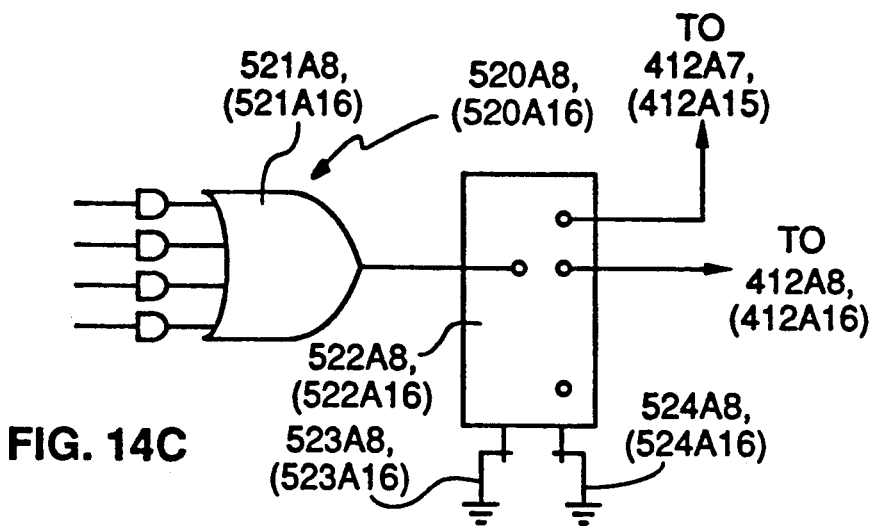

In the first family 400A of logic devices 400, logic allocator 411A includes sixteen router elements 520A (FIG. 14A through FIG. 14C). Each router element 520A includes OR gate 521A, which is driven by signals from four product term lines in product term array 410A, and a programmable one-to-three demultiplexer 522A which has a single input terminal and three output terminals. Architectural configuration cells 523A, 524A are used to form a connection between the input terminal and only one of the output terminals, as explained more completely below. In this embodiment, OR gate 521A is included within router element 520A, but alternatively the OR gate could be included with the AND array so that an programmable AND-OR array generated signals for logic allocator 411A.

Two router elements 520A1, 520A9 (FIG. 14A) of logic allocator 411A may provide a signal to only two macrocells, e.g router element 520A1 drives either logic macrocell 412A1 or logic macrocell 412A2 and router element 520A9 drives either logic macrocell 412A9 or logic macrocell 12A10 (FIG. 12). Similarly, router elements 520A8, 520A16 (FIG. 14C) in logic allocator 411A may provide a signal to only two macrocells, element 520A16 to logic macrocell 12A15 or logic macrocell 412A16 and element 520A8 to logic macrocell 412A7 or logic macrocell 412A8 (FIG. 12). Each of the other twelve router elements 520An (FIG. 14B) in logic allocator 411A may provide a signal to the macrocell 412A(n−1) or to macrocell 412An, or to macrocell 412A(n+1), where n=2, 3, ..., 7, 10, ..., 15.

Thus, in this embodiment, logic macrocells 412A2 through 412A7 and 412A9 through 412A15 may receive up to a maximum of a sum of twelve product terms while logic macrocells 412A1, 412A8, 412A9 and 412A16 may receive up to a maximum of a sum of only eight product terms. Logic macrocells 412A1, 412A8, 412A9 and 412A16 receive only up to a sum of eight product terms because complete wraparound at the end of programmable logic block 402A, e.g., providing a line from multiplexer 522A16 to logic macrocell 412A1, is not supported.

The output terminal of demultiplexer 522A that receives the input signal is determined by the configuration of architectural cells 523A and 524A. The possible values of the architectural cells 523A and 524A are shown in Table VI and the numbers n, n−1 and n+1 are as defined in FIG. 29B.

TABLE 2

| | Product Term Steering | |
|---|---|---|
| Architectural Cell 523A | Architectural Cell 524A | Output Signal Supplied to Logic Macrocell |
| 0 | 0 | reserved |
| 0 | 1 | 412A(n − 1) |
| 1 | 0 | 412An |
| 1 | 1 | 412A(n + 1) |

In Table 2, a zero corresponds to a logical zero and is equivalent to a programmed state and a one corresponds to a logical one and is equivalent to an unprogrammed or erased state. The programming for cells 520A1 and 520A16 is also given by Table 2 where n=1 and n=16 respectively.

In the second family 400B of logic devices 400, logic allocator 411B also includes sixteen router elements 520B (FIG. 15A through FIG. 15D). Each router element 520B includes OR gate 521B, which is driven by signals from four product term lines in product term array 410B, and a programmable one-to-four demultiplexer 522B which has a single input terminal and four output terminals. Architectural configuration cells 523B, 524B are used to form a connection between the input terminal and only one of the output terminals, as explained more completely below.

First router element 520B1 (FIG. 15A) of logic allocator 411B may provide a signal to either output logic macrocell 412BA1 (FIG. 13), or buried logic macrocell 412BB1. Second router element 520B1 (FIG. 15B) may provide a signal to either output logic macrocell 412BA1 (FIG. 15), buried logic macrocell 412BB1 or output logic macrocell 412BA2. Similarly, the last router element 520B16 (FIG. 15D) in logic allocator 411B may provide a signal to buried logic macrocell 412BB7 (FIG. 13), output logic macrocell 412BA8, or buried logic macrocell 412BB8.

Figure 15A:
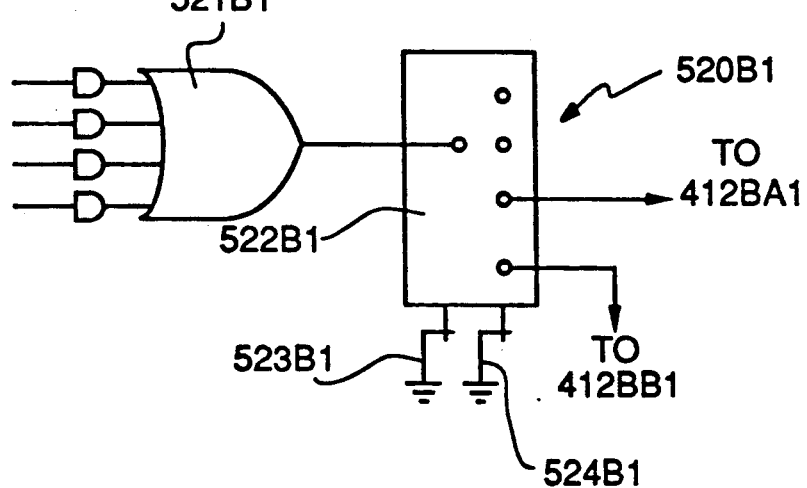
FIGS. 15A, 15B, 15C, and 15D illustrate the router elements in the logic allocator of the second family of programmable logic devices.
Figure 15B:
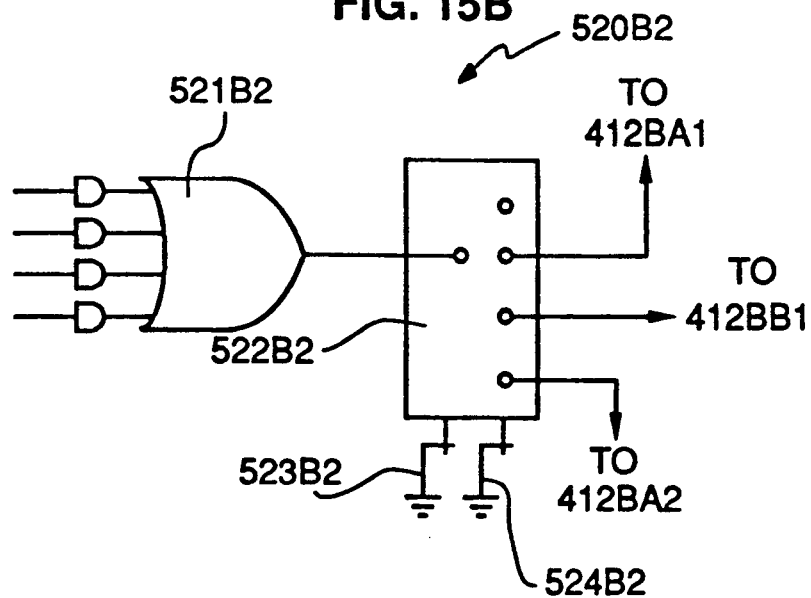
Figure 15C:
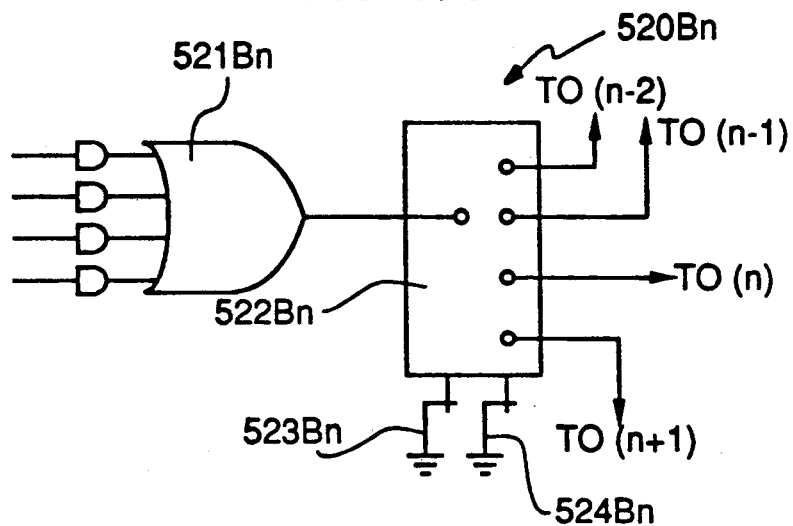
Figure 15D:
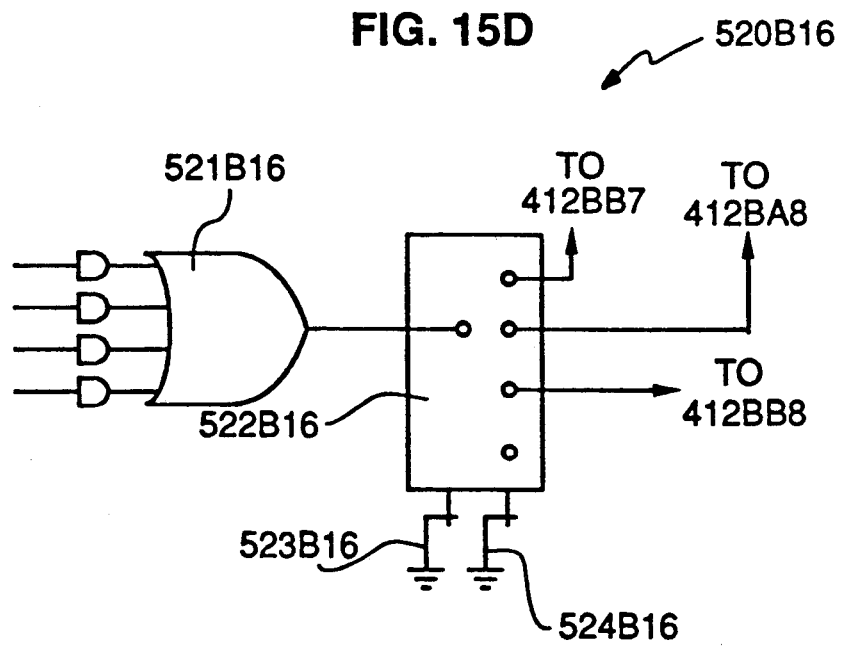

Each of the other thirteen router elements 520Bn (FIG. 15C) in logic allocator 411B may provide a signal to one of four logic macrocells. In FIG. 15C, the four output lines from multiplexer 522Bn are given as lines to macrocells (n−2), (n−1), (n), and (n+1) where n=3,4, ..., 15. Here, n represents the position of router element 520Bn in the column of router elements within logic allocator 411B. To locate the output logic macrocells and buried logic macrocells (n−2), ..., (n+1) to which the output lines n−2, ..., n+1 from programmable multiplexer 522Bn are connected, column 412B of output logic macrocells 412BA and buried logic macrocells 412BB (FIG. 15) are numbered consecutively from one to sixteen where output logic macrocell 412BA1 is one and buried logic macrocell 412BB8 is sixteen, i.e., n=1...16. Line n is then connected to the nth logic macrocell in column 412B.

For example, consider n=7, i.e., router element 520B7. The seventh macrocell in column 412B (FIG. 15) is output logic macrocell 412BA4. Thus, line n from router element 520B7 is connected to output logic macrocell 412BA4 Line n−1 is connected to buried logic macrocell 412BB3 and line n−2 is connected to output logic macrocell 412BA3. Line n+1 is connected to buried logic macrocell 412BB4.

Thus, in this embodiment, logic macrocells 412B3 through 412B14 may receive up to a maximum of a sum of sixteen product terms while logic macrocells 412B1 and 412B15 may receive up to a maximum of only a sum of twelve product terms. Macrocell 412B16 may receive only up to a sum of eight product terms. Again, complete wraparound at the end of programmable logic block 402B is not supported.

The output terminal of demultiplexer 522B that receives the input signal is determined by the configuration of architectural cells 523B and 524B. The possible values of the architectural cells 523B and 524B are shown in Table VII and the numbers n, n−1, n−2, and n+1 are as defined in FIG. 15C.

TABLE 3

| Architectural Cell 523B | Product Term Steering Architectural Cell 524B | Output Signal Supplied to Logic Macrocell |
| --- | --- | --- |
| 0 | 0 | (n − 2) |
| 0 | 1 | (n − 1) |
| 1 | 0 | n |
| 1 | 1 | (n + 1) |

In Table 3, a zero corresponds to a logical zero and is equivalent to a programmed state and a one corresponds to a logical one and is equivalent to an unprogrammed or erased state. The programming for cells 520B1, 520B2 and 520B16 is also given by Table 3 where n=1, 2 and 16 respectively.

Thus, in this embodiment, the numbers of sums of logical product terms for each macrocell 412 in programmable logic block 402 are variable and may range from a sum of one product term to four sums of four product terms, i.e., sixteen product terms, for each logic macrocell.

Figure 16:
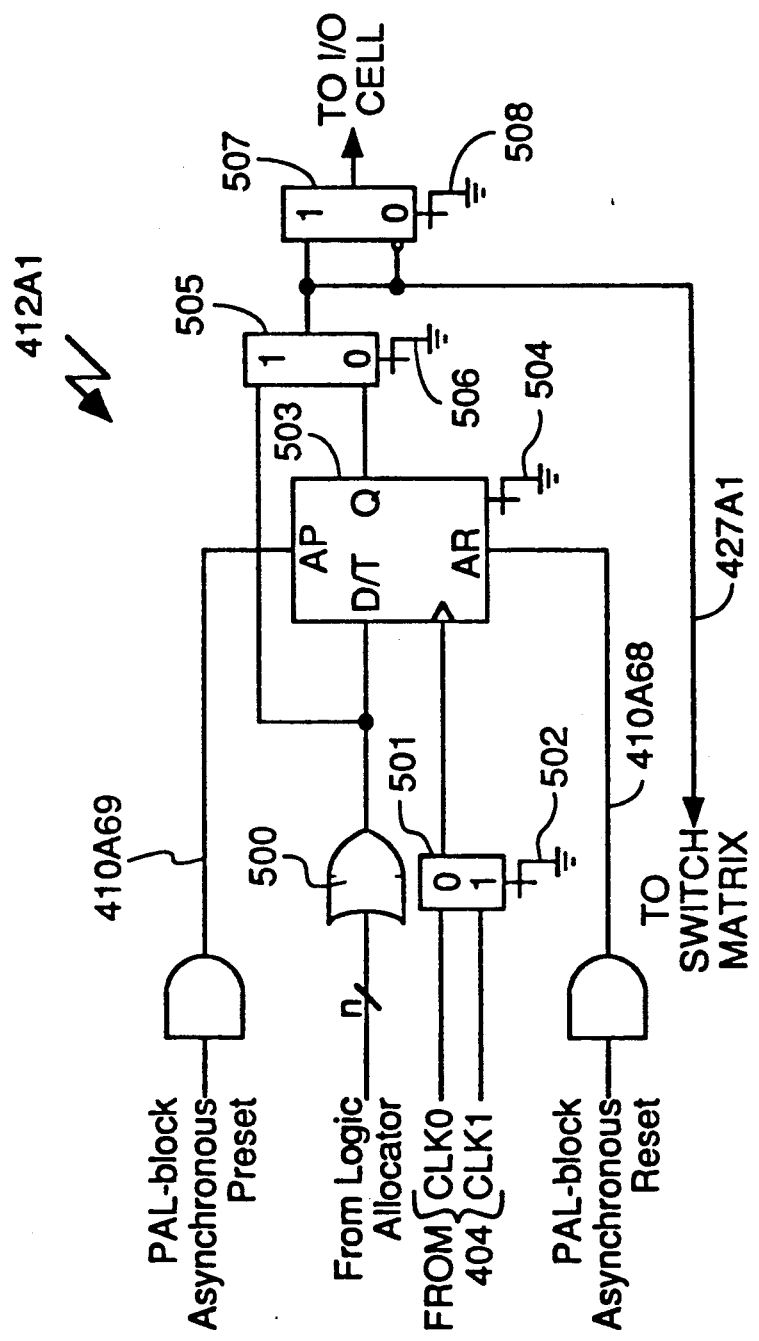
FIG. 16 is a schematic diagram of a programmable logic macrocell in programmable logic devices 400.

Each logic macrocell 412A of this invention in family 400A is identical so that logical output macrocell 412A1, illustrated in FIG. 16, is representative of any logical macrocell 412A in this embodiment. A logic macrocell, according to this invention, may be configured so that the output signals are either registered or combinatorial with an active high or an active low polarity. When the logic macrocell is used as a register, the logic macrocell can be further configured as a D type or T type flip-flop. Programmable polarity along with the built in T type flip-flop capability comprises a number of product terms required for implementing some logic functions. The different configurations of logic macrocell 421A are achieved by programming the four architectural cells in the macrocell.

As previously described, the programmable logic block of second family 400B of programmable logic device 400 of this invention includes a plurality of logic output macrocells 412BA and a plurality of buried logic macrocells 412BB. Logic macrocell 412BA, sometimes referred to as an output logic macrocell, is similar to logic macrocell 412A1 and the description of macrocell 412A1 is incorporated herein by reference.

Figure 17:
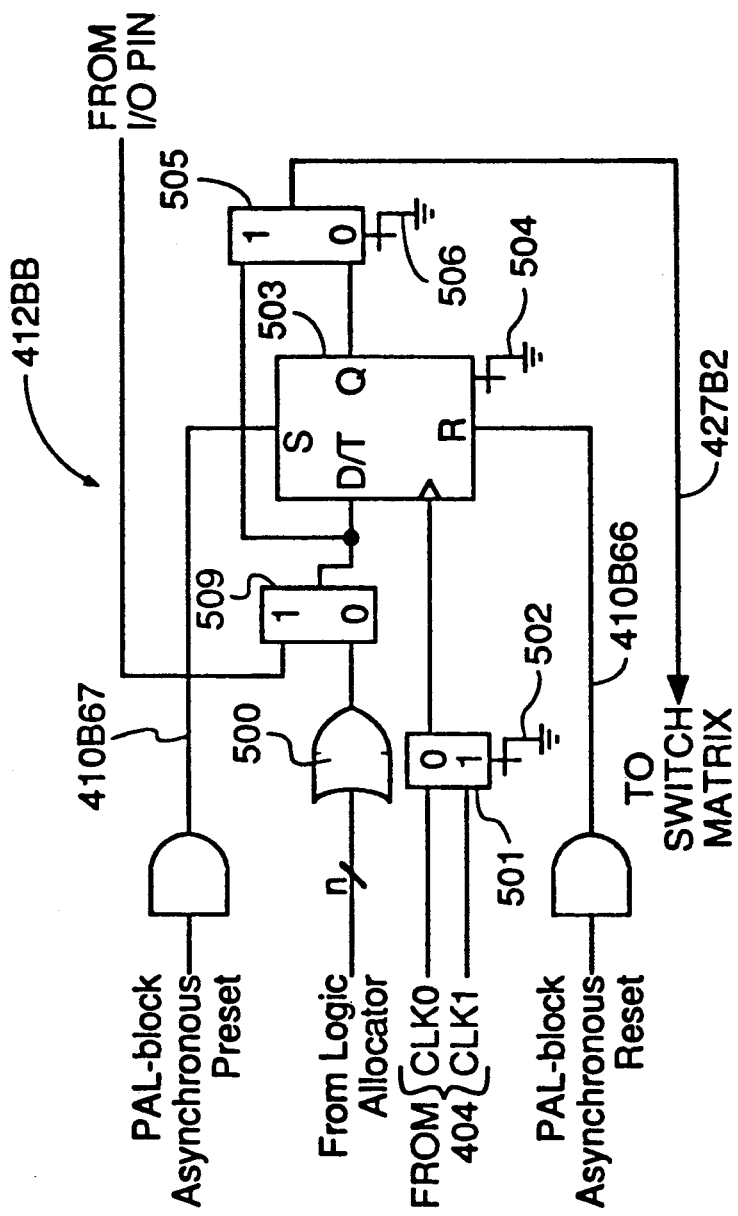
FIG. 17 is a schematic diagram of a programmable buried logic macrocell in programmable logic devices 400.

Buried logic macrocell 412BB (FIG. 17) is also similar to output logic macrocells 412A, 412BA (FIG. 16) except buried logic macrocell 412BB does not send an output signal to an I/O macrocell and therefore does not have polarity control multiplexer 505. The output signal from buried logic macrocell 412BB (FIG. 17) is an internal feedback signal on line 427B2 to switch matrix 401B. A significant feature of buried logic macrocell 412BB is the dual mode of operation, i.e., the buried logic macrocell's ability to function either as an output cell with feedback to switch matrix 401 or as an input cell.

Both output logic macrocells 412A, 412BA and buried logic macrocells 412BB are clocked on an individual macrocell basis by a signal from one of the two synchronous clock input pins. This clocking allows the user to implement flexible and multiple state machines in a single device. Further, if either of the clock input pins is not used as a clock signal source, the pin is available as an input pin to the switch matrix.

As previously described, all the logic macrocells including any buried logic macrocells in the programmable logic block are controlled by a common asynchronous reset product term and a common asynchronous preset product term. Thus, for each programmable logic block, all the flip-flops in the logic macrocells whether in an output logic macrocell or a buried logic macrocell are simultaneously initialized.

Figure 18:
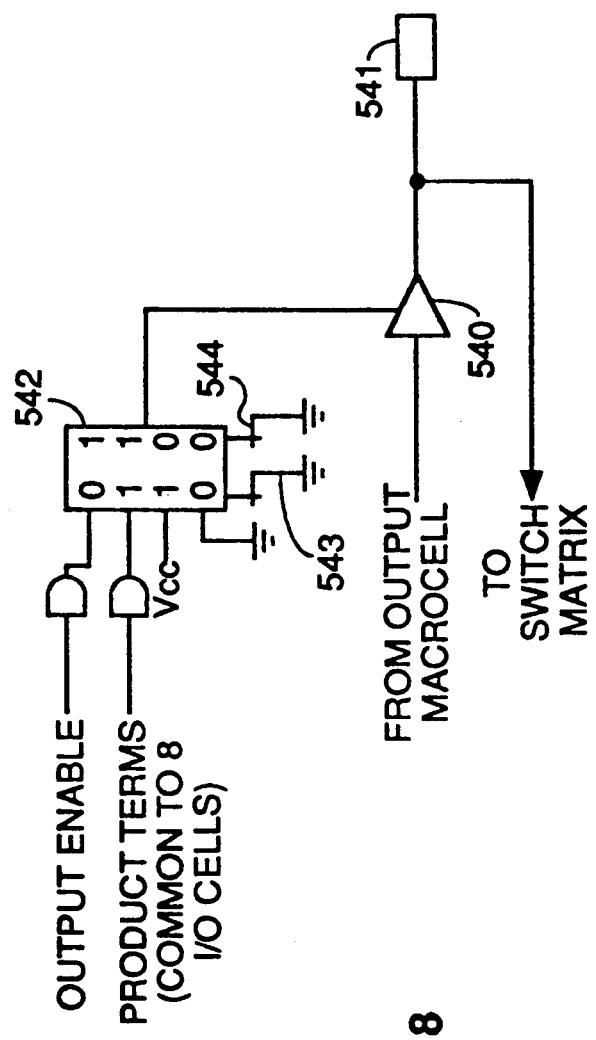
FIG. 18 is a schematic diagram of an I/O macrocell in programmable logic devices 400.

I/O macrocell 413 of this invention is illustrated in FIG. 18. When power supply voltage Vcc is supplied to tristate buffer 540, buffer 540 is permanently enabled for use as an output buffer and conversely when the control terminal is grounded, buffer 540 is tristated so that I/O pin 541 functions permanently as an input pin. When either of the output enable terms is applied to the control terminal, the I/O pin functions as a bidirectional I/O pin which is controlled by the product term. As previously explained, the two product terms are common to eight I/O cells.

Switch matrix 401A for the first family 400A of PLDs includes a multiplicity of four-to-one programmable multiplexers and a multiplicity of five-to-one programmable multiplexers. In FIGS. 19A and 19B the input lines to each of the programmable multiplexers are given. Notice two of the lines in the switch matrix are connected directly to switch matrix output lines.

For ease of presentation, blocks 402A-1 and 402A-2 are represented as blocks "A" and "B" respectively in FIGS. 19A and 19B. Similarly, logic macrocell 412A1-1 becomes A1 and logic macrocell 412A1-2 becomes B1 so that the macrocells in block 420A-1 range from macrocell A1 to macrocell A16 and in block 402A-2 from macrocell B1 to B2. The feedback lines are represented by the macrocell number. The I/O pin associated with a macrocell is represented by the macrocell number followed by a carat " ". Dedicated input pins 404A are numbered I1 to I6.

As illustrated in FIGS. 19A and 19B sixteen of the input signals for both programmable logic blocks 402A-1, 402A-2 are derived from four different sources, i.e., two I/O pins sources and two macrocell feedback sources rotated to allow dual feedback capability.

Each programmable multiplexer has two architectural cells which are used to configure the multiplexer so that only one of the input lines is connected to the output line. The resource selection for each group of multiplexers is presented in Tables 4 and 5.

TABLE 4

Four-to-One Programmable Multiplexer Signal Selection in Switch Matrix 401A of Family 400A

| Architectural Cell 1 | Architectural Cell 2 | Global Signal Selections |
|---|---|---|
| 0 | 0 | I/O pin input signals from PLB 402A-1 |
| 0 | 1 | Feedback signals from logic macrocells in PLB 402A-1 |
| 1 | 0 | I/O pin input signals from PLB 402A-2 |
| 1 | 1 | Feedback signal from logic macrocells in PLB 402A-2 |

Note in Table 5, the multiplexers receive input signals from only a single programmable logic block so that only multiplexers associated with block 402A-1 are given in Table 5. The architectural cells configuration for block 402A-2 is the same as that shown for block 402A-1 except the sources are from block 402A-2.

TABLE 5

Signal Selection for Five-to-One Programmable Multiplexer in Switch Matrix 401A of Family 400A

| Architectural Cell 1 | Architectural Cell 2 | Architectural Cell 3 | Global Signal Selections |
|---|---|---|---|
| 0 | 0 | 0 | I/O pin input signals from PLB 402A-1 |
| 0 | 1 | 0 | Feedback signals from logic macrocells in PLB 402A-1 |
| 1 | 0 | 0 | I/O pin input signals from PLB 402A-1 |
| 1 | 1 | 0 | Feedback signals from logic macrocells in PLB 402A-1 |
| 0 | 0 | 1 | Signal from dedicated input pin |

Notice that in switch matrix 401A each input signal other than the dedicated input pin signals has at least two different entry points to a programmable logic block. Thus, the input signal sources to switch matrix 401A are appropriately rotated so that for any logic macrocell and the I/O pin associated with that logic macrocell, both the logic macrocell feedback signal and the signal on the corresponding I/O pin are available to each programmable logic block in device 400A.

Also notice that each programmable logic block may receive the same input signals or different input signals. This allows the structure to function either as a monolithic array with a maximum of twenty-two inputs or two separate relatively independent split arrays with a total maximum number of forty-two input signals.

Switch matrix 401B for the first family 400B of the programmable logic devices of this invention is illustrated in FIGS. 20A and 20D. Switch matrix 401B includes a multiplicity of twelve-to-one programmable multiplexers and a multiplicity of four-to-one programmable multiplexers and two input lines connected directly to two output lines. FIGS. 20A through 20D show the multiplexer input lines for each output line.

For ease of presentation, programmable logic blocks 402B-1 through 402B-4 are represented as blocks "A", "B", "C", and "D", respectively in FIGS. 20A through 20D. Similarly, output logic macrocells and buried logic macrocells are represented by the block letter and the number of the position of the macrocell in column 412B. Accordingly, the output logic macrocells and buried macrocells for programmable logic block A are numbered A1 through A16 where A1, A3, ..., A15 are output macrocells and numbers A2, A4, ..., A16 are buried macrocells. The macrocells in the other programmable logic blocks are similarly renumbered. As previously indicated for switch matrix 401A, the feedback lines are represented by the macrocell number. The I/O pin associated with a macrocell is represented by the macrocell number followed by a carat " ". The dedicated input pins 404B are numbered I1 through I6 respectively.

Sixteen of the input signals for each programmable logic blocks 402B-1, 402B-2, 402B-3, 402B-4 are derived from twelve different sources, i.e., four I/O pin sources, four output logic macrocell feedback sources and four buried logic macrocell feedback sources, rotated to allow dual feedback capability.

Each programmable multiplexer in switch matrix 401B has cells which are used to configure the multiplexer so that only one of the input lines is connected to the output line. The resource selection for each group of multiplexers is presented in Table 6 and 7.

TABLE 6

Twelve-to-One Programmable Multiplexer Selection in Switch Matrix 401B

| Cell 1 | Cell 2 | Cell 3 | Cell 4 | Global Signal Selection |
|---|---|---|---|---|
| 0 | 0 | 0 | 0 | I/O pin input signals from PLB 402B-1 |
| 0 | 0 | 0 | 1 | Feedback signals from output logic macrocells in PLB 402B-1 |
| 0 | 0 | 1 | 0 | Feedback signals from buried logic macrocells in PLB 402B-1 |
| 0 | 0 | 0 | 1 | I/O pin input signals from PLB 402B-2 |
| 0 | 1 | 0 | 0 | Feedback signals from output logic macrocells in PLB 402B-2 |
| 0 | 1 | 0 | 1 | Feedback signals from buried logic macrocells in PLB 402B-2 |
| 0 | 1 | 1 | 0 | I/O pin input signals from PLB 402B-3 |
| 0 | 1 | 1 | 1 | Feedback signals from output logic macrocells in PLB 402B-3 |
| 1 | 0 | 0 | 0 | Feedback signals from buried logic macrocells in PLB 402B-3 |
| 1 | 0 | 0 | 1 | I/O pin input signals from PLB 402B-4 |
| 1 | 0 | 1 | 0 | Feedback signals from output logic macrocells in PLB 402B-4 |
| 1 | 0 | 0 | 1 | Feedback signals from buried logic macrocells in PLB 402B-4. |

TABLE 7

Four-to-One Programmable Multiplexer Selection in Switch Matrix 401B

| Architectural Cell 1 | Architectural Cell 2 | Global Signal Selections |
|---|---|---|
| 0 | 0 | I/O pin input signals from PLB 402B-n |
| 0 | 1 | Feedback signals from output logic |

TABLE 7-continued

| Four-to-One Programmable Multiplexer Selection in Switch Matrix 401B | | |
|---|---|---|
| Architectural Cell 1 | Architectural Cell 2 | Global Signal Selections |
| | | macrocells in PLB 402B-n |
| 1 | 0 | Feedback signals from buried logic macrocells in PLBB-n |
| 1 | 1 | Dedicated Input pin signal |

Notice that in switch matrix 401B each input signal other than the dedicated input pin signals has at least two different entry points to a programmable logic block. Thus, the input signal sources to switch matrix 401B are appropriately rotated so that for any output logic macrocell and the I/O pin associated with that output logic macrocell, both the output logic macrocell feedback signal and the signal on the corresponding I/O pin are available to each programmable logic block in device 400B. Also notice that each programmable logic block may receive the same input signals or different input signals. This allows the structure to function either as a monolithic array with a maximum of twenty-two inputs or four separate relatively independent split arrays with a total maximum number of seventy input signals.

Thus, programmable logic devices 400A, 400B of this invention have a plurality of programmable connections. The programmable connections are a multiplicity of electrically erasable cells. The number of cells depend upon the specific implementation, but the number of cells for device 400A (FIG. 10) and for device 400B (FIG. 11) are given in Table 8 and Table 7 respectively.

TABLE 8

| Device 400A | | |
|---|---|---|
| E2 cells for the AND-OR array | 2 × 44 × 70 = | 6,160 |
| E2 cells for the programmable logic macrocells | 2 × 16 × 4 = | 128 |
| E2 cells for the programmable input/output macrocells | 2 × 2 × 16 = | 64 |
| E2 cells for the logic allocator | 2 × 2 × 16 = | 64 |
| E2 cells for the switch matrix | 2 × 2 × 16 = 2 × 3 × 4 = | 64 24 |
| | TOTAL | 6,504 |

TABLE 9

| Device 400B | | |
|---|---|---|
| E2 cells for the AND-OR array | 4 × 44 × 68 = | 11,968 |
| E2 cells for the programmable logic macrocells | 4 × 16 × 4 = | 256 |
| E2 cells for the programmable input/output macrocells | 4 × 2 × 8 = | 64 |
| E2 cells for the logic allocator | 4 × 2 × 16 = | 128 |
| E2 cells for the switch matrix | 4 × 4 × 16 = 4 × 2 × 4 = | 256 32 |
| | TOTAL | 12,704 |

A partial PDB 121 is given in FIGS. 21A through 21E. The information, as explained more completely below, is for programmable logic device 400A (FIG. 4). PDB 121 is a text file created by a standard editor. PDB 121 is "free formatted" with either spaces or tabs separating elements. Each line (record) must be a complete item and stand-alone, however. The first non-blank character in each record indicates the format of the following information. Ten characters (";@#%&>]>[$") are interpreted by resource allocation means 110. No special order is assumed for the records, although they are discussed herein in logical top-down order.

Examples of each record type are given with the syntax for that record. Brackets and ellipses ("[. . .]") indicate optional repetitions of a selected syntax element. Comment lines may be inserted anywhere and begin with a semi-colon (";").

PDB 121 is terminated with a logical end of file marker ("$"). Any text remaining in PDB 121 after the logical end of file marker is ignored and not processed. An example of an end of file record is:

$"end of File".

PDB file 121 begins with error messages used by resource allocation means 110. The format for an error message record is:

?<FLAG><SEVERITY CODE><ERROR MESSAGE>.

<FLAG> is a coding flag used by resource allocation means 110 to address the error message. <SEVERITY CODE> describes the severity of the error and is used by resource allocation means 110 in the error recovery process. For example, a severity code of "−3" terminates processing by resource allocation means 110 <ERROR MESSAGE> is the information provided to the user when resource allocation means 110 detects an error that generates the flag associated with the error message. The items "%1" and "%2" in the error message are replaced with text supplied by resource allocation means 110.

The physical design begins with a header record ("@") that indicates the partname, a number to represent the part, the total number of device pins, the number of programmable logic blocks in the device, the number of input lines from the switch matrix to each programmable logic block, the total number of signal pins, the total number of I/O macrocells, the total number of logic macrocells (output and buried) and the total number of product terms available for logic functions. An example of a header record is line H1 in FIG. 21B. Notice that the header record is included twice. Resource allocation means 110 searches for the header record and when an "@" is detected, the next record is read as the header record.

Line DBG1 in FIG. 21B is a debug record. The debug record is terminated with a "*". Line DBG1 has a debug print out flag, <NU>, which is not used, and a series of configuration codes that indicate the number of resources left in a programmable logic block when the programmable logic block is considered full by resource allocation means 110. The values of the configuration codes determine the "slack" resources in each programmable logic block so that resource allocation means 110 can successfully fit the user design to the device. "Slack" resources are those resources within the programmable logic block that are reserved so as to indicate that the programmable logic block is filled prior to the exhaustion of all the actual physical resources of the block. This approach provides some flexibility in resource assignment and therefore a higher probability of successfully fitting the user design to the programmable logic device.

The resources monitored are logic equations, pin macrocells, product terms and input signals to the product term array. The print outflag determines the information printed out for the user by resource allocation means 110. A small number, such as 0, 1, or 2, represents normal output ranging from a small output to a large output respectively. If a large number, e.g., 15 is selected, a printout useful for software debugging (display of internal variables) of resource allocation means 110 is generated.

In PDB 121, programmable logic blocks 402 are designated by a capital letter. The letter "A" represents block 402-1 (FIG. 4) and letter "B" represent block 402-2. The letter "I" designates dedicated input pins (these pins are processed as block 0). Similarly, logic macrocells and the I/O macrocells are numbered 1 to 16 in device 400A. In device 400B, the output logic macrocells and the buried logic macrocells are number 1 to 16 so that odd numbered logic macrocells are output logic macrocells and even numbered logic macrocells are buried logic macrocells.

The next record Pinl (FIG. 21B), record type "#", is the global pin list of all ports of the programmable logic device that interfaced to the outside world. The format for a record in the global pin list is:

{<Blk><Macro #><Pin #><UR.h
UR.v><F1><F2><Type>...}.

<Blk> is either the programmable logic block associated with the pin or a dedicated input pin. The values for <Blk> are A, B, ... for programmable logic blocks and I for a dedicated input pin. Notice in FIG. 21B that ground and power pins for device 400A are given in comment lines where "G" represents a ground pin and "P" represents a power pin. In one embodiment, however, eight programmable logic blocks are allowed [A, B, ..., H], but other embodiments may include 16, 24 or 32 blocks for example.

<Macro #> is (i) either the number, ranging from 1 to 16 for device 400A, of the output logic macrocell that is coupled to the pin for pins associated with a programmable logic block or (ii) the number, ranging from 1 to 6 for device 400A, of the dedicated input pin otherwise.

<Pin #> is the number of the physical pin for device 400A. <UR.h UR.v><F1><F2> are locations for text labeling on the pin map in output documentation 140. <UR.h UR.v> represent the row and column location respectively of the pin in the pin map. <F1> is either zero or one as is <F2>. <F1> and <F2> are position and justification flags for the label associated with the pin in the pin map, e.g., the label positioned on top, bottom, right or left side of device in the pin map. Finally, <Type> is the attribute of the pin where an attribute is a member of the set {Input, Clock/Input, I/O Pin} is designated by the corresponding member of the set {A, B, C}. A star "*" terminates pin entry. This format allows more than one pin definition to occur on one line.

One or more definitions of physical programmable logic blocks follow in PDB 121, each definition containing multiplexer connections and source fanout lists of the programmable interconnection resources of the device. For each of these lists, the second item of each record is the name of the macrocell that is being described. In all cases a letter and number is used for reference. The letter refers to the programmable logic block and the number to the macrocell.

The programmable interconnections present in programmable logic device 400, in particular the interconnections in programmable switch matrix 401, are programmable multiplexers which are modeled as a list of alternate links, one of which may be active at any time. Thus, in PDB 121 the possible links must be identified.

As described above, each programmable logic block 402 has twenty-two input lines from the switch matrix 401. The switch matrix record ("%"), designates the possible connections to each input line for each programmable logic block. Recall switch matrix 401A has 16 four-to-one programmable multiplexers and four five-to-one programmable multiplexers for each programmable logic block plus two dedicated input pin lines that are input lines to the programmable logic block.

The portion of the switch matrix associated with at least one programmable logic block must be specified using switch matrix records. However, if the switch matrix is symmetric for each programmable logic block in the device, complete switch matrix records must be provided for only the first portion of the switch matrix presented in PDB 121.

If incomplete records are detected resource allocation means 110 assumes the switch matrix is symmetric and completes the information in the missing records using symmetry and the information from the first portion of the switch matrix. Since switch matrix 401A is symmetric, the complete records from the first portion of the switch matrix are simply copied to the appropriate locations for the other portions of the switch matrix. Of course, switch matrix records for the entire switch matrix can always be provided.

Each switch matrix record has three distinct fields. The first field defines the output line of the programmable multiplexer and the input lines to the programmable multiplexer. A star "*" terminates the first field because the field has a variable length. The second field controls the printing of the logical signal map and the third field defines the fuse map location of the architectural cells for the programmable multiplexer. The format for a switch matrix record is:

%<Sink>{<Sources>...}* <UR.h
UR.v><F1><F2>{IL #F FB}*.

<Sink> is the multiplexer output line and <Sources> are the multiplexer input lines. The next three items are identical to the description for the items with the same identification in the pin record. The field IL defines the input line in the product term array to which the multiplexer output line is connected.

Recall that each multiplexer output line is connected to a driver that provides the multiplexer output signal to a first line in the product term array, i.e., input line IL, and the complement of the multiplexer output signal to a second line. The field #F is the number of architectural cells and field FB is the address of the first architectural cell for the multiplexer.

Figure 22:
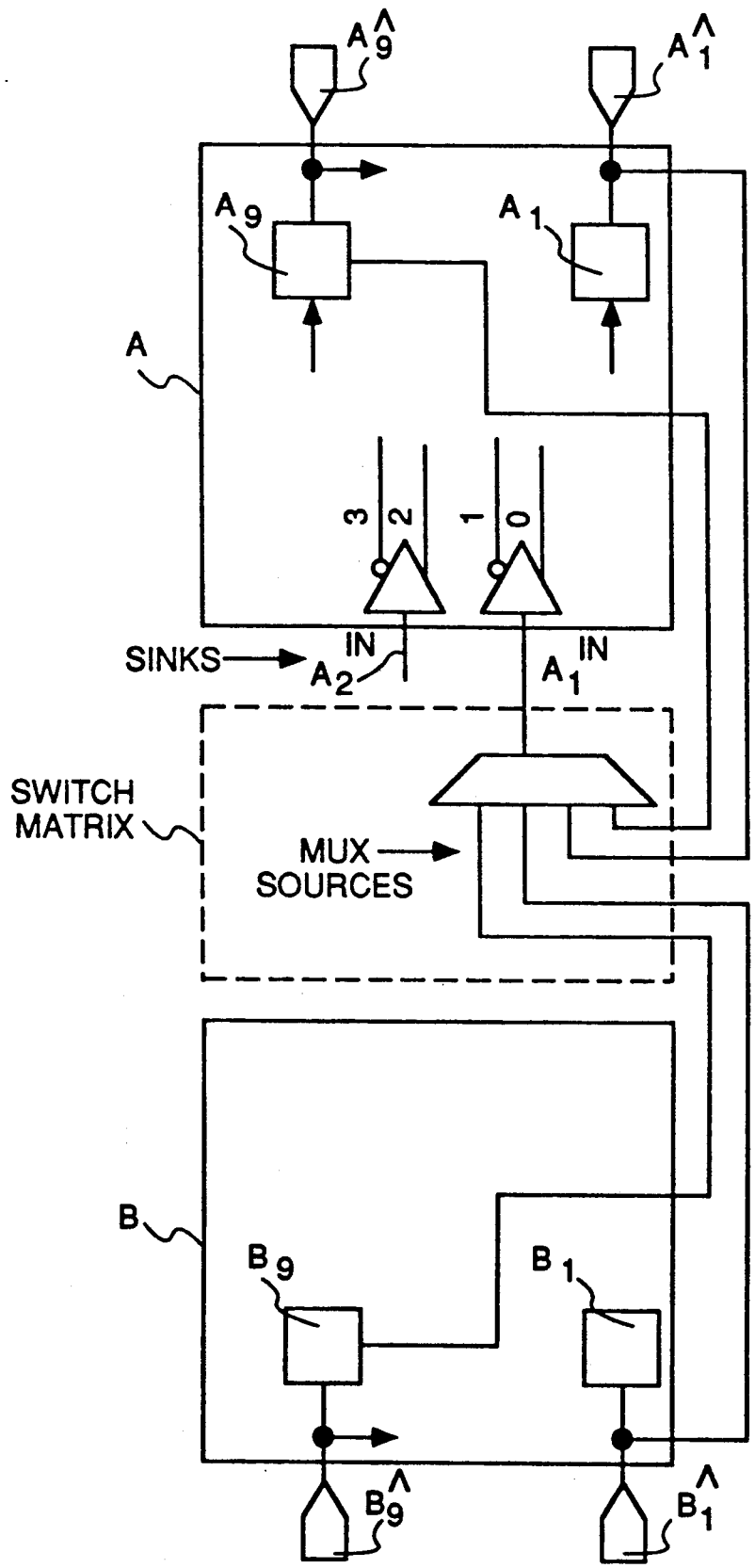
FIG. 22 is a block diagram illustrating the input lines to a typical programmable multiplexer in the switch matrix and the definition of the product terms in the product term array driven by the multiplexer output line according to the principles of this invention.

Consider line SWM1 in FIG. 21C, which is the first switch matrix record. Line SWM1 corresponds to the first line AIN1 in FIG. 19A and is illustrated as a multiplexer in FIG. 22. The first entry in line SWM1 "A 01" identifies the first input line to programmable logic block A (FIG. 22). The next four entries, "A^ 01 A 09

B^ 01 B 09" (FIG. 22) indicate that the four input lines to the first multiplexer are from (i) I/O pin 1, i.e., the I/O pin coupled to output logic macrocell 1 in programmable logic block A; (ii) the feedback line from output logic macrocell 9 in programmable logic block A; (iii) I/O pin 1, i.e., the I/O pin coupled to output logic macrocell 1 in programmable logic block B; and (iv) the feedback line from output logic macrocell 9 in programmable logic block B. Notice that in these records, a dedicated input pin is represented by "I", and that "A^" refers to the pin associated with a macrocell in block A.

In some programmable logic devices, for example the devices described in U.S. patent application Ser. No. 07/243,574, entitled "Flexible, Programmable Cell Array Interconnected By A Programmable Switch Matrix" of Om P. Agrawal, et al., now U.S. Pat. No. 4,963,768 issued Oct. 16, 1990, which is incorporated herein by reference in its entirety, programmable multiplexers in feedback cells provide input signal to the product term array.

A fanout list is a group of fanout records which include a list of the connections to an output line from a logic macrocell (both output logic macrocells and buried macrocells). However, the connections to an output line, i.e., the fanout, can be determined from the switch matrix list. Since the switch matrix list defined each programmable connection, the source and sinks for the fanout list are determined by resource allocation means 110 if they are not given in the fanout records.

Specifically a fanout record (">") contains six fields. The first field indicates which sinks are driven by a macrocell output signal. A star ("*") terminates the sink list. The second field is the associated text location for the logical signal map. The third field indicates which pair of product terms are the output enable product term for the I/O macrocell and the logic macrocell. The pair of product terms have successive locations.

The fourth field is the first product term in the product term array that is associated with the macrocell. In device 400A, as described above, each logic macrocell may receive a multiplicity of product terms. The number of product terms depends upon the configuration of the logic allocator. However, the product terms in the product term array may be divided into a series of clumps (control product terms are not included in this process) where each clump either provides input signals to the same OR gate, or is steered by the logic allocator to another OR gate located in a nearby macrocell. To determine the fourth field in a fanout record, each of the product term clumps are sequentially numbered starting with zero. The fourth field for other logic macrocells is determined similarly.

The fifth field in the fanout record is the number of products terms in the clump as defined above in the description of the fourth field in a fanout record.

The sixth field, which contains four numbers, defines the product term steering connections from the product term array to the logic macrocell. Specifically, the sixth field gives all product term clump numbers, as defined above for field four, that may be coupled by programmable multiplexers to the logic macrocell. Hence, the entries in the sixth field indicate the connection available to the logic allocator within the programmable logic device. Specifically, the numbers state the macrocells to which a clump can be directed. In this embodiment up to four clumps of product terms may be steered to a particular logic macrocell. If less than four clumps are steered to the logic macrocell, e.g., as in device 400A or in product sharing, a value of "99" is entered in the unused positions.

The last field in a fanout record gives (i) the total number of architectural cells associated with either the multiplexer in the logic allocator, the output logic macrocell and the I/O macrocell or the multiplexer in the logic allocator, and the buried logic macrocell and (ii) the address for the first of these architectural cells.

Thus, the format for a fanout record is:

> <Source>{<Sinks>...}* <UR.h
UR.v><Ptoe><Ptlm><Pt#><d1...
d4>{#F FB}*.

Notice in FIG. 21C, a "A 00" macrocell is given. This is a dummy macrocell which is used to define the set and reset product terms for the logic macrocells. In this record, <Ptoe> and <Ptlm> are the product terms used for set and reset.

The switch matrix records and the fanout records must be entered for each programmable logic block in the programmable logic device. However, if the programmable logic blocks and the switch matrix are symmetric, only the records for the first programmable logic block need be entered and resource allocation means 110 generates the information for the other programmable logic blocks As illustrated in FIG. 21D, for a symmetric device for programmable logic block B, a switch matrix records contains only the <Sink> and the printing fields which are necessarily different from the values in the switch matrix records for block A. Similarly, in the fanout records, only the <Source>, print fields, <Ptoe> and <Ptlm> are given.

To complete the device description a fanout list for the dedicated input pins must be given. Again, this information is contained in the switch matrix records so either the user may provide the information or resource allocation means 110 determines the information from the switch matrix records.

The input fanout record ("<") indicates which sinks which are driven by a dedicated input signal. A star ("*") terminates the sink list. Following this is the associated text location for the logical signal map. The format for an input fanout record is:

< <Source>{<Sinks>...}* <UR.h
UR.v><F1><F2>.

The remaining records in PDB 121 (FIG. 21E) are used in generating the documentation output and are described below.

As described above, user design 100 provided logical data that is mapped to programmable logic device 400 which is defined by the product data obtained from PDB 121. Typically, user design and PDB 121 are obtained from secondary memory (disk) of the computer system in which resource allocation means 110 is executing and loaded into main memory. Obviously, retaining data in main memory eliminates the need for resource allocation means 110 to access the same data repeatedly on secondary memory and therefore enhances the operation of resource allocation means 110.

Hence, in one embodiment, the logical data and physical data for the selected programmable logic device are held in main memory, i.e., RAM, (memory) resident array/list structures (database structures) for quick processing. As explained more completely below, the memory resident database structures are created with pointers and structured records to allow dynamic extension to different sized logic designs and various programmable logic device organizations.

Prior to considering the operation of resource allocation means 110 in more detail, the main memory based database structures used in resource allocation means 110 are described. These structures are described below in terms of programmable logic devices 400. In view of this disclosure those skilled in the art can describe equivalent structures for other programmable logic devices.

In the following description, one implementation of memory resident databases are described using the Pascal computer programming language. The particular structures used to maintain the databases in main memory and the computer language used herein are illustrative only of the principles of this invention and are not intended to limit the invention to the particular embodiment described. In view of this disclosure, alternative means can be used by those skilled in the art to retain the required databases in the main memory of the computer system for processing.

An important aspect of the memory resident databases is that the selection of an array organization and fixed size limits should not constrain the database from handling dynamic sizing. For resource allocation means 110 operating in a computer system having a Motorola 68000 microprocessor or one of the microprocessors in the Motorola 68000 series, such as the Apple MacIntosh computers, all the database structures can be created "on the Heap". Hence, the size of the database structures and addressing mechanism used to access information in these structures is somewhat arbitrary.

In this embodiment, (i) a symbol table, which is used for storing user signal symbols in user design 100, (ii) a signal database, which is used to store information about the logic equations in user design 100, (iii) a physical database, which is used to store information characterizing the selected programmable logic device, and (iv) a Hungarian assignment database, which is used in resource assignment 130 are retained in main memory of the computer system. Each of these storage means and their structure are considered below in turn.

A symbol table is used to maintain the user symbols for all signal variables. Specifically, the symbol table contains all declared pin labels, the design name, device type and so on. The symbol table includes a superset of all used signal variables, i.e., input signal, output equations, I/O equations or buried equations variables.

Figure 23:
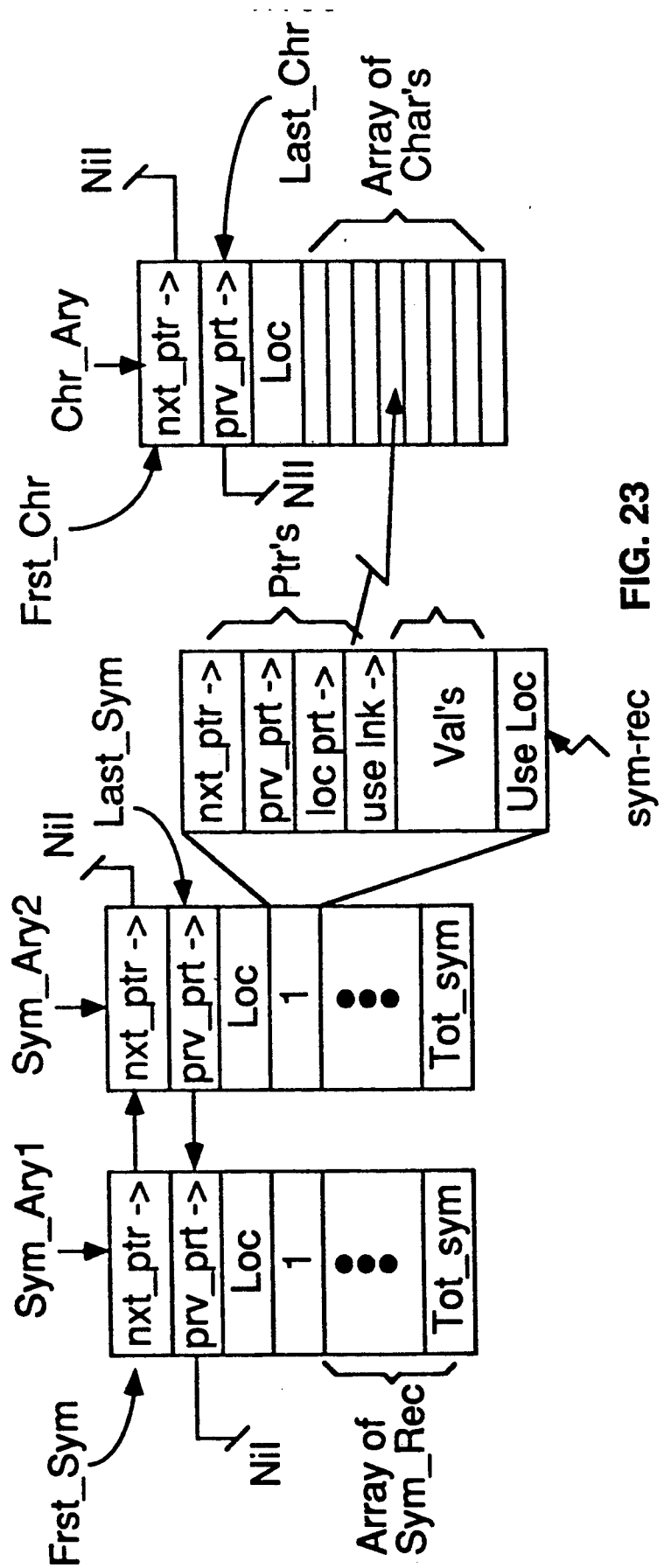
FIG. 23 illustrates the structure of the symbol array, symbol records, and character records according to the principles of this invention.

The symbol table is created by using a Hash function to place variables, described more completely below, within blocked records Sym_Ary1, Sym_Ary2 (FIG. 23). In FIG. 23, only two blocked records are used to illustrate the principles of this invention. Resource allocation means 110 typically uses a multiplicity of such records. Each of blocked records Sym_Ary1, Sym_Ary2 contains book-keeping pointers and an array of symbol records. Expansion to additional symbol space is accomplished by linking additional blocked records to blocked records Sym_Ary1, Sym_Ary2.

Symbol table access routines manage the addition and accessing of symbol data thereby hiding this blocked structure from higher level programs of resource allocation means 110. The blocked structure provides incremental size modifications to the symbol table with little effect on access times and utilization of unused memory structures.

The structure of blocked records Sym_Ary1, Sym_Ary2 is defined in FIG. 24 and illustrated graphically in FIG. 23. Each blocked record Sym_Aryi, where i denotes the record number, includes a link nxt_ptr to the next block and a link prv_ptr to the previous block. The first record has link prv_ptr set to nil and the last record has link nxt_ptr set to nil. Also pointer Frst_Sym points to link nxt_ptr in the first record and pointer Last_Sym points to link prv_ptr in the last record. Integer Loc is the location of the next open space in the array of symbol records sym_rec in blocked record Sym_Aryi. Each blocked record Sym_Ary cointains Tot_Sym records. In this embodiment, Tot_Sym was chosen as 64.

Each symbol record sym_rec is defined in FIG. 24 and illustrated graphically in FIG. 23. In a symbol record (FIGS. 23 and 24), pointer nxt_ptr is a link to the next symbol in the array of symbols records having the same Hash address (used resolve collisions of multiple symbols within same Hash bucket).

Pointer equ_ptr is a link to an equation record in the signal database, described below, which is used if this symbol is associated with an output or buried equation. Pointer loc_ptr is a link to the actual text of the symbol, which, in this embodiment, is stored as Pascal string in the character array described below. Pointer use_lnk is a link to a use record containing information about which equations in user design 100 contain this symbol. (The use records are an array of bytes, i.e., equation numbers where this symbol is used linked with book-keeping pointers. (FIG. 33D))

Number sym_num (FIG. 24) is a sequence number for which symbol this is globally among all symbols (1,2,3 . . . n). Number idf_val is a sequence number for which symbol this is within list of pins and nodes (1,2,3 . . . n). Number sig_val is a sequence number (1,2,3 . . . n) for which symbol this is within the list of logic equations—buried and output. Number len_val is the length of the symbol string in bytes. Address loc_val is the address into the character array where the symbol string is stored. (Variable loc_val is logically redundant with variable loc_ptr). The numbers syn_num to loc_val are in the field Val's (FIG. 23).

The following items are in field Use Loc (FIG. 23). Vector use_vec (FIG. 24) is a Boolean vector containing a one bit flag for each programmable logic block within the programmable logic device where this signal is used. Array use_loc is an array of locations where the signal represented by this symbol is placed as an input signal to the programmable AND array of that programmable logic block. Code typ_val is a code for the type of signal {Input, I/O macrocell feedback, buried EQ, clock, not-used} represented by this symbol. Code inp_fnc is a code for the type of input function {Direct, Latch, Registered, not-used} Code out_fnc is a code for the type of output function {Combinatorial, D-type flip-flop, T-type flip-flop, Latch, not-used}. Fields Blk, Loc are the location where a logic equation is placed, i.e., programmable logic block Blk and macrocell location Loc, if the logic equation is an output or buried equation, otherwise the fields are not used. Flag log_flg is a Boolean flag for active low (False) or high (true) interpretation of logic value within the pin list.

The actual text of the user symbols are contained within blocked records Chr_Ary (FIG. 23). Like the records described above, these records (FIGS. 23 and 24) contain book-keeping pointers and an array of characters. Expansion to additional character space is accomplished by linking in additional blocked records Chr_Ary.

Figure 25:
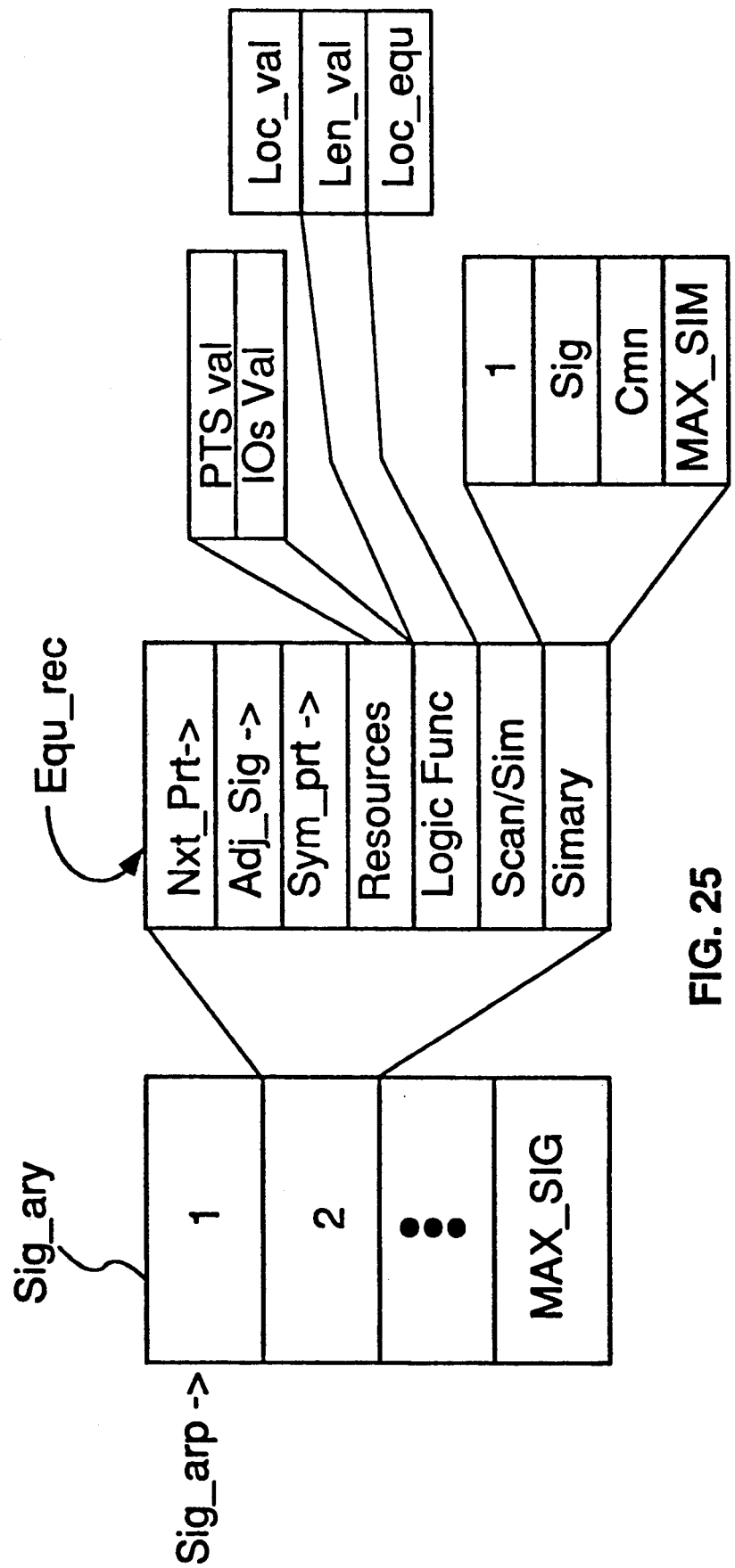
FIG. 25 illustrates the signal array and the equation records stored in the signal array according to the principles of this invention.

The signal database contains the information that is known about the logic equations of the design, and is stored in two memory structures sig_ary and equ_ary. The general structure of the records equ_rec in signal array sig_ary that make up the signal database is illustrated in FIG. 25 and both are defined in FIG. 26. Each record equ_rec in signal array sig_ary refers to equation array equ_ary, (just as the records in symbol array sym_array referred to character array chr_ary), i.e, equation array records include book-keeping pointers, a location of the next open space in the equation array. In FIG. 25, only the signal array records are illustrated.

Each equation record equ_rec within signal array sig_ary is defined in FIG. 26 and illustrated in FIG. 25. In equation record equ_rec, pointer nxt_sig is a pointer to the next related signal as auxiliary equations, linked to the primary logic function (tri-state, set flip-flop, reset flip-flop, and clock flip-flop equations). Pointer adj_sig is a pointer to the next signal to be realized in a physical programmable logic block as determined by partitioning means 120. Pointer sym_ptr is the pointer to the symbol record described above, for this equation. All of these points are initialized to "Nil" at the beginning of processing and later reflect the progress of block partitioning means 120 and database initialization 115.

Field logic function (FIG. 25) includes fields loc_val, len_val, and loc_equ which are links to binary operation tokens detailing Boolean logic equations stored in equ_ary array, transliterated from the "TRE" or "PLA" file contents. The following fields are defined in FIG. 26, but the fields are not illustrated in FIG. 25 for clarity. Field typ_val is the type of signal (Input, Output, Buried Node, etc.). Field trs_val is the check sum of the three-state output enable product term for this equation. Field set_val is a check sum of the set product term for this equation. Field rst_val is a check sum of the reset product term for this equation. Number sig_val is a sequence number for which signal this is within list of logic equations—buried and output (1,2,3 ... n).

In FIG. 25, field Resources includes the numbers pts_val, ios_val, (FIG. 26) which are the number of product terms and the number of input signals for this equation. Vector Logic is a binary vector containing 1's for any I/O signals that participate in the Boolean equations for this signal or its auxiliary equations. Herein, "signal" is defined as one or more Boolean equations. For example, the main Boolean equation which defines a registered output signal is handled in combination with auxiliary equations that specify clocking, setting and resetting of the register, for example The variables scan, simcnt hold temporary values used in block partitioning 120. Array sim_ary is an array (0 ... MAX_SIM) containing the six largest values of similarity recorded between this equation and others, as described more completely below. Each record in the array includes two integer variables sig and cmn.

The memory resident physical database contains information about the physical programmable logic blocks selected for programming and the logical modules generated in block partitioning 120 of user design 100. The memory resident physical database is stored in several structures, i.e., the switch matrix, fanout, pin and pin/block arrays and a coarse physical database. Each of these structures is described more completely below.

Figure 27:
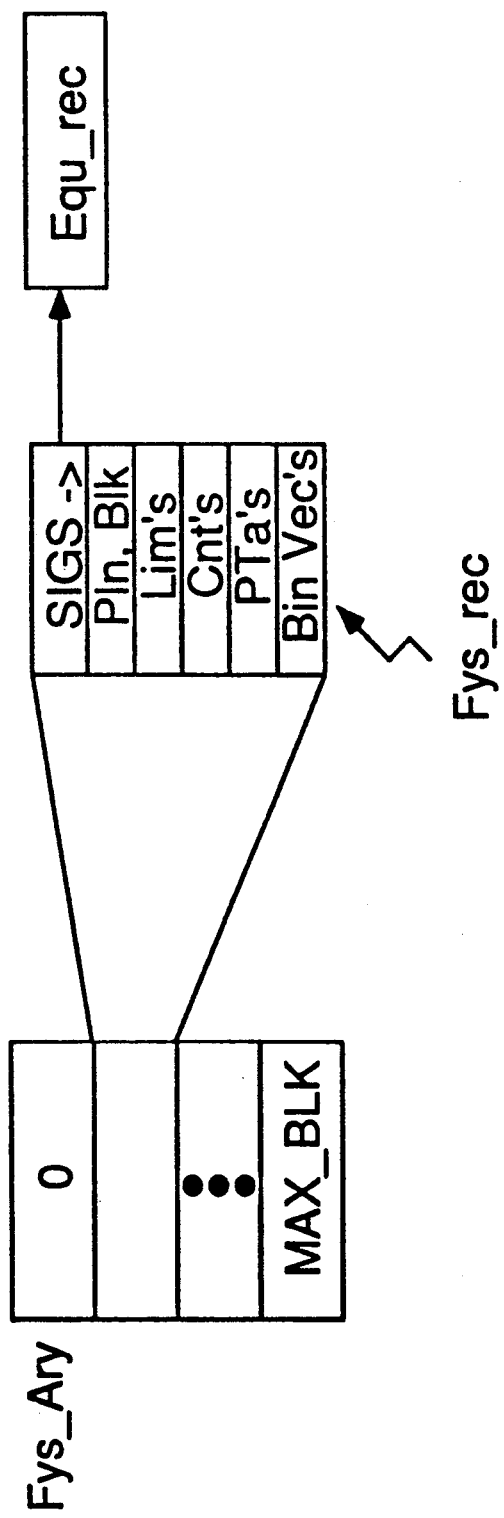
FIG. 27 illustrates the physical array and the physical record structure used to store data according to the principles of this invention.

The coarse physical database consists of an array of physical records (0 ... MAX_BLK), (FIG. 27). The maximum number of records MAX_BLK in the array is a constant defined below. Number MAX_BLK must be larger than the number of programmable logic blocks for any PLD defined in PDB 121. The first record in the array, i.e., record (0), contains information about dedicated input pins of the programmable logic device.

The next FYS_BLK records, where FYS_BLK is the number of programmable logic blocks in the programmable logic device, contain information about the programmable logic blocks. The remainder of the records in the coarse physical database, (MAX_BLK-FYS_BLK+1) records, relate to logical modules, which, as explained more completely below, are unrelated to any particular programmable logic block, and are defined in block partitioning 120. In the following description of the records in the coarse physical database, the term "module" refers to both logic modules and programmable logic blocks unless otherwise indicated.

Each physical record fys_rec (FIG. 27) is defined in FIG. 28. Pointer SIGS is a pointer to the logical signal equations placed in this physical module. Pointer SIGS is initialized to nil. The number nxt_pin, Blk (FIG. 28), (shown as Pin, Blk in FIG. 27) is the next pin available for placement of a logic equation. The field Lim's (FIG. 27) contains the variables PT_LIM, IO_LIM, EQ_LIM, PM_LIM (FIG. 28) which are integer variables used to define the limit number of product terms, I/O signals, equations and pin macros, respectively, allowed by the PLD device specifications in PDB 121 to be within this module.

Field Cnt's (FIG. 27) contains a series of variables that characterize the utilization of the module, used by user design 100. Specifically, variable SIZV1 (FIG. 28) is the percent of this module utilized, i.e., a measure of how full this module is. Variable FANCNT is a count of how many signals leave this module and are connected to other signals. Variable FulCnt is a count of how many times this module was selected for addition of signals by block partitioning 120, after the module was marked as "full". Variables IOMCnt, BurCnt, SigCnt are counts of resources, i.e., I/O macrocells, buried macrocells and input signal, respectively, used by user design 100. Variable OrdVal is the order of macrocell assignment for this block in sequence 1,2,3 .. . as determined after block partitioning 120 (sequence depends on fullness). The fullest block is first, and so on.

Array PTa (FIGS. 27 and 28) is an array of product term limits available within this module. Array PTa is used for PLDs having a fixed product term distribution instead of a programmable logic allocator as in PLD 400. The process of checking the fit of a logic equation, described more completely below, is modified to find the first available resource within a programmable logic block that can accommodate the desired equation.

Field Bin Vec's (FIG. 27) contains three binary vectors. Vectors PSBL, LOCL, USED (FIG. 28) are binary vectors containing 1's for any I/O signals that participate in Boolean equations for signals placed within this module, and otherwise, zero Vector PSBL indicates those signals that can reach the module with transfers through the switch matrix. Vector LOCL indicates those signals initially "seeded" to be available in the module and vector USED indicates those signals actually involved with equations placed in the module.

Detailed interconnect and resource definitions for the selected programmable logic device are contained in three arrays called Switch Matrix, Fanout and Pin arrays. Each of these arrays is declared on the heap in this embodiment, and referenced by a pointer The switch and fanout arrays SMX_ary, Fan_ary have similar structures, i.e., each is an array of records RHdr_rec (FIG. 28). Each of these three arrays must be large enough to contain an element for each programmable logic block and macrocells of the programmable logic device, e.g., 8×25 elements for devices 400.

Figure 29:
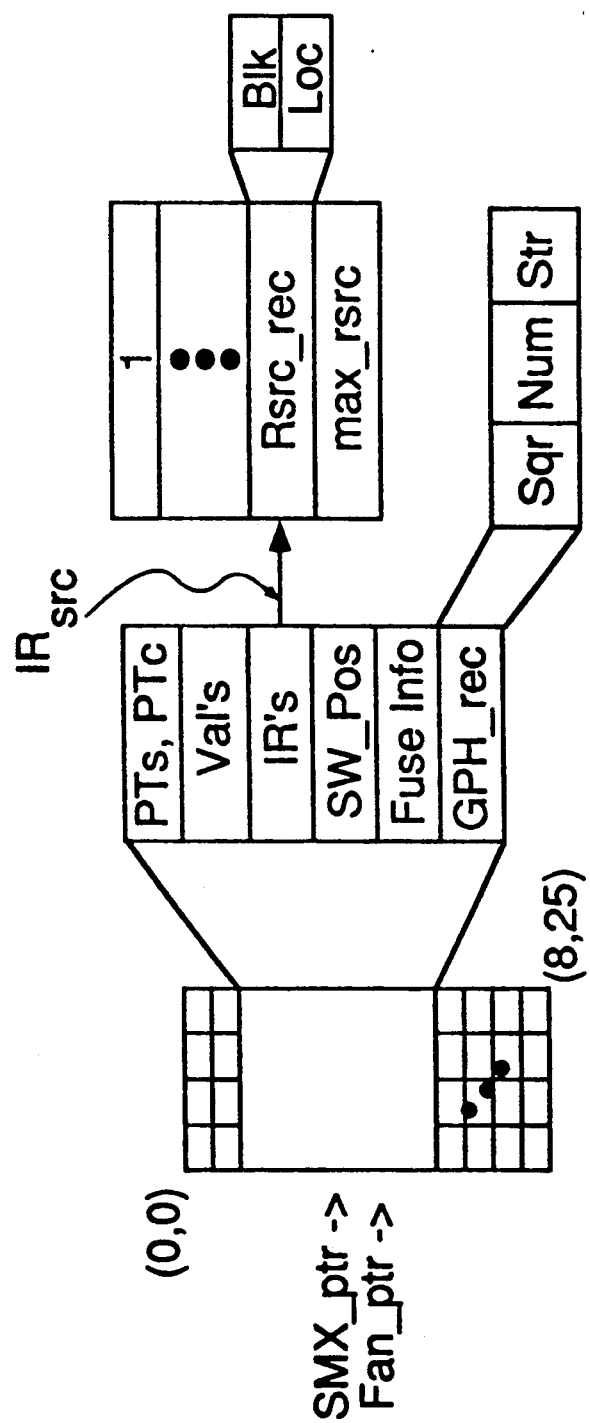
FIG. 29 illustrates the data structure and main memory used to maintain the switch matrix array and the fanout matrix array including the record structure within the array.

Switch matrix array SMX_ary and fanout array Fan_ary are defined in FIG. 28 and illustrated in FIG. 29. The pointers SMX_ptr and Fan_ptr for array SMX_ary and array Fan_ary, respectively, are used to access a record RHdr_rec which is also illustrated in FIG. 29 and is defined in FIG. 28. Field PTS, PTC contains information about product terms resources read from a fanout or switch matrix record in PDB 121. For the fanout array, number PTS indicates how many product terms are available at this macrocell. Array PTC is an array of macrocells to which these product terms can be steered. For the switch matrix, number PTS reflects how the product term groups have been allocated. Array PTC indicates which product terms can be steered to this macrocell.

Field Val's (FIG. 29) contains an index SIG_VAL (FIG. 28) which is an equation array index for the signal placed in this macrocell (identified by [BLK, Loc] address) and a small integer TYP_VAL which indicates the usage of this macrocell (input, output, buried, etc.).

Field IR's (FIG. 29) includes a count IRCNT (FIG. 28) of connection resources at this macrocell and a pointer IRsrc to a list of particular connections available at this macrocell as described in resource record Rsrc_rec (FIG. 28) Count IRCNT is determined as PDB 121 is read. Count IRCNT must be less than the number max_rsrc.

Each resource record Rsrc rec includes variable BLK and LOC which give the block and location in the block of the resource. Recall that the switch matrix record in PDB 121 list input signals to the multiplexers in the switch matrix and the fanout records lists where each macrocell output signal goes. This information is used to model connection resources.

Variable SW_POS (FIGS. 28 and 29) is a variable used for recording which interconnect resources and connections are used. Field Fuse Info (FIG. 29) contains the number of fuses NFUSE (FIG. 28) and starting address FSBAS for fuses associated with switch matrix.

Record GPH_REC (FIG. 29) is a record of location information and flag settings, i.e., SQR, NUM and STR (FIG. 28, 29 and 33C) for display of logical map annotations. Finally, variable ILINE contains the input line within the programmable AND array associated with this macrocell as defined above in PDB 121.

Figure 30:
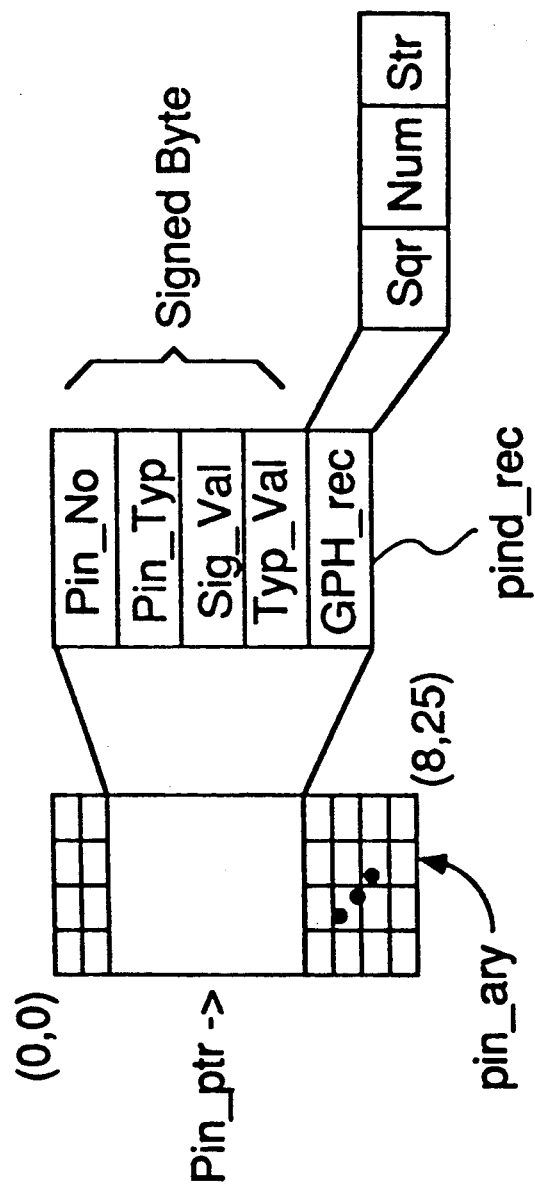
FIG. 30 illustrates the structure in the main memory of the computer system for the pin array including the pin records.

Pin array Pin_ary is illustrated in FIG. 30 and defined in FIG. 31. Pin array Pin_ary describes which pin occurs at a particular macrocell address (BLK, Loc). The pin array is an array of records pind_rec (FIG. 31). Pin array Pin_array is accessed by pointer Pin_ptr.

Record pind_rec is illustrated in FIG. 30 and defined in FIG. 31. Pin number PIN_NO is the number of a physical pin {1 . . . 44} for device 400, described above. Variable PIN_TYP indicates whether the pin is an dedicated input, CLK/INP, or I/O pin and is encoded as A, B C respectively. Index SIG_VAL is an equation array index to the signal placed in the macrocell associated with this pin. Integer TYP_VAL is an integer indicating the usage of the macrocell associated with this pin (input, output, buried, etc.) Record GPH_REC (FIG. 30) is a record of location information and flag settings, i.e., SQR, NUM and STR (FIGS. 30 and 33C), for display of pin map annotations.

A pin array p2B_ary (FIG. 31) is an array of records PIN_Rec. Pin array p2B_ary is the inverse of pin array pin_ary and shows which macrocell can be found at a particular pin index. Each record PIN_Rec includes a block BLK and macrocell location LOC that define the correspondence between the device pin and the macrocell and programmable logic block location.

FIG. 31 also lists two types of records used in the bookkeeping for the programming of the various fuses within the PLD. (Herein, fuses, architectural cells, EPROM cells and EEPROM cells are used interchangeably.) Records PT_rec are data structures for the main programmable logic array AND/OR functions. Records FUS_rec contain 281 "lines" of these, i.e., enough for a four block programmable logic device (PLD) Array ASF (60 integers) is used for the macrocell architecture and switch matrix fuses.

Figures 42A, 42B, 42C, 42D, 42E:
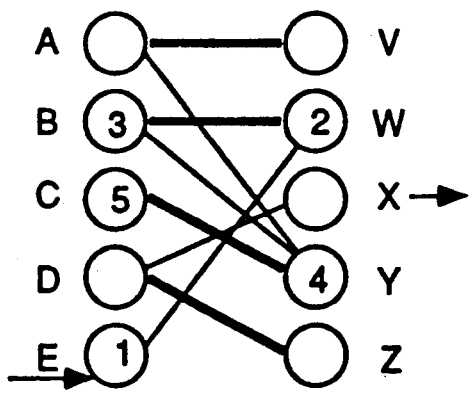

The Hungarian assignment process used in resource assignment 130, as described below, uses three special data structures. The first data structure HAA (FIG. 32) consists of an array of records HA_Lnk representing "links" of the cover graph. This structure is defined in FIG. 32. The individual fields of this record deserve some comment and are understood more clearly in view of the description below of FIGS. 42D and 42E:

| | |
|---|---|
| covr, | column entry covered |
| whoc, | row that covers column covr |
| left, | entries for cover graph on left side of graph numbers within circles in FIG. 42E |
| rght, | entries for cover graph on right side of graph numbers within circles in FIG. 42E The following variables are repeated for each row of graph as required. |
| frml, | row indicator on left hand side of graph from which links extend to column indicator on right hand side of graph |
| head, | labels for right side of FIG. 42E |
| Lcnt, | link count of number of tails used from row frml |
| tail, | array of arc tails leaving left side of FIG. 42E |

The second data structure MPA_array is a square array of costs. The array is an n×m grid of integers reflecting the individual costs of mapping n rows to each of the n columns where, in this embodiment, n=m.

The third data structure PTA (FIG. 32) is an array of records PTA_rec representing the summary measures associated with a particular execution of the programmable logic block or macrocell assignment Structure PTA and record PTA_rec are defined in FIG. 32. Variables SPM, SLM are temporary variables used for multiple purposes. Number PTU represent the product terms used by the logic equation being assigned resources. Index Sig is an equation array index of the signal to be placed in a macrocell during the assignment. Number PTA is the number of product terms available at this macrocell. The programmable logic block LBk, and the macrocell location Mac are the next variables in the record. Variable Fan is the number of programmable logic blocks driven by the signal placed in this macrocell. Pointer Sym is a pointer to the symbol record for the signal placed in this macrocell.

In addition to the structures described above, several constants (FIG. 33A and 33B) are required for global dimensioning. These constants are selected based upon the size of the programmable logic devices in PDB 121. The constants in FIGS. 33A and 33B are based upon the family of devices 400. FIGS. 33C through 33E complete the definitions required for operation of resource allocation means 110 in this embodiment.

Prior to starting database initialization 115, the basic design limits are established at compile time using the information described above. Database initialization creates the portions of the structures described above which are based upon the information in user design 100, PDB 121 and PLC 122.

Figure 34:
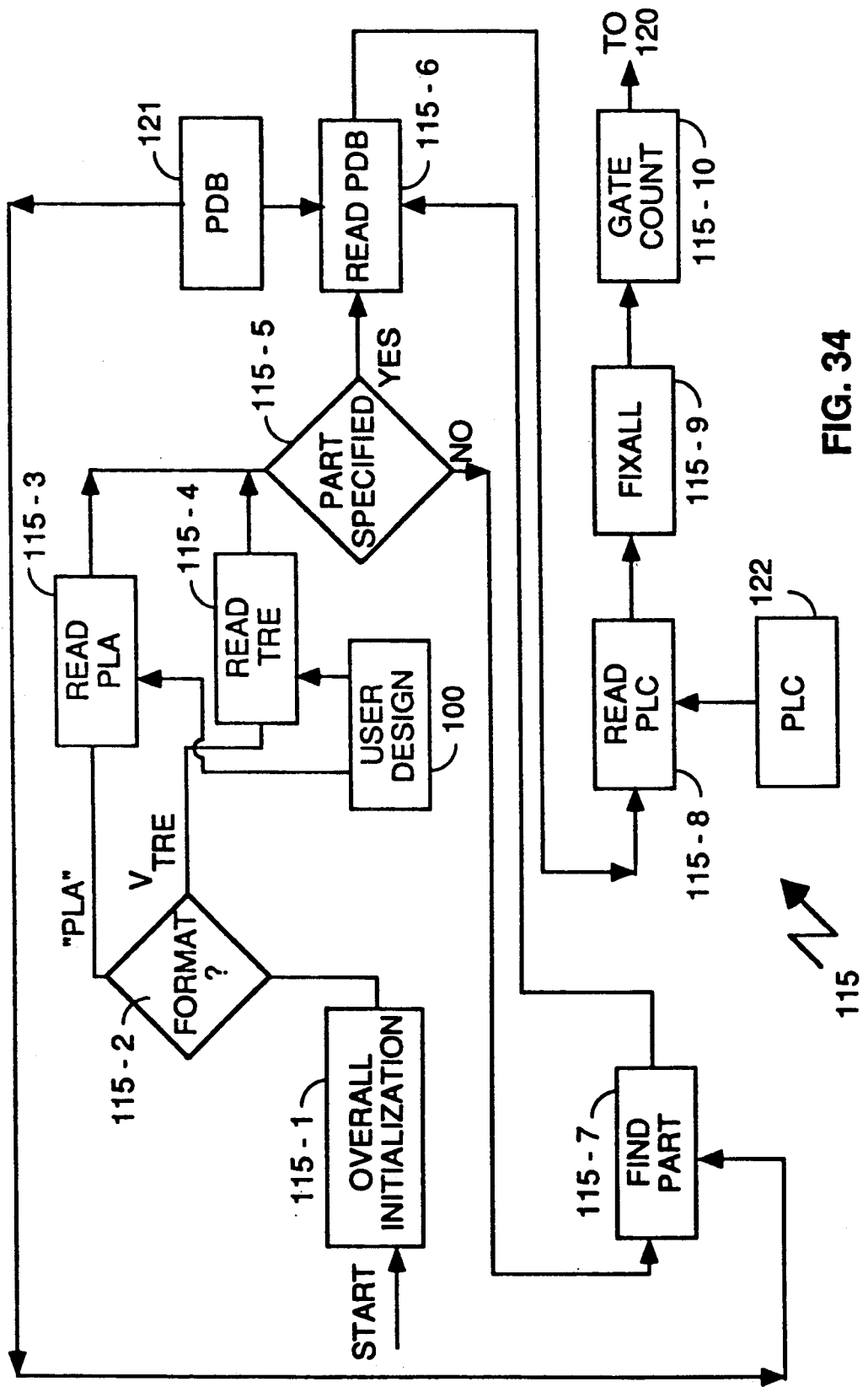
FIG. 34 is a process flow diagram for the database initialization means of this invention.

Database initialization 115 is illustrated in more detail in FIG. 34. The first operation in database initialization 115 is overall initialization 115-1 Overall initialization 115-1 defines the global data used in resource allocation means 110, and the pointers, variables, and structures used in main memory, as well as the names of its files used for the memory resident signal and device databases. One embodiment of these global data structures was described above.

Specifically, overall initialization 115-1 defines the signal database structure for storing the user's logic design in main memory of the computer system in which resource allocation means 110 is operating. Typically, user design 100 is a file on secondary storage of the computer system. Overall initialization 115-1 also creates and allocates space for the database structure for subsequently storing information in main memory characterizing the part to which user design 100 is being mapped. As described above, these databases are held in a memory resident array/list structure for quick processing. The databases include pointers and records that allow dynamic extension to different sized logic designs and various programmable logic device organizations.

Upon completion of overall initialization 115-1, database initialization 115 passes processing to user design format test 115-2. If user design 100 is in the "PLA" file format, processing transfers to Read PLA design 115-3. Conversely if user design 100 is in the "TRE" file format processing transfers to Read TRE design 115-4. Both read PLA design 115-3 and read TRE design 115-4 read user design 100 and place the information in the signal database structure described above.

As explained above, user design 100 may be encoded in several file formats. Thus, two different embodiments are provided for generating the signal database. In view of this disclosure, those skilled in the art can incorporate other file formats for user design 100 into database initialization 115. However, the PLA file format is a relative standard because this formats has been adapted by several industrial companies.

Figure 35:
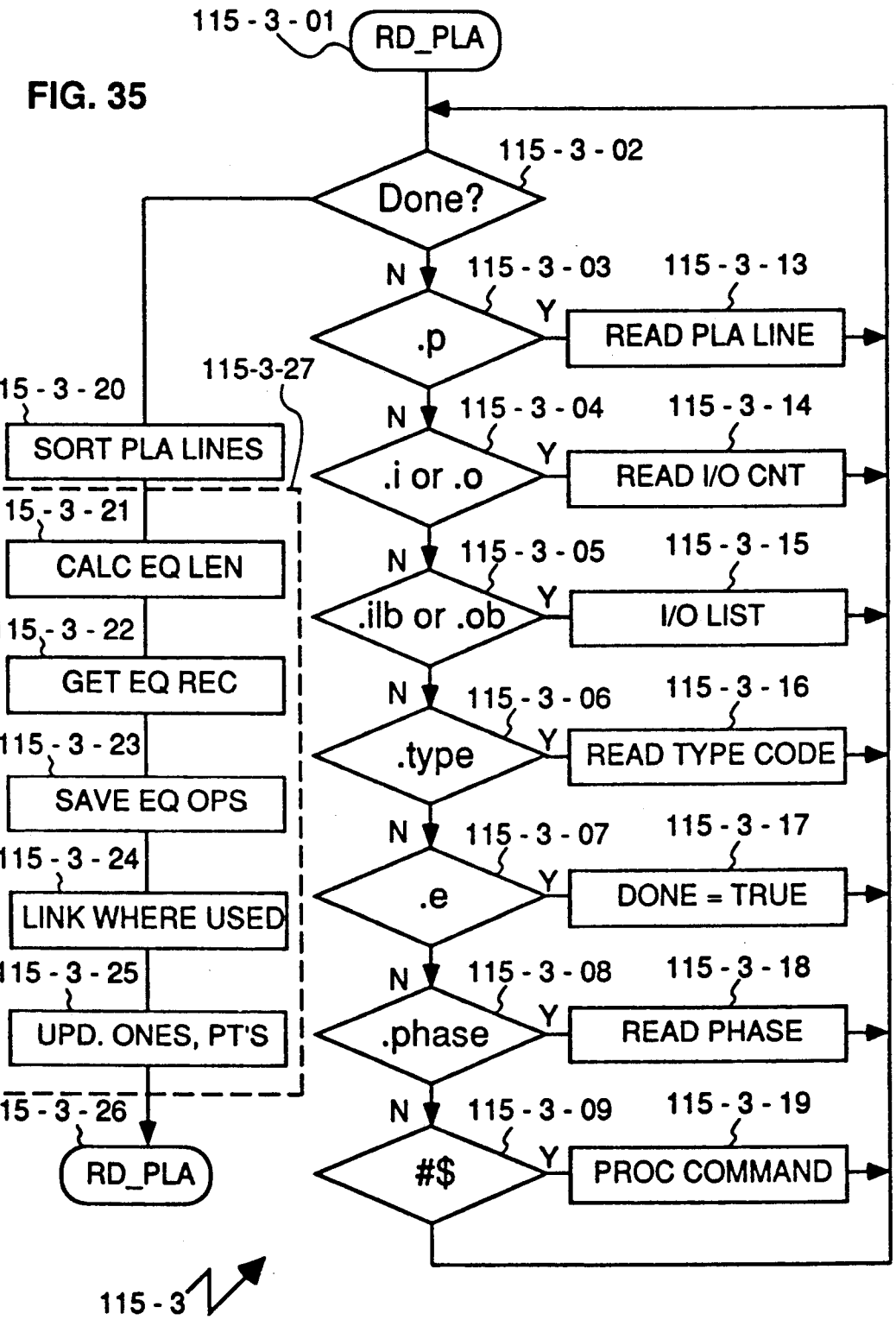
FIG. 35 is a process flow diagram for reading a user design in the PLA file format according to the principles of this invention.

The process read PLA design 115-3 for reading user design 100 is depicted in FIG. 35. Read PLA design 115-3 has a single main loop containing tests 115-3-02 through 115-3-09. Each test either branches to the related processing function 115-3-13 through 115-3-19, respectively, or passes processing to the next test. The last decision box 115-3-09 leads to another series of decision boxes for processing each of the syntax extensions which is identical in format to the illustrated loop. Three of the syntax extensions, (TITLE, JEDECFILE, DEVICE), described above, lead to simple data storage operations. Two of the syntax extensions (PINS, NODES) lead to a processing operation (Pin/Node list reader) which is explained more completely below.

Initially, read PLA 115-3-01 reads a single non-blank sequence of characters from user design file 100 and categorizes the data read. Processing then passes to test done 115-3-02. If an end flag is detected, test done 115-3-02 transfers to sort PLA lines 115-3-20. Otherwise, the data is sequentially processed by tests 115-3-03 through 115-3-09 until one of the tests recognizes the data as specifying a particular PLA data type. Notice tests 115-3-03 through 115-3-09 sample for each of the data type entries in the PLA syntax, as described above. Upon a test recognizing the data, processing branches to the related processing function which in turn reads the rest of the line of data in user design 100. When test .e 115-3-07 detects the end of user design 100, the end flag is set which in this embodiment is setting DONE to "true".

In this embodiment, processing functions 115-3-14, 115-3-16, 115-3-18, 115-3-17 only implement storage of information. Processing functions 115-3-13, 115-3-15, 115-3-19, however, are more complex functions which both interpret and store the data. PLA line reader 115-3-13 reads the input and output logic strings and adds a copy of the input string to selected symbols identified within the output string. PLA line reader 115-3-13 uses the phase string in this process by matching the individual characters of the two strings (output and phase) to indicate which output variable to store. Each of these input strings represent product terms in the selected output variable's logic function or a related auxiliary equation. These product terms are stored in an unordered linked list and identified by the logic function decoded from the signal extension.

I/O list reader 115-3-15 and pin/node list reader (included within procedure command 115-3-19) are similar in that both take the provided signal string, break the signal string into its component parts (ABC.AR-:13, for example into name, "ABC", functional extension, "AR", polarity, "−", and number, "13", and call the symbol table routines, as described above, to store the relevant information. Functional extensions, if provided, lead to numerical encoding of equation type (T, D, comb, latch, etc.)

After user design 100 has been read and processed, the logic functions are converted to the internal formats needed by resource allocation means 110, specifically the formats of signal array sig_ary records, i.e., the equation records equ_rec, described above. Hence, sort PLA lines 115-3-20 first sorts for each logic equation, called the main function, to place all product terms of the main function in sequence, followed be each of the auxiliary equations, if present. Specifically, sort PLA lines 115-3-20 performs this sort function by a single pass over the linked list of PLA lines.

Next, build equation 115-3-27 builds each equation within signal array sig_ary using the sequence of processing steps 115-3-21 through 115-3-25. The processes are (i) calculating the equation length, (ii) reserving space for the equation record, (iii) saving the equation in the byte opcode format, (iv) linking variables where they are used, and (v) updating the summary statistics—the one's in the Boolean vector and product term input ones counts. Upon completion of these processes, the processing of user design 100 by generate signal database 115 is complete.

Figure 36:
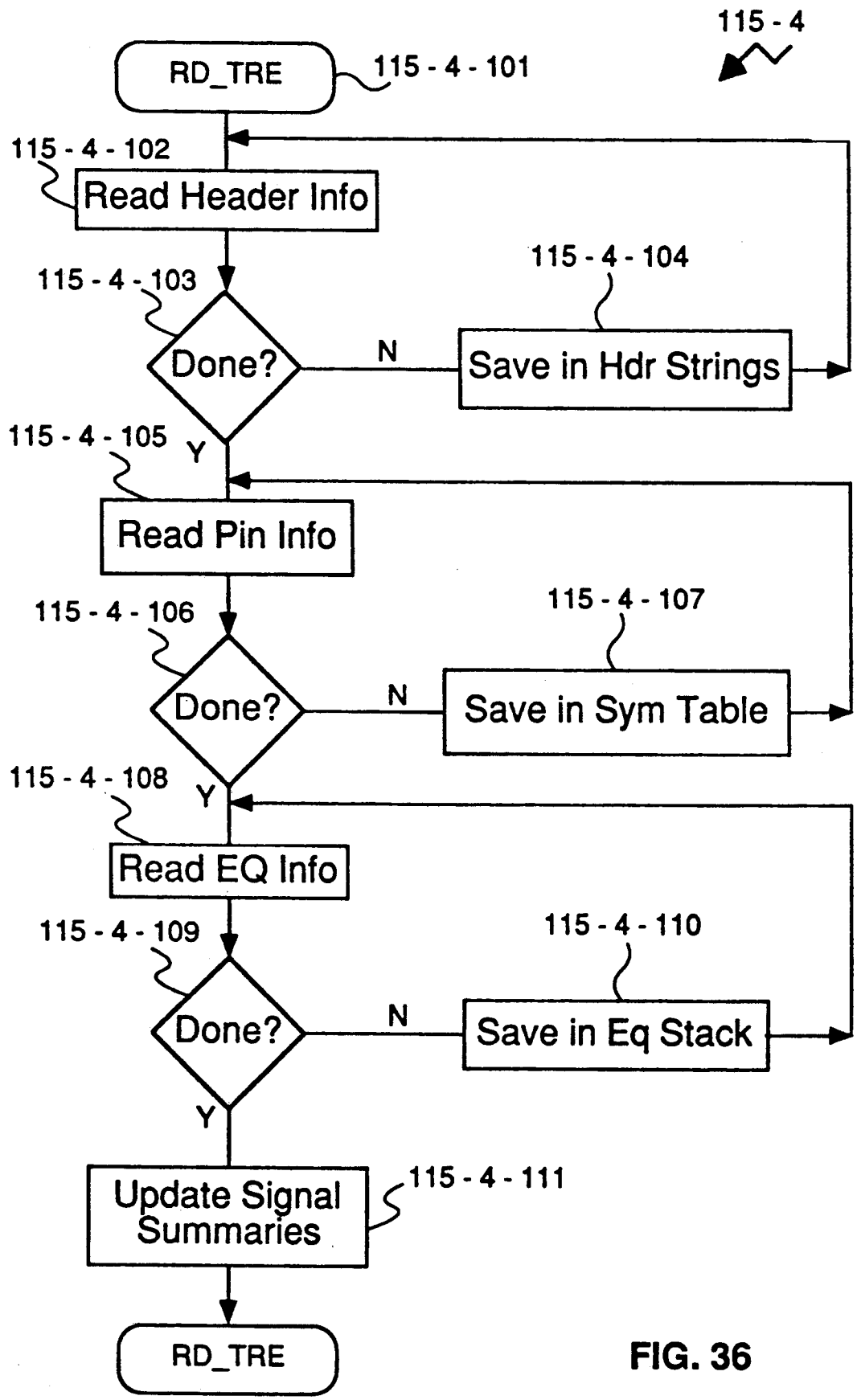
FIG. 36 is a process flow diagram for reading a user design in the TRE file format according to the principles of this invention.

If user design 100 is in the TRE file format, read TRE design 115-4 (FIG. 34) uses process read TRE 115-4 illustrated in FIG. 36. Read TRE 115-4 includes three main loops. One loop for each of the major blocks of data present within user design 100, i.e., the declaration header, pin lists, and equation lists. Since the data is user design 100 is sequential, each of the three main loops operate in sequence. Each of the sections in user design 100 are variable in length, and therefore have a termination signal encoded at the end of a section. All of the objects in each of the file sections are represented as short lines, containing one or more numerical codes for data identification, followed sometimes by alphanumeric strings of additional data.

The design declarations of TITLE, AUTHOR, DATE and COMPANY, PATTERN and REVISION are contained in the header section. In the first loop, read header info 115-4-102 reads the design declarations. Save in header strings 115-4-104 places each character sequence read in the appropriate header string for later use in documentation generation 145 (FIG. 6), i.e., annotating the design documentation 140. The device type (numerical code) concludes the header section of user design 100 and processing passes to the second loop.

The second loop processes the pin lists in user design 100. The pin list section contains declarations of the user signal names to be placed on the device pins and internal device nodes. This information is functionally identical to the Signal_List described above for the PLA file format, although the information is specified differently.

Read pin info 115-4-105 reads each pin record in user design 100. For each entity, i.e., either a pin or a node, save in symbol table 115-4-107 creates a symbol table entry and annotates the necessary flags for polarity, function and numerical identification, if known. After all of the pin records in user design 100 are processed, processing passes to the third loop in Read TRE 115-4.

The third loop processes the equation section in user design 100. The equation section is a flattened, sequential representation of the structured equation nodes previously described with respect to FIG. 8A. Read equation information 115-4-108 reads each of the lines. Save in equation stack 115-4-110 compresses each line as necessary and then examines the line if it contains a signal reference. If present, the signal name reference is translated using the symbol table to a single index number (byte opcode) and stored appropriately in equation array EQU_ARY. A first-in-last-out stack is used to reverse the order of the operations.

After all the logic equations are processed, update signal summaries 115-4-111 build links to tie the list of equation operations to the symbol table and to signal array Sig_Any, including summary information in the equation records equ_rec. This process was described previously in build equation 115-3-27 (FIG. 35) and that discussion is incorporated herein by reference.

After the processing of user design 100 is complete, part specified test 115-5 (FIG. 34) passes control to read PDB 115-6 if user design 100 specified a particular device for implementing the design and to find part 115-7 otherwise.

Figure 37:
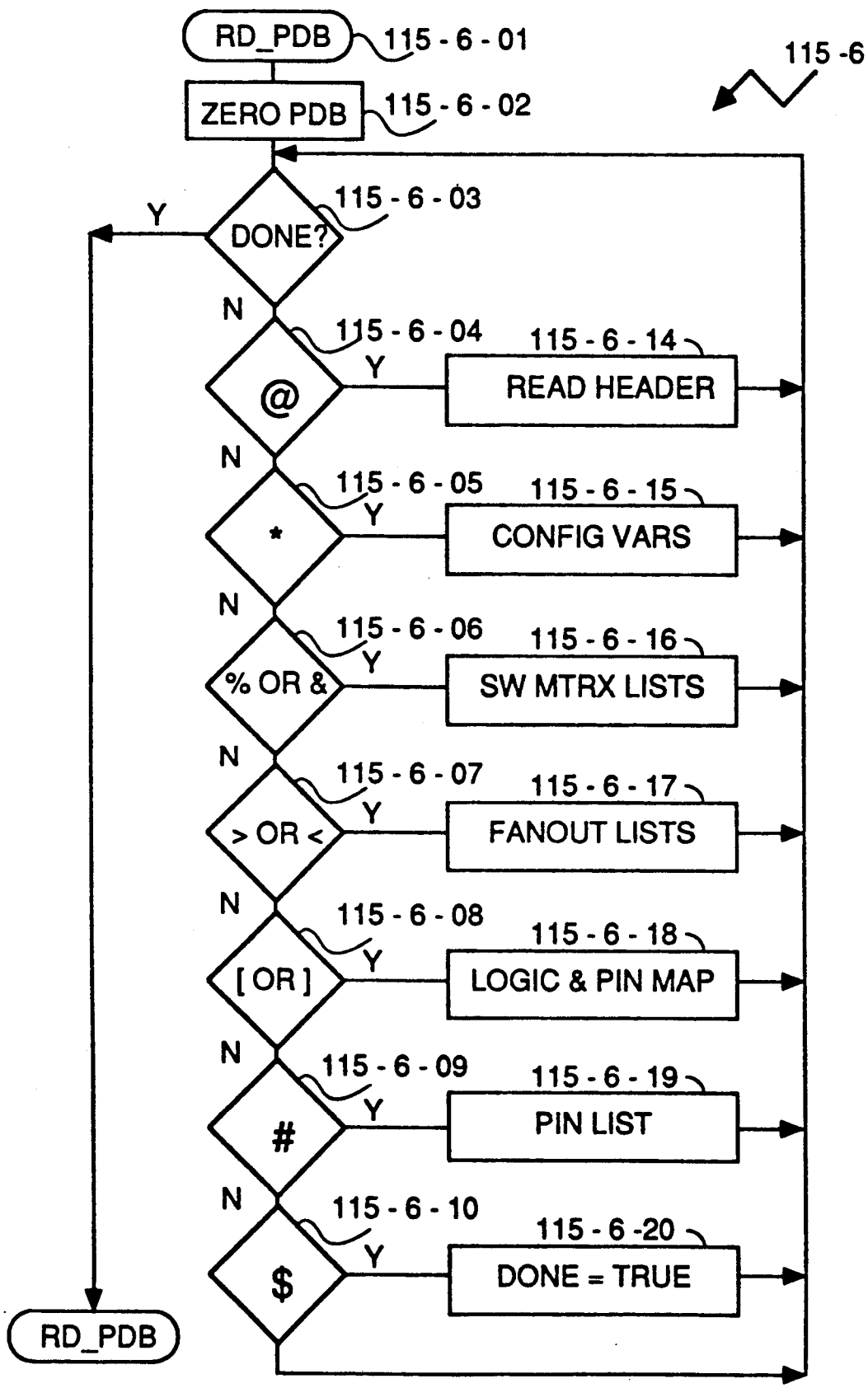
FIG. 37 is a process flow diagram for reading the device database according to the principles of this invention.

Read PDB 115-6 is depicted in FIG. 37. Read PDB 115-6 has of a single main loop that sequentially reads PDB 121 and stores the information in the memory resident physical database, described above. In the loop are tests 115-6-03 through 115-6-10 which check for each of the data type entries in the PDB syntax as described above i.e., Header, Configuration variables, Switch Matrix, Fanout, Pinlist and graphical map information.

Initially, zero PDB 115-6-02 zeros memory resident physical data base. Next if the done flag is not set, test done 115-6-03 reads and categorizes a single non-blank sequence of characters from PDB 121. Each of processing functions 115-6-14 through 115-6-20 is executed based on the recognized datatype. The process of reading and categorizing the single non-blank sequence of characters here is different than the previously mentioned in that the process here also converts single character entries for logic block identification (A, B, C, D, ... H) and input block (I) into simple index codes (0, 1, 3, 4, ..., 8).

Each of the processing function 115-6-14 through 115-6-19 are structured to process PDB 121 and build the memory resident databases described above. Specifically, the formats for each line in PDB 121 have been translated to read statements and the read data are converted to the structures in the physical database. Briefly, when an @ records in PDB 121 is detected, @ test 114-6-04 transfers processing to read header 114-6-14 which reads the remaining portion of the record. Read header 114-6-14 determines whether the header record is for the specified part in user design 100. If the header record is not for the specified device processing continues in read header 115-6-14 which locates either the next @ record or the end of PDB 121. If the end of PDB 121 is detected, an error message is sent to the user and all processing terminates.

When read header 115-6-14 determines that the header record corresponds to the specified part, processing transfers to done test and the remainder of the PDB 121 file is read to fill out the product data described above located in the memory resident physical database. In this embodiment, processing functions pin list 115-6-19, Switch matrix 115-6-16 and Fanout list 115-6-17 share common lower-level routines for reading lists, fuse data, product terms, etc.

Part specified test 115-5 (FIG. 34) passes control to find part 115-7 if user design 100 fails to specify a particular device for implementing the design. Find part 115-5 is identical in operation to read PDB 115-6 except read header operates differently in find part 115-7. In find part 115-7, read header reads the header record and compares the total number of device pins, the total number of signal pins, the total number of I/O macrocells, total number of logic macrocells(output and buried) and the total number of product terms available for logic functions for the device with the data in the signal database to ascertain whether the device is suitable for the user design. If the device is not acceptable, the next header record is processed by read header. This process continues until either an acceptable device is located or the end of PDB 121 is reached. If the end of PDB 121 is reached, processing terminates as described above with respect to read header 115-14. When an acceptable device is located, processing transfers to read PDB 115-6 and read PDB 115-6 reads the device description in PDB 121 as described above. The information read by read PDB 115-6 is stored in the memory resident physical database, described above.

The user may specify one or more preplacements of signals (logic equations) in a PLC database file 122 separate from user design 100. Alternatively, user design 100 may be analyzed by database initialization 115-1 and if the design has been determined through empirical experience to require preplacement of one or more signals, a design preplacement database may be included with resource allocation means 110. Definition of the tests to identify user designs requiring preplacement for successful implementation on a programmable logic device requires further analysis to determine how to identify such designs and how to provide signal preplacements that result in successful implementation of the user design.

PLC 122 is a free-formatted file containing signal names followed by pin or node names on which the named signal is to be located. Alternatively, the signal name can be followed by a block assignment (A, B, ... D). Either of these formats locates a signal at a specified position in programmable logic device 400 prior to the operation of resource allocation means 110.

Read PLC 115-8 (FIG. 34) reads the user supplied database with preplacement of selected signals in user design 100 on either selected physical pins of the programmable logic device or within a selected programmable logic block of the programmable logic device.

Upon completion of read PLC 115-8, fixall 115-9 ascertains whether any information for the selected programmable logic device was not given in PDB 121. For any missing information fixall uses symmetry conditions and the information given for the first programmable logic block processed in reading PDB 121 to generate the missing information. Specifically, fixall 115-9 copies the switch matrix definition including the fuse numbers from the first programmable logic block specified in PDB 121 to the other programmable logic blocks defined in PDB 121. Next, the fanout information including the product term and fuse information for the first programmable logic block specified in PDB 121 is copied to the other programmable logic blocks defined in PDB 121.

After the fanout information is complete for all programmable logic blocks in the programmable logic device, fixall 115-9 transforms the product term fanout list to a product term available list. Subsequently, the macrocell output signal fanout list is derived from the switch matrix information. Fixall 115-9 then derives a summary of the available resource limits in each programmable logic block for use in block partitioning 120. Finally, fixall 115-9 performs the design processing necessary for grouping of logic equations for set, reset and tristate functions associated with logic macrocells and I/O macrocells respectively. Specifically, the auxiliary logic equations are grouped with the main logic equation for subsequent processing.

After processing is completed by fixall 115-9, gate count 115-10 (FIG. 34) conducts several tests to identify any obvious inconsistencies between the information in the signal database and the physical database. Specifically, the overall resource of the selected programmable logic device are compared with the user's design overall resource requirements. For example, is the total number of input and output signals in the signal data base greater than the total number of physical pins for the selected device? Is the total number of output signals in the signal database greater than the number of I/O pins for the device? Is the number of registered logic equations greater than the number of logic macrocells in the device? Are the product terms required greater than the available product terms in the device? Is the number of clock signals supplied on physical pins greater than the number of physical pins available for clock signals? Is the number of gates in the user design greater than the number of gates in the programmable logic device? If the answer to any of these checks is yes, processing terminates and the user must correct the problem. Alternatively, the percent usage of the programmable logic device is calculated and this percentage along with the comparison for each of the questions is provided to the user in an output file.

If gate count 115-10 is successfully completed, database initialization 115 is complete and resource allocation means 110 is ready to begin block partitioning 120 (FIG. 6). Block partitioning 120 splits the user logic into a selected number n of roughly equal-sized modules where the selected number n is the number of programmable logic blocks in the selected programmable logic device. In block partitioning, the modules are not associated directly with a specific programmable logic block in the programmable logic device. Rather, related logic functions in the user design are grouped together in a module so that the number of signals at module boundaries are minimized and the resources of a programmable logic block are not exceeded by the resources required by the logic equations placed in the module.

As described more completely below, logic clusters are grown around "seed" equations placed arbitrarily in a module. User pin pre-placements, which were read in database initialization 115 (FIG. 34), can also be used to start this process. Logic equations are added to the module in an order determined by their "affinity" to the seed equation.

Resource limitations for the number of available logic equations and signal connections (block input and output pins) are enforced as a "hard" limit for each module. Once these limits are reached, any overflow logic equations that have an affinity for the module are placed in a secondary module, or finally a non-present "virtual" module, if all physical modules are filled. "Slack" resource quantities, if present in the PDB 121 on the configuration variables, modify these hard limits.

In this embodiment of block partitioning 120, a crystallization process is used. Prior to describing the detailed process used in block partitioning 120, a simple application of the crystallization process is considered.

Figure 38:
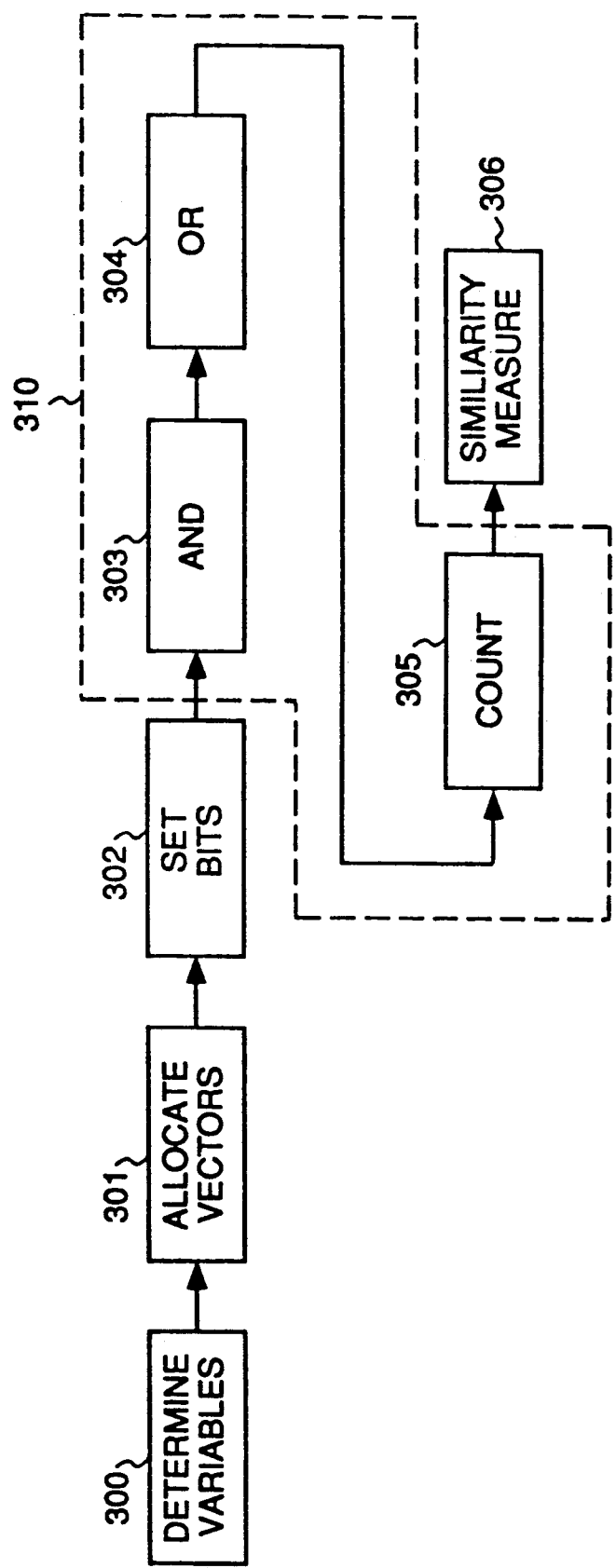
FIG. 38 is a process flow diagram for the general crystallization process of this invention.

The crystallization partitioning process, in this embodiment, generates a measure of the similarity of two logic equations in terms of their input logic signals. To generate this measure, the user logic design is analyzed and the total number of different input logic signals in the logic design are determined by determine variable 300 (FIG. 38). For this example, the total number of different input logic signals is ten.

Next, for each main logic equation an n bit Boolean vector is allocated by allocate vectors 301. Each bit in the Boolean vector is associated with one of the input signals. In this example for logic functions A and B, each of which are defined by a main logic equation, a ten bit Boolean vector BV{A} and BV{B} is formed. The ten input logic signals are ordered from 1 to 10 and if an input signal is in logic function A, a "1" is entered in Boolean BV{A} in the position for that signal. If the input signal is not in logic function A, a "0" is entered in Boolean BV{A} in the position of that variable. Thus, in set bits 302, for each bit in the Boolean vector, if the input signal represented by the bit is in the logic function associated with the Boolean vector, the bit is set to a first predetermined value and otherwise to a second predetermined value. Typically, all the Boolean vectors are initialized to the second predetermined value so that set bits 302 only sets the appropriate bits to the first predetermined value.

Following this procedure for the input logic signals to logic functions A and B, the two Boolean vectors of logic functions A and B respectively are (Note these values were arbitrarily picked for this example):

BV{A} = 0001110011.

BV{B} = 1001010001.

After the two Boolean vectors are defined, process 310 compares the two Boolean vectors to determine the number of similar signals and the number of different signals. Specifically, Boolean vector AND 303 in process 310 generates a Boolean vector BV{C} by calculating a bit-wise AND of Boolean vectors BV{A} and BV{B}. Also, Boolean vector OR 304 generates a Boolean vector BV{D} by calculating a bit-wise Exclusive OR of Boolean vectors BV{A} and BV{B}. Boolean vectors BV{C} and BV{D} are:

BV{C} = 0001010001 = BV{A} * BV{B}.

BV{D} = 1000100010 = BV{A} +: BV{B}.

Boolean vector BV{C} indicates how many input signals are common to both logic functions. Boolean vector BV{D} indicates the different input signals—those present in one logic function, but not the other logic function.

Count 305 counts the total number of ones in Boolean vector BV{C} and the total number of ones in Boolean vector BV{D}. Similarity measure 306 generates the similarity measure between logic functions A and B. The similarity measure is:

$$\text{Similarity}\{A,B\} = \text{Ones }(BV\{C\}) - \text{Ones}(BV\{D\})div\ 3$$

where Ones(BV{}) is the total number of ones in the binary vector BV{} as determined by count 305 and "div 3" means divided by three. The similarity measure is limited to positive values. Hence if the similarity measure is negative, the similarity measure is set to zero.

Thus, for binary vectors BV{A} and BV{B} the similarity measure is:

$$\text{Similarity}\{A,B\} = 3 - (3/3) = 3 - 1 = 2.$$

The division weighting of binary vector BV{D} causes the similarity measure to more heavily favor common input signals over different input signals. Other weighting factors may prove more effective for some designs. The "3" used for division was empirically chosen. In this embodiment, input signals to logic equations have been used to ascertain the similarity of logic equations. In view of this disclosure, other logic variables could be used in the similarity determination.

Figure 39:
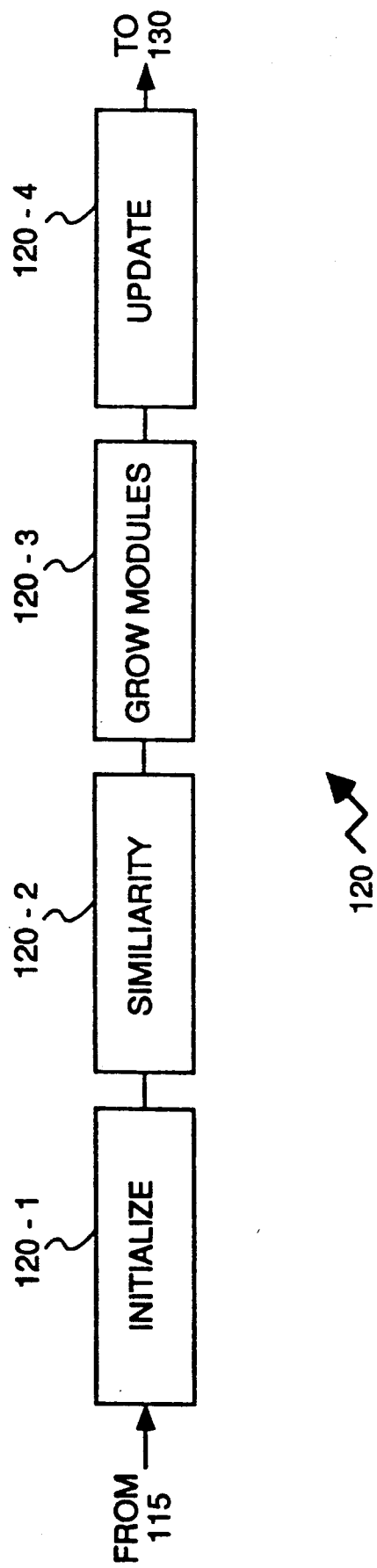
FIG. 39 is a process flow diagram for the block partitioning means of this invention.

Block partitioning 120, as illustrated in FIG. 39, includes four main steps: initialization 120-1, similarity, 120-2, grow modules 120-3, and update signal database 120-4. The first operation in initialization 120-1 is to initialize the Boolean vectors for each module to reflect seed preplacements. The Boolean vectors for the modules are the same size as the Boolean vectors for each of the logic equations. As logic equations are added to a module Boolean vector, the bits corresponding to the input signals for that equation are set to the first predetermined value. Note that the initialization operation described above with respect to the Boolean vectors in the similarity process, in this embodiment, are performed in database initialization 115.

Next, in initialization 120-1 limits for the maximum number of equations in the programmable logic device and in each programmable logic block, the maximum number of macrocells associated with a physical pin in the programmable logic device and in each programmable logic block, the maximum number of product terms in the programmable logic device and in each programmable logic block, and the maximum number of input signals to the programmable logic arrays in the device and in each programmable logic block are determined, placed in the coarse physical data structure described above. The calculated limits are adjusted for any signals preplaced in a module by the user in PLC 122.

After completion of initialization 120-1, similarity 102-2 determines a similarity measure between all possible pairs of logic equations using the process described above. For logic equation Sm, equation Sm is paired with all successors in the signal array up to logic equation Sn, the last equation in the signal array as:

Similarity{Sm, Sm+1}, Similarity{Sm, Sm+2}, ... , Similarity{Sm, Sn} where Similarity{Si, Sj} is determined as described above for logic equations A and B. Specifically, process 303 through 306 (FIG. 38) are performed for each pair of logic equations. Processes 300 through 302 were previously performed in database initialization 115.

For a signal array of n equations, there are $n*(n-1)/2$ possible pairings. When n is large, e.g., greater than 30–40, many of the pairings are meaningless, i.e., the similarity measure is zero or nearly zero, so that the pairs of logic equations have little similarity. Hence, in this embodiment, the similarity measures are sorted for each equation Sm and only the measures greater than a predetermined value are retained for subsequent processing in block partitioning 120. Hence, only about the 5 to 10, preferably about 6, largest similarity measures and the associated logic equations are retained in the memory resident signal database, described above.

After all similarity measures have been determined by similarity 120-2, grow modules 120-3 (FIG. 39) sequentially finds (i) the most similar pairing, i.e., the pair of logic equations in the array that have not yet been placed and that have the largest similarity measure, and (ii) the physical module that is most "receptive" to placing that pair within it, i.e. the module that has the highest affinity with the pair of logic equations.

When an equation is added to a module the Boolean vector for each module is formed by entering a one in each location of the vector which corresponds to an input signal that has been assigned to the module. Herein, a module Boolean vector is represented by LOCLx where x is the letter (A, B, C, D) designating the module.

If the user did not specify logic equation preplacements, user preplacement test 120-3-1 (FIG. 40) transfers to random equation placement 120-3-3. One logic equation is randomly assigned to each module by random equation placement 120-3-3 and Boolean vectors LOCL are updated. Otherwise, user placements are processed in seed module 120-3-2. Again, when each equation is processed, Boolean vectors LOCL and available resource quantities are updated. Grow modules 120-3 is complete when all equations have been placed. Otherwise, pairs of equations are considered for placement. All equations placed test 120-3-4 controls when processing is completed and control is passed to update 120-4 (FIG. 39).

The next pair of logic equations Sx, Sy having the highest overall similarity measure are located by find max similarity 120-3-5, i.e. the pair of equations among all the unplaced pairs that have the maximum similarity measure. If neither logic equation Sx nor logic equation Sy has been placed in a module, both equations unplaced test 120-3-6 passes processing to place equations 120-3-8.

If either of logic equations Sx or Sy have already been placed in a module, processing transfer to one equation unplaced test 120-3-6. If one equation in the pair is unplaced processing transfers to co-place equations 120-3-9. Co-place equations 120-3-9 attempts to place the unplaced logic equation within the same module that the other equation is placed. Lastly, if both signals have been placed in different modules, merge modules 120-3-10 tries to merge both of the logic modules into one larger module. Grow modules 120-3 continues with the next pair of equations having the highest similarity unless all equations have been placed in which case all equations placed test 120-3-4 transfers to update 120-4.

Figure 41A:
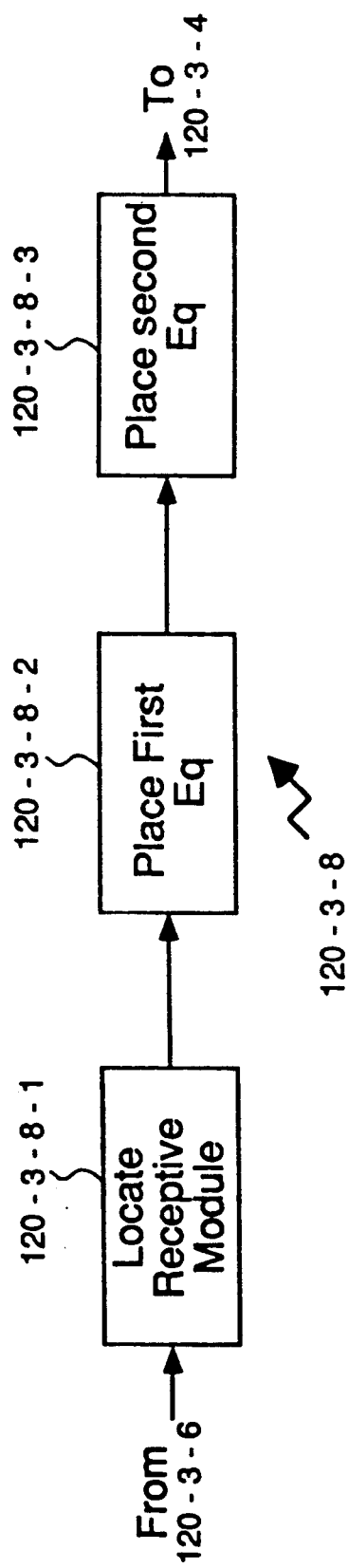
FIGS. 41A through 41C are process flow diagrams for the processes within grow modules (FIG. 40) according to the principles of this invention.

Place equation 120-3-8, illustrated in more detail in FIG. 41A, computes the similarity measure of the pair of equations Sx and Sy to the Boolean vectors LOCLa, LOCLb, ..., of the modules in sequence (a,b, ...) in locate receptive module 120-3-8-1. Specifically, locate receptive module 120-3-8-1 determines the receptivity of each module for equation Sx, Sy, where the receptivity is Receptivity(Sx,Sy,a) = Max(Similarity{Sx, LOCLa}, Similarity{Sy, LOCLa}) − Ful_Cnta.

Receptivity(Sx,Sy,b) = Max(Similarity{Sx, LOCLb}, Similarity{Sy, LOCLb}) − Ful_Cntb.

The factor FUL_Cnt is a measure of the number of times that block partitioning 120 has attempted to place a logic equation in a full module. The variable FUL_Cnt is initially zero for each module. The correction to the receptivity by the variable FUL_Cnt effectively diminishes the receptivity for the full module which has the effect, as explained more completely below, of placing the logic equations in an empty module rather than a nearly full module. Recall that in PDB 121, the user selected limits such that the modules were declared full prior to actually being completely filled. As previously explained, the slack resources are maintained to increase the probability of successfully allocating the resources in the programmable logic device to the user logic equations.

Figure 41C:
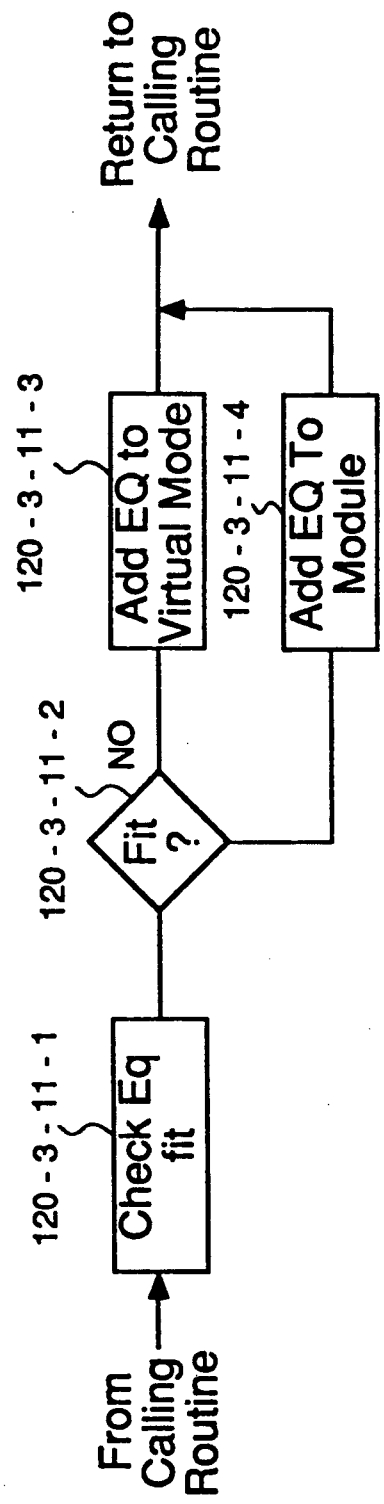
Figure 41B:
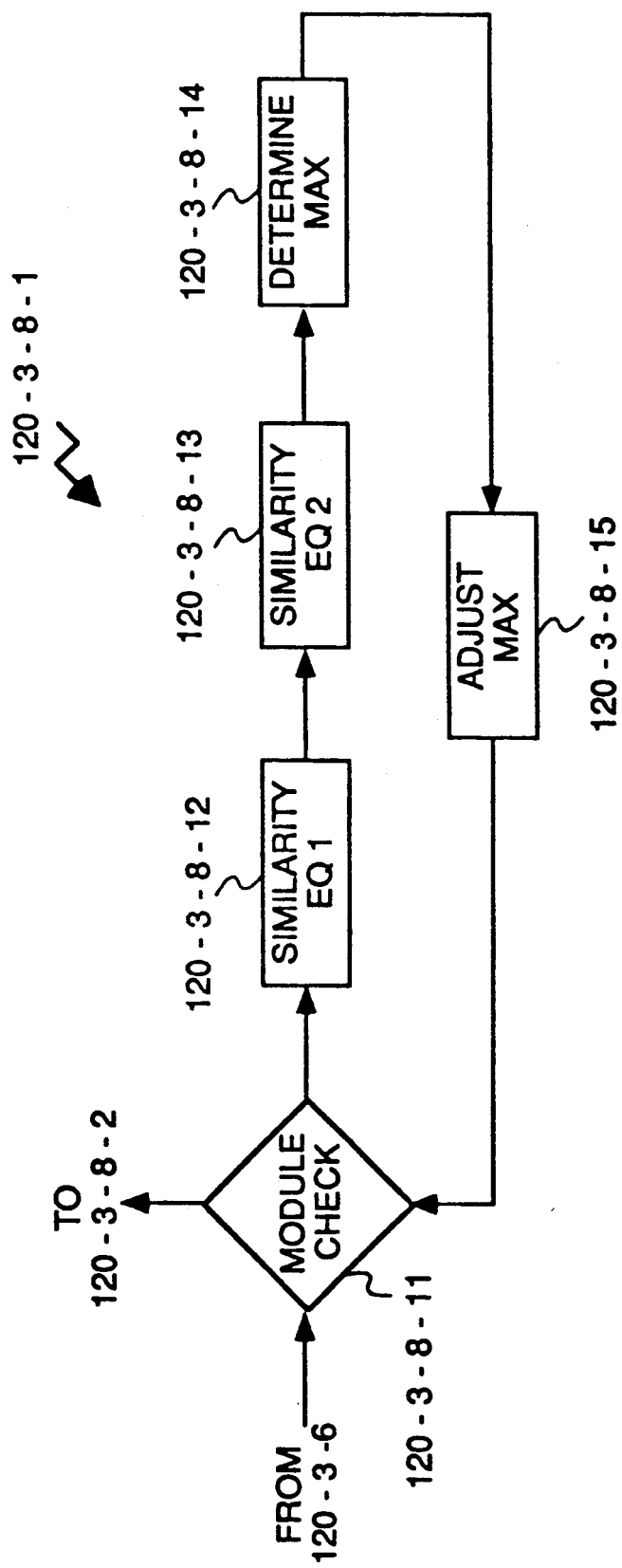

The operations in locate receptive module 102-3-8-1 (FIG. 41A) are illustrated in more detail in FIG. 41B. The steps in locating the receptive module are module check 120-3-8-11, similarity EQ1 120-3-8-12, similarity EQ2 120-3-8-13, determine max 120-3-8-14, adjust max 120-3-8-15. Module check 120-3-8-11 ascertains whether the receptivity has been determined for each module. If all the modules have been processed, locate receptive module 120-3-8-1 passes processing to place first equation 120-3-8-2.

However, if one or more modules must still be processed module check 120-3-8-11 transfers processing to similarity EQ1 120-3-8-12. Similarity EQ1 120-3-8-12 and similarity EQ2 120-3-8-13 (processes 303 through 305 (FIG. 38)) determine (i) the similarity measure for Boolean vector for the first logic equation Sx in the pair of equations and the Boolean vector LOCL for the module and (ii) the similarity measure for Boolean vector for the second equation Sy in the pair and the Boolean vector LOCL for the module, respectively.

Find max 150-3-8-14 determines the maximum of the two similarity measures and passes this value to adjust max 150-3-8-18. Adjust max 120-3-8-15 subtracts the variable FUL_Cnt for the module from the maximum similarity measure and stores this value as the receptivity for the module. Thus, upon completion of locate receptive module 120-3-8-1 (FIG. 41A) a receptivity has been calculated for each module. The pair of equations are assigned to the module having the maximum receptivity.

In block partitioning 120, the goal is to find the module most receptive to a logic equation pair. Once this module is found, each of Equations Sx, Sy are tested to see if the equations can be placed within that module.

Place first equation 120-3-8-2 and place second equation 120-3-8-3 (FIG. 41A) require adequate available resources in the module having the maximum receptivity to support the assigned equation. Process check fit 120-3-11, which is included in place first equation 120-3-8-2, place second equation 120-3-8-3, co-place equations 120-3-9, and check merge 120-3-10, is illustrated in more detail in FIG. 41C. Each assignment of a logic equation to a module is checked for a "fit" within the resource constraints of the module by check fit 120-3-11 before the equation is placed in the module. In one embodiment, check equation fit 120-3-11-1 tests (i) the number of signal inputs to the product term array including any new signals for the equation being placed; (the total number of input signals must be less than or equal to the number of input lines from the switch matrix to the product term array, in this embodiment less than or equal to 22); (ii) if the programmable logic device has a fixed number of product terms per macrocell the product terms used by the equation being placed are checked against the available product terms within the module to ascertain whether a slot is available for allocation of the equation; (iii) if the number of equations, the number of product terms and the number of I/O pins are used up by placement of the pair of equations in the logic module; and (iv) three state and set/reset requirements.

PLD 400 (FIGS. 12 and 13) has limited resources for independent three-state output enable and register set/reset. Therefore, addition of an equation to a module must take into account these resources and their commonality. In another embodiment, check fit 120-3-11 would use the check sum calculated across the three-state enable term to recognize dependent and independent output enables and keep track of their usage. In yet another embodiment, the banking requirements of set and reset for registered equations may be taken into account in the block partitioning process 120. Equations may be selected for inclusion in a module based on needs for common set and reset functions. The modifications to fit check 120-3-11 for this embodiment are apparent to those skilled in the art in view of this disclosure.

If any of these tests fail, fit test 120-3-11-2 passes control to virtual module 120-3-11-3 which adds the logic equation to the virtual module and updates the variable FUL_Cnt for the full module to account for the placement failure. If sufficient resources are available, add equation 120-3-11-4 places the equation in the selected module.

This effectively "seeds" the equation in the particular module that is the most receptive by local resources, i.e, has the most input signals in common with the input signals used in the placed logic equations. Upon addition of a logic equation to a module, the resources still available in that module are decremented by the number of resources used by that logic equation. Also, the Boolean vector used in the similarity process for the module is updated to reflect the input signals in the module.

After placement of a pair of logic equations, processing returns to find all equations placed 120-3-4 and if equations remain to be processed, the next most similar logic equation pair are processed, and so on. This process effectively places the logic equations having the greatest affinity first. If one member of an equation pair has already placed, the other is also co-located if possible, i.e, if the module has sufficient resources left to support the unplaced equation.

Figure 40:
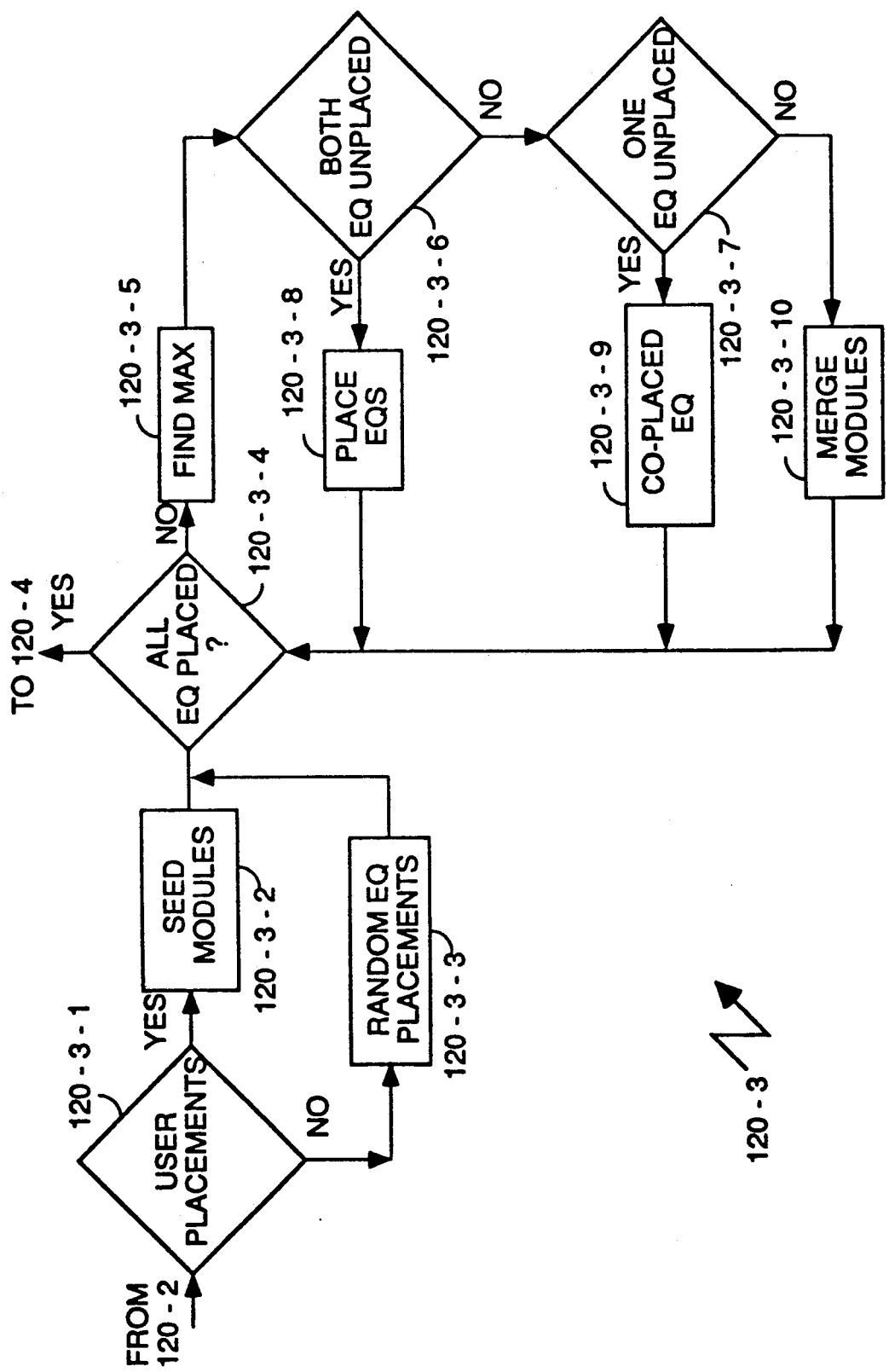
FIG. 40 is a process flow diagram for grow modules (FIG. 39) in more detail.

Specifically, both equations placed test 120-3-6 (FIG. 40) transfers processing to only one equation unplaced test 120-3-7 (FIG. 40). If only one of the equations has been placed, processing transfers to co-place equation 120-3-9 Co-place equation 120-3-9 locates the module containing the other equation in the pair and then uses check fit 120-3-11 (FIG. 41C) to determine whether the equation can be co-placed in the module containing the other equation If the co-placement is a success, processing passes to all equations placed 120-3-4 and processing continues. Otherwise, the equation is placed in the virtual module by add to virtual module 120-3-11-3 (FIG. 41C) and then returns processing to equations placed 120-3-4.

If both of the logic equations have already been placed only one equation unplaced test 120-3-7 (FIG. 40) passes processing to merge modules 120-3-10. If both logic equations are already placed in the same module, processing simply returns to all equations placed 120-3-4 (FIG. 40). However, if both equations have been placed in different modules, the two modules are checked, using check fit 120-3-11 (FIG. 41C), to determine whether sufficient resources are available so that the two modules can be merged to one site, and the other emptied. If the merge of the modules is feasible, the merge is carried out and processing returns to all equations placed 120-3-4. If the merge is not successful, the modules are unchanged and processing also transfers to all equations placed 120-3-4.

When all the logic equations have been placed in a module, grow modules 120-3 (FIG. 39) terminates. If any logic equations are placed in the virtual module, after grow modules 120-3 terminates equations, update 120-4 (FIG. 39) first attempts to place them in a partially filled block, along with any other equations present. Equations in the virtual block result from two sources—excess logic for the device resources and segmented user logic. Excess logic is simple. Whenever all the modules are full as measured by check fit 120-3-11 (FIG. 41C). the remaining equations are placed in module zero, a synthetic "virtual" module to handle overflows, as described above.

If the user logic is completely segmented into several design modules that share no common signals, block partitioning 120 seeks to place the user design modules into different modules in the partitioning process. Recall one module in the partitioning process is used for each physical programmable logic block in the selected PLD. If there are more user design modules than partitioning modules, the extra user design module is also placed into block zero.

Thus, this processing in update 102-4 is a last chance attempt to place the equations marked as module zero in some other module. Update 102-4 scans all available blocks and reevaluates their fit. In this embodiment, check fit 120-3-11 (FIG. 41C) is used in this reevaluation. Potentially, update 102-4 (FIG. 39) could also relax the extra margin of resource "slack" provided by the configuration variables.

The final operation in update 102-4 is a bookkeeping routine that goes back after grow modules 120-3 and updates several pieces of information based on the results of grow modules 120-3. The information updated is: the symbol's vector USE_VEC, described above, the various Fanout counts and clock pin locations.

Once grow modules 120-3 is completed, vector USE_VEC for each symbol can be updated with the actual module's designation based on where each signal goes. Please note these are not physical blocks at this time, only logic module usage.

For each symbol, the list of equations the symbol reaches is scanned. The various modules they are located in are remembered by setting individual bits in a Boolean vector, one for each block in order (A=bit 1, B=bit 2, C=bit 3, etc.).

The fanout counts of how many modules a signal goes to, can also be correctly counted at this point. This is done in two processing steps, one for dedicated input signals and one for logic equations, because the signal usage declarations are slightly different. The fanout counts are just the number of one's present in the previously described vector USE_VEC's.

Unplaced clocks are also allocated to physical pins at this point. The allocation is performed in an arbitrary sequential order for each signal name as it is declared and located on available clock resources in the device. In a future embodiment, this may be modified if clock resources drive specific blocks, instead of being global as in devices 400.

This block partitioning process provides acceptable results for programmable logic devices having global connections resources for processing on the order of ten to fifty logic equations and most user designs having the same range of equations. For larger designs, e.g, design having about one hundred logic equations, modifications or other partitioning processes may be required to increase processing speed. As an example, if the input design was hierarchial, many pairings could be eliminated from the initial processing. Combined handling of auxiliary equations with the main logic equation speeds this processing and extends usefulness of the block partitioning process of this invention.

This block partitioning process has limited success for very ill-conditioned designs that have very few connections or shared common input signals between a set of equations. The Byte-parallel CRC error detection circuit is a classic case of an ill-conditioned design. In the CRC design, each logic equation essentially feeds another logic equation so that the output and input signals are all ordered in a sequence, like a pipeline, or like data being processed in separate steps.

Hence, in this type of design there are no common input signals to the logic equations. Therefore, similarity measures based upon common input signals will be very small and most likely zero. In the present embodiment, the equations for such ill-conditioned designs are partitioned arbitrarily.

However, in another embodiment, the block partitioning could be performed based upon similarity of use of the logic equation output signals rather than input signals. In this partitioning process, pipeline stages that used the same output signal would be placed in one module. Alternatively, the user preplacement could be used to place a group of equations in a module rather than assigning specific signals to physical pins.

Block partitioning 120, as described above, partitioned a user logic design into modules of equal size. However, this partitioning process works for any size modules so long as the resources available in each module are known. Specifically, the block partitioning process of this invention is not limited to single programmable logic devices. Indeed, this block partitioning process is suitable for general circuit design using one or more PLDs. For example, the programmable logic blocks are components with an electronic device. The components have resources for supporting a user design. The user design is specified by circuits, e.g., the logic equation above. Therefore, the block partitioning of this invention is suitable for placing user circuits in modules that are related to components in an electronic device.

In particular circuit board layout, where interconnectivity between devices is not a problem, can be performed using the block partitioning process. Circuit board layout is a simpler problem than that described above where the interconnectivity was limited by switch matrix 401. In processing circuit board modules, block partitioning would proceed as described above where the resources would be the resources on each device, e.g., PLDs. Again, in this embodiment the modules would be designed to minimize the input signals on the periphery of the devices. Accordingly, the embodiment described above is not intended to limit the process to a single PLD, but rather to be illustrative of a general process that has wide applicability in partitioning an electronic circuit into modules having specified resources.

After block partitioning 120 (FIG. 6) is completed, processing transfers to resource assignment 130. In this embodiment, an assignment process, called the Hungarian assignment process is used. Typically, the Hungarian assignment process has been used in conjunction with computer dating services which promised to find an optimal unique assignment between their clients, satisfying some computed measure of "compatibility". Alternatively, the same sort of problem is also found in assigning workers with varying skills to a set of tasks or jobs.

Briefly stated the problem solved by the Hungarian assignment process is given two populations and some defined numerical measure of compatibility between each member of the two populations, the assignment process systematically determines an optimal association between the two populations. In this case, an optimal assignment is a minimum sum of the compatibility measure across all pairs consisting of one member from each population. Typically, a rectangular array of cost depicts the compatibility measure of all possible pairs within the two populations.

The Hungarian assignment process is applicable to a variety of problems. However, this process fails if the compatibility measure is a function of previous assignments. If for example, one assignment "consumes" some shared resource, precluding other associations, the algorithm will fail.

The limitation of assignment dependencies would seem to preclude the Hungarian assignment process from consideration for resource assignment within a programmable logic block because after resources have been assigned to one logic equation, the resources have been consumed and are not available for another logic equation. However, this apparent limitation is removed by a few simplifying assumptions, and by arranging the assignments in the ways described below.

The product term resources in a programmable logic block may be thought of as the abilities of the males in the marriage problem. The logic equations (females) are "compatible" to the degree the macrocells have adequate product term resources present. A simple cost function, described more completely below, is used as the compatibility measure between the logic equations and the available product terms. If the resources of a macrocell are inadequate for a particular user logic equation, a sufficiently large number is substituted in place of the compatibility measure derived from the cost function so as to preclude the assignment of the inadequate resources to the logic equation.

In resource assignment 130, the Hungarian assignment process is iteratively used, in one embodiment, to assign the logic modules to programmable logic blocks, to assign logic equations that require I/O pins to specific I/O pins, to assign logic equations that require buried macrocells to specific buried macrocells, and input signals for logic equations to specific I/O pins. In each case, the Hungarian process is the same and the process is provided a cost matrix for processing. Thus, initially a cost matrix is assumed and the Hungarian assignment process is described. After the description of the Hungarian assignment process in general terms, resource assignment 130 is described in more detail In this detailed description, the operation of the Hungarian assignment process is not repeated because in view of the following example, those skilled in the art can apply the Hungarian assignment process to the cost matrix that is generated.

The Hungarian assignment process is formulated for populations with equal numbers of members. Other configurations are possible, but the result is to idle, or not satisfy initially the population with the surplus members. In the application of the Hungarian assignment process to assignment of logic equations to resources within the programmable logic block, this is not a problem. Hence, in the following example a square cost matrix is used.

In FIG. 42A, columns V through Z are logic equations assigned to the programmable logic block that require the same size clump of product terms, e.g., 1–4 product terms. The rows A through E represent the available resources for the columns. For example, if I/O pins are being assigned, the rows are I/O pins that have from 1 to 4 product terms available. The rows are referred to as slots where the logic equation can be placed. The value at the intersection of a row and a column is the cost associated with using the product terms associated with the I/O pin for that particular logic equation.

Given the matrix in FIG. 42A, the first operation in the Hungarian assignment process is to find the smallest number in each row and subtract that number from the other elements in the row. The result of this operation is given in FIG. 42B. The next operation is to find the minimum value in a column and subtract that number from the other elements in the column. The result of this operation is given in FIG. 42C.

Reducing the numbers in the matrix does not alter the solution. If all numbers are non-negative after the reduction, the best solution is then an all zero matching. Specifically, an initial mapping of the logic equations to the programmable logic block resources is created from the reduced matrix (FIG. 42D). A graph (FIG. 42E) is constructed by drawing for each row a link from the resource to the columns in that row having a zero element. For example, in row A, a zero is present in column V and Y leading to the two links drawn in FIG. 42E.

Similar links are drawn for each resource, i.e., each row, that has a zero in any of the column elements in that row. Narrow lines are used initially to represent the links.

Whenever a link (FIG. 42E) mapping from left to right(left is the resources available and right is the logic equations) is unique, the link becomes a part of the initial mapping. The unique links are shown by a broad line in FIG. 42E. Resource C is mapped to equation Y by this process. The other links to equation Y, i.e., the links A→Y and B→Y are removed from consideration by the unique mapping of link C→Y. The remaining lines are then unique links and map is shown in FIG. 42E (link A→V and link B→W). The last remaining unique link E→W is duplicative and is therefore removed.

The next step in the Hungarian assignment process is to chose arbitrarily a match for resource D, because the mapping of resource D is not unique. A first or last link selection is equally acceptable, so link D→Z is chosen in the initial mapping (FIG. 42E).

The initial mapping (FIG. 42E) is next examined to see if the mapping is a maximal cover. For all unmatched resources and equations, i.e., resource E and equation X, is there a possible augmenting path, as described below, from the unmatched resource on the left to the unmatched equation on the right? If so, the initial mapping is changed to include that path, otherwise the cover is maximal.

For the mapping in FIG. 42E, there is a path E→W, then a path W→B (via a backedge, where a backedge is traversing a unique link from right to left), next a path B→Y and finally a path Y→C. These nodes are numbered 1,2,3,4,5 in successive steps of distance. Note that equation Y does not map to resource A, because the path is not a backedge. Thus, no augmenting path exists between resource E and equation X. Therefore, the cover AD/VZ (represented by the dotted lines in FIG. 42F) ,.i.e., the unnumbered rows and the numbered columns in the previous step, is maximal.

Since a complete maximal cover has not been found, the next step in the Hungarian assignment process is to find the minimum uncovered number M and use that number in a second reduction of the matrix. In FIG. 42F, the minimum uncovered number is one. In the second reduction, number M is first subtracted from all uncovered rows, i.e., rows B, C and E and then the number M is added to all covered columns i.e., columns W and Y. The result is given in FIG. 37G. Again, the links are defined by zero matching as described above. The selection of unique links gives the comprehensive cover shown—all rows are covered.

This is the optimal solution. Transferring the mapping to the original array and summing the circled elements gives the minimal sum of 12 (FIG. 42H).

Hence, the steps in the Hungarian Assignment process given a cost matrix are:
1. Subtract minimum value in each row from all elements in that rows.
2. Subtract minimum value in each column from all elements in that column.
3. Find Maximum zero-matching and minimum cover. If all rows are matched, the optimal solution has been found and processing stops.
4. Find Uncovered Minimum number M
5. Subtract M from all Uncovered Rows and add M to all covered columns.
6. Repeat Steps 3-5 until optimal solution is found.

The Hungarian assignment process uses the three data structures defined above. In one embodiment, procedures were created for initial reduction subtraction (Steps 1 and 2), building the graph, unique link, first link creation, checking for maximal cover (Step 3) and second reduction steps (Steps 4 and 5).

Figure 43A:
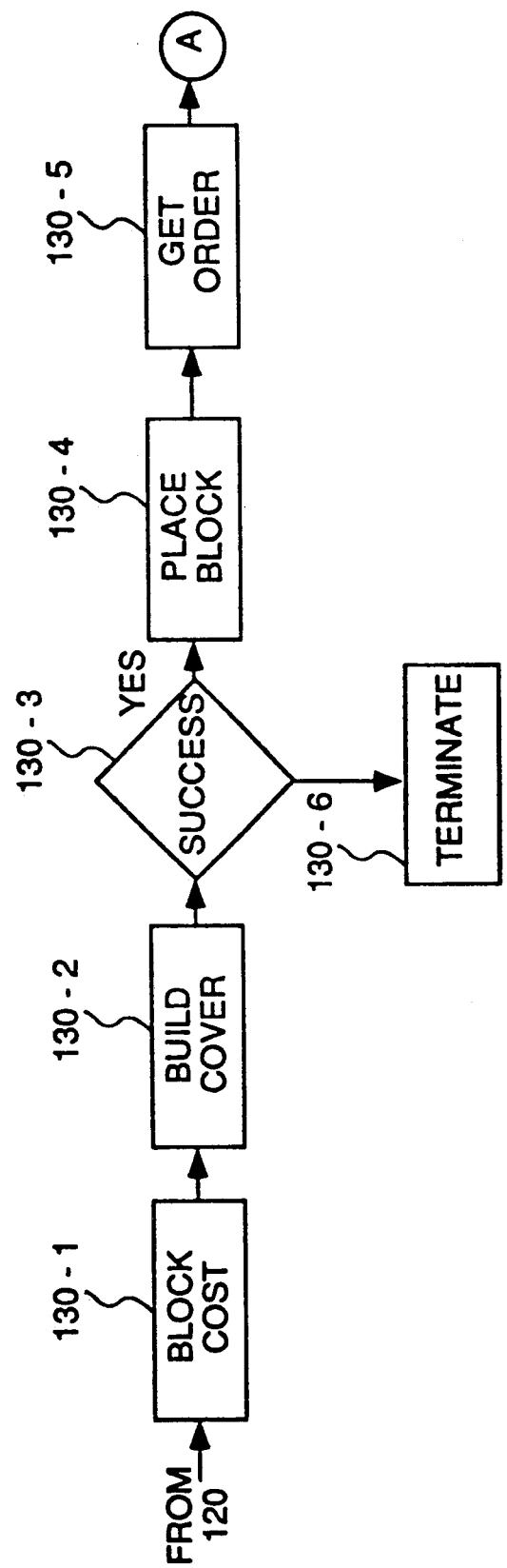

After block partitioning 120 (FIG. 6), modules of logic equations are contained in the memory resident physical database. Thus, the first operation in resource assignment 130 (FIG. 6) is to assign the modules to programmable logic blocks with the selected programmable logic device. If the programmable logic blocks are symmetric, block cost 130-1 (FIG. 43A) builds a cost matrix with the diagonal elements set to zero and all other elements set to a high number which means that the assignment is not feasible.

If the programmable logic blocks are not symmetric, block cost 130-1 counts the total number of pin macrocells and the total number of logic macrocells in each programmable logic block in the selected programmable logic device using the data in the memory resident physical database. The rows in the cost matrix are the logic modules and the columns in the cost matrix are programmable logic blocks.

If the number of I/O macrocells required by the logic module are greater than those available in the programmable logic block, the cost is set to a value that indicates the assignment is infeasible. Otherwise, the cost is the total number of logic macrocells available minus (i) the number of I/O macrocells and (ii) the number of buried macrocells required by the logic module unless the available logic macrocells is equal to or one greater than the required number of I/O macrocells. In these cases where the two numbers are nearly equal, additional cost is added to the calculated cost (five if the calculated cost is one and ten if the calculated cost is zero) for this use of the programmable logic block.

After block cost 130-1 builds the cost matrix, build cover 130-2 processes the cost matrix using the Hungarian assignment process described above. If each module is mapped to a programmable logic block, success 130-3 passes processing to place block 130-4. Conversely, success 130-3 passes processing to terminate 130-6 which provides the user with appropriate error message describing the failure of the mapping and terminates processing.

Place block 130-4 first renumbers the logic modules from block partitioning 120 to physical programmable logic blocks (A, B, ... H) based upon the module assignments to programmable logic blocks generated by build cover 130-2. Next place block 130-4 modifies the symbol block fields for the physical programmable logic blocks and fills in the use vector of the symbol array also based upon the physical programmable logic blocks.

In this embodiment, the dedicated input pins are processed as programmable logic block zero. Place block 130-4 uses the connection information generated in block partitioning 120 and sorts the blocks so that the blocks are ordered from the block requiring the most connections to the block requiring the least connections. Specifically, the sorting process orders the blocks, including block zero, based on the fanout counts of logic equation (signal) interconnects. Other measures, such as resource utilization were tested, but were found to be less effective than fanout. In subsequent processing, the block with the largest fanout is processed first so that there is a maximum probability of successfully mapping the equations in the module to the block.

After place block 130-4 completes processing, the number of input lines of each block from the switch matrix, macrocells remaining, the number of I/O pins required, the number of buried register equations, the number of product terms utilized, and the signal fanout for each programmable logic block and the signal fan-out for the dedicated input pins are printed to the user output file. For example, see FIG. 45 under the heading "*Physical DB*". Get order 130-5 simply allows for manual ordering of the blocks for subsequent processing if the user specifies such ordering.

After determination of the order of processing the blocks by place block 130-4 and get order 130-5, resource assignment of the resource in each of the programmable logic blocks and the input block is done. In this embodiment, this resource assignment first maps the logic equations requiring an I/O pin to the programmable logic block, and then the buried register equations are mapped.

If the user specified any equation placements for the block being processed, these equations are placed and the resources required by these equations are marked as used prior to starting the I/O pin and buried equation mapping. Blocks remaining test 130-7 (FIG. 43B) determines whether programmable logic blocks including block zero have been processed. If any block remains for processing block remaining test 130-7 passes control to block zero test 130-8.

Figure 43B:
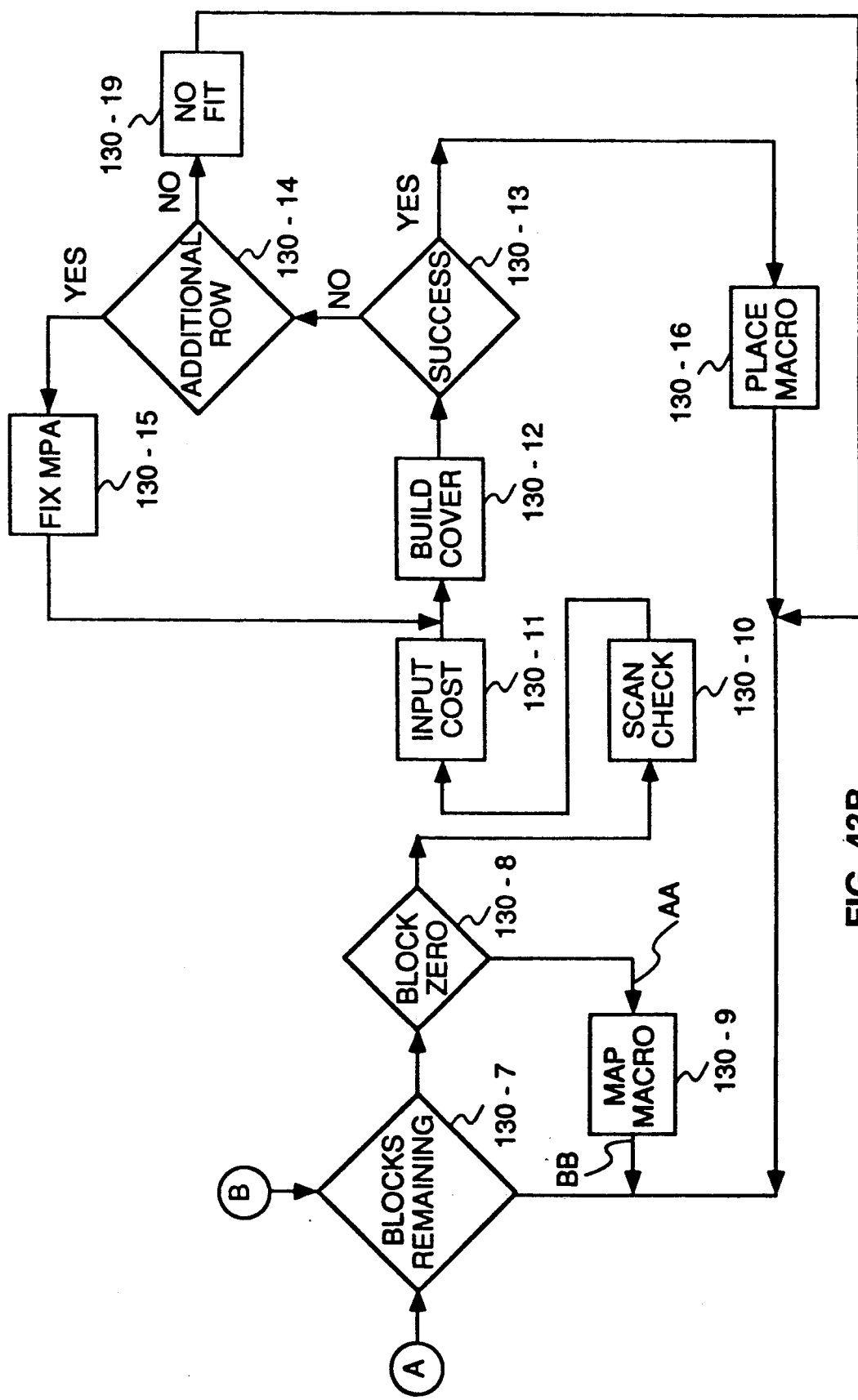
Figure 44:
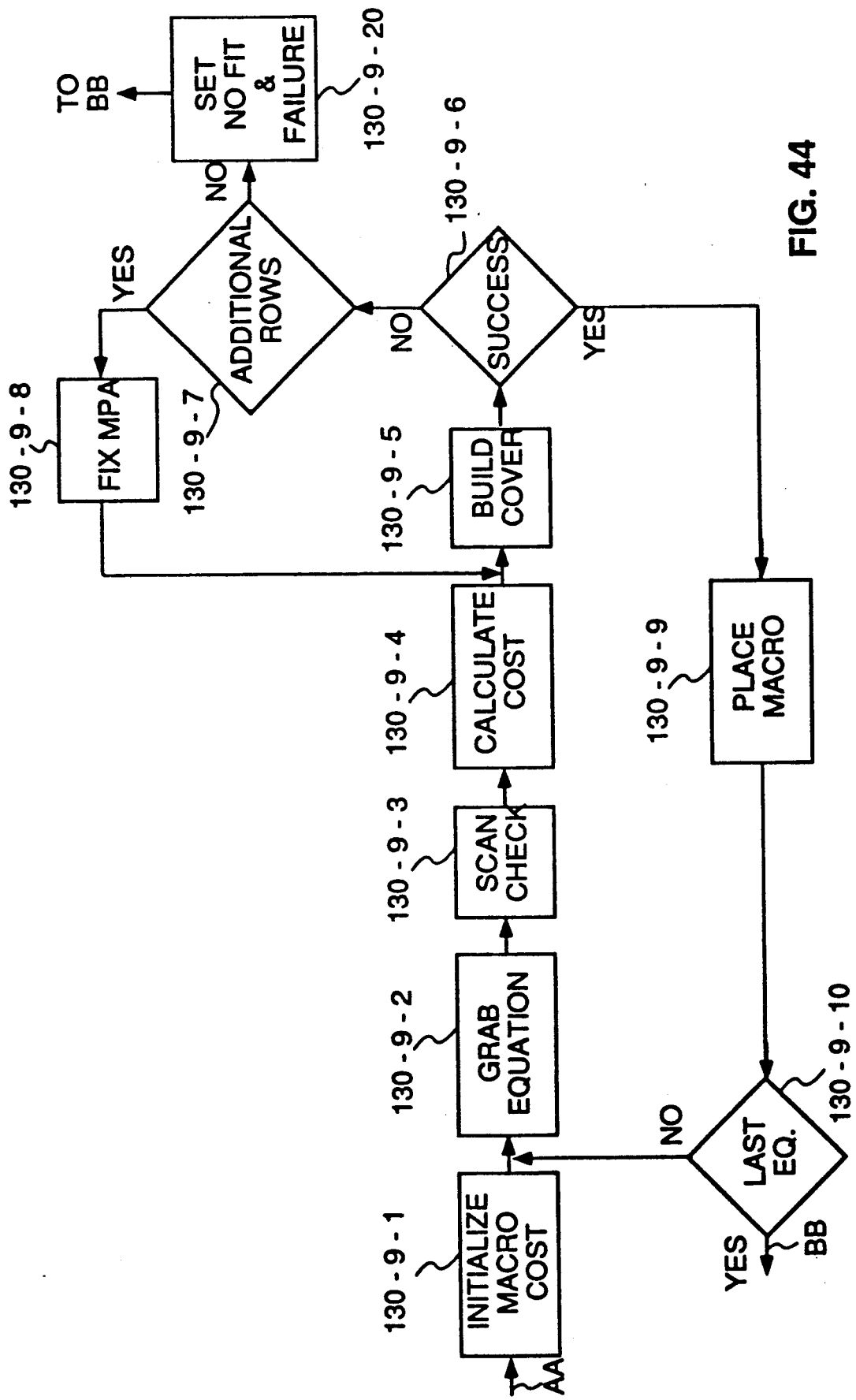
FIG. 44 is a process flow diagram for map macro (FIG. 42B).

If block zero is not being processed, block zero test 130-8 passes control to macro map 130-9 which includes steps 130-9-1 to 130-9-10 (FIG. 44). Macro map 130-9 (FIG. 43B) placed each logic equation that requires either an I/O pin or a buried macrocell in the programmable logic block and then returns processing to last block test 130-6.

In macro map 130-9, initialize macro cost 130-9-1 (FIG. 44) first zeros the cost array. Next the product term requirements for each equation in the block are determined using information in the memory resident signal database described above. After the product terms requirements are determined, a bubble sort is used to order the equations by type, i.e., I/O or buried, and by product term requirement.

After the equations are ordered and the cost matrix zeroed, processing transfers to grab equation 130-9-2. Grab 130-9-2 first grabs all equations of the same type that have product term requirements governed by the size of its product term clump where the first product term clump might dictate 13-16 product terms, the second product term clump 9-12 product terms and so on. Grab equation 130-9-2 processes the I/O equations having the greatest number of product terms in the first pass through the loop in macro map, the I/O equations having the second greatest number of product terms on the second pass through the loop in macro map, and so on.

After grab equation 130-9-2 grabs the equations, the slots available for placement of the equations are ascertained. Three factors must be considered in obtaining the slots. First, if a logic equation is placed in a slot, the slot is not available. Second if the slot is available, can the logic allocator steer the number of product terms required to the slot. A first-available service rule was used. A scan is made of the used and available product term resources for a predetermined equation size. The first macrocell that has sufficient product terms within the connection capabilities of the logic allocator is chosen. Further, the first available set of product term resources is used to provide the logic required, as well.

The third factor is proper use of three state output enable banking, which is described more completely below. Here a slot is either an output logic macrocell or a buried macrocell depending on the type of the equation being processed. Hence, grab equation 130-9-2 determines the size of the matrix in the Hungarian assignment process because the slots retrieved are the rows and the equations grabbed are the columns.

Scan check 130-9-3 looks at a segment of the remaining PLD interconnection resources and determines if there are multiple paths between any pair of sources, i.e, macrocell feedback signals to the switch matrix or pin signals to the switch matrix, to any target array input. Specifically, logic equations or dedicated pin signals that are being considered for assignment to resources within a programmable logic block may potentially fanout such that both equations are driving the same array input. Hence, if the signal from the first equation were assigned to the macrocell, the target array input is consumed and would not be available for the second logic equation.

If such multiple paths are present, scan check 130-9-3 removes one of the paths, currently destructively, as explained below. In another embodiment, a simple modification could be made to allow the operation to be non-destructive, i.e., after resource allocation for the logic equation requiring an I/O pin or a buried register the deleted paths could be reactivated. However, the number of connections destructively removed is small so the motivation to change this behavior is low.

Scan check 130-9-3 is necessary because the Hungarian assignment process evaluates all mappings simultaneously, in parallel. Mapping a particular row, say row A, to a first column 3, must not be dependent on mapping another row B to a second column 4 instead of to a third column 6. Such dependencies, as described above, cause the Hungarian assignment process to fail, because one mapping has to be evaluated based on the results of other mappings, e.g. the mappings must be performed serially.

Most of these mapping dependencies may be removed implicitly by designing the switch matrix in segments, and forcing each driver row, i.e., each switch matrix input line, to go to unique columns, i.e., programmable logic block input lines, which in devices 400 are product term array input lines, along a simple pattern such as a diagonal. This simple pattern works for all logic equations that drive either macrocells or pins within a programmable logic block in devices 400.

In this embodiment, scan check 130-9-3 attempts to find multiple paths by looking at all the places a driver's signal can go through the switch matrix, and reports any intersection with any macrocells reached by another driver, currently being considered as part of the assignment rows. Scan check 130-9-3 performs these operations, described more completely below, in five steps, i.e, (i) mark all inputs to AND array unused, (ii) trace all paths through the switch matrix from each driver, (iii) mark all inputs reached by a driver (range), (iv) look for collisions between the ranges, and (v) remove redundant paths identified by collisions.

Scan check 130-9-3 begins by "marking" all available array inputs in the device as "unused" in a spare field of the fanout array. A reserved numeric value is stored in that memory location to indicate unused. Scan check 130-9-3 then executes a loop for the sub-set of all drivers, (either pin or logic equation) that have been selected for this assignment and "marks" every array input that is reachable from that driver with its driver identity. The subset of drivers considered is the subset returned by grab-equation 130-9-2, as "slots" for potential assignment—rows of the cost array. Whenever a used array input is reached, i.e., that array input has been marked by some other driver, scan check 130-9-3 removes that macrocell's input multiplexer in the switch matrix from one of the drivers range of fanout. A Boolean flag alternates between the first and second driver of the pair. This alternation "randomizes" the connection removal from drivers first on the list to ones found later.

Calculate cost matrix 130-9-4 determines a cost for the assignment of a logic equation to each slot. Hence, the columns of the cost matrix represent logic equations and the rows are macrocell sites available for logic equation placement. The cost starts at zero and is incremented for various costs. In this embodiment, the product terms can be steered to multiple locations so that there is not a cost associated with unutilized product terms when a specific slot is used. However, if a slot has a fixed number of product terms, e g., 12 and only three of the product terms are used. The cost of using that slot is 9. A small cost of 5 units is accessed for placing a buried register equation in a slot that has an I/O pin.

Next, the feasibility of realizing each of the fanout connections of each of the logic equations in the cost matrix is checked by placing each logic equation at each of the potential slots in the cost matrix. The use vector associated with the logic equation output signal symbol provides the signal fanout information. The switch matrix array in combination with the fanout array provides the possible signal paths. If any paths exist to support the fanout, the necessary fanout connections are feasible. All fanout connections required in the fanout list must be feasible.

A large cost is accessed for infeasible connections to assure that the Hungarian assignment process does not make the assignment. In this embodiment, this cost is 121 units. In determining whether to assign this cost, the requirements associated with the equation other than product terms are analyzed. For example, can the fanout list for the equation output signal be routed through the available empty switch matrix positions if this slot is used. If the fanout list cannot be established the equation cannot be assigned to the slot.

After the cost matrix is completed, build cover 130-9-5 processes the cost matrix using the Hungarian assignment process described above. If the Hungarian assignment process is successful, success test 130-9-6 passes processing to place macro 130-9-9. However, if the Hungarian assignment process fails, success test 130-9-6 passes processing to additional rows test 130-9-17.

Recall, as described above, the Hungarian assignment process in build cover 130-9-5 processes a square cost array. Accordingly, if the cost matrix constructed by grab equation 130-9-2 and calculate cost 130-9-4 had more available slots than logic equations, the cost matrix was not square. Build cover 130-9-5 processed only the first n rows of the cost matrix where n is the number of columns.

Thus, additional rows test 130-9-7 determines whether there are extra rows in the cost matrix, i.e., rows $n+1$ to m where n is the number of columns and m is the number of rows in the cost matrix. If additional rows are available, processing transfers to fix MPA 130-9-8. Otherwise, processing transfers to blocks remaining 130-7. However, a failure flag is set so that generate documentation 145 later provides diagnostic information to the user.

Fix MPA 130-9-8 uses the extra rows in the cost array to retry the Hungarian assignment process. Specifically, fix MPA 130-8-9 locates the row in the square cost matrix with the most infeasible costs and replaces that row in the cost matrix with one of the extra rows. The new cost matrix is then provided to build cover 130-9-5 and the number of rows n is incremented by one so that should the Hungarian assignment process fail, additional rows test 130-9-7 continues processing only if m is greater than $n+1$.

Place macro 130-9-9 is a book-keeping process that places the equations at the selected macrocells locations and updates the switch matrix connections, product term usage and other resources used by placement of the equation at the macrocell location. All the required resources are marked as used. Last equation check 130-9-10 passes processing to grab equation 131-9-2 if there are equations remaining for the logic block. Otherwise, last equation check transfers processing to block remaining test 130-7 (FIG. 43B).

In the previous processing, block zero test 130-8 (FIG. 43B) passed processing to macro placement 130-9. However, if block zero is being processed, block zero test 130-8 passes processing scan check 138-10. Here, scan check 138-10 performs the same processes for the dedicated input pins as described above for scan check 130-9-3 and that description is incorporated herein by reference.

Upon completion of scan check 138-10, input cost 130-11 first zeros the cost matrix. Next, input cost obtains a list of the available dedicated input pins. After the available slots for dedicated input pin signals are ascertained, the input signals for the dedicated input pins are obtained from the memory resident signal database. Again, the fanout for the dedicated input signals is checked at each of the available slots. If a slot cannot support all of the fanout connections for any given signal, the cost for the assignment of that signal to the slot is set at infeasible. The dedicated input pin slots are the rows of the cost matrix and the input signals are the columns.

After input cost 130-11 obtains the input signals, the column position of the signals in the cost matrix is sorted according to the fanout of the signals using a bubble sort process. Thus, the columns of the cost matrix are ordered from largest fanout to smallest fanout. After input cost 130-11 builds and orders the cost matrix, build cover 130-12 determines the assignment of input signals to dedicated input pins using the Hungarian assignment process described above Success test 130-13, additional rows test 130-14 and fix MPA 130-15, all function as previously described with respect to success test 130-9-6 (FIG. 44), additional rows test 130-9-7 and fix MPA 130-9-8. The only difference is that here the input cost array is for dedicated input signals and available dedicated input slots. Accordingly, the previous description is not repeated.

Place macro 130-16 is again a bookkeeping process that places the input signals at the selected dedicated input pin locations and updates the switch matrix connections and other resources used by placement of the signal at the pin location. All the required resources are marked as used. Place macro 130-16 passes processing to block remaining 130-7.

Figure 43C:
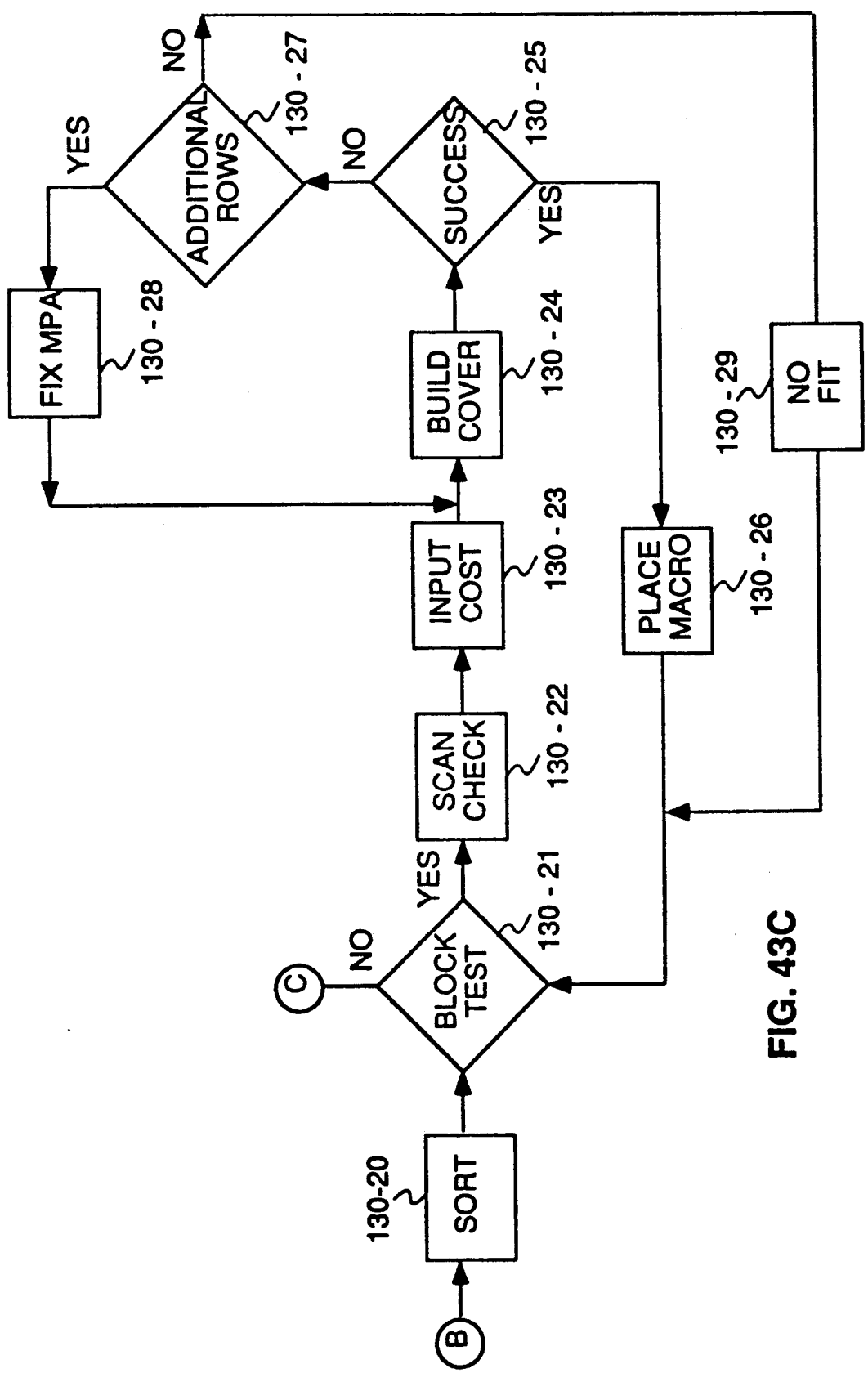

When the last block has been processed so that all the I/O equations and buried equations have been assigned to locations in the programmable logic device and the dedicated input pins have been processed, blocks remaining check 130-7 passes processing to sort 130-20 (FIG. 43C). If user design 100 specified more dedicated input signals, i.e., device input signals, than are supported by the dedicated input pins of the PLD, the unmapped device input signals must be allocated resources in the PLD. These signals may be placed at any available I/O pin.

Sort 130-20 orders the programmable logic blocks by the number of available I/O pins in preparation for placing input signals to the logic equations. Again, each programmable logic block is sequentially processed starting with the block having the largest number of available I/O pins.

Block test 130-21 (FIG. 43C) determines whether all the programmable logic blocks have been processed for input signal placement. If a block is available for processing, block test 130-21 passes control to scan check 130-22, which performs the same functions as the scan checks, described above. Input cost 130-23 generates the cost matrix in a manner similar to that described above for input cost 130-11 (FIG. 43B). The only difference is that here I/O pins available in the block are selected as possible slots instead of dedicated input pins. The costs are the feasibility of realizing the need interconnections for each signal at the given slot.

After input cost 130-23 (FIG. 43C) generates the cost matrix for the available I/O pins as row and the input signals as columns, build cover 130-24 determines the assignment of input signals to dedicated I/O pins using the Hungarian assignment process described above. If the Hungarian assignment process is successful, success test 130-25 passes processing to place macro 130-26. However, if the Hungarian assignment process fails, success test 130-25 passes processing to additional rows test 130-27. Additional rows test 130-27 functions in the same manner as the additional rows test, described above, as does fix MPA 130-28.

Place macro 130-26 is a bookkeeping process that places the signals at the selected I/O pin locations and updates the switch matrix connections, product term usage and other resources used by placement of the signal at the I/O pin location. All the required resources are marked as used. Place macro 130-26 transfers processing to last block test 130-21.

When the last block has been processed so that the input signal have been assigned to available I/O pins, last block check 130-21 passes processing to processes 130-30 through 130-37 (FIG. 43D). These processes, which perform the same operations, i.e., scan check 130-31, input cost 130-32, build cover 130-33, success test 130-34, place macro 130-35, additional rows test 130-36 and fix MPA 130-37 as previously described, are a last gasp effort to place any remaining signals. Specifically, these processes attempt to place any remaining input signals randomly at each available I/O slot in any programmable logic block. If a signal is successfully placed, place macro 130-35 updates the resources used after the placement. If all the signals are mapped to the selected programmable logic device, resource assignment 130 terminates processing successfully, and processing transfers to documentation generation 145.

Throughout all of the final input signal resource assignment steps, if any signal fails to be assigned resources, the signal is passed on to the later steps for possible assignment within another programmable logic block. Since the input signals are processed in order of decreasing fanout, the signals driving many places were assigned first when the switch matrix was the most empty. Accordingly, the assignment of input signals with the smaller fanout is typically successful in one of the programmable logic blocks.

In the previous embodiment of resource assignment 130, the order of assigning resources was logic equations requiring an I/O pin, buried logic equations, and then input signals. In another embodiment, logic equations requiring output signal enable product terms are processed first followed by processing of the previous embodiment.

Thus, in this embodiment, the first mapping phase would process logic equations containing independent output enable product term functions. Logically separate output enable product term functions would be placed in different macrocell banks, and repeated identical output enable functions would be placed in the same macrocell bank, if space allows, or different banks otherwise.

The logically separate output enable product term functions would be processed first. The first of these functions would be checked for routing feasibility by being placed at any of the macrocell locations served by an independent output enable product term. The next equation would be placed on the next available independent output product term, skipping whatever macrocells are bound to the first output enable product term function.

For example, if equations A, B have separate output enable product term functions and four macrocells are banked to each output enable product term in the device, if equation A is placed at macrocell 2, equation B is "blocked" from macrocells {0,1,3}. The first "open" site for equation B is macrocell 4. A second equation B2, (having the same output enable function as equation B) would be similarly blocked from macrocells {0,1,3}, but equation B2 could fit in location 5.

In the Hungarian assignment process, the available slots reflect the feasibility of the signal routing for the macrocell placement (a 0 means all signal routes are feasible, and a one means one or more connections are blocked):

| OE Slots → | {0-3} | {4-7} | {8-11} | {12-15} |
|---|---|---|---|---|
| EQ A | 1 | 0 | 1 | 1 |
| EQ B | 1 | 0 | 1 | 0 |
| EQ C | 0 | 1 | 0 | 1 |

-continued

| OE Slots → | {0-3} | {4-7} | {8-11} | {12-15} |
|---|---|---|---|---|
| EQ D | 0 | 1 | 1 | 0 |

Feasible Assignment: A→12, B→0, C→4, D→8 (not unique)

Routing feasibility is investigated for each or the several macrocells served by the output enable product term, and for each equation present in the equation group. Use of the Hungarian assignment process produces a valid mapping.

After the separate output enable product term functions are mapped, other equations sharing a common output enable product term function to those equations already placed would be processed. Each of the available macrocells in the bank with a common output enable product term function would be checked for feasible routings with another application of the Hungarian assignment process.

The success of this process for output enable product term function mapping relies on the sparsity of independent output enable product terms in logic equations. Database studies have shown that in typical user designs only 5-10% of the logic equations use output enable product terms. Hence, this process should be appropriate for the mapping of such functions.

Figure 47:
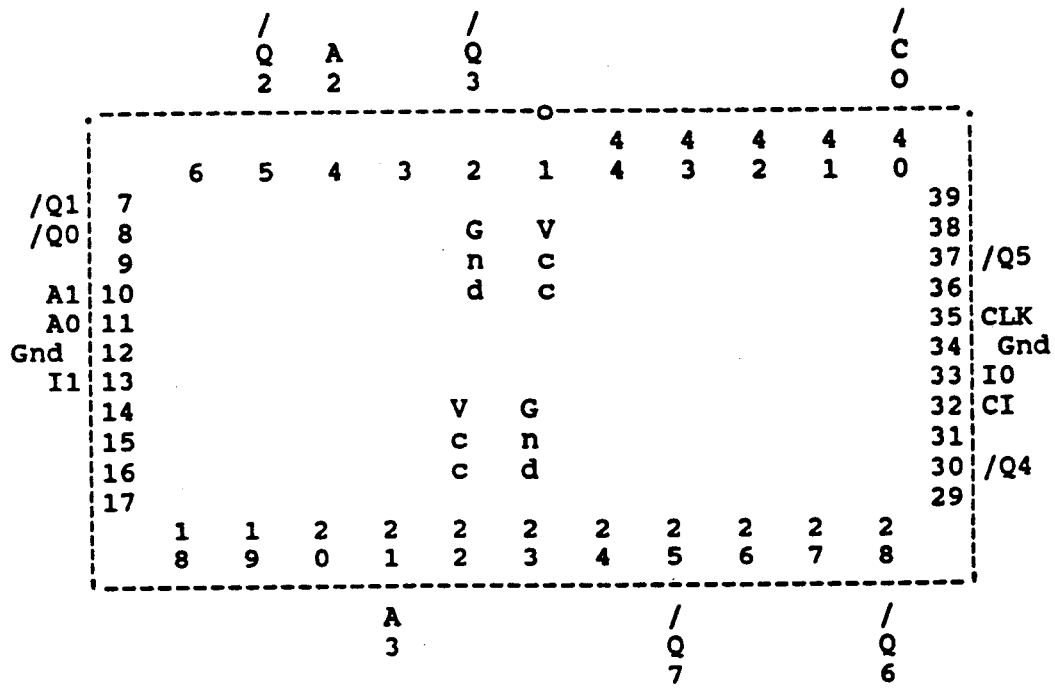
FIG. 47 is an example of a pin map produced by document generation 145 according to the principles of this invention.

Upon successful completion of resource assignment 130, documentation means generates the documentation described above. Specifically, success or failure of the fitting is significant and is indicated to the user on the computer video display screen. In addition, a logical map and a pin map, as illustrated in FIGS. 46 and 47, are generated in an output file. The logical map and the pin map are built using information in the memory resident databases that was generated by resource allocation means 110 as well as information provided by the user in PDB 121. Hence, the information provided by the user is described, before considering the two maps in more detail. Specifically, the pin and logical maps are created by resource allocation means 110 based on instructions located in PDB 121. Different programmable logic device architectures are accommodated by changing the contents of the data in PDB 121. No changes to resource allocation means 110 are necessary.

The instructions in PDB 121 necessary to depict the logical and pin maps consist of three types of records, i.e., squares, strings and number records (FIG. 21E). These records are referred to as graphical records. In PDB 121, the leading character "[" indicates logical map instructions, while the character "]" designates pin map instructions.

The second field of the graphical records indicate the instruction type, where a "1" is a square, a "2" is a number sequence, and a "3" is a "String".

On a square graphical record, four numbers are required after the second field, i.e., the coordinates of the upper right corner location of the square(horizontal and vertical) and the coordinates of the lower left corner location of the square(horizontal and vertical). (Herein, the term "square" includes any rectangular shape.) Two squares may be defined on a record as shown below. A square graphical record is terminated with a "*". Characters following the star ("*") termination are ignored. The format for the square graphical record is (recall comment records start with a ";"):

```
;   Sqr's
;   [<Rtyp> <UR.h> <UR.v> <LL.h> <LL.v>...] *
[   1    10    1     13    16      1    10   17   13 20   *
```

The number sequences on a number graphical record are used for labeling a collection of macrocell locations. On a number graphical record six numbers are required after the second field, i.e., two numbers for the horizontal and vertical location of the number sequence, two flags for positioning control and lastly two numbers d1, d2 which are the first and last numbers respectively of the sequence. The first number must be smaller then the last number. Two number sequences may be used in one record as shown below. A number graphical record is terminated with a "*". Characters following the star ("*") termination are ignored. The format for a number graphical record is:

```
;   Num's  -  <d1> start,  <d2> end Number
;   [<Rtyp> <UR.h> <UR.v> <f1> <f2> <d1> <d2>...] *
[   2   35   2    0  0   1   10    2    26  11    1  0
                                             11   20   *Blk A
```

The string graphical records are user labels for the maps. The characters from the record are placed directly on the logical or pin map location designated. On a string graphical record after the second field, the record has two numbers for the horizontal and vertical location of the string, two flags for changing the orientation (horizontal or vertical) and the justification ("front" or "end") of the string and finally the string which is limited to nine characters.

With these controls, labeling can be accomplished without having to count the number of characters present in the string. Two strings may be defined in the record as shown below. A string graphical record is terminated with a "*". Characters following the star ("*") termination are ignored. The format for a string graphical record is:

```
;   Str's    <dstr>   String   (9 char max.)
;   [<Rtyp> <UR.h> <UR.v> <f1> <f2> <dstr>...] *
;   <f1>  Justification:   0=front,  1=end
;   <f2>  Orientation:     0=vert,   1=horiz
[   3     8    1    1    1   Gbl_Inp    3    7   17   1   1   Clks   *
```

The logical and pin maps are "drawn" on a 50×119 character screen buffered for random access by documentation means 145 (FIG. 6). In this embodiment, the logical map instructions are processed by documentation means 145 and the logical map drawn before documentation means 145 proceeds with constructing the pin map. Hence, successive commands may overwrite the previous display buffer contents. Documentation means 145 clears the drawing buffer, processes all stored instructions of the particular type, then annotates the map with the user signal names for the device resources.

Within the other parts of PDB 121, as described above, (on the Pin List, Switch Matrix, Fanout Mux and Fanout list records), there were drawing locations and flag settings appropriate for these annotations. The drawing locations and flag settings are in the same string format. When commanded to draw a square, description means 145 uses the coordinates provided for the square and fills in the horizontal and vertical screen character positions with vertical bars ("|") and dashes ("−"). The corners are filled with periods (".") and apostrophes ("'").

The user signal names are chopped to eight characters (the maximum length allowed by the map design) and sent with the appropriate location and flag information to the string drawing procedure. When all signals have been processed, the drawing buffer is sent to the video display screen and output file.

The pin map has a small amount of "custom processing" to fit the 50 line image onto a 25 line video display screen. The top and bottom row of signal names are "folded" to appear in the center of the package pinout square for the video display screen output. Care in map design allows the signal names to be read and not appear confusing.

The logical map (FIG. 46) depicts how user logic in user design 100 is mapped onto macrocells and the interconnection provided by the switch matrix. The logical map includes a map for each programmable logic block and a map for the dedicated input pins and the associated signal lists for each of these maps. The dedicated input pin map has a single signal list, located to the left of the input pin number block, indicating the user signal names located on dedicated input pin. Status characters indicate a combinatorial, latched or registered input signal using the convention: "|" is a combinatorial signal, ":" is a registered input signal and "−" is a latched input signal.

For each programmable logic blocks, two columns of signal lists are provided, labeled I/O. The I/O list indicates which logic equation and logic variable is located on each input line from the switch matrix to the programmable logic block.

A one character flag is used to annotate the output of the logic map for macrocell usage. Initially a vertical bar ("|") indicates the cell is unused. Following signal placement in a cell, ten special characters are used:

@: Output equation only—No Feedback to other logic equations
?: Placement mapping problem with signal in this cell
.: Buried Register logic equation—Local (to this block) Feedback
*: Buried Register logic equation—global Feedback
−: I/O Macro logic equation—Local (to this block) Feedback
+: I/O Macro logic equation—global Feedback
 : Input Functions—Local (to this block) Feedback
::  Input Functions—global Feedback
!: Buried Reg+Input function—Local (to this block) Feedback
: Buried Reg+Input function—global Feedback The pin map (FIG. 47) depicts each user signal name that is associated with package pins. The pin map is a "customized" symbol of the device outline that allows the user to quickly locate pins for trouble shooting of a breadboard. The pin map also serves as documentation for the user signal inputs to the programmable logic device.

For the most part, the pin mapping is completely determined by the logical mapping and the device layout—a given signal name appears on both the logic map location of a macrocell and the associated signal pin in the pin map. However, for buried logic macrocells, the associated pin is free to be used a device input for another signal. Thus, different signal names may appear on the related locations.

In addition to the logic map, a feedback map (FIG. 48) is also generated. The feedback map has a format identical to that described above except the columns of signal names are inputs to the AND array.

To further document the layout of the programmable logic devices the user is provided with several additional print outs. First, a list of all switch matrix connections is provided. Next, a list of the macrocell/logic equations layout is provided. Finally, a list of the signals (FIG. 49) generated and where they are used is provided. The format for this list is:

$$<Signal><S\#><P\#><Type><PT><1s>\text{-}<B><M\#><S\#><BLK><\text{Fanout List}>$$

where:
  $<S\#>$: is the internal signal number;
  $<Signal>$: is the signal name;
  $<P\#>$: pin number
  $<Type>$: is the signal type is given by three characters. The first character is I, P, or B where I is dedicated input pin, P is I/O pin or logic equation, and B is buried logic equation. The second character indicates whether the signal is used in other equations. A "." means the signal has not been used, and a "I" means the signal has been used. The third character indicates the type of register is the signal is registered otherwise "." is entered. "T" is a t-type flip-flop, "D" is a D-type flip-flop and "L" is a latch.
  $<PT>$: is number of provided terms in main logic equation;
  $<1s>$: is the number of ones in the boolean vector for each logic equation;
  $<B><M\#>$: is the programmable logic block and the macrocell;
  $<BLD>$: are the blocks where the signal is used;
  $<\text{Fanout list}>$: is the fanout for the signal.

Finally, documentation means 145 generates a JEDEC file for the programmable logic device that contains the fuse configuration to implement user design 100 in the device.

Build documentation uses a bookkeeping routine, that translates the user logic equations, through the physical mapping developed by resource assignment means 130 to the device fuses necessary to implement the desired function specified by the user logic equation.

The bookkeeping routine operates on a block of computer memory linearly addressed much like the selected device does —i.e., an array of 6504 fuse locations for device 400A and an array of 12704 fuse locations for device 400B. Initially all fuses are initialized to a "1" (the erased state for the implementation technology).

This block of computer memory is accessed as a two dimensional array for the lower addresses—the product terms, and as a linear space for the switch matrix and architectural fuses. Of course, the memory can be read by the computer in other ways as well, i.e., an array of bytes.

The bookkeeping routine used to build the JEDEC file operates in two phases, i.e., one phase to handle all logic equations and one phase to handle all architecture fuses for all macrocells. The bookkeeping routine also performs a series of final checks on the configuration of the logic specified. Usage checks, such as whether all related equations are present, whether the proper access is possible and the like, are handled by this processing.

In the second phase of the bookkeeping routine, for each cell, status flags for each macrocell are kept as to what the macrocell is used for—input, output, buried logic, or unused. Additional flags tie the macrocell back to the signal names declared for each and the internal signal array sig_ary which contains the logic equations.

Processing the architectural fuses, amounts to scanning all macrocells, and transferring this usage information into the specific fuse locations for the cell. A simple address translation and table look-up converts the cell's block and location number to the address for the architectural fuses. The usage flags are transferred to selected bits using a multi-way case.

The first phase of the book-keeping routine processes the user logic equations. This phase involves "unwrapping" the mappings imposed on the switch matrix and the product term allocator by resource assignment means 130. Two locations have to be developed—the input line numbers of signals brought into a logic equation and the product term it is to be realized on.

When the input signals to an equation are located within a particular cell of the switch matrix, the signals appear on a specific input line of that AND array (defined in a field of the switch matrix record Sw_Mtrx).

When a logic equation is placed at a particular macrocell, certain product terms have to be connected to that macrocell and the terms within the equation have to be assigned locations associated with a particular product term. Which product term is governed by the first placement strategy used in the logic allocator and the resource definitions used in the fanout records. Both of these items determine the exact row and column address used in processing an input signal to a user logic equation and the signals related fuse state for the connection.

The loop for processing all equations does these translations for each term in the logic function and for each input signal present. If the variable is complemented, the input line is incremented to introduce the correct signal polarity (the inverting driver).

Auxiliary related equations, like three-state and set and reset have to be processed as well as the main logic equations. The auxiliary equations have been implicitly located in the proper product terms by the mapping of the macrocell location. Clock equations were handled by the earlier architectural fuse processing.

Lastly, if no errors were detected in the final checks, the completed Jedec memory array is output to a disk file. Various check-sums and fuse addresses are appended to the individual fuse states as the characters are stored.

The embodiments of the resource allocation system and method of this invention described above are illustrative of the principles of this invention and are not intended to limit to the invention to the particular embodiments described. In view of this disclosure, those skilled in the art can use the principles of this invention for resource allocation in other devices having blocks interconnected by limited connection resources.

I claim:

1. A system for allocation of resources of a programmable logic device (PLD) having a multiplicity of programmably interconnected programmable logic blocks to user logic equations comprising:

means for inputting user logic equations, means, operatively, coupled to said user logic equations, for partitioning said user logic equations into a multiplicity of modules wherein each user logic equation is placed in one of said modules based upon an affinity between that user logic equation and other user logic equations in said one module;

means, operatively coupled to said partitioning means to receive said modules of partitioned user logic equations, for allocating resources in a programmable logic device wherein each of said user logic equations in said modules is assigned to specific components in said PLD; and means, operatively coupled to said resource allocation means, for generating the state of each programmable connection in said PLD.

2. A system for allocation of resources as in claim 1 with each of said user logic equations having at least one input signal, said partitioning means further comprising:

similarity means, operatively coupled to said logic equation input signals, for generating a similarity measure S for two Boolean vectors;

wherein said similarity means generates said measure S for each pair of said user logic equations using a first Boolean vector representing the presence of input signals to the first user logic equation in said pair of user logic equations and a second Boolean vector representing the presence of input signals to the other user logic equation in said pair of said user logic equations.

3. A system for allocation of resources as in claim 2, said similarity means further comprising:

means, responsive to said similarity measure, for selecting for each user logic equation similarity measures greater than a predetermined limit wherein for each similarity measure greater than the predetermined limit, said selecting means stores the similarity measure and the associated Boolean vector for each user logic equation in said pair of equations and only the stored pairs of user logic equations are subsequently processed.

4. A system for allocation of resources selected from any one of claims 2 or 3, said partitioning means further comprising:

seeding means, operatively coupled to said similarity means, for placing a different user logic equation in each of said multiplicity of modules.

5. A system for allocation of resources as in claim 4, said partitioning means further comprising:

receptivity means, operatively coupled to said similarity means, for generating a receptivity of each module for each of said user logic equations based upon said similarity measures;

wherein said receptivity means assigns the user logic equation to the module having the largest receptivity thereby partitioning the user logic equations into modules based upon the affinity of the logic equations input signals.

6. A system for allocation of resources as in claim 5 wherein said similarity means further comprises
means, operatively coupled to said user logic equations, for generating for each of said multiplicity of modules and a pair of said user logic equations, (i) a first similarity measure S1 for the Boolean vector for the input signals to the first user logic equation in said pair and a Boolean vector for the input signals to the user logic equations in a module, and (ii) a second similarity measure S2 for the Boolean vector for the input signals to the other user logic equation in said pair and said Boolean vector for the input signals to the user logic equations in said module wherein each pair of measures S1 and S2 are stored for subsequent processing.

7. A system for allocation of resources as in claim 6 wherein said receptivity means further comprises:
meaning, operatively coupled to said means for generating similarity measures S1 and S2, for selecting a maximum similarity measure;
wherein said maximum similarity measure selection means selects a maximum similarity measure SM for each module from said pairs of similarity measures S1 and S2 for that module; and
said maximum similarity measure selection means subsequently selects a maximum similarity measure SMMAX from said maximum of similarity measures SM for said modules thereby locating the module that has the greatest receptivity for the user logic equation is said pair of user logic equations.

8. A system for allocation of resources as in claim 7 wherein said receptivity means further comprises:
means, operatively coupled to said maximum similarity measure selection means, for assigning said user logic equation associated with the maximum similarity measures SMMAX to the module associated with maximum similarity measure SMMAX thereby placing said user logic equation in the module having the greatest affinity for said equation.

9. A system for allocation of resources as in claim 8 said partitioning means further comprising:
means, operatively coupled to a source specifying the resources available for each of said multiplicity of modules and to said assigning means, for monitoring available resources in a module wherein:
said monitoring means, upon one of said user logic equations being placed in a module by said receptivity means, decrements the available resources in said module by the number of resources required for said one user logic equation.

10. A system for allocation of resources as in claim 9 wherein said assigning means places said user logic equation in the module having the highest affinity for the equation only if said module has sufficient resources for said user logic equation.

11. A system for allocation of resources as in claim 2, said similarity means further comprising;
means, operatively coupled to said logic equation input signals, for determining a total number n of input signals to a user logic equation wherein said Boolean vector representing the input signals to said user logic equation has n bits and each bit represents one of said n input signals.

12. A system for allocation of resources as in claim 11, said similarity means further comprising:
means, operatively coupled to said total number determining means, for setting each bit in a Boolean vector to a predetermined value;
wherein said setting means sets a bit to a first predetermined value when the input signal represented by said bit is an input signal to the user logic equation associated with said Boolean vector; and
said setting means sets said bit to a second predetermined value otherwise.

13. A system for allocation of resources as in claim 12, said similarity means further comprising:
means, operatively coupled to said bit setting means, for determining input signals common to Boolean vectors
wherein said means for determining common input signals generates an n bit Boolean vector C where for each common input signal, the bit in Boolean vector C for that input signal is set to said first predetermined value to represent the presence of said common input signal.

14. A system for allocation of resources as in claim 13, said means for determining common input signals further comprising:
means, operatively coupled to said bit setting means, for generating a bit-wise logic AND function (AND) of any pair of said Boolean vectors wherein said bit-wise AND generating means generates said Boolean vector C.

15. A system for allocation of resources as in claim 13, said similarity means further comprising:
means, operatively coupled to said bit setting means, for determining the input signals in a first Boolean vector that are different from the input signals in a second Boolean vector;
wherein said means for determining different input signals generates an n bit Boolean vector D where
for each different input signal, the bit in Boolean vector D for that input signal is set to said first predetermined value to represent the presence of said different input signal.

16. A system for allocation of resources as in claim 15, said means for determining different input signals further comprising:
means, operatively coupled to said bit setting means, for generating a bit-wise logic Exclusive OR function (Exclusive OR) of any pair of Boolean vectors wherein said Exclusive OR means processes said first and second Boolean vectors to generate said Boolean vector D.

17. A system for allocation of resources as in claim 15, said similarity means further comprising:
means, operatively coupled to said means for determining common input signals and said means for determining different input signals, for counting the number of bits in a Boolean vector having a predetermined value;
wherein said counting means counts the number bits in said Boolean vector C having said first predetermined number and stores said count as a number c; and
said counting means counts the number bits in said Boolean vector D having said first predetermined number and stores said count as a number d.

18. A system for allocation of resources as in claim 17, said similarity means further comprising:
    means, operatively coupled to said counting means, for generating said similarity measure S;
        wherein said generating means divides the number d by a predetermined weight to form a number D1; and
        said generating means subtracts the number D1 from the number c to form said measure of similarity S.

19. A system for allocation of resources as in claim 1, said allocating means further comprising:
    means, operatively coupled to said partitioning means, for assigning each of said multiplicity of modules to one of said programmable logic blocks in said programmable logic device.

20. A system for allocation of resources as in claim 19, said allocating means further comprising:
    means, operatively coupled to said module assigning means, for assigning each of said user logic equations in one of said modules to resources in said programmable logic block assigned to said one of said modules;
        wherein said logic equation assigning means assigns logic equations requiring similar number of product terms as a group; and
        the groups of logic equations are processed sequentially by the required number of product terms starting with the group that requires the greatest number of product terms.

21. A system for allocation of resources as in claim 20, said user logic equations including output logic equations and buried logic equations, wherein said logic equation assigning means first assigns each of said output logic equations and subsequently assigns each of said buried logic equations.

22. A system for allocation of resources as in claim 21, said user logic equations including the same input signals for user logic equations in at least two modules, and said programmable logic device having dedicated input pins, said allocating means further comprising:
    means, operatively coupled to said module assigning means, for assigning said input signals for user logic equations in at least two modules to said dedicated input pins.

23. A system for allocation of resources as in any one of claims 19, 20 or 22, said allocating means further comprising:
    means, operatively coupled to a source specifying the resources available for said interconnections means and for each programmable logic block of said PLD and to said assigning means, for monitoring resources available in each of said programmable logic blocks and said interconnections means wherein upon allocation of resources by any of said assigning means, said allocated resources are identified as used and removed from the available resources by said resource monitoring means.

24. A system for allocation of resources as in claim 23 said allocating means further comprising:
    means, operatively coupled to each of said assigning means, for locating all available resources for one of said assigning means;
    means, operatively coupled to each of said assigning means, for determining a cost for use of each of said available resources by said one assigning means; and
    each of said assigning means further comprises means, operatively coupled to said available locating resource means and to said cost determining means, for building a two-dimensional matrix wherein:
        the rows of said matrix are available resources and the columns of said matrix are one of (i) logic equations to be assigned for said logic equation assigning means and (ii) input signals to be assigned for said input signal assigning means; and
        the element at the intersection of a row and a column is the cost of using said available resource for the assignment associated with said column.

25. A system for allocation of resources as in claim 24 said allocating means further comprising:
    Hungarian assignment means, operatively coupled to said two dimensional matrix building means in each of said assigning means, for determining the optimal assignment of resources in said matrix.

26. A method, operative in a computer system, for allocation of resources of a programmable logic device (PLD) having a multiplicity of programmably interconnected programmable logic blocks to user logic equations comprising:
    inputting user logic equations
    partitioning said user logic equations into a multiplicity of modules wherein each user logic equation is placed in one of said modules based upon an affinity between that user logic equation and other user logic equations in said one module;
    allocating resources in a programmable logic device wherein each of said user logic equations in said modules is assigned to specific components in said PLD; and
    generating the state of each programmable connection in said PLD.

27. A method for allocation of resources as in claim 26 with each of said user logic equations having at least one input signal, said partitioning step further comprising:
    generating a similarity measure S for two Boolean vectors;
        wherein said measure S is generated for each pair of said user logic equations using a first Boolean vector representing the presence of inputs signals to the first user logic equation in said pair of user logic equations and a second Boolean vector representing the presence of input signals to the other user logic equation in said pair of said user logic equations.

28. A method for allocation of resources as in claim 27, said similarity measure generating step further comprising:
    selecting for each user logic equation similarity measures greater than a predetermined limit wherein for each similarity measure greater than the predetermined limit, the similarity measure and the associated Boolean vector for each user logic equation in said pair of equations are stored and only the stored pairs of user logic equations are subsequently processed.

29. A method for allocation of resources selected from any of claim 27 or 28, said partitioning step further comprising:
    placing a different user logic equation in each of said multiplicity modules.

30. A method for allocation of resources as in claim 29, said partitioning step further comprising:

generating a receptivity of each module for each of said user logic equations based upon said similarity measures;
wherein the user logic equation is assigned to the module having the largest receptivity thereby partitioning the user logic equations into modules based upon the affinity of the logic equations input signals.

31. A method for allocation of resources as in claim 30 wherein said receptivity step includes generating for each of said multiplicity of modules and a pair of said user logic equations, (i) a first similarity measure S1 for the Boolean vector for the input signals to the first user logic equation in said pair and a Boolean vector for the inputs signals to the user logic equations in a module, and (ii) a second similarity measured S2 for the Boolean vector for the input signals to the other user logic equation in said pair and said Boolean vector for the input signals to the user logic equations in said module and wherein each pair of measures S1 and S2 are stored for subsequent processing.

32. A method for allocation of resources as in claim 31 wherein said receptivity step further comprises:
selecting a maximum similarity measure;
wherein said maximum similarity measure selection step selects a maximum similarity measure SM for each module from said pairs of similarity measures S1 and S2 for that module; and
said maximum similarity measure selection step subsequently selects a maximum similarity measures SMMAX from said maximum of similarity measures SM for said modules thereby locating the module that has the greatest receptivity for the user logic equation is said pair of user logic equations.

33. A method for allocation of resources as in claim 32 wherein said receptivity step further comprises:
assigning said user logic equation associated with the maximum similarity measure SMMAX to the module associated with maximum similarity measure SMMAX thereby placing said user logic equations in the module having the greatest affinity for said equation.

34. A method for allocation of resources as in claim 33 said partitioning step further comprising:
monitoring available resources in a module wherein:
upon one of said user logic equations being placed in a module in said receptivity step, the available resources in said module are decremented by the number of resources required for said one user logic equation.

35. A method for allocation of resources as in claim 34 wherein said assigning step places said user logic equation in the module having the highest affinity for the equation only if said module has sufficient resources for said user logic equation.

36. A method for allocation of resources as in claim 27, said similarity measure generating step further comprising:
determining the total number n of said input signals to a user logic equation wherein said Boolean vector representing the input signals to said user logic equation has n bits and each bit represents one of said n input signals.

37. A method for allocation of resources as in claim 36, said similarity step further comprising:
setting each bit in a Boolean vector to a predetermined value;
wherein said setting step sets a bit to a first predetermined value when the input signal represented by said bit is an equal signal to the user logic equation associated with said Boolean vector; and
said setting step sets said bit to a second predetermined value otherwise.

38. A method for allocation of resources as in claim 37, said similarity measure generating step further comprising:
determining the input signals common to a first Boolean vector and to a second Boolean vector;
wherein said common input signals are represented in an n bit Boolean vector C wherein
for each common input signal, the bit in Boolean vector C for that input signal is set to said first predetermined value to represent the presence of said common input signal.

39. A method for allocation of resources as in claim 38, said step for determining common input signals comprising:
generating a bit-wise logic AND function (AND) for a pair of said Boolean vectors wherein said bit-wise AND of said pair of Boolean vectors generates said Boolean vector C.

40. A method for allocation of resources as in claim 38, said similarity measure generating step further comprising:
determining the input signals in a first Boolean vector that are different from the input signals in a second Boolean vector;
wherein said different input signals are represented in an n bit Boolean vector D; and
for each different input signal the bit in Boolean vector D for that input signal is set to said first predetermined value to represent the presence of said different input signal.

41. A method for allocation of resources as in claim 40, said step for determining different input signals further comprising:
generating a bit-wise logic Exclusive OR function (Exclusive OR) of a pair of Boolean vectors wherein said Exclusive OR step processes said first and second Boolean vectors to generate said Boolean vector D.

42. A method for allocation of resources as in claim 40, said similarity measure generating step further comprising:
counting the number bits in said Boolean vector C having said first predetermined number and storing said count as a number c; and
counting the number bits in said Boolean vector D having said first predetermined number and storing said count as a number d.

43. A method for allocation of resources as in claim 42, said similarity measure generating step further comprising:
dividing the number d by a predetermined weight to form a number D1; and
subtracting the number D1 from the number c to form said measure of similarity S.

44. A method for allocation of resources as in claim 26, said allocating step further comprising:
assigning each of said multiplicity of modules to one of said programmable logic blocks in said programmable logic device.

45. A method for allocation of resources as in claim 44, said allocating step further comprising:

assigning each of said user logic equations in one of said modules to resources in said programmable logic block assigned to said one of said modules;
wherein said logic equation assigning step assigns logic equations requiring similar number of product terms as a group; and
the groups of logic equations are processed sequentially by the required number of product terms starting with the group that requires the greatest number of product terms.

46. A method for allocation of resources as in claim 45, said user logic equations including output logic equations and buried logic equations, wherein said logic equation assigning step first assigns each of said output logic equations and subsequently assigns each of said buried logic equations.

47. A method for allocation of resources as in claim 45, said user logic equations including the same input signals for user logic equations in at least two modules, and said programmable logic device having dedicated input pins, said allocating step further comprising:
assigning said input signals for user logic equations in at least two modules to said dedicated input pins.

48. A method for allocation of resources as in any one of claims 44, 45, or 47, said allocating step further comprising:
monitoring resources available in each of said programmable logic blocks and said interconnections means wherein upon allocation of resources in any of said assigning steps, said allocated resources are identified as used and removed from the available resources.

49. A method for allocation of resources as in claims 48 said allocating step further comprising:
locating all available resources for one of said assigning steps;
determining a cost for use of each of said available resources by said assigning step; and
building a two-dimensional matrix wherein:
the rows of said matrix are available resources and the columns of said matrix are one of (i) logic equations to be assigned for said logic equation assigning step and (ii) input signals to be assigned for said input signal assigning step; and
the element at the intersection of a row and a column is the cost of using said available resource for the assignment associated with said column.

50. A method for allocation of resources as in claim 40 said allocating step further comprising:
using a Hungarian assignment process for determining the optimal assignment of resources in said matrix.

51. In a computer system including a stored product data (PDB) having information characterizing at least one programmable logic device (PLD), a system, operative in main memory of said computer system, for allocating resources of a programmable logic device to a user design comprising:
initialization means, operatively coupled to said PDB, for (i) initializing data structures and (ii) inputting user design that includes logic equations and signals wherein said initialization means reads said user design and information from said PDB and in turn uses the read information in initializing data structures in said main memory including data structures representing signals and logic equation in the user design;
means, operatively coupled to said data structures representing the signals and logic equations in the user design, for partitioning logic equations into a multiplicity of modules wherein each logic equation is placed in one of said modules based upon an affinity between that logic equations and other logic equations in said one module and further wherein said modules are structures in said main memory;
means, operatively coupled to said multiplicity of modules, for allocating resources in a programmable logic device wherein each of said logic equations in said modules in assigned to specific components in said PLD; and
means, operatively coupled to said resource allocation means, for generating the state of each programmable connection in said PLD.

52. In a computer system including a stored product database (PDB) having information characterizing at least one programmable logic device, a system, operative in main memory of said computer system, for allocating resources of a programmable logic device to a user design as in claim 51, said partitioning means further comprising:
similarity means, operatively coupled to said data structures representing signals and logic equations, for determining a similarity measure S for two Boolean vectors;
wherein said similarity means determines said measure S for each pair of said logic equations using a first Boolean vector representing the presence of input signals to the first logic equation in said pair of logic equations and a second Boolean vector representing the presence of input signals to the other logic equation in said pair of said logic equations.

53. In a computer system including a stored product database (PDB) having information characterizing at least one programmable logic device, a system, operative in main memory of said computer system, or allocating resources of a programmable logic device to a user design as in claim 52, said similarity means further comprising;
means, responsive to said similarity measure, for selecting for each logic equations similarity measures greater than a predetermined limit wherein for each similarity measure greater than the predetermined limit, said selecting means stores the similarity measure and the associated Boolean vector for each logic equation in said pair of equations in said main memory for subsequent processing.

54. In a computer system including a stored product database (PDB) having information characterizing at least one programmable logic device, a system, operative in main memory of said computer system, for allocating resources of a programmable logic device to a user design selected from any one of claims 52 or 53, said partitioning means further comprising:
seeding means, operatively coupled to said similarity means, for placing a different logic equation in each of said multiplicity of modules.

55. In a computer system including a stored product database (PDB) having information characterizing at least one programmable logic device, a system, operative in main memory of said computer system, for allocating resources of a programmable logic device to a user design as in claim 54, said partitioning means further comprising:

receptivity means, operatively coupled to said similarity means, for generating a receptivity of each module for each of said logic equations based upon said similarity measures;

wherein said receptivity means assigns the logic equations to the modules having the largest receptivity thereby partitioning the logic equations into modules based upon the affinity of the logic equations input signals.

56. In a computer system including a stored product database (PDB) having information characterizing at least one programmable logic device, a system, operative in main memory of said computer system, for allocating resources of a programmable logic device to a user design as in claim 55 wherein said similarity means further comprises:

means, operatively coupled to said logic equations, for generating for each of said multiplicity of modules and a pair of said logic equations, (i) a first similarity measure S1 for the boolean vector for the input signals to the first logic equation in the pair and a Boolean vector for the input signals to the logic equations in a module, and (ii) a second similarity measure S2 for the Boolean vector for the input signals to the other logic equation in the pair and said Boolean vector for the input signals to the logic equations in said module wherein said measures S1 and S2 are stored in said main memory.

57. In a computer system including a stored product database (PDB) having information characterizing at least one programmable logic device, a system, operative in main memory of said computer system, for allocating resources of a programmable logic device to a user design as in claim 56 wherein said receptivity means further comprises:

means, operatively coupled to said pairs of measures S1 and S2, for selecting a maximum similarity measure;

wherein said maximum similarity selection means selects a maximum similarity measure S for each module from said pairs of similarity measures S1, S2 for that module; and said maximum similarity selection means subsequently selects a maximum similarity measure SMMAX from said maximum of similarity measures SM for said modules thereby locating the module that has the greatest receptivity for the logic equation in said pair of user logic equations.

58. In a computer system including a stored product database (PDB) having information characterizing at least one programmable logic device, a system, operative in main memory of said computer system, for allocating resources of a programmable logic device to a user design as in claim 57 wherein said receptivity means further comprises:

means, operatively coupled to said maximum similarity measure selection means, for assigning said logic equation associated with the maximum similarity measure SMMAX to the module associated with the maximum similarity measure SMMAX thereby placing said logic equation in the module having the greatest affinity for said logic equation.

59. In a computer system including a stored product database (PDB) having information characterizing at least one programmable logic device, a system, operative in main memory of said computer system, for allocating resources of a programmable logic device to a user design as in claim 58 said partitioning means further comprising:

means, operatively coupled to a source specifying the resources available for each module and to said assigning means, for monitoring available resources in a module wherein:

said monitoring means, upon one of said logic equations being placed in a module by said receptivity means, decrements the available resources in said module by the number of resources required for said one logic equation.

60. In a computer system including a stored product database (PDB) having information characterizing at least one programmable logic device, a system, operative in main memory of said computer system, for allocating resources of a programmable logic device to a user design as in claim 58 wherein said assigning means placed said logic equation in the module having the highest affinity for said logic equation only if said module has sufficient resources for said logic equation.

61. In a computer system including a stored product database (PDB) having information characterizing at least one programmable logic device, a system, operative in main memory of said computer system, for allocating resources of a programmable logic device to a user design as in claim 52, said similarity means further comprising:

means, operatively coupled to said logic equation input signals, for determining a total number n of input signals to a logic equation wherein said Boolean vector representing the input signals to said logic equation has n bits and each bit represents one of said n input signals.

62. In a computer system including a stored product database (PDB) having information characterizing at least one programmable logic device, a system, operatively in main memory of said computer system, for allocating resources of a programmable logic device to a user design as in claim 61, said similarity means further comprising:

means, operatively coupled to said total number determining means, for setting each bit in a Boolean vector to a predetermined value;

wherein said setting means sets a bit to a first predetermined value when the input signal represented by said bit in an input signal to the logic equation associated with said Boolean vector; and said setting means sets said bit to a second predetermined value otherwise.

63. In a computer system including a stored product database (PDB) having information characterizing at least one programmable logic device, a system, operative in main memory of said computer system, for allocating resources of a programmable logic device to a user design as in claim 62, said similarity means further comprising:

means, operatively coupled to said bit setting means, for determining input signals common to a first Boolean vector and to a second Boolean vector;

wherein said means for determining common input signals generates an n bit Boolean vector C where for each common input signal, the bit in Boolean vector C for that input signals is set to said first predetermined value to represent the presence of said common input signal.

64. In a computer system including a stored product database (PDB) having information characterizing at least one programmable logic device, a system, operative in main memory of said computer system, for allocating resources of a programmable logic device to a user design as in claim 63, said means for determining common input signals comprising:
  means, operatively coupled to said bit setting means, for generating a bit-wise logic AND function (AND) of any pair of said Boolean vectors wherein said bit-wise AND generating means creates said Boolean vector C.

65. In a computer system including a stored product database (PDB) having information characterizing at least one programmable logic device, a system, operative in main memory of said computer system, for allocating resources of a programmable logic device to a user design as in claim 62, said similarity means further comprising:
  means, operatively coupled to said bit setting means, for determining the input signals in a first Boolean vector that are different from the input signals in a second Boolean vector;
    wherein said means for determining different input signals generates an n bit Boolean vector D where for each different input signal, the bit in Boolean vector D for that input signal is set to said first predetermined value to represent the presence of said different input signal.

66. In a computer system including a stored product database (PDB) having information characterizing at least one programmable logic device, a system, operative in main memory of said computer system, for allocating resources of a programmable logic device to a user design as in claim 65, said means for determining different input signals further comprising:
  means, operatively coupled to said bit setting means, for generating a bit-wise logic Exclusive OR function (Exclusive OR) of any pair of Boolean vectors wherein said Exclusive OR means processes said first and second Boolean vectors to generate said Boolean vector D.

67. In a computer system including a stored product database (PDB) having information characterizing at least one programmable logic device, a system, operatively in main memory of said computer system, for allocating resources of a programmable logic device to a user design as in claim 65, said similarity means further comprising:
  means, operatively coupled to said means for determining common input signals and said means for determining different input signal, for counting the number of bits in a Boolean vector having a predetermined value;
    wherein said counting means counts the number bits in said Boolean vector C having said first predetermined number and stores said count as a number c; and
    said counting means counts the number bits in said Boolean vector D having said first predetermined number and stores said count as a number d.

68. In a computer system including a stored product database (PDB) having information characterizing at least one programmable logic device, a system, operative in main memory of said computer system, for allocating resources of a programmable logic device to a user design as in claim 67, said similarity means further comprising:
  mean, operatively coupled to said counting means, for generating said similarity measure S;
    wherein said generating means divides the number d by a predetermined weight to form a number D1; and
    said generating means subtracts the number D1 from the number c to form said measure of similarity S.

69. In a computer system including a stored product database (PDB) having information characterizing at least one programmable logic device, a system, operatively in main memory of said computer system, for allocating resources of a programmable logic device to a user design as in claim 51, said allocating means further comprising:
  means, operatively coupled to said partitioning means, for assigning each of said multiplicity of modules to one of said programmable logic blocks in said programmable logic device.

70. In a computer system including a stored product database (PDB) having information characterizing at least one programmable logic device, a system, operative in main memory of said computer system, for allocating resources of a programmable logic device to a user design as in claim 69, said allocating means further comprising:
  means, operatively coupled to said module assigning means, for assigning each of said logic equations in one of said modules to resources in said programmable logic block assigned to said one of said modules;
    wherein said logic equation assigning means assigns logic equations requiring similar number of product terms as a group; and
    the groups of logic equations are processed sequentially by the required number of product terms starting with the group that requires the greatest number of product terms.

71. In a computer system including a stored product database (PDB) having information characterizing at least one programmable logic device, a system, operative in main memory of said computer system, for allocating resources of a programmable logic device to a user design as in claim 70, said logic equations including output logic equations and buried logic equations, wherein said logic equation assigning means first assigns each of said output logic equations and subsequently assigns each of said buried logic equations.

72. In a computer system including a stored product database (PDB) having information characterizing at least one programmable logic device, a system, operative in main memory of said computer system, for allocating resources of a programmable logic device to a user design as in claim 71, said logic equations including the same input signals for logic equations in at least two modules, and said programmable logic device having dedicated input pins, said allocating means further comprising:
  means, operatively coupled to said module assigning means, for assigning said input signals for user logic equations in at least two modules to said dedicated input pins.

73. In a computer system including a stored product database (PDB) having information characterizing at least one programmable logic device, a system, operative in main memory of said computer system, for allocating resources of a programmable logic device to a user design as in any one of claims 69, 70, or 72, said allocating means further comprising:

means, operatively coupled to a source specifying the resources available for said interconnections means and each programmable logic block of said PLD and to said assigning means, for monitoring resources available in each of said programmable logic blocks and said interconnections means wherein upon allocation of resources by any of said assigning means, said allocated resources are identified as used and removed from the available resources by said resource monitoring means.

74. In a computer system including a stored product database (PDB) having information characterizing at least one programmable logic device, a system, operative in main memory of said computer system, for allocating resources of a programmable logic device to a user design as in claims 73 said allocating means further comprising:

means, operatively coupled to each of said assigning means, for locating all available resources for one of said assigning means;

means, operatively coupled to each of said assigning means, for determining a cost for use of each of said available resources by said one assigning means; and each of said assigning means further comprises means, operatively coupled to said available locating resource means and to said cost determining means, for building a two-dimensional matrix wherein:

the rows of said matrix are available resources and the columns of said matrix are one of (i) logic equations to be assigned for said logic equation assigning means and (ii) input signals to be assigned for said input signal assigning means; and the element at the intersection of a row and a column is the cost of using said available resource for the assignment associated with said column.

75. In a computer system including a stored product database (PDB) having information characterizing at least one programmable logic device, a system, operative in main memory of said computer system, for allocating resources of a programmable logic device to a user design as in claims 74 said allocating means further comprising:

Hungarian assignment means, operatively coupled to said two dimensional matrix building means in each of said assigning means, for determining the optimal assignment of resources in said matrix.

* * * * *